United States Patent
Lung et al.

(10) Patent No.: US 8,664,689 B2
(45) Date of Patent: Mar. 4, 2014

(54) MEMORY CELL ACCESS DEVICE HAVING A PN-JUNCTION WITH POLYCRYSTALLINE PLUG AND SINGLE-CRYSTAL SEMICONDUCTOR REGIONS

(75) Inventors: Hsiang-Lan Lung, Elmsford, NY (US);
Erh-Kun Lai, Elmsford, NY (US);
Yen-Hao Shih, Elmsford, NY (US);
Yi-Chou Chen, Hsinchu (TW);
Shih-Hung Chen, Hsinchu County (TW)

(73) Assignee: Macronix International Co., Ltd., Hsinchu (TW)

(*) Notice: Subject to any disclaimer, the term of this patent is extended or adjusted under 35 U.S.C. 154(b) by 777 days.

(21) Appl. No.: 12/267,492

(22) Filed: Nov. 7, 2008

(65) Prior Publication Data
US 2010/0117049 A1 May 13, 2010

(51) Int. Cl.
*H01L 29/861* (2006.01)
*H01L 29/88* (2006.01)

(52) U.S. Cl.
USPC .................. 257/104; 257/106; 257/E25.01

(58) Field of Classification Search
USPC .................. 257/104–106, 395, 595, E25.01, 257/E21.537; 438/128
See application file for complete search history.

(56) References Cited

U.S. PATENT DOCUMENTS

| | | | |
|---|---|---|---|
| 3,271,591 A | 9/1966 | Ovshinsky | |
| 3,530,441 A | 9/1970 | Ovshinsky | |
| 4,452,592 A | 6/1984 | Tsai | |
| 4,599,705 A | 7/1986 | Holmberg et al. | |
| 4,719,594 A | 1/1988 | Young et al. | |
| 4,769,339 A | 9/1988 | Ishii et al. | |
| 4,876,220 A | 10/1989 | Mohsen et al. | |
| 4,959,812 A | 9/1990 | Momodomi et al. | |
| 5,106,775 A | 4/1992 | Kaga et al. | |

(Continued)

FOREIGN PATENT DOCUMENTS

| | | |
|---|---|---|
| TW | 250617 B | 3/2006 |
| WO | WO-0079539 | 12/2000 |
| WO | WO-0145108 | 6/2001 |
| WO | WO-0225733 | 3/2002 |

OTHER PUBLICATIONS

Morimoto et al. ("Monolithic Integration of Si-interband Tunneling Diodes with a MOSFET for ultralow voltage operation static random access memory", FED Journal, vol. 11, Supplement, pp. 15-20, (2000) (no month cited)).*

(Continued)

*Primary Examiner* — Hoai V Pham
(74) *Attorney, Agent, or Firm* — Haynes Beffel & Wolfeld LLP

(57) ABSTRACT

A memory device includes a driver comprising a pn-junction in the form of a multilayer stack including a first doped semiconductor region having a first conductivity type, and a second doped semiconductor plug having a second conductivity type opposite the first conductivity type, the first and second doped semiconductors defining a pn junction therebetween, in which the first doped semiconductor region is formed in a single-crystalline semiconductor, and the second doped semiconductor region includes a polycrystalline semiconductor. Also, a method for making a memory device includes forming a first doped semiconductor region of a first conductivity type in a single-crystal semiconductor, such as on a semiconductor wafer; and forming a second doped polycrystalline semiconductor region of a second conductivity type opposite the first conductivity type, defining a pn junction between the first and second regions.

25 Claims, 79 Drawing Sheets

(56) References Cited

U.S. PATENT DOCUMENTS

| | | | |
|---|---|---|---|
| 5,166,096 A | 11/1992 | Cote et al. | |
| 5,166,758 A | 11/1992 | Ovshinsky et al. | |
| 5,177,567 A | 1/1993 | Klersy et al. | |
| 5,332,923 A | 7/1994 | Takeuchi et al. | |
| 5,391,901 A | 2/1995 | Tanabe et al. | |
| 5,515,488 A | 5/1996 | Hoppe et al. | |
| 5,534,712 A | 7/1996 | Ovshinsky et al. | |
| 5,550,396 A | 8/1996 | Tsutsumi et al. | |
| 5,687,112 A | 11/1997 | Ovshinsky | |
| 5,688,713 A | 11/1997 | Linliu et al. | |
| 5,716,883 A | 2/1998 | Tseng et al. | |
| 5,754,472 A | 5/1998 | Sim et al. | |
| 5,789,277 A | 8/1998 | Zahorik et al. | |
| 5,789,758 A | 8/1998 | Reinberg | |
| 5,814,527 A | 9/1998 | Wolstenholme et al. | |
| 5,831,276 A | 11/1998 | Gonzalez et al. | |
| 5,837,564 A | 11/1998 | Sandhu et al. | |
| 5,841,150 A * | 11/1998 | Gonzalez et al. | 257/3 |
| 5,869,843 A | 2/1999 | Harshfield | |
| 5,879,955 A | 3/1999 | Gonzalez et al. | |
| 5,902,704 A | 5/1999 | Schoenborn et al. | |
| 5,920,788 A | 7/1999 | Reinberg | |
| 5,933,365 A | 8/1999 | Klersy et al. | |
| 5,952,671 A | 9/1999 | Reinberg et al. | |
| 5,958,358 A | 9/1999 | Tenne et al. | |
| 5,970,336 A | 10/1999 | Wolstenholme et al. | |
| 5,985,698 A | 11/1999 | Gonzalez et al. | |
| 5,998,244 A | 12/1999 | Wolstenholme et al. | |
| 6,011,725 A | 1/2000 | Eitan et al. | |
| 6,025,220 A | 2/2000 | Sandhu | |
| 6,031,287 A | 2/2000 | Harshfield | |
| 6,034,882 A | 3/2000 | Johnson et al. | |
| 6,066,870 A | 5/2000 | Siek | |
| 6,077,674 A | 6/2000 | Schleifer et al. | |
| 6,077,729 A | 6/2000 | Harshfield | |
| 6,087,269 A | 7/2000 | Williams | |
| 6,087,674 A | 7/2000 | Ovshinsky et al. | |
| 6,104,038 A | 8/2000 | Gonzalez et al. | |
| 6,111,264 A | 8/2000 | Wolstenholme et al. | |
| 6,114,713 A | 9/2000 | Zahorik | |
| 6,117,720 A | 9/2000 | Harshfield | |
| 6,147,395 A | 11/2000 | Gilgen | |
| 6,150,253 A | 11/2000 | Doan et al. | |
| 6,153,890 A | 11/2000 | Wolstenholme et al. | |
| 6,177,317 B1 | 1/2001 | Huang et al. | |
| 6,185,122 B1 | 2/2001 | Johnson et al. | |
| 6,189,582 B1 | 2/2001 | Reinberg et al. | |
| 6,236,059 B1 | 5/2001 | Wolstenholme et al. | |
| RE37,259 E | 7/2001 | Ovshinsky | |
| 6,271,090 B1 | 8/2001 | Huang et al. | |
| 6,280,684 B1 | 8/2001 | Yamada et al. | |
| 6,287,887 B1 | 9/2001 | Gilgen | |
| 6,291,137 B1 | 9/2001 | Lyons et al. | |
| 6,314,014 B1 | 11/2001 | Lowrey et al. | |
| 6,316,348 B1 | 11/2001 | Fu et al. | |
| 6,320,786 B1 | 11/2001 | Chang et al. | |
| 6,326,307 B1 | 12/2001 | Lindley et al. | |
| 6,339,544 B1 | 1/2002 | Chiang et al. | |
| 6,351,406 B1 | 2/2002 | Johnson et al. | |
| 6,372,651 B1 | 4/2002 | Yang et al. | |
| 6,380,068 B2 | 4/2002 | Jeng et al. | |
| 6,420,215 B1 | 7/2002 | Knall et al. | |
| 6,420,216 B1 | 7/2002 | Clevenger et al. | |
| 6,420,725 B1 | 7/2002 | Harshfield | |
| 6,423,621 B2 | 7/2002 | Doan et al. | |
| 6,429,064 B1 | 8/2002 | Wicker | |
| 6,440,837 B1 | 8/2002 | Harshfield | |
| 6,462,353 B1 | 10/2002 | Gilgen | |
| 6,473,332 B1 | 10/2002 | Ignatiev et al. | |
| 6,483,736 B2 | 11/2002 | Johnson et al. | |
| 6,487,114 B2 | 11/2002 | Jong et al. | |
| 6,501,111 B1 | 12/2002 | Lowrey | |
| 6,511,867 B2 | 1/2003 | Lowrey et al. | |
| 6,512,241 B1 | 1/2003 | Lai | |
| 6,514,788 B2 | 2/2003 | Quinn | |
| 6,514,820 B2 | 2/2003 | Ahn et al. | |
| 6,521,973 B2 * | 2/2003 | Sharples et al. | 257/577 |
| 6,534,781 B2 | 3/2003 | Dennison | |
| 6,545,903 B1 | 4/2003 | Wu | |
| 6,551,866 B1 | 4/2003 | Maeda et al. | |
| 6,555,860 B2 | 4/2003 | Lowrey et al. | |
| 6,563,156 B2 | 5/2003 | Harshfield | |
| 6,566,700 B2 | 5/2003 | Xu | |
| 6,567,293 B1 | 5/2003 | Lowrey et al. | |
| 6,576,546 B2 | 6/2003 | Gilbert et al. | |
| 6,576,948 B2 * | 6/2003 | Hofmann et al. | 257/311 |
| 6,579,760 B1 | 6/2003 | Lung et al. | |
| 6,586,761 B2 | 7/2003 | Lowrey | |
| 6,589,714 B2 | 7/2003 | Maimon et al. | |
| 6,593,176 B2 | 7/2003 | Dennison | |
| 6,596,589 B2 | 7/2003 | Tseng et al. | |
| 6,597,009 B2 | 7/2003 | Wicker | |
| 6,605,527 B2 | 8/2003 | Dennison et al. | |
| 6,605,821 B1 | 8/2003 | Lee et al. | |
| 6,607,974 B2 | 8/2003 | Harshfield | |
| 6,613,604 B2 | 9/2003 | Maimon et al. | |
| 6,617,192 B1 | 9/2003 | Lowrey et al. | |
| 6,621,095 B2 | 9/2003 | Chiang et al. | |
| 6,625,057 B2 | 9/2003 | Iwata | |
| 6,627,530 B2 | 9/2003 | Li et al. | |
| 6,639,849 B2 | 10/2003 | Takahashi et al. | |
| 6,653,733 B1 | 11/2003 | Gonzalez et al. | |
| 6,670,713 B2 | 12/2003 | Gonzalez et al. | |
| 6,673,700 B2 | 1/2004 | Dennison et al. | |
| 6,674,115 B2 | 1/2004 | Hudgens et al. | |
| 6,744,088 B1 | 6/2004 | Dennison | |
| 6,750,079 B2 | 6/2004 | Lowrey et al. | |
| 6,750,101 B2 | 6/2004 | Lung et al. | |
| 6,791,102 B2 | 9/2004 | Johnson et al. | |
| 6,797,979 B2 | 9/2004 | Chiang et al. | |
| 6,805,563 B2 | 10/2004 | Ohashi et al. | |
| 6,815,704 B1 | 11/2004 | Chen | |
| 6,838,692 B1 | 1/2005 | Lung et al. | |
| 6,850,432 B2 | 2/2005 | Lu et al. | |
| 6,859,389 B2 | 2/2005 | Idehara et al. | |
| 6,861,267 B2 | 3/2005 | Xu et al. | |
| 6,864,500 B2 | 3/2005 | Gilton | |
| 6,864,503 B2 | 3/2005 | Lung et al. | |
| 6,867,638 B2 | 3/2005 | Saiki et al. | |
| 6,888,750 B2 | 5/2005 | Walker et al. | |
| 6,894,304 B2 | 5/2005 | Moore | |
| 6,894,305 B2 | 5/2005 | Yi et al. | |
| 6,900,517 B2 | 5/2005 | Tanaka et al. | |
| 6,903,362 B2 | 6/2005 | Wyeth et al. | |
| 6,909,107 B2 | 6/2005 | Rodgers et al. | |
| 6,910,907 B2 | 6/2005 | Layadi et al. | |
| 6,927,410 B2 | 8/2005 | Chen | |
| 6,928,022 B2 | 8/2005 | Cho et al. | |
| 6,933,516 B2 | 8/2005 | Xu | |
| 6,936,544 B2 | 8/2005 | Huang et al. | |
| 6,936,840 B2 | 8/2005 | Sun et al. | |
| 6,937,507 B2 | 8/2005 | Chen | |
| 6,943,365 B2 | 9/2005 | Lowrey et al. | |
| 6,969,633 B2 | 11/2005 | Dennison | |
| 6,969,866 B1 | 11/2005 | Lowrey et al. | |
| 6,972,428 B2 | 12/2005 | Maimon | |
| 6,972,430 B2 | 12/2005 | Casagrande et al. | |
| 6,977,181 B1 | 12/2005 | Raberg et al. | |
| 6,992,932 B2 | 1/2006 | Cohen et al. | |
| 7,005,665 B2 | 2/2006 | Furkay et al. | |
| 7,023,009 B2 | 4/2006 | Kostylev et al. | |
| 7,033,856 B2 | 4/2006 | Lung et al. | |
| 7,038,230 B2 | 5/2006 | Chen et al. | |
| 7,038,938 B2 | 5/2006 | Kang et al. | |
| 7,042,001 B2 | 5/2006 | Kim et al. | |
| 7,053,406 B1 | 5/2006 | Ho et al. | |
| 7,067,864 B2 | 6/2006 | Nishida et al. | |
| 7,067,865 B2 | 6/2006 | Lung et al. | |
| 7,078,273 B2 | 7/2006 | Matsuoka et al. | |
| 7,115,927 B2 | 10/2006 | Hideki et al. | |
| 7,116,593 B2 | 10/2006 | Hanzawa et al. | |
| 7,122,281 B2 | 10/2006 | Pierrat | |
| 7,122,824 B2 | 10/2006 | Khouri et al. | |
| 7,126,149 B2 | 10/2006 | Iwasaki et al. | |

(56) References Cited

U.S. PATENT DOCUMENTS

| | | | |
|---|---|---|---|
| 7,132,675 B2 | 11/2006 | Gilton | |
| 7,154,774 B2 | 12/2006 | Bedeschi et al. | |
| 7,157,314 B2 | 1/2007 | Subramanian et al. | |
| 7,164,147 B2 | 1/2007 | Lee et al. | |
| 7,166,533 B2 | 1/2007 | Happ | |
| 7,169,635 B2 | 1/2007 | Kozicki | |
| 7,202,493 B2 | 4/2007 | Lung et al. | |
| 7,208,751 B2 | 4/2007 | Ooishi et al. | |
| 7,214,958 B2 | 5/2007 | Happ | |
| 7,220,983 B2 | 5/2007 | Lung | |
| 7,238,994 B2 | 7/2007 | Chen et al. | |
| 7,248,494 B2 | 7/2007 | Oh et al. | |
| 7,251,157 B2 | 7/2007 | Osada et al. | |
| 7,269,052 B2 | 9/2007 | Segal et al. | |
| 7,277,317 B2 | 10/2007 | Le Phan et al. | |
| 7,291,556 B2 | 11/2007 | Choi et al. | |
| 7,309,630 B2 | 12/2007 | Fan et al. | |
| 7,309,921 B2 | 12/2007 | Fukuro et al. | |
| 7,321,130 B2 | 1/2008 | Lung et al. | |
| 7,323,708 B2 | 1/2008 | Lee et al. | |
| 7,332,370 B2 | 2/2008 | Chang et al. | |
| 7,336,526 B2 | 2/2008 | Osada et al. | |
| 7,351,648 B2 | 4/2008 | Furukawa et al. | |
| 7,359,231 B2 | 4/2008 | Venkataraman et al. | |
| 7,364,935 B2 | 4/2008 | Lung et al. | |
| 7,365,385 B2 | 4/2008 | Abbott | |
| 7,379,328 B2 | 5/2008 | Osada et al. | |
| 7,385,235 B2 | 6/2008 | Lung et al. | |
| 7,394,088 B2 | 7/2008 | Lung | |
| 7,397,060 B2 | 7/2008 | Lung | |
| 7,419,868 B2 * | 9/2008 | Ou et al. | 438/237 |
| 7,423,300 B2 | 9/2008 | Lung et al. | |
| 7,426,134 B2 | 9/2008 | Happ et al. | |
| 7,427,531 B2 * | 9/2008 | Cho et al. | 438/102 |
| 7,492,638 B2 * | 2/2009 | Kao et al. | 365/185.18 |
| 7,551,473 B2 * | 6/2009 | Lung et al. | 365/148 |
| 7,623,370 B2 | 11/2009 | Toda et al. | |
| 7,651,906 B2 * | 1/2010 | Park et al. | 438/237 |
| 7,768,825 B2 * | 8/2010 | Kao et al. | 365/175 |
| 2001/0054727 A1 | 12/2001 | Hofmann et al. | |
| 2002/0070457 A1 | 6/2002 | Sun et al. | |
| 2002/0113273 A1 | 8/2002 | Hwang et al. | |
| 2003/0048655 A1 * | 3/2003 | El-Sharawy et al. | 365/149 |
| 2003/0095426 A1 | 5/2003 | Hush et al. | |
| 2003/0186481 A1 | 10/2003 | Lung | |
| 2003/0211732 A1 | 11/2003 | Chiang | |
| 2003/0215978 A1 * | 11/2003 | Maimon et al. | 438/95 |
| 2004/0026686 A1 | 2/2004 | Lung | |
| 2004/0051094 A1 | 3/2004 | Ooishi | |
| 2004/0096571 A1 * | 5/2004 | Kim et al. | 427/96 |
| 2004/0165422 A1 | 8/2004 | Hideki et al. | |
| 2004/0248339 A1 | 12/2004 | Lung | |
| 2004/0256610 A1 | 12/2004 | Lung | |
| 2005/0018526 A1 | 1/2005 | Lee | |
| 2005/0029502 A1 | 2/2005 | Hudgens | |
| 2005/0029587 A1 | 2/2005 | Harshfield | |
| 2005/0062087 A1 | 3/2005 | Chen et al. | |
| 2005/0077631 A1 | 4/2005 | Fukuro | |
| 2005/0093022 A1 | 5/2005 | Lung | |
| 2005/0145984 A1 | 7/2005 | Chen et al. | |
| 2005/0184282 A1 | 8/2005 | Lai et al. | |
| 2005/0191804 A1 | 9/2005 | Lai et al. | |
| 2005/0201182 A1 | 9/2005 | Osada et al. | |
| 2005/0212024 A1 | 9/2005 | Happ | |
| 2005/0215009 A1 | 9/2005 | Cho | |
| 2005/0270832 A1 | 12/2005 | Chu et al. | |
| 2006/0006472 A1 | 1/2006 | Jiang | |
| 2006/0038221 A1 | 2/2006 | Lee et al. | |
| 2006/0066156 A1 | 3/2006 | Dong et al. | |
| 2006/0073642 A1 | 4/2006 | Yeh et al. | |
| 2006/0091476 A1 | 5/2006 | Pinnow et al. | |
| 2006/0094154 A1 | 5/2006 | Lung | |
| 2006/0108667 A1 | 5/2006 | Lung | |
| 2006/0110878 A1 | 5/2006 | Lung et al. | |
| 2006/0110888 A1 | 5/2006 | Cho et al. | |
| 2006/0113521 A1 | 6/2006 | Lung | |
| 2006/0118913 A1 | 6/2006 | Yi et al. | |
| 2006/0124916 A1 | 6/2006 | Lung | |
| 2006/0126395 A1 | 6/2006 | Chen et al. | |
| 2006/0131555 A1 | 6/2006 | Liu et al. | |
| 2006/0138467 A1 | 6/2006 | Lung | |
| 2006/0154185 A1 | 7/2006 | Ho et al. | |
| 2006/0157681 A1 | 7/2006 | Chen et al. | |
| 2006/0186483 A1 * | 8/2006 | Cho et al. | 257/390 |
| 2006/0211165 A1 | 9/2006 | Hwang et al. | |
| 2006/0226409 A1 | 10/2006 | Burr et al. | |
| 2006/0234138 A1 | 10/2006 | Fehlhaber et al. | |
| 2006/0237756 A1 * | 10/2006 | Park et al. | 257/296 |
| 2006/0266993 A1 | 11/2006 | Suh et al. | |
| 2006/0284157 A1 | 12/2006 | Chen et al. | |
| 2006/0284158 A1 | 12/2006 | Lung et al. | |
| 2006/0284214 A1 | 12/2006 | Chen | |
| 2006/0284279 A1 | 12/2006 | Lung et al. | |
| 2006/0286709 A1 | 12/2006 | Lung et al. | |
| 2006/0286743 A1 | 12/2006 | Lung et al. | |
| 2006/0289848 A1 | 12/2006 | Dennison | |
| 2007/0008786 A1 | 1/2007 | Scheuerlein | |
| 2007/0020799 A1 | 1/2007 | Choi et al. | |
| 2007/0030721 A1 | 2/2007 | Segal et al. | |
| 2007/0037101 A1 | 2/2007 | Morioka | |
| 2007/0096162 A1 | 5/2007 | Happ et al. | |
| 2007/0103963 A1 | 5/2007 | Kim et al. | |
| 2007/0108077 A1 | 5/2007 | Lung et al. | |
| 2007/0108429 A1 | 5/2007 | Lung | |
| 2007/0108430 A1 | 5/2007 | Lung | |
| 2007/0108431 A1 | 5/2007 | Chen et al. | |
| 2007/0109836 A1 | 5/2007 | Lung | |
| 2007/0109843 A1 | 5/2007 | Lung et al. | |
| 2007/0111429 A1 | 5/2007 | Lung | |
| 2007/0115794 A1 | 5/2007 | Lung | |
| 2007/0117315 A1 | 5/2007 | Lai et al. | |
| 2007/0121363 A1 | 5/2007 | Lung | |
| 2007/0121374 A1 | 5/2007 | Lung et al. | |
| 2007/0126040 A1 | 6/2007 | Lung | |
| 2007/0131922 A1 | 6/2007 | Lung | |
| 2007/0131980 A1 | 6/2007 | Lung | |
| 2007/0138458 A1 | 6/2007 | Lung | |
| 2007/0147105 A1 | 6/2007 | Lung et al. | |
| 2007/0153563 A1 | 7/2007 | Nirschl | |
| 2007/0154847 A1 | 7/2007 | Chen et al. | |
| 2007/0155172 A1 | 7/2007 | Lai et al. | |
| 2007/0158632 A1 | 7/2007 | Ho | |
| 2007/0158633 A1 | 7/2007 | Lai et al. | |
| 2007/0158645 A1 | 7/2007 | Lung | |
| 2007/0158690 A1 | 7/2007 | Ho et al. | |
| 2007/0158862 A1 | 7/2007 | Lung | |
| 2007/0161186 A1 | 7/2007 | Ho | |
| 2007/0173019 A1 * | 7/2007 | Ho et al. | 438/257 |
| 2007/0173063 A1 | 7/2007 | Lung | |
| 2007/0176261 A1 | 8/2007 | Lung | |
| 2007/0187664 A1 | 8/2007 | Happ | |
| 2007/0201267 A1 | 8/2007 | Happ et al. | |
| 2007/0215852 A1 | 9/2007 | Lung | |
| 2007/0224726 A1 | 9/2007 | Chen et al. | |
| 2007/0235811 A1 | 10/2007 | Furukawa et al. | |
| 2007/0236989 A1 | 10/2007 | Lung | |
| 2007/0246699 A1 | 10/2007 | Lung | |
| 2007/0249090 A1 | 10/2007 | Philipp et al. | |
| 2007/0257300 A1 | 11/2007 | Ho et al. | |
| 2007/0262388 A1 | 11/2007 | Ho et al. | |
| 2007/0274121 A1 | 11/2007 | Lung et al. | |
| 2007/0285960 A1 | 12/2007 | Lung et al. | |
| 2007/0298535 A1 | 12/2007 | Lung | |
| 2008/0002456 A1 | 1/2008 | Toda et al. | |
| 2008/0006811 A1 | 1/2008 | Philipp et al. | |
| 2008/0012000 A1 | 1/2008 | Harshfield | |
| 2008/0014676 A1 | 1/2008 | Lung et al. | |
| 2008/0025089 A1 | 1/2008 | Scheuerlein et al. | |
| 2008/0043520 A1 | 2/2008 | Chen | |
| 2008/0094871 A1 | 4/2008 | Parkinson | |
| 2008/0101110 A1 | 5/2008 | Happ et al. | |
| 2008/0137400 A1 | 6/2008 | Chen et al. | |
| 2008/0164453 A1 | 7/2008 | Breitwisch et al. | |
| 2008/0165569 A1 | 7/2008 | Chen et al. | |

(56) References Cited

U.S. PATENT DOCUMENTS

| | | |
|---|---|---|
| 2008/0165570 A1 | 7/2008 | Happ et al. |
| 2008/0165572 A1 | 7/2008 | Lung |
| 2008/0166875 A1 | 7/2008 | Lung |
| 2008/0179582 A1 | 7/2008 | Burr et al. |
| 2008/0180990 A1 | 7/2008 | Lung |
| 2008/0186755 A1 | 8/2008 | Lung et al. |
| 2008/0191187 A1 | 8/2008 | Lung et al. |
| 2008/0192534 A1 | 8/2008 | Lung |
| 2008/0224119 A1 | 9/2008 | Burr et al. |
| 2008/0225489 A1 | 9/2008 | Cai et al. |
| 2008/0280401 A1* | 11/2008 | Burr et al. ............. 438/154 |
| 2009/0166600 A1 | 7/2009 | Park et al. |
| 2009/0316473 A1 | 12/2009 | Happ |

OTHER PUBLICATIONS

Oh, J.H., et al., "Full Integration of Highly Manufacturable 512Mb PRAM based on 90nm Technology," Electron Devices Meeting, 2006. IEDM '06. International Dec. 11-13, 2006 pp. 1-4.

Pellizer, F., et al., "A 90nm Phase Change Memory Technology for Stand-Alone Non-Volatile Memory Applications," STM/Intel VLSI 2006, 2 pages.

Gilbert, Nad E., "A macro model of programmable metallization cell devices," Solid-State Electronics 49 (2005) 1813-1819.

Horii, H. et al., "A Novel Cell Technology Using N-doped GeSbTe Films for Phase Change RAM," Jun. 10-12, 2003 Symposium on VLSI Technology Digest of Technical Papers, pp. 177-178.

Hwang, Y. N. et al., "Full Integration and Reliability Evaluation of Phase-change RAM Based on 0.24um-CMOS Technologies," Jun. 10-12, 2003 Symposium on VLSI Technology Digest of Technical Papers, pp. 173-174.

Lai, Stephan et al., "OUM-A 180 nm Nonvolatile Memory Cell Element Technology for Stand Alone and Embedded Applications," IEEE IEDM Dec. 2-5, 2001, pp. 803-806.

\* cited by examiner

MEMORY CELL ACCESS DEVICE HAVING A PN-JUNCTION WITH POLYCRYSTALLINE PLUG AND SINGLE-CRYSTAL SEMICONDUCTOR REGIONS

PARTIES TO A RESEARCH AGREEMENT

International Business Machine Corporation, a New York corporation and Macronix International Corporation, Ltd., a Taiwan corporation, are parties to a Joint Research Agreement.

CROSS-REFERENCE TO RELATED APPLICATION

The present application is related to U.S. patent application Ser. No. 12/167,453, entitled MEMORY CELL ACCESS DEVICE HAVING A PN-JUNCTION WITH POLYCRYSTALLINE AND SINGLE-CRYSTAL SEMICONDUCTOR REGIONS by the same inventors, filed on the same day as the present application.

BACKGROUND

1. Field of the Invention

The present invention relates to high density memory devices based on phase change based memory materials, including chalcogenide based materials and other programmable resistive materials, and to methods for manufacturing such devices.

2. Description of Related Art

Phase change based memory materials, such as chalcogenide based materials and similar materials, can be caused to change phase between an amorphous state and a crystalline state by application of electrical current at levels suitable for implementation in integrated circuits. The generally amorphous state is characterized by higher electrical resistivity than the generally crystalline state, which can be readily sensed to indicate data. These properties have generated interest in using programmable resistive material to form nonvolatile memory circuits, which can be read and written with random access.

The change from the amorphous to the crystalline state is generally a lower current operation. The change from crystalline to amorphous, referred to as reset herein, is generally a higher current operation, which includes a short high current density pulse to melt or breakdown the crystalline structure, after which the phase change material cools quickly, quenching the phase change process and allowing at least a portion of the phase change material to stabilize in the amorphous state. The magnitude of the current needed for reset can be reduced by reducing the size of the phase change material element in the cell and/or the contact area between electrodes and the phase change material, such that higher current densities are achieved with small absolute current values through the phase change material element.

Because the phase change occurs as a result of heating, a relatively large current is needed in order to heat the phase change material and induce the desired phase change. Field effect transistor access devices have been proposed as drivers for phase change memory cells, but field effect transistors (e.g., MOSFET) can have a weaker current drive. Bipolar junction transistors (BJT) can provide larger current drive than field effect transistors, but the integration of bipolar junction transistors with CMOS peripheral circuitry is difficult and results in highly complex designs and manufacturing processes.

Diode access devices have been proposed as drivers for phase change memory cells. However, diodes having both regions made of doped polysilicon may have an unacceptably high off current. Diodes having both regions made of doped single-crystal silicon may provide a suitably low off current, but processes for making a diode having both regions made of doped single-crystal silicon are complex. Diode structures have been proposed that include polysilicon for one terminal and single-crystal silicon for another. See, U.S. Pat. No. 7,309,921. However, such structures do not completely solve the problem of high off-current due to the polysilicon terminal, and have not been proposed for memory cell access devices. See, U.S. Pat. No. 7,157,314.

It is desirable to provide access devices that reliably provide sufficient current for phase change memory cell programming while having a suitably low off current, that are readily manufacturable at acceptable cost, and that are compatible with high performance logic circuitry.

SUMMARY

In a general aspect a memory device as described herein includes an access device that comprises a pn-junction, including a first doped semiconductor region having a first conductivity type, and a second doped semiconductor region having a second conductivity type opposite the first conductivity type, the first and second doped semiconductors defining a pn-junction therebetween, in which the first doped semiconductor region is formed in a single-crystalline semiconductor, and the second doped semiconductor region includes a polycrystalline semiconductor. The doping concentration in the polysilicon region is greater than that in the single-crystal region in embodiments described herein. The second doped semiconductor region is implemented in the form of a plug within a via through an insulating layer, or as a patterned semiconductor body first patterned and then covered by an insulating layer.

In some embodiments the first doped semiconductor region includes a lightly-doped P-type semiconductor and the second doped semiconductor region includes a more heavily-doped N-type polycrystalline semiconductor having a doping concentration higher than that of the lightly-doped P-type semiconductor; in other embodiments the first semiconductor region includes a lightly-doped N-type semiconductor and the second semiconductor region includes a more heavily-doped P-type polycrystalline semiconductor. The heavily doped semiconductor regions in the polysilicon have a doping concentration higher than that of the lightly doped semiconductor regions in the single crystalline semiconductor so that the electrical junction lies within the single crystalline semiconductor when the junction is off, significantly reducing leakage due to the off state current of the diode. For example, the heavily doped semiconductor regions may have a concentration of dopants (atoms/cm$^3$), that is more than 10 times the concentration of dopants in the lightly doped semiconductor regions, and more preferably 100 to 1000 times greater or more. For example, the heavily doped semiconductor regions have a doping concentration on the order of around $10^{+17}$ to $10^{+19}$/cm$^3$, and the lightly doped semiconductor regions have a doping concentration on the order of $10^{+14}$/cm$^3$ to $10^{+16}$/cm$^3$.

In some embodiments the single-crystalline semiconductor is a single-crystal silicon; in some embodiments the polycrystalline semiconductor is a polysilicon.

In some embodiments the diode further includes an electrically conductive cap on the second doped semiconductor region; and in some such embodiments the cap includes a silicide.

In some embodiments the second doped semiconductor region is self-aligned with the first doped semiconductor region; in some embodiments the second doped semiconductor region is formed as a column over the first doped semiconductor region.

In some embodiments the memory device further includes a phase change memory element coupled with the second doped semiconductor region.

In another general aspect a memory device array as described herein includes first access lines extending in a first direction, and second access lines overlying the first access lines and extending in a second direction, and a plurality of memory cells, each comprising an access device and a memory material. The access device includes first and second doped semiconductor regions defining a pn-junction. The first doped semiconductor region is of a first conductivity type and is formed in a single-crystalline semiconductor substrate, and the first doped semiconductor region is in electrical communication with a corresponding first access line. The second doped semiconductor region is of a second conductivity type opposite the first conductivity type and includes a polycrystalline semiconductor. The memory material is in electrical communication with a corresponding second access line. In some embodiments the memory material is a phase change memory material.

In some embodiments the access device further includes an electrically conductive cap on the second doped semiconductor region; and in some such embodiments the electrically conductive cap includes a silicide. The memory cell may further include a bottom electrode contacting the electrically conductive cap, and in such embodiments the memory material contacts the bottom electrode. The bottom electrode may be omitted in some embodiments, such as embodiments using a pore type memory cell having a pore opening to the cap, filled with programmable resistance material. In other embodiments the memory material contacts the second semiconductor region.

In some embodiments the diode further includes a thin barrier layer at the pn-junction. The barrier layer can inhibit diffusion of dopants across the pn-junction, and can enhance performance of the diode without impeding on-state current flow in operation of the device.

In some embodiments the memory cell further includes a top electrode, and in such embodiments the memory material contacts the top electrode. In some embodiments the top electrode constitutes the first access line.

In another general aspect a method for making a memory cell diode driver as described herein includes: providing a single-crystalline semiconductor zone having a first conductivity type; forming a conductively-doped region of a second conductivity type (e.g. an n-well) in the upper region of the semiconductor substrate suitable for acting as an access line; forming a lightly-doped (where lightly-doped is used in relative sense herein compared to the doping concentration of the polycrystalline material mentioned below) region of the first conductivity type within and adjacent the upper surface of the conductively-doped region; forming isolation trenches defining a bottom diode region strip having an exposed surface; depositing a second dielectric material onto the surface of the bottom diode region strip; forming a junction via (or contact opening) through the second dielectric material to expose an area of the lightly-doped region at the surface of the bottom diode region strip; and forming a more heavily-doped polycrystalline material of the second conductivity type in the contact opening, the more heavily-doped polycrystalline material contacting the area of the lightly-doped region. The polycrystalline material may be deposited in the contact opening and then doped; or, the polycrystalline material may be deposited in a suitably doped form.

The semiconductor wafer substrate may constitute the single-crystalline semiconductor zone; or, an epitaxially-grown single-crystalline semiconductor layer formed over an insulation layer on the wafer ("SOI substrate") may constitute the single-crystalline semiconductor zone.

In some embodiments the method further includes forming an electrically conductive cap over the surface of the heavily-doped polycrystalline material.

In another general aspect a method for making a memory cell driver as described herein includes: providing a single-crystalline semiconductor zone having a first conductivity type; forming a conductively-doped region of a second conductivity type in the upper region of the semiconductor substrate; forming a lightly-doped region of the first conductivity type within and adjacent the upper surface of the conductively-doped region; forming isolation trenches defining a bottom junction region strip having an exposed surface; depositing a more heavily-doped polycrystalline material of the second conductivity type over the surface of the bottom junction region strip; depositing an electrically conductive cap material over the surface of the heavily-doped polycrystalline material; patterning the cap material and the more heavily-doped polycrystalline material to form a top junction element over the lightly-doped region at the surface of the bottom junction region strip; depositing a second dielectric material onto the surface of the first dielectric material and the bottom junction region strip and the top diode element; and planarizing the second dielectric material and exposing a portion of the surface of the top junction element.

In another general aspect a method for making a memory cell driver as described herein includes: providing a single-crystalline semiconductor substrate having a second conductivity type; forming a lightly-doped region of the first conductivity type within and adjacent the upper surface of the substrate; depositing a more heavily-doped polycrystalline material of the second conductivity type over the surface of the lightly-doped region; forming isolation trenches defining a diode strip having an exposed surface; patterning the more heavily-doped polycrystalline material to isolate a second junction element and expose adjacent lightly-doped regions of the first conductivity type; forming a spacer adjacent the sidewalls of the second junction element; forming an electrically conductive cap material over the second junction element; conducting an implant of the first conductivity type to more heavily dope the exposed lightly-doped regions of the first conductivity type to establish conductively doped regions; and depositing a second dielectric material onto the surface of the first dielectric material and the second diode element.

In some embodiments of the methods, a thin layer of a barrier material (for example $SiO_2$ or $SiN_xO_y$) is formed on the lightly-doped region of the first conductivity type prior to depositing the polycrystalline semiconductor material; as a result a thin barrier is provided at the pn-junction. The barrier layer can inhibit diffusion of dopants across the pn-junction, and can enhance performance of the diode.

Advantageously certain features of the memory array and of peripheral devices may be formed together. For example, the deposit of polycrystalline material may constitute both the polycrystalline semiconductor node of the diode array and the FET gate in the peripheral devices. Briefly: the crystalline semiconductor material in the memory array region is doped; trench isolation are formed; an oxide is grown over the memory array region and the peripheral device region; the oxide is patterned to form gate oxides for the peripheral devices and to remove the oxide from the memory array; and polycrystalline material is deposited and patterned for both in the peripheral device region to form gates and in the array area to form polysilicon, more heavily doped elements of the access devices. Thereafter an interlayer dielectric is formed, and openings are formed in both the peripheral device region and the memory array region. The openings are filled with a conductive contact plug material such as tungsten in the peripheral device region, and with elements completing the memory cells in the array region. Therefore, a single polysilicon process can be shared for both the more heavily doped polysilicon elements in the array and peripheral polysilicon structures, saving substantial costs in manufacturing. In this embodiment, transistor gate structures in the peripheral circuitry region of the device and the more heavily doped polysilicon elements of the drivers comprise respective features in a single polysilicon layer.

Forming the first diode region of single-crystal semiconductor material provides for a memory cell having significantly reduced off-current, or leakage current, as compared with a diode having both regions formed of polycrystalline material. According to the disclosed embodiments the first diode region can be formed in the crystalline semiconductor wafer, and the pn-junction is defined at the wafer surface. It is not necessary to etch into the wafer to form the pn-junction. Forming the second diode region of polycrystalline semiconductor material, rather than of single-crystal semiconductor material simplifies fabrication, because an epitaxial growth procedure by which single-crystal material is typically formed is avoided.

Figure 2A:
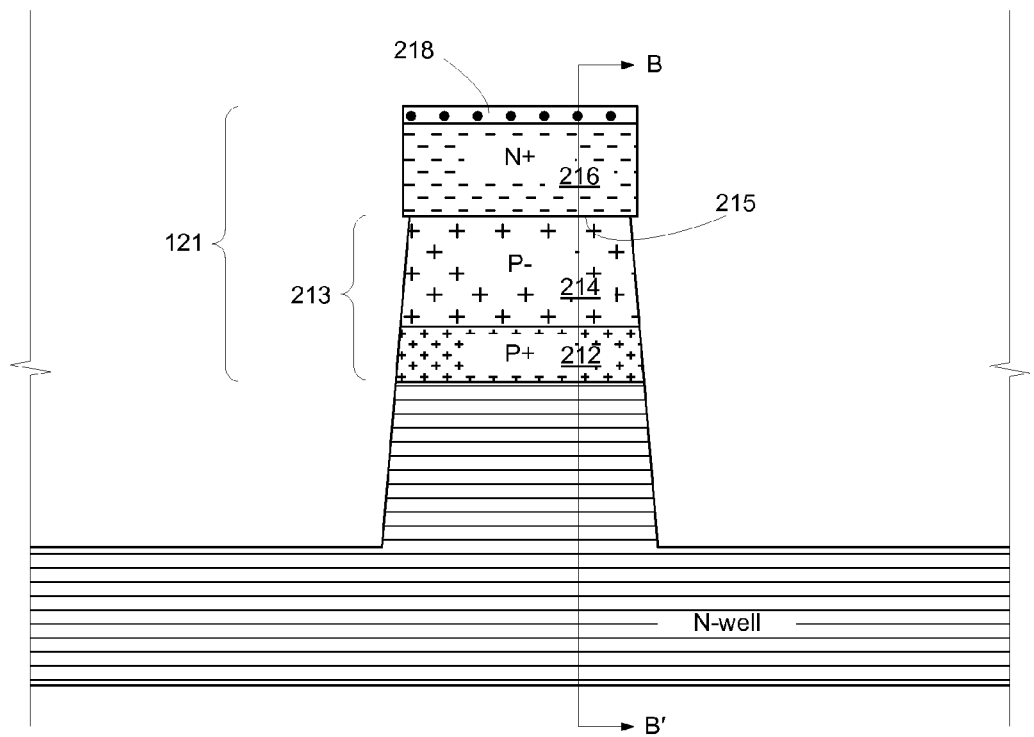
FIGS. 2A and 2B are diagrammatic sketches in sectional views showing an embodiment of a unit diode access device including a patterned polysilicon body.
Figure 2B:
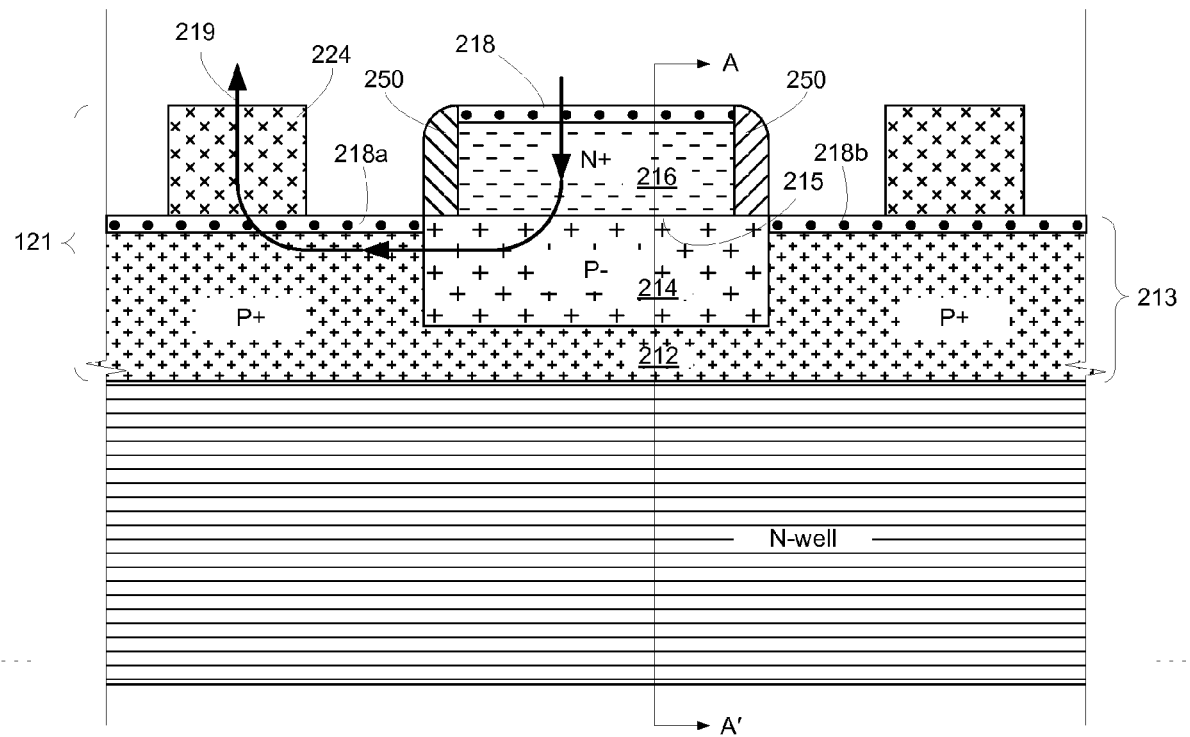

In the preceding figures, in many instances, the corresponding figures labeled "A" and "B" (where presented) show sections taken generally perpendicular to one another; for example, the orientation of the sectional view shown in FIG. 2A is indicated at A-A' in FIG. 2B, and the orientation of the sectional view shown in FIG. 2B is indicated at B-B' in FIG. 2A. The corresponding figures labeled "C" (where presented) are in a plan view.

DETAILED DESCRIPTION

The invention will now be described in further detail by reference to the drawings, which illustrate alternative specific embodiments and methods. The drawings are diagrammatic, showing features of the embodiments and their relation to other features and structures, and are not made to scale. For improved clarity of presentation, in the figures illustrating various embodiments, elements corresponding to elements shown in other drawings are not all particularly renumbered, although they are all readily identifiable in all the figures. Also for clarity of presentation certain features are not shown in the figures, where not necessary for an understanding of the invention. It is to be understood that there is no intention to limit the invention to the specifically disclosed embodiments and methods but that the invention may be practiced using other features, elements, methods and embodiments. Preferred embodiments are described to illustrate the present invention, not to limit its scope, which is defined by the claims. Those of ordinary skill in the art will recognize a variety of equivalent variations on the description that follows.

Figure 1:
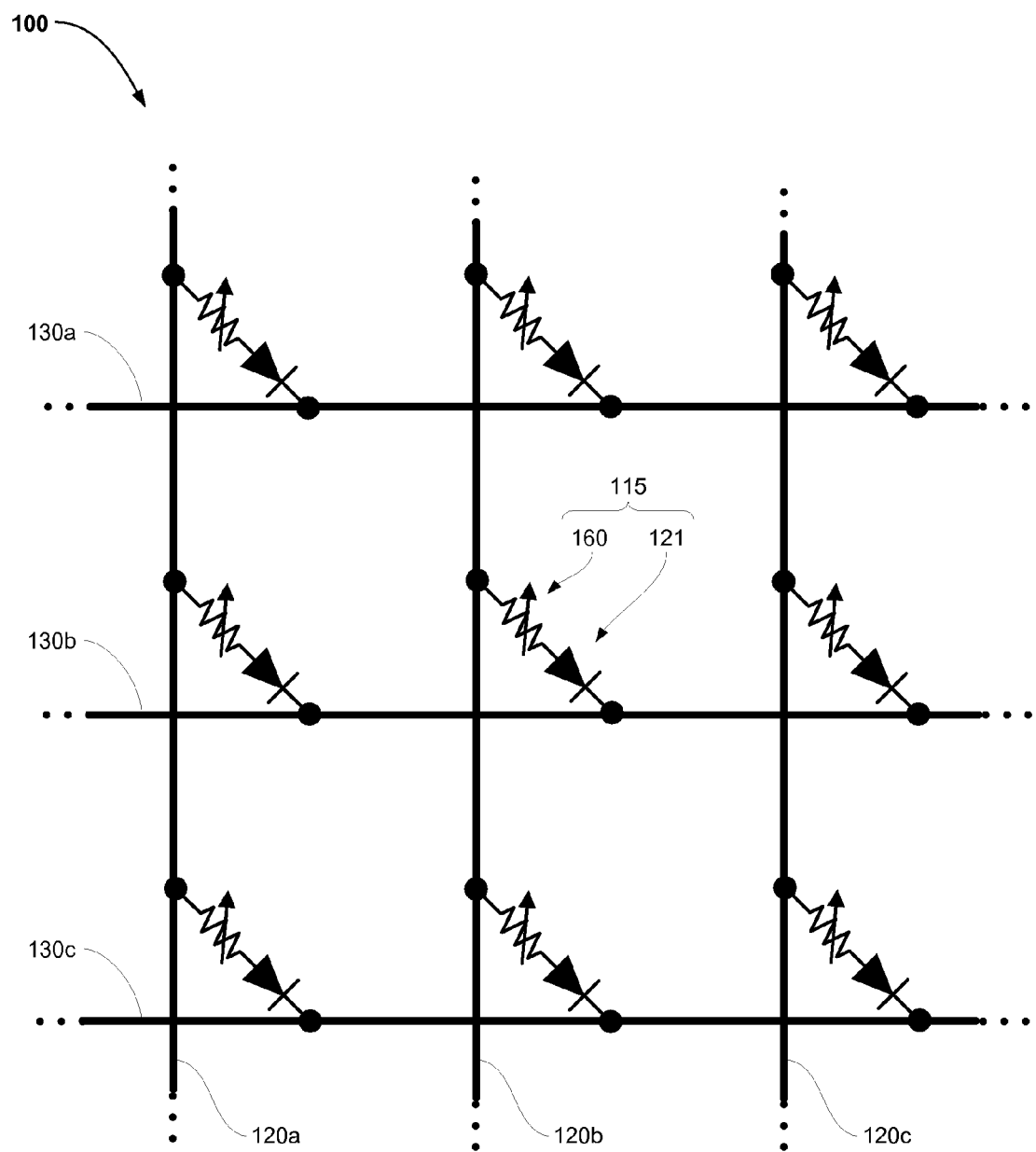
FIG. 1 is a schematic diagram of a memory array employing memory cells having diode access devices as described herein.

FIG. 1 illustrates in a schematic diagram of a portion of a memory array 100 implemented using memory devices and diode access devices as described herein. In alternatives, access device other than diodes, which also include pn-junctions may be used, such as bipolar transistors. Each of the memory cells of array 100 includes a diode access device and a memory element (represented in FIG. 1 by a variable resistor) capable of being set to one of a plurality of resistive states and thus capable of storing one or more bits of data.

The array 100 includes a plurality of word lines 130 including word lines 130a, 130b, and 130c extending in parallel in a first direction, and a plurality of bit lines 120 including bit lines 120a, 120b, and 120c extending in parallel in a second direction generally perpendicular to the first direction. The word lines 130 and bit lines 120 are arranged typically in such a manner that a given word line 130 and a given bit line 120 cross over each other but do not physically intersect.

Memory cell 115 is representative of the memory cells of array 100. The memory cell 115 includes a diode access device 121 and a memory element 160 arranged in series; the diode 121 is electrically coupled to the word line 130b and the memory element 160 is electrically coupled to the bit line 120b (or vice-versa).

Reading or writing to memory cell 115 of array 100 can be achieved by applying appropriate voltages and/or currents to the corresponding word line 130b and bit line 120b to induce a current through a selected memory cell 115. The level and duration of the voltages/currents applied is dependent upon the operation performed, e.g., a reading operation or a writing operation.

In a reset (or erase) operation of memory cell 115 having memory element 160 including a phase change material, a reset pulse is applied to the corresponding word line 130b and bit line 120b to cause a transition of an active region of the phase change material into an amorphous phase, thereby setting the phase change material to a resistance within a resistive value range associated with the reset state. The reset pulse is a relatively high energy pulse, sufficient to raise the temperature of at least the active region of the memory element 160 above the melting temperature to place at least the active region in a liquid state. The reset pulse is then quickly terminated, resulting in a relatively quick quenching time as the active region quickly cools to below the transition temperature so that the active region stabilizes to an amorphous phase.

In a set (or program) operation of memory cell 115 having memory element 160 including a phase change material, a program pulse is applied to the corresponding word line 130b and bit line 120b of suitable amplitude and duration to induce a current sufficient to raise the temperature of at least a portion of the active region above the transition temperature and cause a transition of a portion of the active region from the amorphous phase into a crystalline phase, this transition lowering the resistance of the memory element 160 and setting the memory cell 115 to the desired state.

In a read (or sense) operation of the data value stored in memory cell 115 having memory element 160 comprising phase change material, a read pulse is applied to the corresponding word line 130b and bit line 120b of suitable amplitude and duration to induce current to flow that does not result in the memory element 160 undergoing a change in resistive state. The current through the memory cell 115 is dependent upon the resistance of the memory element 160 and thus the data value stored in the memory cell 115.

Figure 2C:
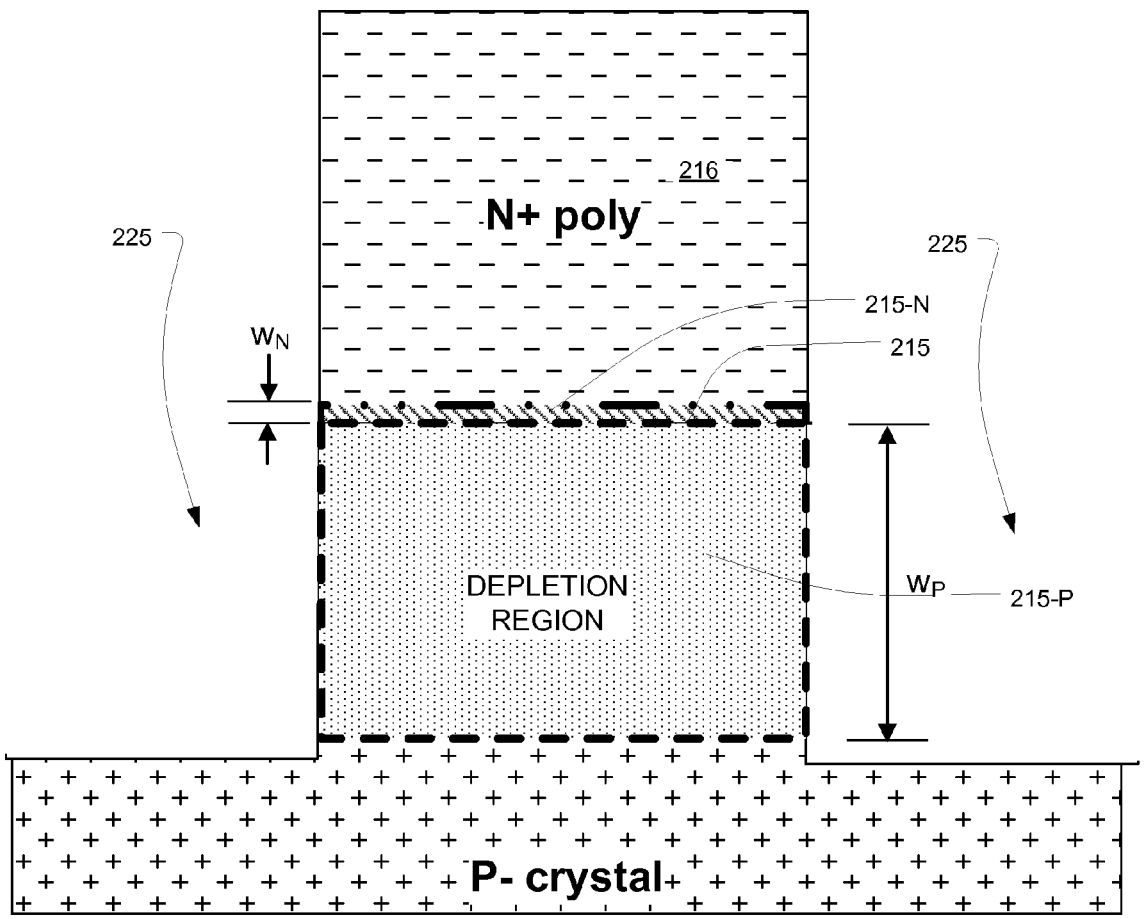
FIG. 2C illustrates a feature of the diode access devices described herein by which the junction is located primarily in the single crystal portion of the diode.

FIGS. 2A and 2B show a portion of an embodiment of a memory cell array 100, in which the second polysilicon region of the diode has the form of an island, in diagrammatic sectional views. FIG. 2A is taken in a direction along a bit line 120, and FIG. 2B is taken in a direction along a word line 130. FIG. 2C illustrates an aspect of the pn-junction formed as described herein, with a depletion region located mostly in the crystalline region having a lower concentration of doping. This aspect establishes a diode with smaller leakage current in the off condition, allowing for improved memory operation. Turning first to FIG. 2C, using reference numerals that will be applied in FIGS. 2A and 2B, a diode is illustrated including a more heavily doped N+ region 216 implemented using polysilicon, and a more lightly doped P− region 214 implemented using single crystal silicon. A physical boundary 215 between the regions 216 and 214 defines the pn-junction. The width of the junction $W_j$ however is the sum of the widths of depletion regions 215-N and 215-P, which have respective widths labeled $W_N$ and $W_P$ in the diagram, where $W_P$ is much greater than $W_N$. The widths $W_N$ and $W_P$ of the depletion regions under zero bias are inversely proportional the doping concentrations, as is known from the preservation of charge equality:

$$qN_A W_P = qN_D W_N,$$

where q is charge, $N_A$ is concentration of acceptors (p-type doping), and $N_D$ is concentration of donors (n-type doping). Where $N_D$ is much greater than $N_A$, the depletion region on the p-type material is much wider than the depletion region in the n-type material.

So, in embodiments in which the concentration of n-type dopants in region 216 is 100 times greater than the concentration of p-type dopants in region 214, the width $W_P$ will be 100 times greater than the width $W_N$. As the majority of the junction, as defined by the depletion regions, occurs in the crystalline portion 214 of the diode, the off-current characteristics are determined primarily by the behavior in the crystalline portion 214. The heavily doped, polycrystalline semiconductor regions may have a concentration of dopants (atoms/cm$^3$), that is more than 10 times the concentration of dopants in the lightly doped, single crystal semiconductor regions, and more preferably 100 to 1000 times greater. For example, the heavily doped semiconductor regions around $10^{+17}$ to $10^{+19}$/cm$^3$ doping concentration on the order of, and the lightly doped semiconductor regions have a doping concentration on the order of $10^{+14}$/cm$^3$ to $10^{+16}$/cm$^3$.

FIG. 2C also shows that the crystalline region 214 is a single crystalline body with an interface for forming the pn-junction on top, and integral with a more heavily doped access line 212 as illustrated more clearly in FIGS. 2A and 2B. The top of the crystalline region 214 includes body protruding above a surface of the single crystalline body adjacent the access device by an amount greater than the depth of the depletion region, that is greater than $W_P$ in the embodiment with a p-type crystalline material. Thus, the depletion region that forms in crystalline region 214 is isolated from adjacent diodes by trenches 225 in the single crystalline body, having depths greater than the width of the depletion region in the crystalline material. This isolates the junctions from adjacent junctions that can be packed close together. The trenches can be formed in a manner self-aligned with the polycrystalline regions by over-etching when patterning the polysilicon regions 216, or using a sidewall spacer on the polysilicon regions as a etch mask, as shown in FIG. 18B. Of course, other techniques can be applied to form a pattern in the surface of the single crystalline body used for the access line and the single crystal element of the junction.

Therefore, the low leakage current provided in single crystal junctions is achieved, or substantially achieved by the structure described herein. However, the ease of manufacturing provided by forming a polycrystalline more highly doped region 216, is achieved without substantial costs in the form of leakage current.

Referring to FIGS. 2A and 2B, the memory cell 115 includes a first doped semiconductor region 213 having a first conductivity type and a second doped semiconductor region 216 on the first doped semiconductor region 213, the second doped semiconductor region 216 having a second conductivity type opposite the first conductivity type. The first doped semiconductor region 213 includes a conductively doped region 212 overlain by a lightly doped region 214. A pn-junction 215 is defined between the lightly doped region 214 of the first doped semiconductor region 213 and the second doped semiconductor region 216. In the example shown in the figures, the first doped semiconductor region is a p-type semiconductor; the conductively doped region is marked "P+", and the lightly doped region is marked "P−". And, in the example shown in the figures, the second doped semiconductor region is a more heavily-doped n-type semiconductor, marked "N+".

The first doped semiconductor region 213 is formed by doping the (single-crystal) semiconductor substrate and, accordingly, the first doped semiconductor region is a single-crystal semiconductor. The second doped semiconductor region is a doped deposited polysilicon material. Accordingly, the diode is made up of first and second semiconductor regions, defining a pn-junction between them; the first semiconductor region is formed of a single-crystal semiconductor, and the second semiconductor region is formed of a polycrystalline semiconductor.

The doped single-crystal semiconductor regions may be formed in the wafer itself. Alternatively, the doped single-crystal semiconductor regions may be formed in a silicon-on-insulator "SOI" substrate (such as a silicon-insulator-silicon) substrate.

The memory cell 115 includes a conductive cap 218 on the second doped semiconductor region 216. The first and second doped semiconductor regions 213, 216 and the conductive cap 218 constitute a multi-layer stack defining diode 121. In the illustrated embodiment the conductive cap 218 includes a silicide containing, for example, Ti, W, Co, Ni, or Ta formed using a self-aligned silicide process. Patterned silicide processes may be used as well, employing typically a tungsten silicide. The conductive cap 218 assists in maintaining the uniformity of an electric field impressed across the first and second doped semiconductor regions 213, 216 during operation by providing a contact surface that is more highly conductive than the semiconductor material of the first and second doped semiconductor regions 213, 216. The conductive cap 218 also provides a low resistance ohmic contact between the diode 121 and the overlying memory element 160. Additionally, the conductive cap 218 can serve as a protective etch stop layer for the second doped semiconductor region 216 during the manufacture of the memory cell array 100. In addition, the silicide used to form the conductive cap is formed in regions 218a, 218b on the surface of the more heavily doped region 212 and between the memory cells. The conductive cap in regions 218a, 218b removes minority carriers from the more heavily doped region, and improves the conductivity of the word line formed by the region 212. Also, the conductive cap in the regions 218a, 218b provides a low resistance ohmic contact between conductive plugs 224 and the region 212.

In the example shown in FIGS. 2A and 2B, the width of the lightly doped single crystal, semiconductor region 214 beneath the more heavily doped polycrystalline semiconductor region 212 is greater than the width of the second doped semiconductor region 216, as defined by spacers 250 formed adjacent the second doped semiconductor region 216. Conductive plugs 224, typically tungsten and/or other metals, contact through contact openings the more heavily doped semiconductor region 212 situated to the side of the second doped semiconductor region 216, and extend upward to make contact with overlying structures, as shown and described below. In alternative embodiments, the conductive plugs need not be implemented between every cell as shown in FIG. 2B. Instead, some embodiments may provide such plugs in a less dense arrangement, such as every other cell, every fourth cell, every eighth cell and so on depending on the implementation of the overlying structures and other considerations.

Optionally, a thin barrier layer (not shown) can be situated at the pn-junction, that is, between the lightly-doped semiconductor region 214 and the more heavily-doped semiconductor region 216. The barrier layer can inhibit diffusion of dopants across the pn-junction, and can enhance performance of the diode. A suitable barrier layer may be, for example, silicon dioxide ($SiO_2$) or a silicon oxynitride ($SiN_xO_y$); and it may have a thickness in a range of about 5 to 25 Angstroms, for example about 10 Angstroms.

Arrow 219 in FIG. 2B shows the current flow direction from an overlying memory element (not shown in this FIG.) across the pn-junction 215 through the diode and on to and through the contact via, and eventually to an overlying access line (not shown in this FIG.). The more heavily doped semiconductor region 212 performs an in-substrate word line function of limited length. As mentioned above, the length between contacts to the in-substrate, local word line can be extended in embodiments utilizing silicided regions 218a, 218b at the surface. As the FIG. illustrates, because the width of the lightly doped semiconductor region 214 is greater than the width of the second doped semiconductor region 216, the current necessarily passes from the second doped semiconductor region 216 through the lightly doped semiconductor region 214 beneath the spacer before it passes on to the more heavily doped semiconductor region 212.

Figure 3:
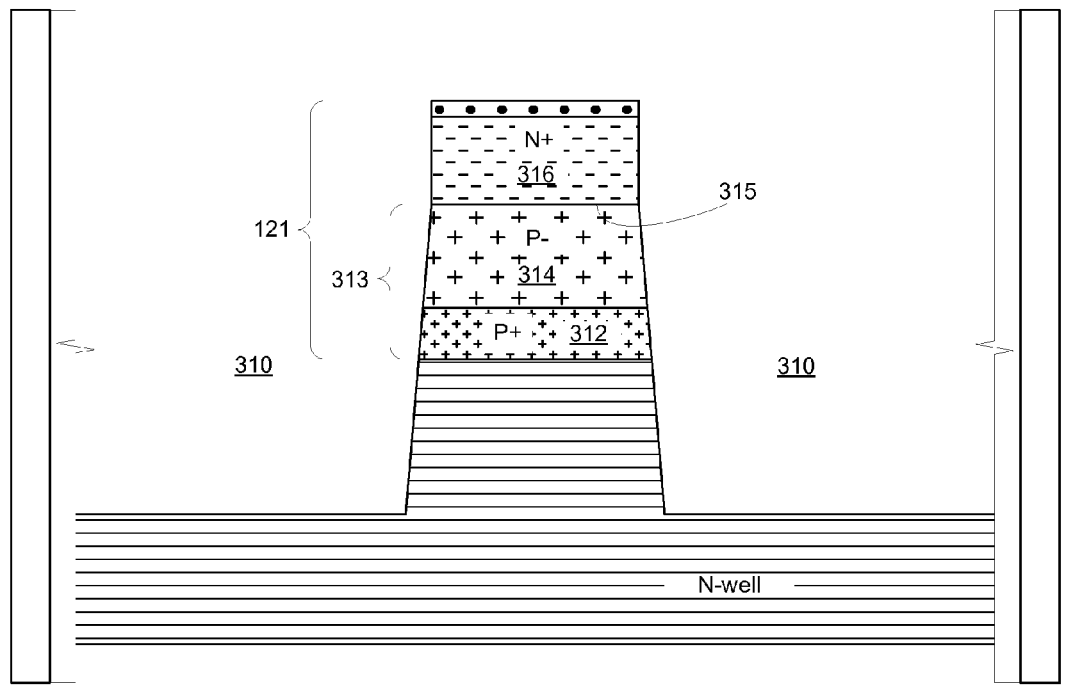
FIGS. 3 and 4 are diagrammatic sketches in sectional views showing alternative embodiments of a unit diode access device.
Figure 4:
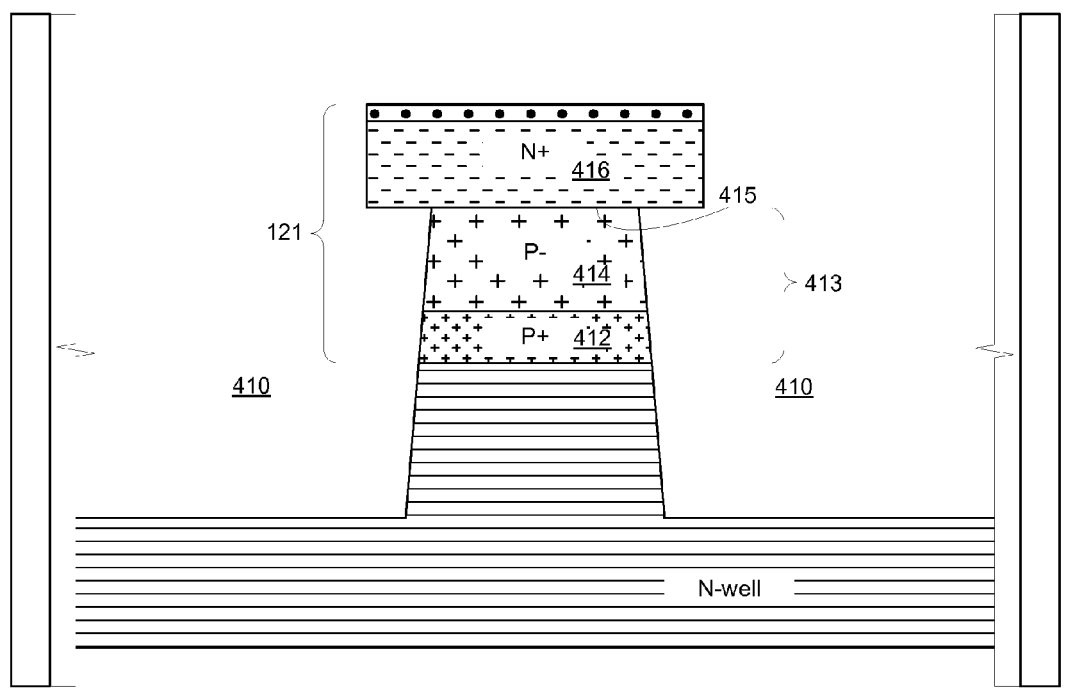

As is discussed in more detail below, access diodes having an island-type second region (as shown generally in FIGS. 2A and 2B) may as a result of selected processing steps in various embodiments have the second region self-aligned with the first diode region strip 313 defined by the isolation trench 310 (FIG. 3), or not aligned with first diode region strip 413 defined by the isolation trench 410 (FIG. 4).

Referring to the self-aligned configuration in FIG. 3, the memory cell includes a first doped semiconductor region 313 having a first conductivity type and a second doped semiconductor region 316 on the first doped semiconductor region 313, the second doped semiconductor region 316 having a second conductivity type opposite the first conductivity type. The first doped semiconductor region 313 includes a more heavily doped region 312 overlain by a lightly doped region 314. A pn-junction 315 is defined between the lightly doped region 314 of the first doped semiconductor region 313 and the second doped semiconductor region 316. Where, as here, the second doped semiconductor region 316 is self-aligned, the width of the second doped semiconductor region is the same as the width of the lightly doped semiconductor region 314 at the pn-junction 315.

Referring to the non-self-aligned configuration in FIG. 4, the memory cell includes a first doped semiconductor region 413 having a first conductivity type and a second doped semiconductor region 416 on the first doped semiconductor region 413, the second doped semiconductor region 416 having a second conductivity type opposite the first conductivity type. The first doped semiconductor region 413 includes a more heavily doped region 412 overlain by a lightly doped region 414. A pn-junction 415 is defined between the lightly doped region 414 of the first doped semiconductor region 413 and the second doped semiconductor region 416. Because, in this configuration, the second doped semiconductor region 416 is not self-aligned, the width of the second doped semiconductor region is greater than the width of the lightly doped semiconductor region 414 at the pn-junction 415.

Figure 5A:
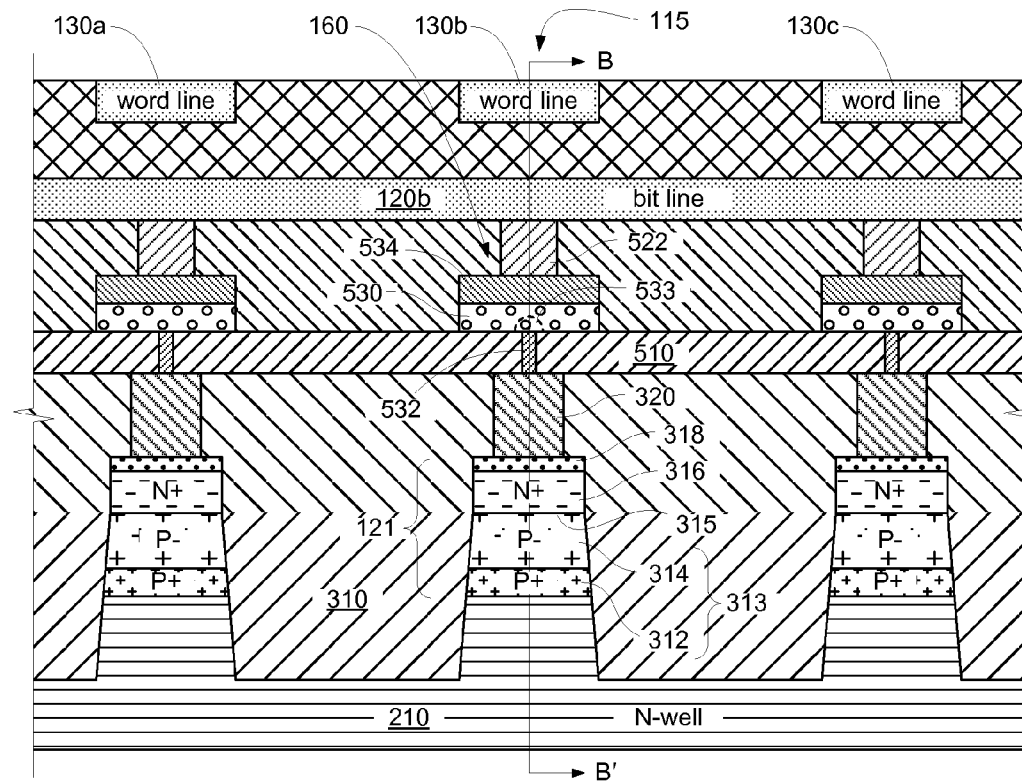
FIGS. 5A-5C are diagrammatic sketches in sectional views of an embodiment of memory cells having diode access devices.
Figure 5B:
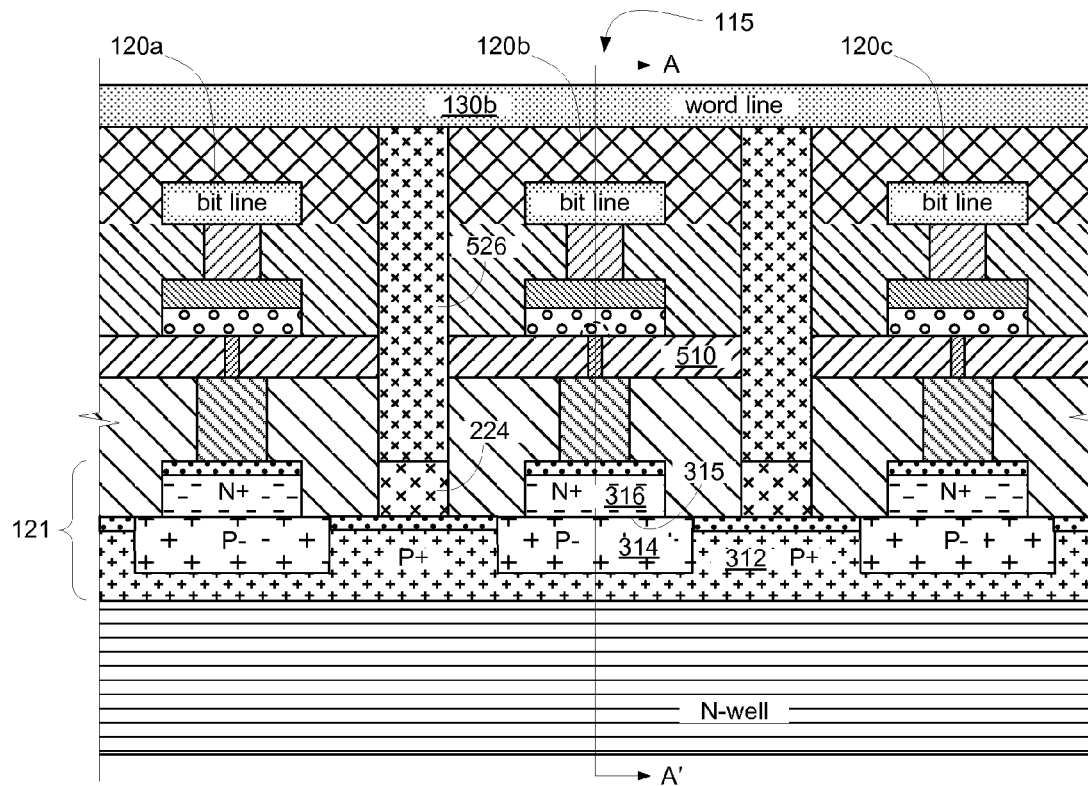
Figure 5C:
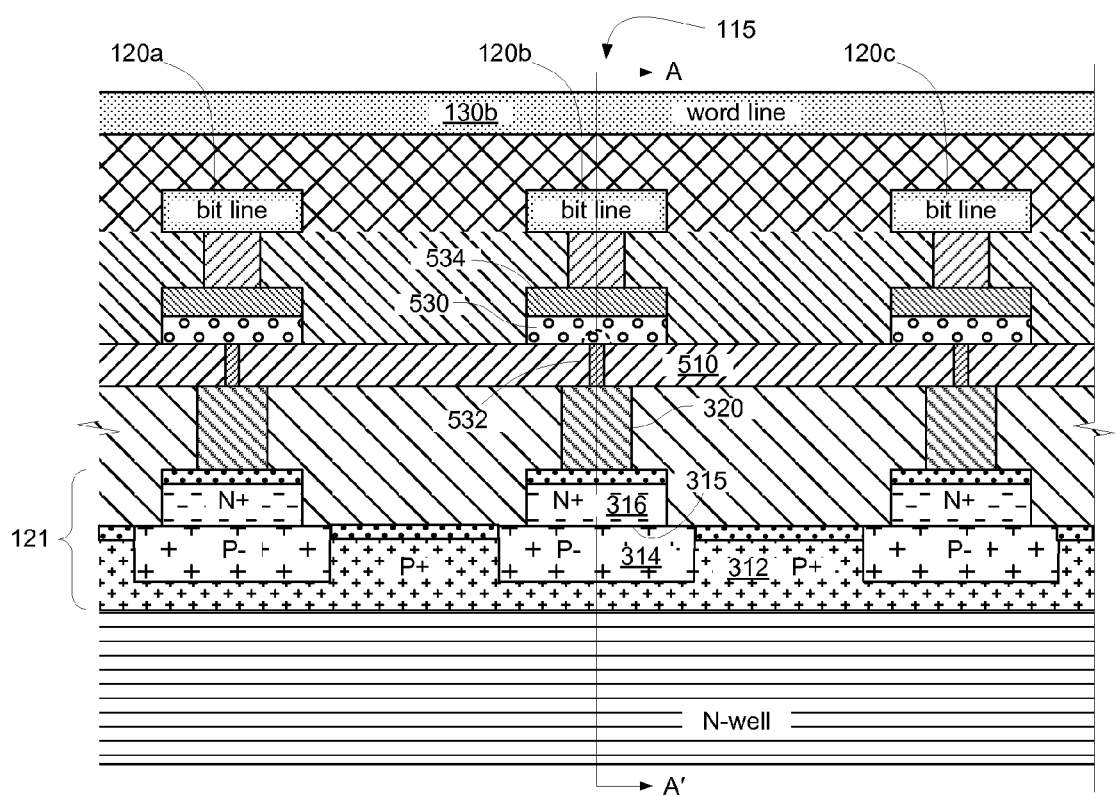

FIGS. 5A, 5B, 5C; 6A, 6B; 7A, 7B; 8A, 8B; and 9A, 9B show examples of various embodiments of memory cells in which various memory element configurations are formed over access diodes having an island-type second region that is aligned with the first diode region strip.

Referring to FIGS. 5A, 5B, a conductive plug 320 is formed in contact with the cap 318, raising the level of the overlying array of memory elements. A dielectric layer 510 supports the memory element array. In this example the memory element 160 includes a bottom electrode in electrical contact with the second region of the diode, a memory material in contact with the bottom electrode, and a top electrode over the memory material and electrically coupled with overlying access line (bit line) 120b. In this configuration the bottom electrode 532 is formed in and extends through a pore in the dielectric layer 510. The bottom electrode 532 contacts the underlying cap 318 and contacts an overlying island of a memory material 530 formed over the dielectric layer 510, and each memory material island is overlain by a top electrode 534. The top electrode is coupled to access line 120b by way of conductive plug 522. In each cell a small area of the phase change material contacts the bottom electrode 532, and an active region 533 adjacent the contact with the bottom electrode is the region of the memory element 530 in which the memory material is induced to change between at least two solid phases.

The pore in the dielectric layer 510 can be formed by, for example, a "keyhole" technique such as the methods, materials, and processes as disclosed in U.S. patent application Ser. No. 11/855,979 filed on 14 Sep. 2007 entitled "Phase Change Memory Cell in Via Array with Self-Aligned, Self-Converged Bottom Electrode and Method for Manufacturing", which is incorporated by reference herein. For example, the dielectric 510 can be formed on the top surface of access circuitry followed by sequentially forming an isolation layer and a sacrificial layer. Next, a mask having openings close to or equal to the minimum feature size of the process used to create the mask is formed on the sacrificial layer, the openings overlying the location of the plug 320 or diode cap 318. The isolation layer and the sacrificial layers are then selectively etched using the mask, thereby forming a contact opening in the isolation and sacrificial layers and exposing a top surface of the dielectric layer 510. After removal of the mask, a selective undercutting etch is performed on the contact opening such that the isolation layer is etched while leaving the sacrificial layer and the dielectric layer 510 intact. A fill material is then formed in the contact opening, which due to the selective undercutting etch process results in a self-aligned void in the fill material being formed within the contact opening. Next, an anisotropic etching process is performed on the fill material to open the void, and etching continues until the dielectric layer 510 is exposed in the region below the void, thereby forming a sidewall spacer comprising fill material within the contact opening. The sidewall spacer has an opening dimension substantially determined by the dimensions of the void, and thus can be less than the minimum feature size of a lithographic process. Next, the dielectric layer 510 is etched using the sidewall spacers as an etch mask, thereby forming an opening in the dielectric layer 510 having a diameter less than the minimum feature size. Next, an electrode layer is formed within the openings in the dielectric layer 510. A planarizing process, such as chemical mechanical polishing CMP, is then performed to remove the isolation layer and the sacrificial layer and to form the first, or bottom, electrode 532, resulting in the structure illustrated.

Referring particularly to FIG. 5B, the first heavily-doped region 312 (doped heavily enough to act as a conductor, with silicided surface regions) is electrically coupled to overlying word line 130b by conductive plugs 224, 526. In the embodiment illustrated in FIG. 5B, conductive plug 320 and conductive plugs 224, 526 include tungsten. Other conductive materials may be used.

FIG. 5C illustrates an alternative embodiment, in which the word line 130b is coupled to the doped regions 312 with a silicide surface, only periodically or only at the periphery of the array. Thus, the conductive plugs 224, 526 shown in FIG. 5B, are eliminated in the embodiment shown in FIG. 5C. Otherwise, FIG. 5C is the same as FIG. 5B.

The bottom electrode 532 may include, for example, TiN or TaN. TiN may be preferred in embodiments in which memory element 530 comprises GST (discussed below) because it makes good contact with GST, it is a common material used in semiconductor manufacturing, and it provides a good diffusion barrier at the higher temperatures at which GST transitions, typically in the 600-700° C. range. Alternatively, the bottom electrode 532 may be TiAlN or TaAlN, or comprises, for further examples, one or more elements selected from the group consisting of Ti, W, Mo, Al, Ta, Cu, Pt, Ir, La, Ni, N, O, and Ru and combinations thereof.

In the illustrated embodiment dielectric 510 surrounding the bottom electrode and underlying the memory element includes silicon nitride. The dielectric material for the layer 510 may be selected to facilitate pore formation by selective etch through an opening in an overlying temporary material, such as a silicon oxide, for example.

The top electrode 534 and the bit lines 120 may include, for example, any of the materials described above with reference to the bottom electrode 532.

The dielectric material constituting the fill in the isolation trench may include, for example, silicon oxide, silicon dioxide, and any other material sufficient to electrically isolate the diode ridges.

In the illustrated example the memory element 530 includes a phase change material. The memory element 530 may comprise, for example, one or more materials from the group of Ge, Sb, Te, Se, In, Ti, Ga, Bi, Sn, Cu, Pd, Pb, Ag, S, Si, O, P, As, N and Au.

Embodiments of the memory cells described herein include phase change based memory materials, including chalcogenide based materials and other materials, for the memory element. Chalcogens include any of the four elements oxygen (O), sulfur (S), selenium (Se), and tellurium (Te), forming part of group VIA of the periodic table. Chalcogenides comprise compounds of a chalcogen with a more electropositive element or radical. Chalcogenide alloys comprise combinations of chalcogenides with other materials such as transition metals. A chalcogenide alloy usually contains one or more elements from group IVA of the periodic table of elements, such as germanium (Ge) and tin (Sn). Often, chalcogenide alloys include combinations including one or more of antimony (Sb), gallium (Ga), indium (In), and silver (Ag). Many phase change based memory materials have been described in technical literature, including alloys of: Ga/Sb, In/Sb, In/Se, Sb/Te, Ge/Te, Ge/Sb/Te, In/Sb/Te, Ga/Se/Te, Sn/Sb/Te, In/Sb/Ge, Ag/In/Sb/Te, Ge/Sn/Sb/Te, Ge/Sb/Se/Te and Te/Ge/Sb/S. In the family of Ge/Sb/Te alloys, a wide range of alloy compositions may be workable. The compositions can be characterized as $Te_aGe_bSb_{100-(a+b)}$. One researcher has described the most useful alloys as having an average concentration of Te in the deposited materials well below 70%, typically below about 60% and ranged in general from as low as about 23% up to about 58% Te and most preferably about 48% to 58% Te. Concentrations of Ge were above about 5% and ranged from a low of about 8% to about 30% average in the material, remaining generally below 50%. Most preferably, concentrations of Ge ranged from about 8% to about 40%. The remainder of the principal constituent elements in this composition was Sb. These percentages are atomic percentages that total 100% of the atoms of the constituent elements. (Ovshinsky U.S. Pat. No. 5,687,112, cols. 10-11.) Particular alloys evaluated by another researcher include Ge2Sb2Te5, GeSb2Te4 and GeSb4Te7 (Noboru Yamada, "Potential of Ge—Sb—Te Phase-Change Optical Disks for High-Data-Rate Recording", SPIE v. 3109, pp. 28-37 (1997).) More generally, a transition metal such as chromium (Cr), iron (Fe), nickel (Ni), niobium (Nb), palladium (Pd), platinum (Pt) and mixtures or alloys thereof may be combined with Ge/Sb/Te to form a phase change alloy that has programmable resistive properties. Specific examples of memory materials that may be useful are given in Ovshinsky '112 at columns 11-13, which examples are hereby incorporated by reference.

Chalcogenides and other phase change materials are doped with impurities in some embodiments to modify conductivity, transition temperature, melting temperature, and other properties of memory elements using the doped chalcogenides. Representative impurities used for doping chalcogenides include nitrogen, silicon, oxygen, silicon dioxide, silicon nitride, copper, silver, gold, aluminum, aluminum oxide, tantalum, tantalum oxide, tantalum nitride, titanium and titanium oxide. See, e.g., U.S. Pat. No. 6,800,504, and U.S. Patent Application Publication No. 2005/0029502.

Phase change alloys are capable of being switched between a first structural state in which the material is in a generally amorphous solid phase, and a second structural state in which the material is in a generally crystalline solid phase in its local order in the active channel region of the cell. These alloys are at least bistable. The term amorphous is used to refer to a relatively less ordered structure, more disordered than a single crystal, which has the detectable characteristics such as higher electrical resistivity than the crystalline phase. The term crystalline is used to refer to a relatively more ordered structure, more ordered than in an amorphous structure, which has detectable characteristics such as lower electrical resistivity than the amorphous phase. Typically, phase change materials may be electrically switched between different detectable states of local order across the spectrum between completely amorphous and completely crystalline states. Other material characteristics affected by the change between amorphous and crystalline phases include atomic order, free electron density and activation energy. The material may be switched either into different solid phases or into mixtures of two or more solid phases, providing a gray scale between completely amorphous and completely crystalline states. The electrical properties in the material may vary accordingly.

Phase change alloys can be changed from one phase state to another by application of electrical pulses. It has been observed that a shorter, higher amplitude pulse tends to change the phase change material to a generally amorphous state. A longer, lower amplitude pulse tends to change the phase change material to a generally crystalline state. The energy in a shorter, higher amplitude pulse is high enough to allow for bonds of the crystalline structure to be broken and short enough to prevent the atoms from realigning into a crystalline state. Appropriate profiles for pulses can be determined, without undue experimentation, specifically adapted to a particular phase change alloy. In following sections of the disclosure, the phase change material is referred to as GST, and it will be understood that other types of phase change materials can be used. A material useful for implementation of a PCRAM described herein is $Ge_2Sb_2Te_5$.

Other programmable resistance memory materials may be used in other embodiments of the invention, including other materials that use different crystal phase changes to determine resistance, or other memory materials that use an electrical pulse to change the resistance state. Examples include materials for use in resistance random access memory (RRAM) such as metal-oxides including tungsten-oxide ($WO_x$), $NiO$, $Nb_2O_5$, $CuO_2$, $Ta_2O_5$, $Al_2O_3$, $CoO$, $Fe_2O_3$, $HfO_2$, $TiO_2$, $SrTiO_3$, $SrZrO3$, $(BaSr)TiO_3$. Additional examples include materials for use in magnetoresistance random access memory (MRAM), for example at least one of CoFeB, Fe, Co, Ni, Gd, Dy, CoFe, NiFe, MnAs, MnBi, MnSb, $CrO_2$, $MnOFe_2O_3$, $FeOFe_2O_5$, $NiOFe_2O_3$, $MgOFe_2$, EuO, and $Y_3Fe_5O_{12}$. See, for example, US Publication No 2007/0176251 entitled "Magnetic Memory Device and Method of Fabricating the Same", which is incorporated by reference herein. Additional examples include solid electrolyte materials used for programmable-metallization-cell (PMC) memory, or nano-ionic memory, such as silver-doped germanium sulfide electrolytes and copper-doped germanium sulfide electrolytes. See, for example, N. E. Gilbert et al., "A macro model of programmable metallization cell devices," Solid-State Electronics 49 (2005) 1813-1819, which is incorporated by reference herein.

An exemplary method for forming chalcogenide material uses PVD-sputtering or magnetron-sputtering method with source gas(es) of Ar, $N_2$, and/or He, etc. at the pressure of 1 mTorr~100 mTorr. The deposition is usually done at room temperature. A collimator with an aspect ratio of 1~5 can be used to improve the fill-in performance. To improve the fill-in performance, a DC bias of several tens of volts to several hundreds of volts is also used. On the other hand, the combination of DC bias and the collimator can be used simultaneously.

A post-deposition annealing treatment in a vacuum or in an $N_2$ ambient is optionally performed to improve the crystallize state of chalcogenide material. The annealing temperature typically ranges from 100° C. to 400° C. with an anneal time of less than 30 minutes.

Alternatively, the chalcogenide material may be formed by chemical vapor deposition (CVD).

Figure 6A:
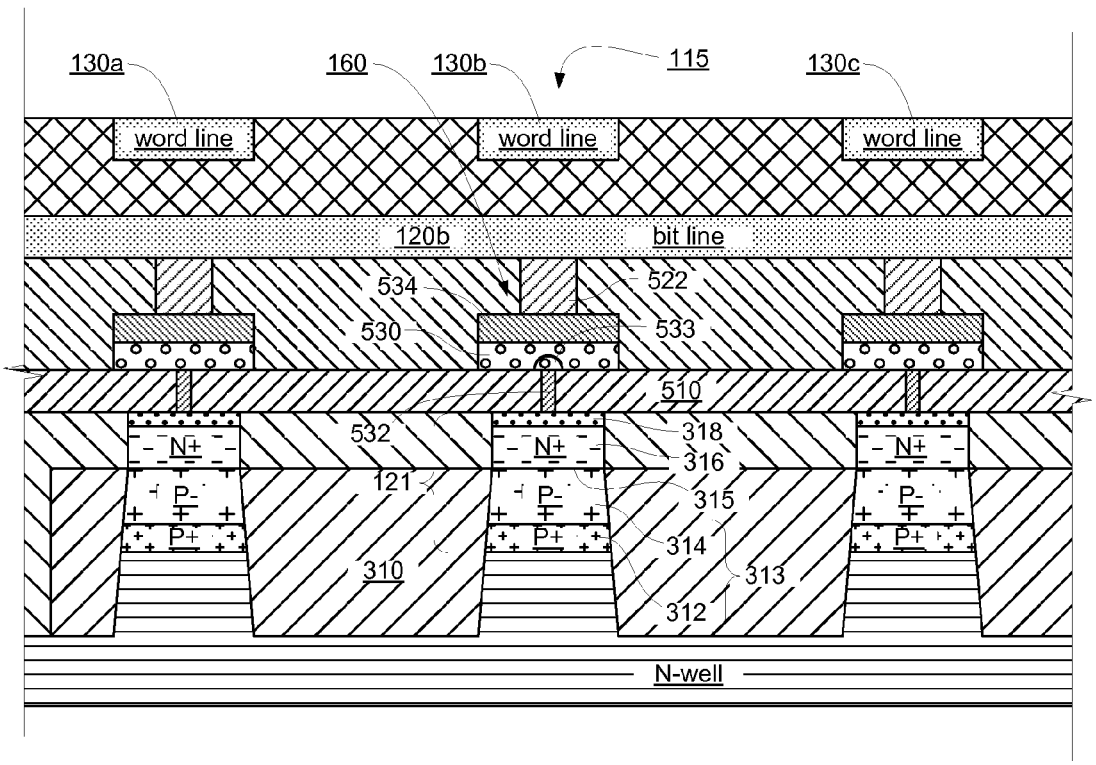
FIGS. 6A and 6B are diagrammatic sketches in sectional views of another embodiment of memory cells having diode access devices.
Figure 6B:
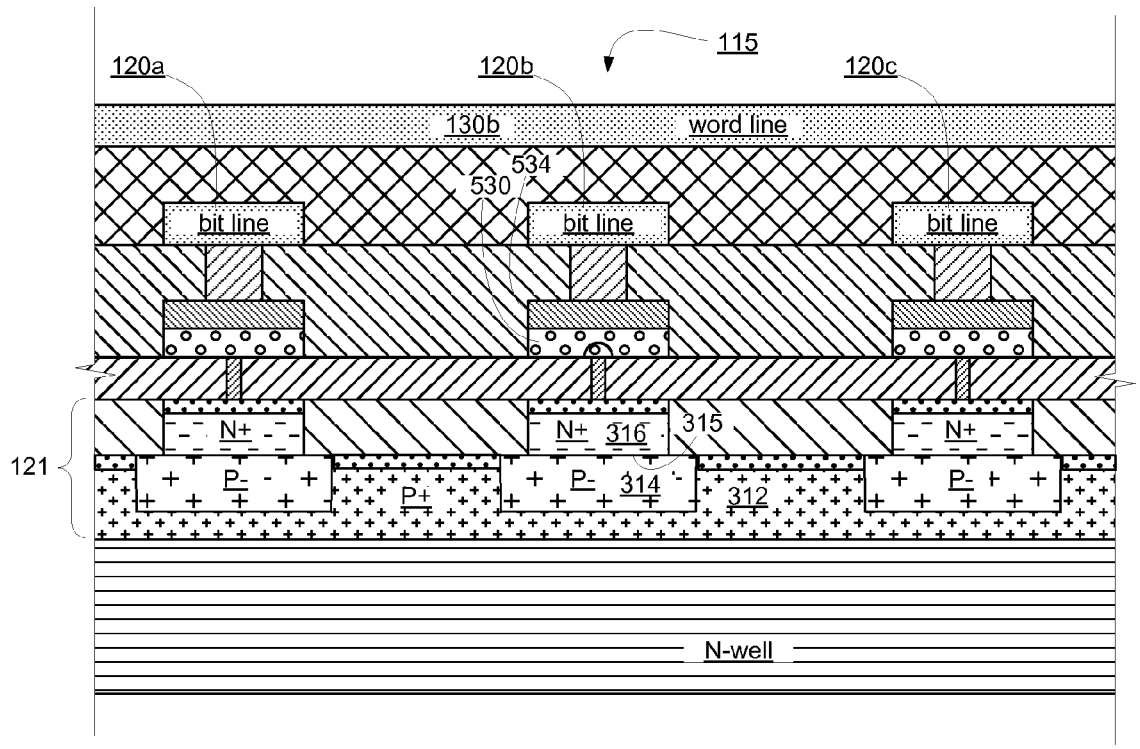

FIGS. 6A, 6B illustrate another embodiment of a memory cell array in which memory elements are formed over access diodes having an island-type second region that is aligned with the first diode region strip. The construction is similar to that of FIGS. 5A, 5B, except that here no conductive plug separates the cap 318 from the bottom electrode 532 and the dielectric layer 510 surrounding the bottom electrode and underlying the memory element 530. As in FIGS. 5A, 5B, the bottom electrode 532 is formed in and extends through a pore in the dielectric layer 510. The bottom electrode 532 contacts the underlying cap 318 and contacts an overlying island of a memory material 530 formed over the dielectric layer 510, and each memory material island is overlain by a top electrode 534. The top electrode is coupled to access line 120b by way of conductive plug 522. In each cell a small area of the phase change material contacts the bottom electrode 532, and an active region 533 adjacent the contact with the bottom electrode is the region of the memory element 530 in which the memory material is induced to change between at least two solid phases.

Referring particularly to FIG. 6B, the first heavily-doped region 312 is electrically coupled to overlying word line 130b at locations not shown in local segments of the region 312 by conductive plugs not shown. Alternatively, the conductive plugs can be placed between each cell as shown in FIG. 5B.

Figure 7A:
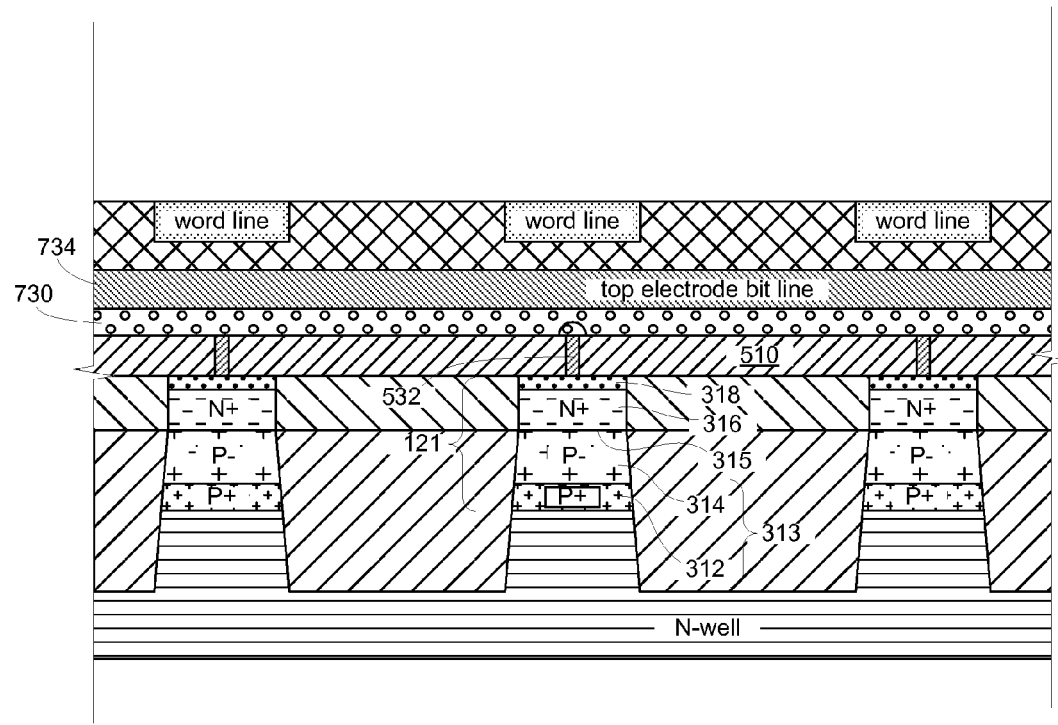
FIGS. 7A and 7B are diagrammatic sketches in sectional views of another embodiment of memory cells having diode access devices.
Figure 7B:
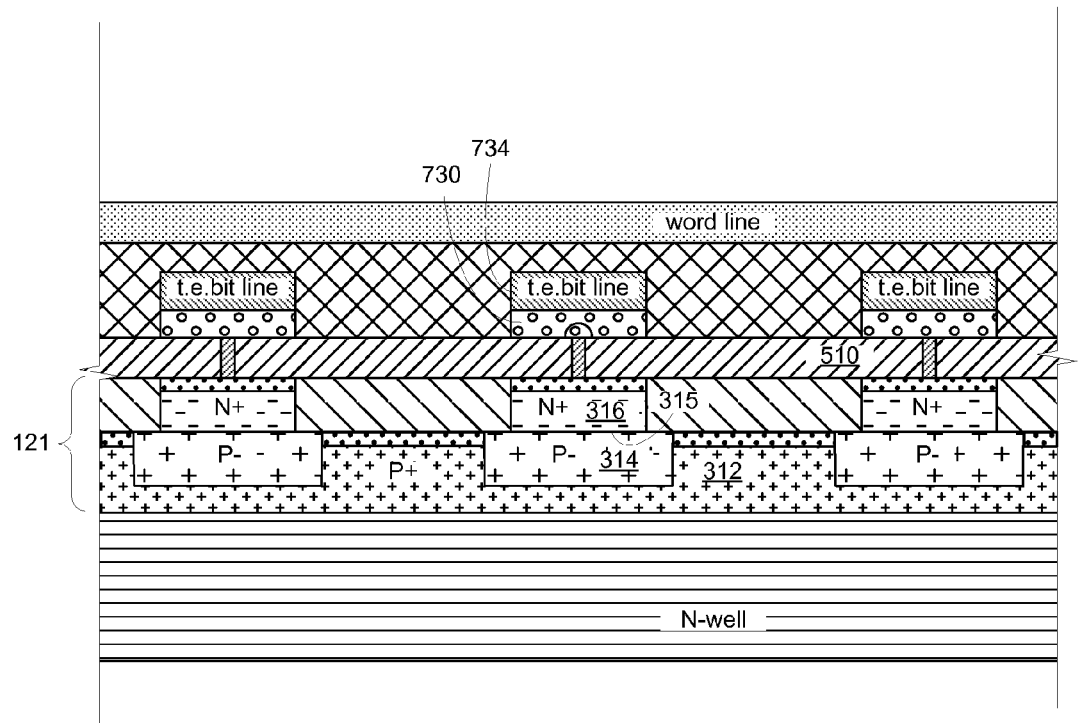

FIGS. 7A, 7B illustrate another embodiment of a memory cell array in which memory elements are formed over access diodes having an island-type second region that is aligned with the first diode region strip. The construction is similar to that of FIGS. 6A, 6B, except that here the memory material is formed as strips 730 rather than islands; and the top electrode, which is also formed as a strip 734 overlying the memory material, serves as a bit line. As in the example of FIGS. 6A, 6B, the bottom electrode 532 is formed in and extends through a pore in the dielectric layer 510. The bottom electrode 532 contacts the underlying cap 318 and contacts an overlying strip of a memory material 730 formed over the dielectric layer 510, and each memory material strip is overlain by a top electrode strip 734. In each cell a small area of the phase change material contacts the bottom electrode 532, and an active region 533 adjacent the contact with the bottom electrode is the region of the memory strip 730 in which the memory material is induced to change between at least two solid phases.

Referring particularly to FIG. 7B, the first heavily-doped region 312 is electrically coupled to overlying word line 130b at locations not shown in local segments of the region 312 by conductive plugs not shown. Alternatively, the conductive plugs can be placed between each cell as shown in FIG. 5B.

Figure 8A:
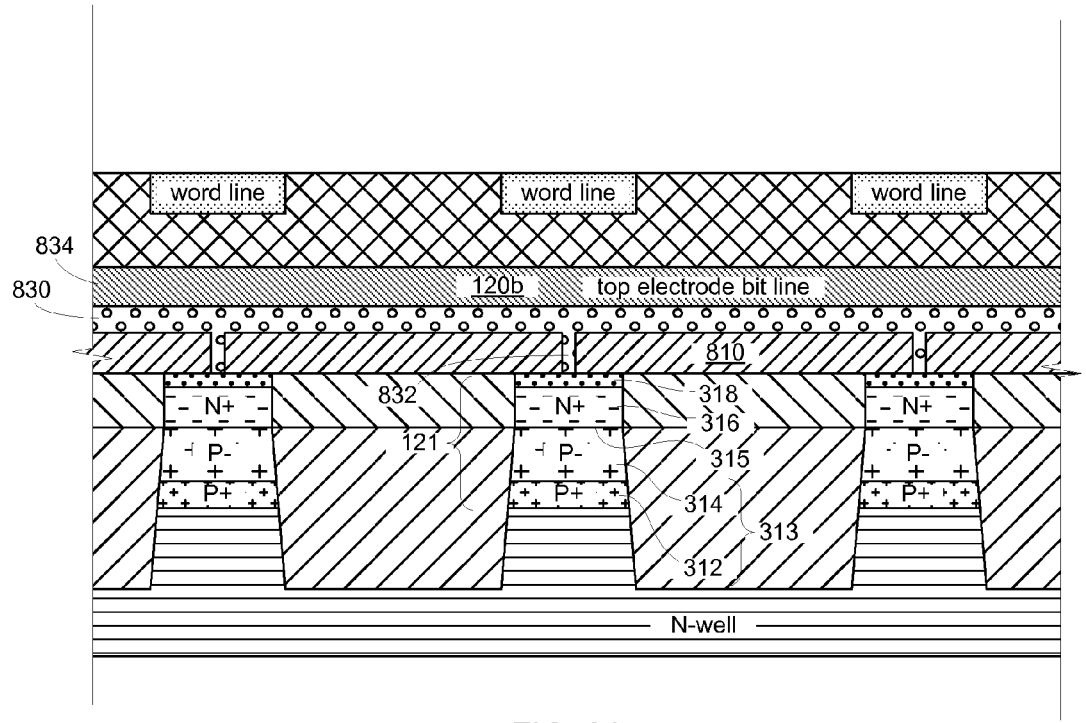
FIGS. 8A and 8B are diagrammatic sketches in sectional views of another embodiment of memory cells having diode access devices.
Figure 8B:
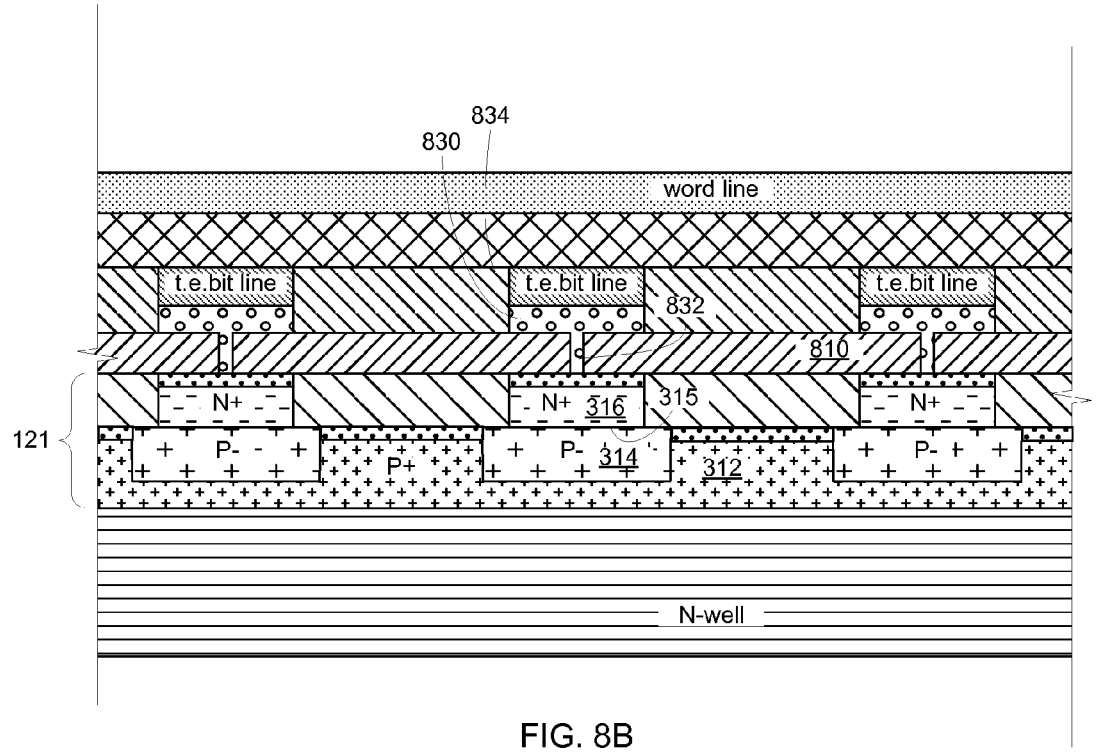

FIGS. 8A, 8B illustrate another embodiment of a memory cell array in which memory elements are formed over access diodes having an island-type second region that is aligned with first diode region strip. In this example the memory material is formed as strips 830 rather than islands; and the top electrode, which is also formed as a strip 834 overlying the memory material, serves as a bit line. Moreover, in this example there are pores in the dielectric layer 810, but there is no separate bottom electrode. Instead, in this example a portion of the memory material extends from the strip 830 through the pores, as shown at 832, and makes contact with the cap 318 at the top of the diode stack 121.

Referring particularly to FIG. 8B, the first heavily-doped region 312 is electrically coupled to overlying word line 130b at locations not shown in local segments of the region 312 by conductive plugs not shown. Alternatively, the conductive plugs can be placed between each cell as shown in FIG. 5B.

Figure 9A:
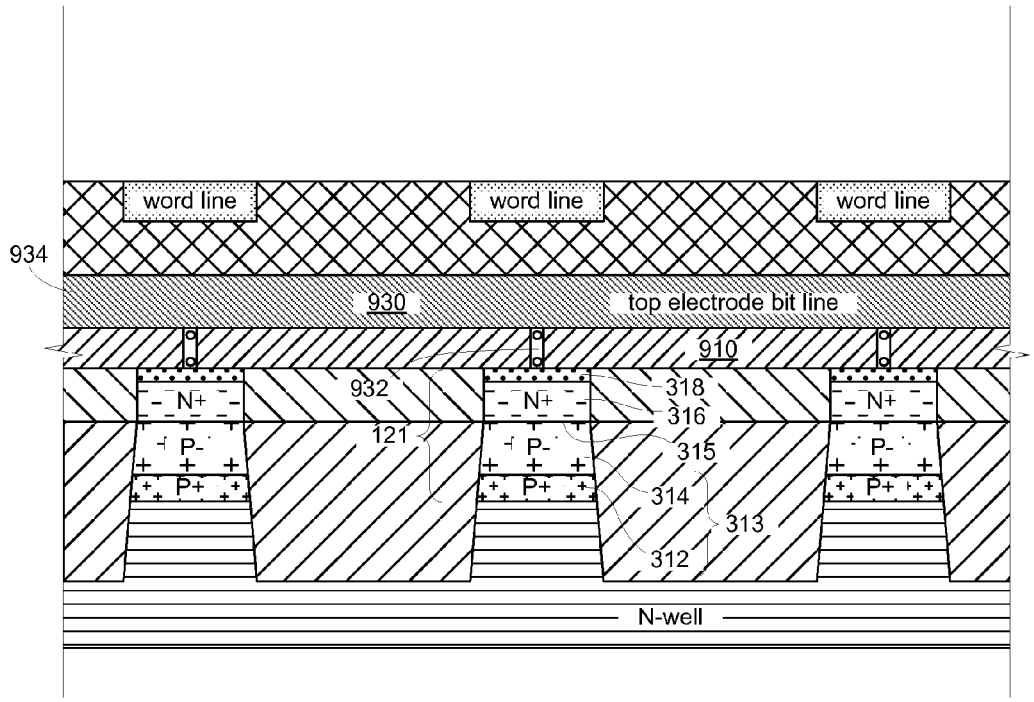
FIGS. 9A and 9B are diagrammatic sketches in sectional views of another embodiment of memory cells having diode access devices.
Figure 9B:
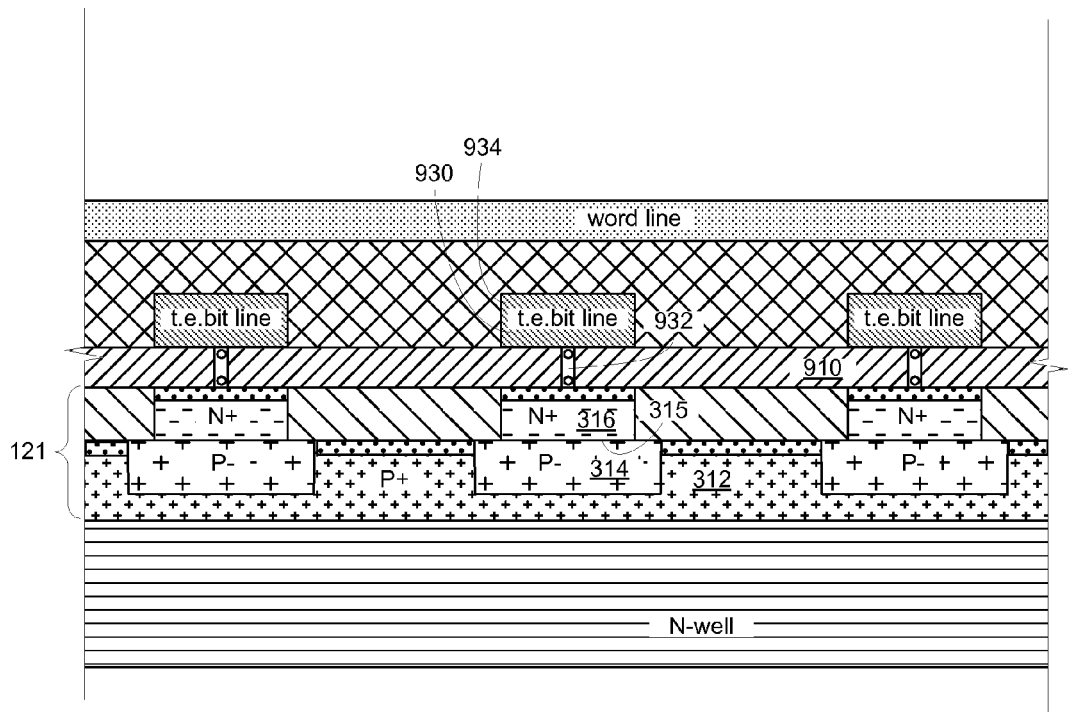

FIGS. 9A, 9B illustrate another embodiment of a memory cell array in which memory elements are formed over access diodes having an island-type second region that is aligned with the first diode region strip. In this example there are pores in the dielectric layer 910 and, as in the example shown in FIGS. 8A, 8B there is no separate bottom electrode. But here there are no strips of memory material, and the top electrode 934, which also serves as the bit line 930, overlies the dielectric 910 directly. The memory element for each cell is formed solely in the pores, as shown at 932, and makes contact below with the cap 318 at the top of the diode stack 121 and above with the overlying top electrode 934.

Referring particularly to FIG. 9B, the first heavily-doped region 312 is electrically coupled to overlying word line 130b at locations not shown in local segments of the region 312 by conductive plugs not shown. Alternatively, the conductive plugs can be placed between each cell as shown in FIG. 5B.

Figure 10A:
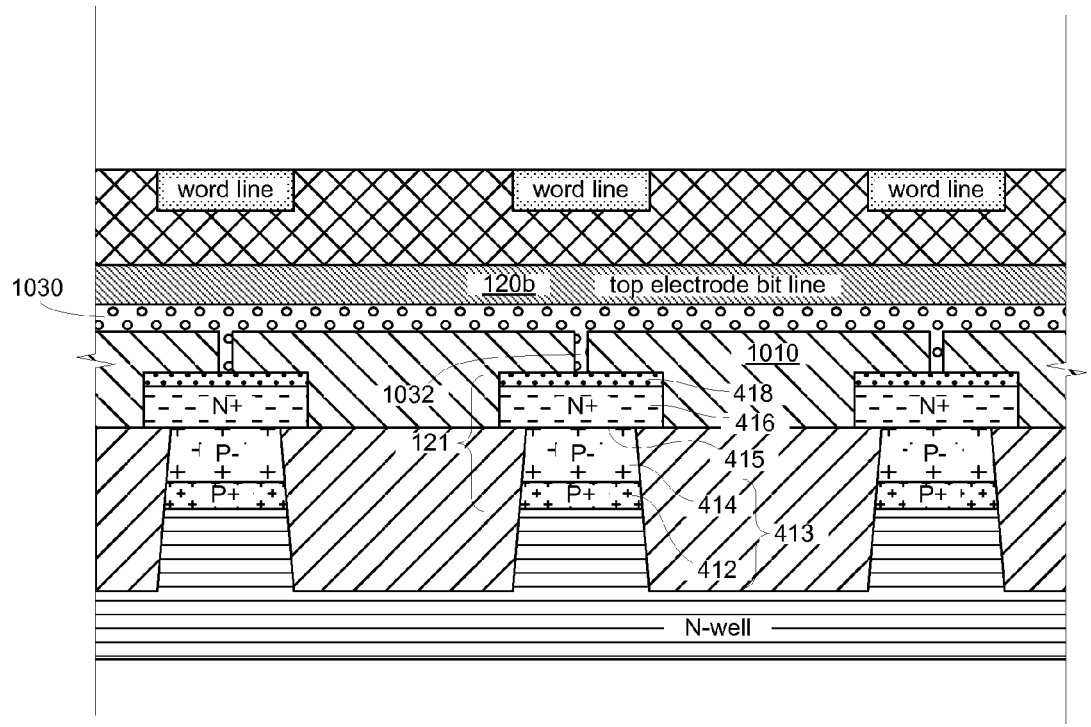
FIGS. 10A and 10B are diagrammatic sketches in sectional views of another embodiment of memory cells having diode access devices.
Figure 10B:
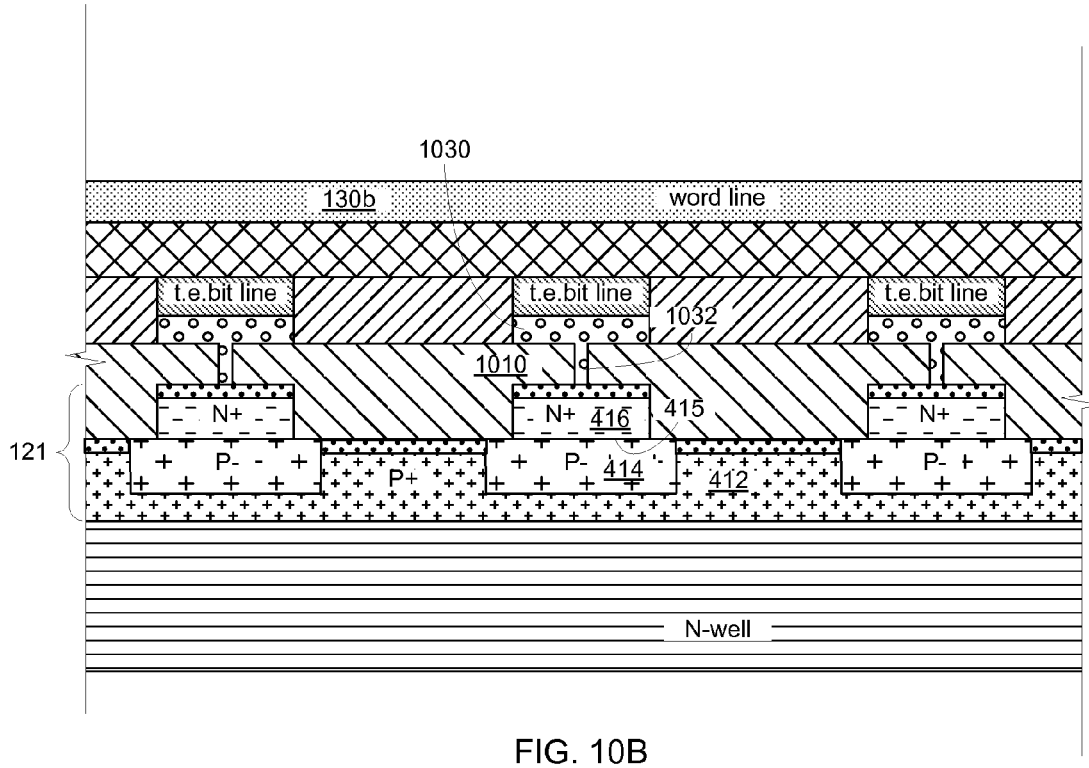

FIGS. 10A, 10B; 11A, 11B; and 12A, 12B show examples of various embodiments of memory cells in which the access diodes have an island-type second region that is not aligned with the first diode region strip.

FIGS. 10A, 10B illustrate an embodiment of a memory cell array in which memory elements are formed over access diodes having an island-type second region that is not aligned with the first diode region strip. The construction is similar to that of FIGS. 8A, 8B, except that here the dielectric fill 1010 upon which the memory material strip 1030 is formed also surrounds at least the upper island part of the diode stack 121, including the second doped semiconductor 416 and the cap 418. As in the example of FIGS. 8A, 8B, there is no separate bottom electrode. Instead, in this example there are pores in the dielectric fill 1010, but a portion of the memory material extends from the strip 1030 through the pores, as shown at 1032, and makes contact with the cap 418 at the top of the diode stack 121.

Referring particularly to FIG. 10B, the first heavily-doped region 412 is electrically coupled to overlying word line 130b at locations not shown in local segments of the region 312 by conductive plugs not shown. Alternatively, the conductive plugs can be placed between each cell as shown in FIG. 5B.

Figure 11A:
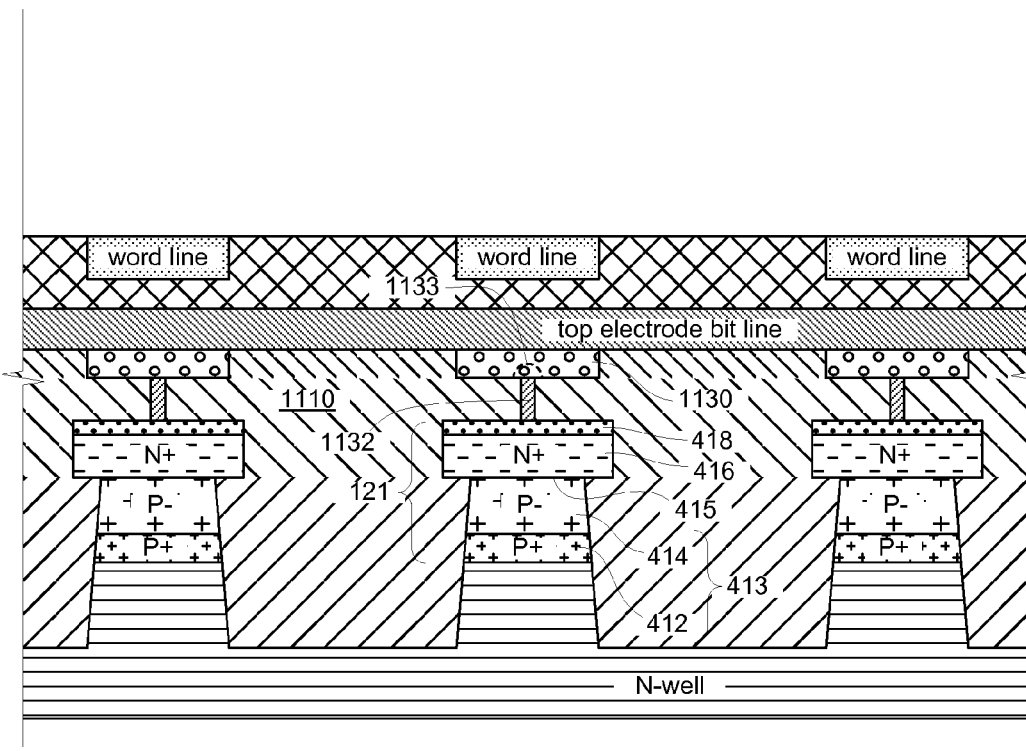
FIGS. 11A and 11B are diagrammatic sketches in sectional views of another embodiment of memory cells having diode access devices.
Figure 11B:
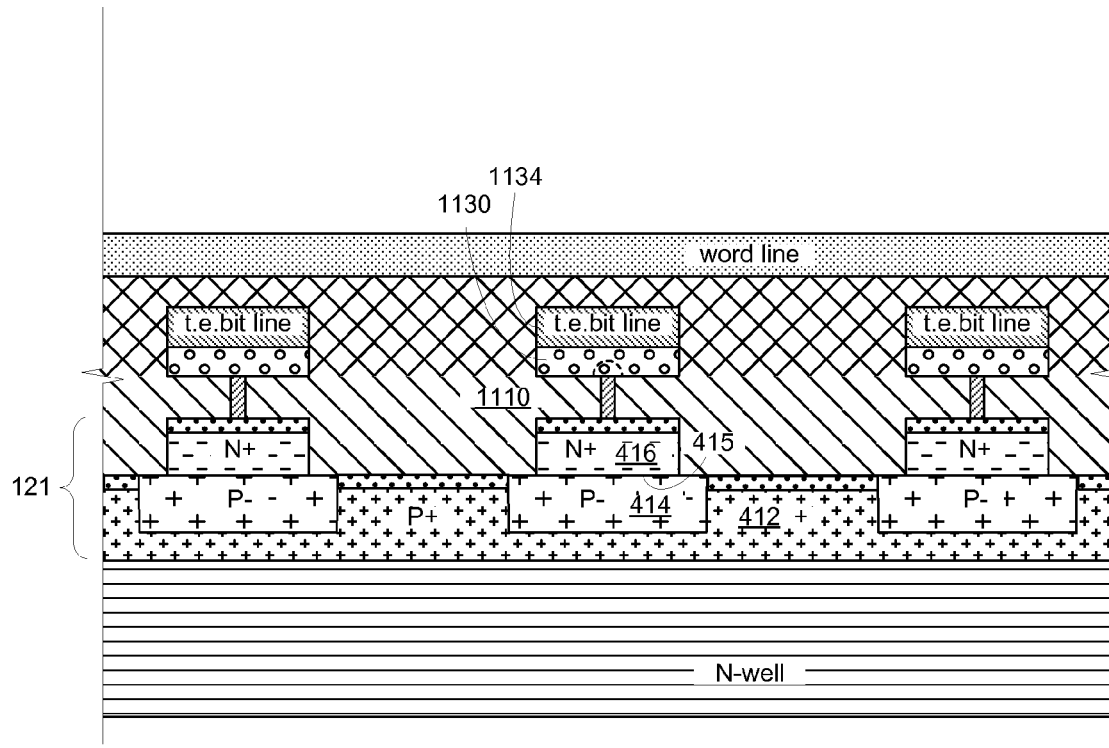

FIGS. 11A, 11B illustrate another embodiment of a memory cell array in which memory elements are formed over access diodes having an island-type second region that is not aligned with the first diode region strip. In this example, a dielectric fill 1110 surrounds at least the upper island part of the diode stack 121, including the second doped semiconductor 416 and the cap 418. The bottom electrode 1132 is formed in and extends through a pore in the dielectric layer 1110. The bottom electrode 1132 contacts the underlying cap 418 and contacts an overlying memory material island 1130 formed over the dielectric layer 1110, and the row of memory material islands is overlain by a top electrode strip 1134, which serves as a bit line. In each cell a small area of the phase change material contacts the bottom electrode 1132, and an active region 1133 adjacent the contact with the bottom electrode is the region of the memory material island 1130 in which the memory material is induced to change between at least two solid phases.

Referring particularly to FIG. 11B, the first heavily-doped region 412 is electrically coupled to overlying word line 130b at locations not shown in local segments of the region 312 by conductive plugs not shown. Alternatively, the conductive plugs can be placed between each cell as shown in FIG. 5B.

Figure 12A:
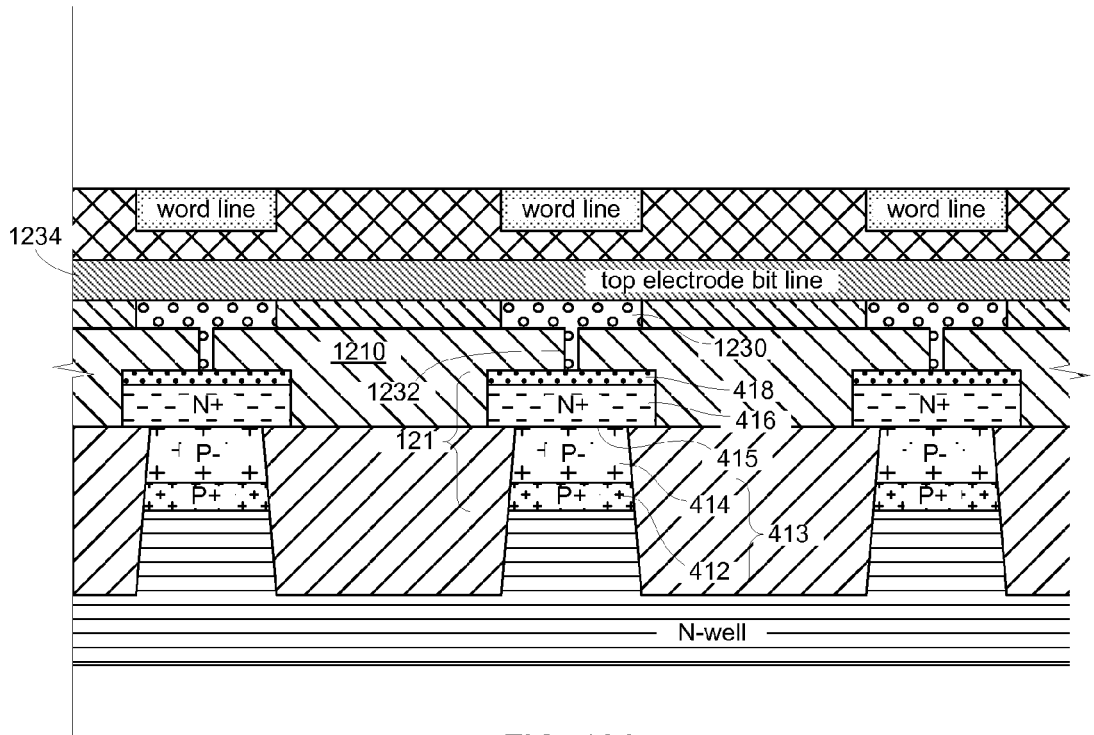
FIGS. 12A and 12B are diagrammatic sketches in sectional views of another embodiment of memory cells having diode access devices.
Figure 12B:
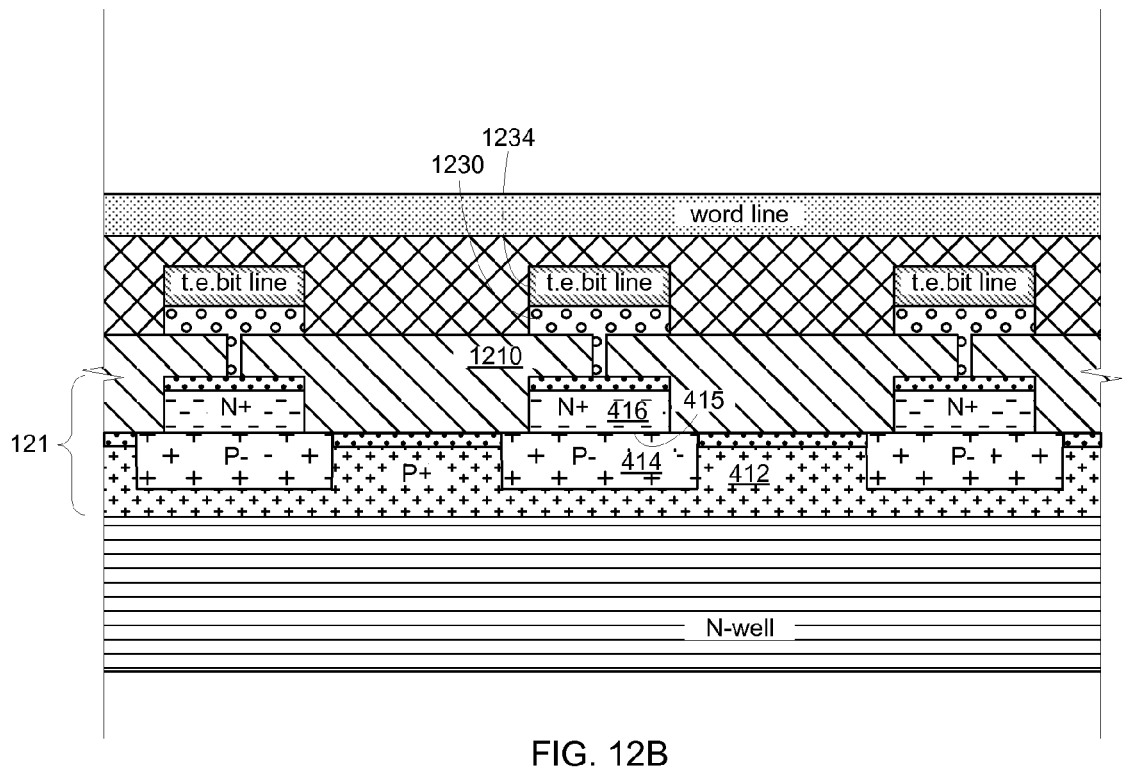

FIGS. 12A, 12B illustrate another embodiment of a memory cell array in which memory elements are formed over access diodes having an island-type second region that is overlies the first diode region strip. In this example, as in the example of FIGS. 11A, 11B, a dielectric fill 1210 surrounds at least the upper island part of the diode stack 121, including the second doped semiconductor 416 and the cap 418, and the memory material is formed as islands 1230 rather than a strips; and the top electrode, which is also formed as a strip 1234 overlying the memory material, serves as a bit line. However, in this example there are pores in the dielectric layer 1210, but there is no separate bottom electrode. Instead, in this example a portion of the memory material extends from the island 1230 through the pores, as shown at 1232, and makes contact with the cap 418 at the top of the diode stack 121.

Referring particularly to FIG. 12B, the first heavily-doped region 412 is electrically coupled to overlying word line 130b at locations not shown in local segments of the region 312 by conductive plugs not shown. Alternatively, the conductive plugs can be placed between each cell as shown in FIG. 5B.

FIGS. 13-20C show stages in an embodiment of a process for making access diodes having an island-type second region that is self-aligned with the first diode region strip.

Figure 13:
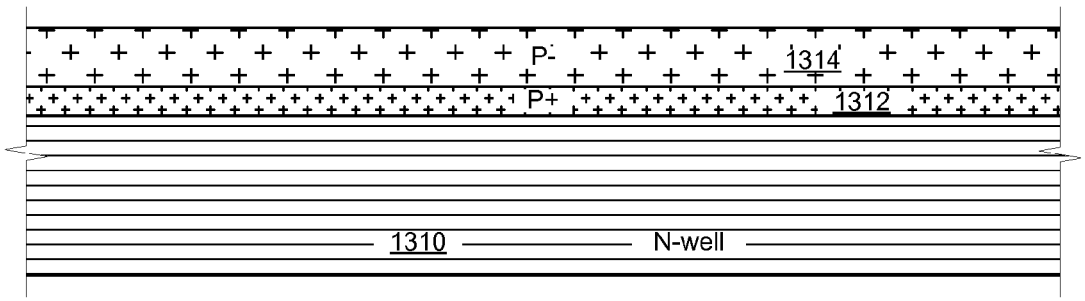
FIGS. 13-20C are diagrammatic sketches showing stages in an embodiment of a process for making diode access devices such as are shown for example in FIGS. 2A, 2B, 3.

A semiconductor substrate is provided (typically in the form of a semiconductor wafer, for example a silicon wafer). Where, as in this example, the substrate is a P-type semiconductor, an N-well 1310 is formed, and then the wafer is doped to provide a relatively heavily-doped region overlain by a relatively lightly-doped region of the same conductivity type (P-type in this example). The result is shown in FIG. 13. In the figures, the relatively heavily-doped region 1312 is indicated by "P+" and the relatively lightly-doped region 1314 is indicated by "P−."

Figure 14:
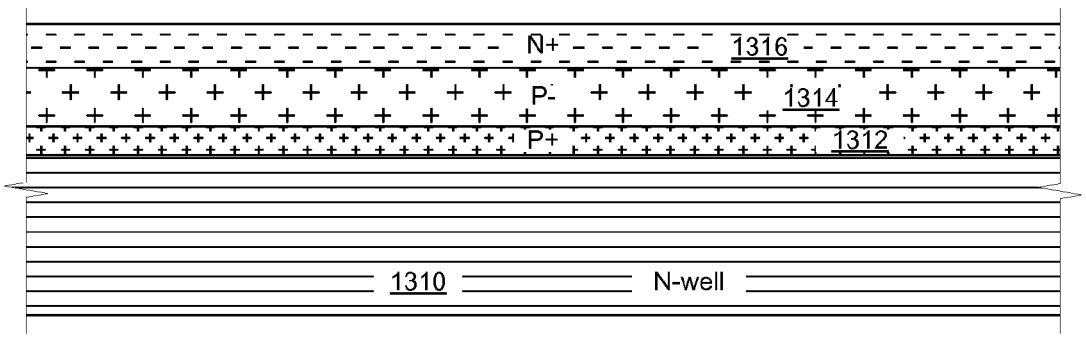

Thereafter, a layer 1316 of polycrystalline semiconductor material is formed over the lightly-doped region 1314. The polycrystalline semiconductor material (typically polysilicon) is relatively heavily-doped compared to the doping concentration of the lightly-doped region, and has a conductivity type opposite that of the underlying lightly-doped region of the substrate. The result is shown in FIG. 14. In the figures, the relatively heavily-doped polycrystalline layer 1316 is indicated by "N+".

Where, optionally, a barrier layer is desired at the pn-junction, the layer can be formed by growing or depositing a dielectric layer on the exposed lightly-doped silicon region 1314 prior to forming the overlying layer 1316 of polysilicon. A suitable barrier layer may be, for example, silicon dioxide ($SiO_2$) or a silicon oxynitride ($SiN_xO_y$); and it may be formed to a thickness in a range of about 5 to 25 Angstroms, for example about 10 Angstroms.

Figure 15A:
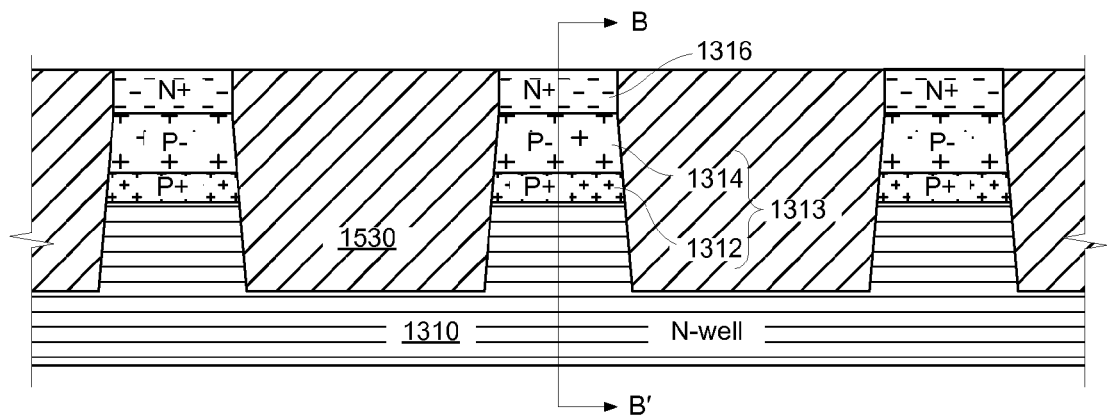
Figure 15B:
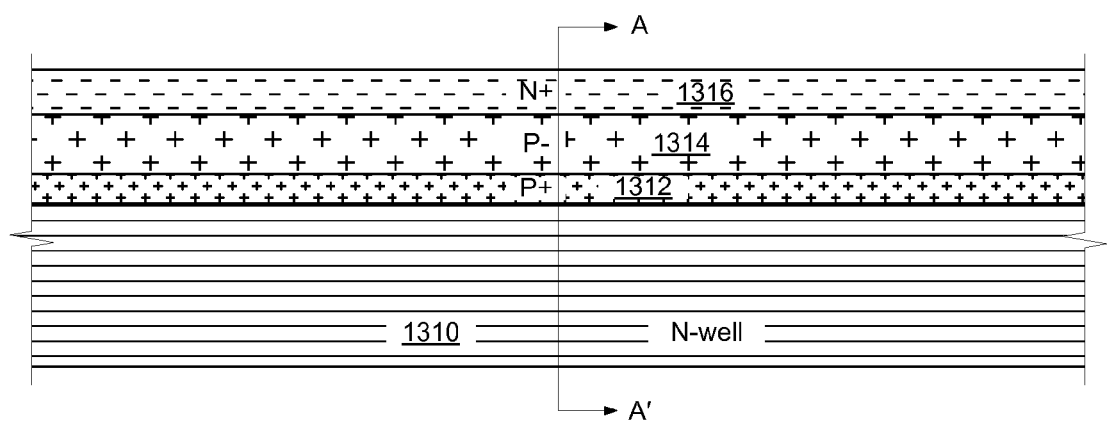
Figure 15C:
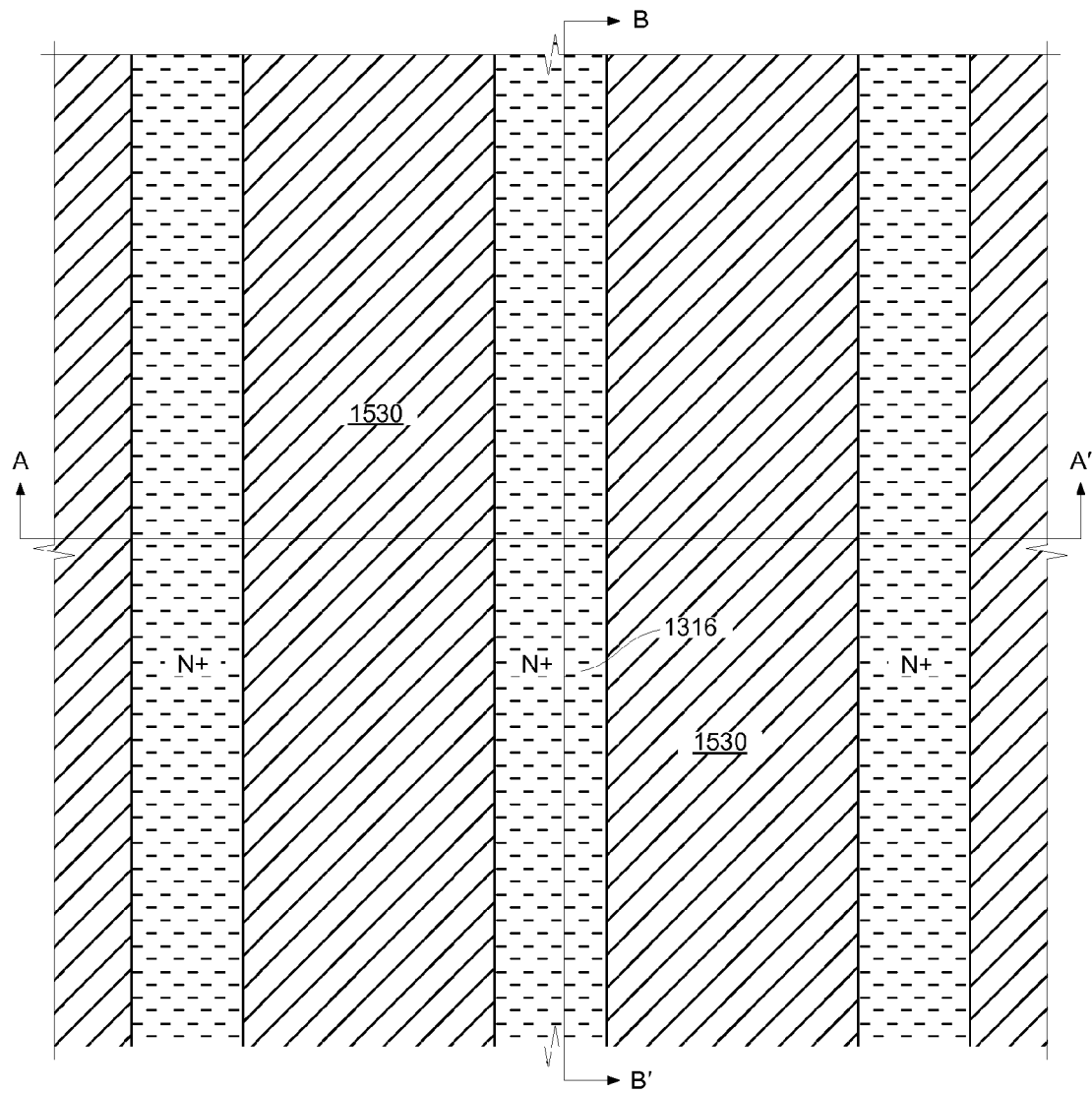

Thereafter, an isolation trench is formed, resulting in ridges separated by a dielectric 1530, as shown in FIGS. 15A, 15B, 15C. Each ridge includes a strip of the relatively heavily doped crystalline semiconductor material (1312, P+) overlying the N-well, overlain by a strip of the relatively lightly doped crystalline semiconductor material (1314, P−). These together constitute a first region 1313, which is overlain by a strip of the relatively heavily doped (opposite type) polycrystalline material (1316, N+).

Figure 16:
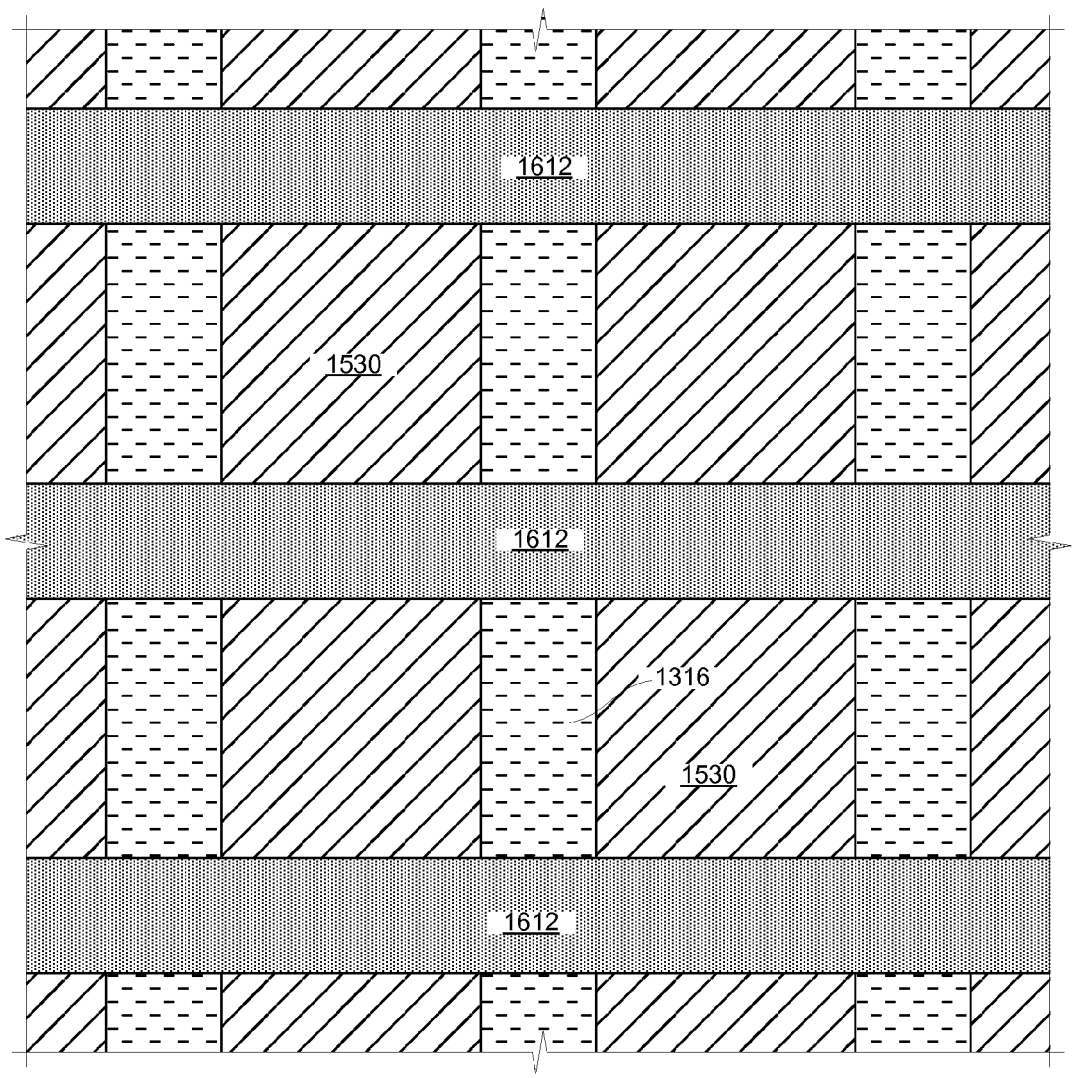

Thereafter, a mask is formed over the ridges and the dielectric 1530 between the ridges, as shown in FIG. 16. The mask is patterned as strips 1612 traversing the strips 1316 of the relatively heavily doped polycrystalline material.

Figure 17A:
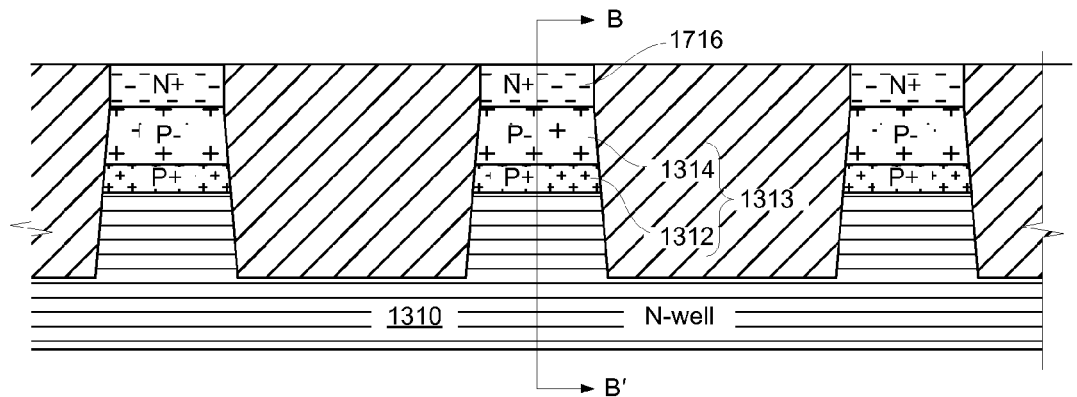
Figure 17B:
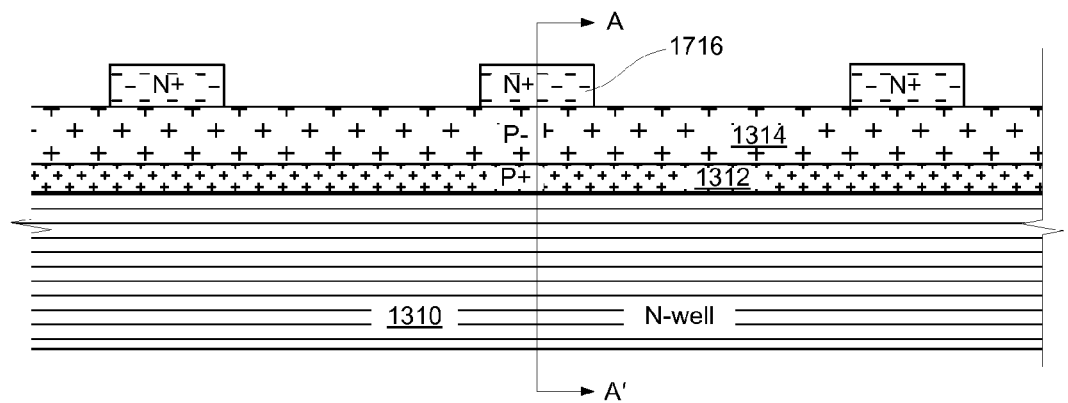
Figure 17C:
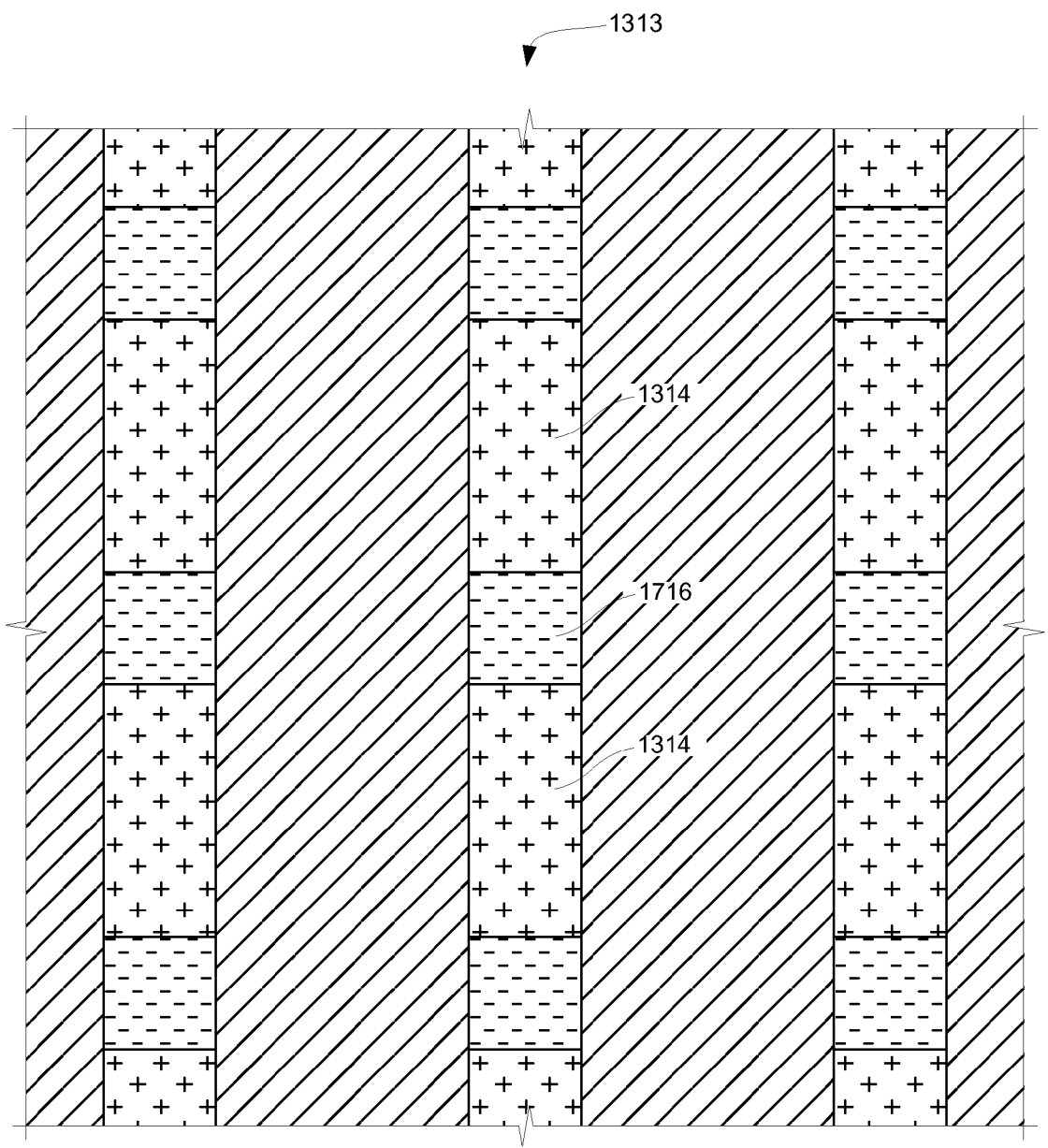

Thereafter, an etch is carried out to remove any exposed relatively heavily doped polycrystalline material (and exposed dielectric material), and the mask is removed, with a result as shown in FIGS. 17A, 17B, 17C. The etch stops at the surface of the relatively lightly-doped crystalline semiconductor material (1314, P−), so that the resulting construct consists of islands 1716 of relatively heavily doped polycrystalline material upon the first region 1313 ridges. In embodiments in which the spacing between N+ regions 1716 is small, the process includes overetching so that the etch continues past the surface of the lightly-doped crystalline semiconductor material 1314, to a depth greater than the depth of the pn-junction (i.e. greater than width $W_P$ of the depletion region as shown in FIG. 2C), to isolate the adjacent depletion regions. This overetching is shown in FIG. 18B, but can be applied in any embodiment including closely packed cells, including embodiments in which other alignment processes are used.

Figure 18A:
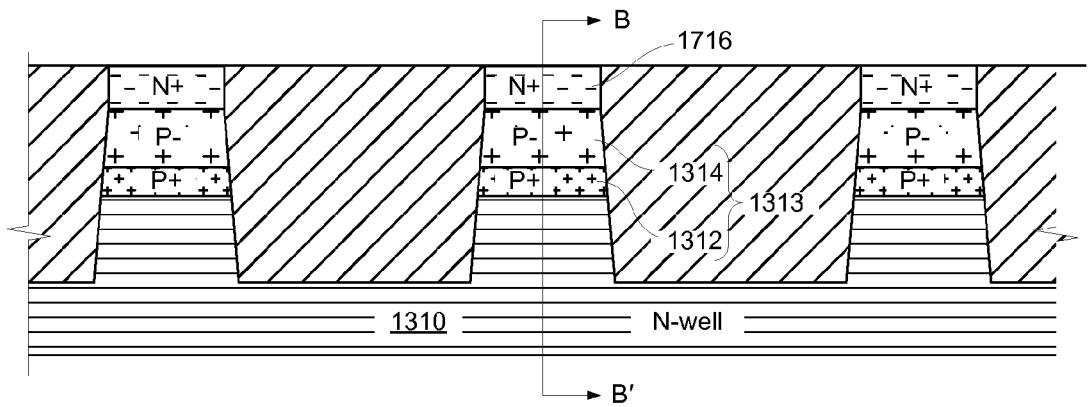
Figure 18B:
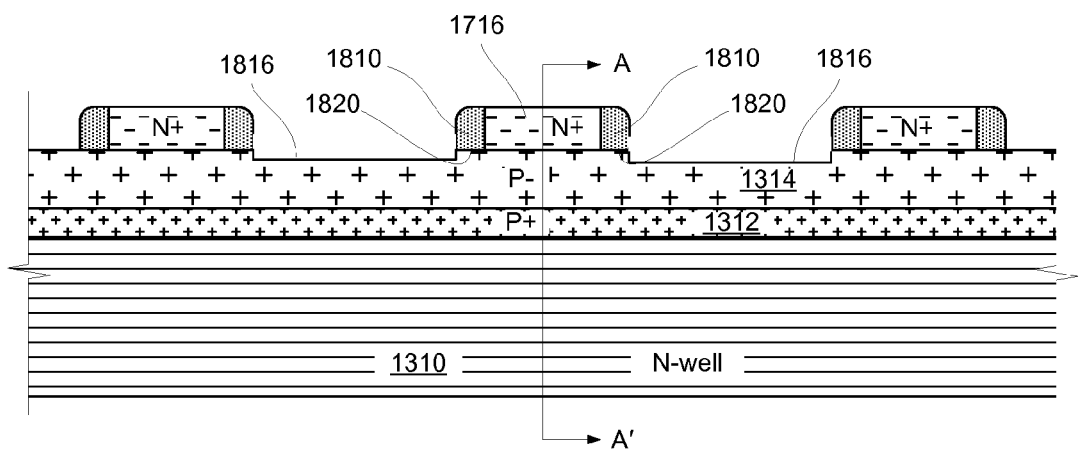
Figure 18C:
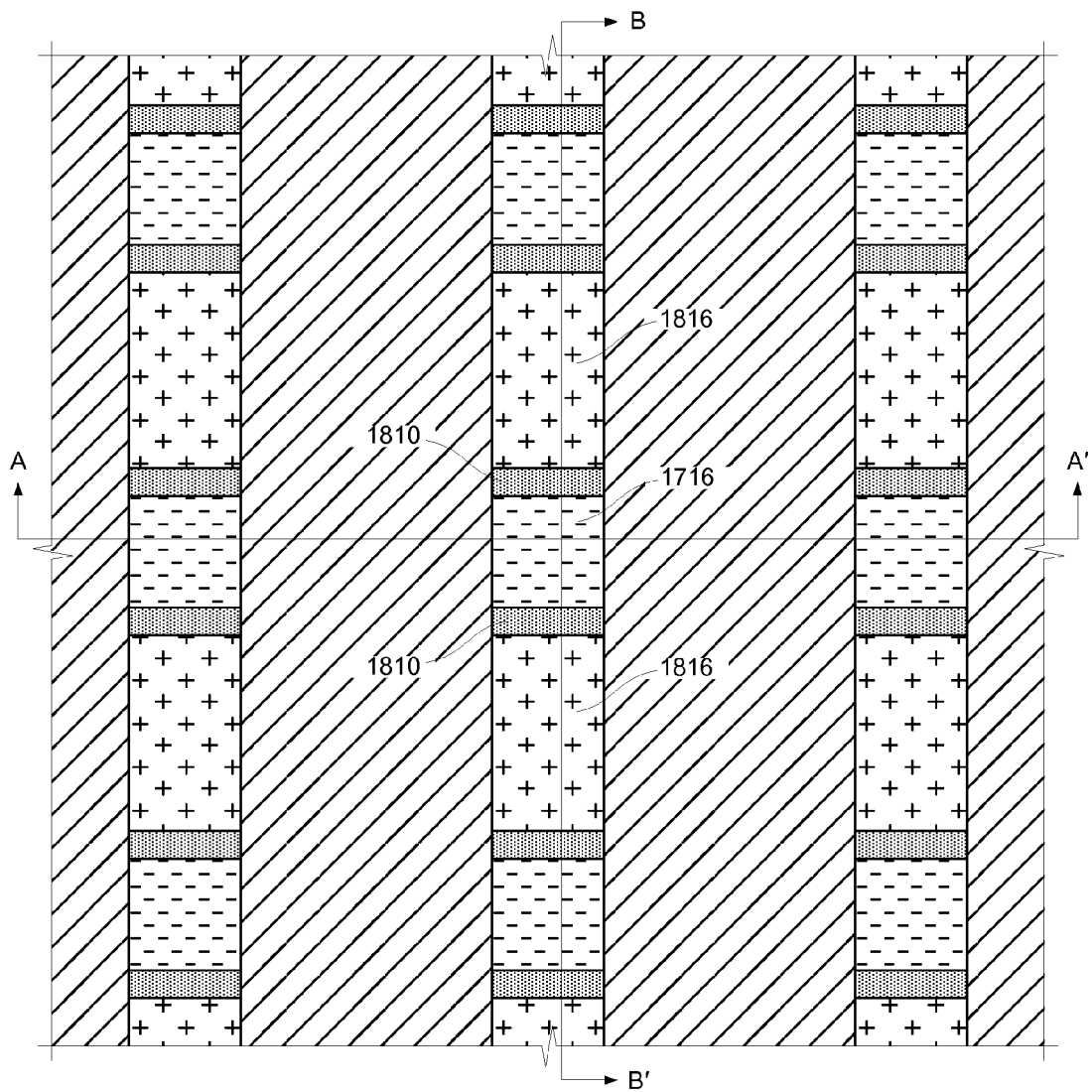

Thereafter, spacers 1810 are formed at the sides of the islands 1716 of relatively heavily doped polycrystalline material, as shown in FIGS. 18A, 18B, 18C. The spacers 1810 mask narrow regions 1820 of the relatively lightly-doped crystalline semiconductor material (1314, P−) adjacent each island 1716, and the width of the masked region can be determined by the width of the spacers 1810. This leaves regions of the relatively lightly-doped crystalline semiconductor material exposed, as indicated at 1816.

Figure 19A:
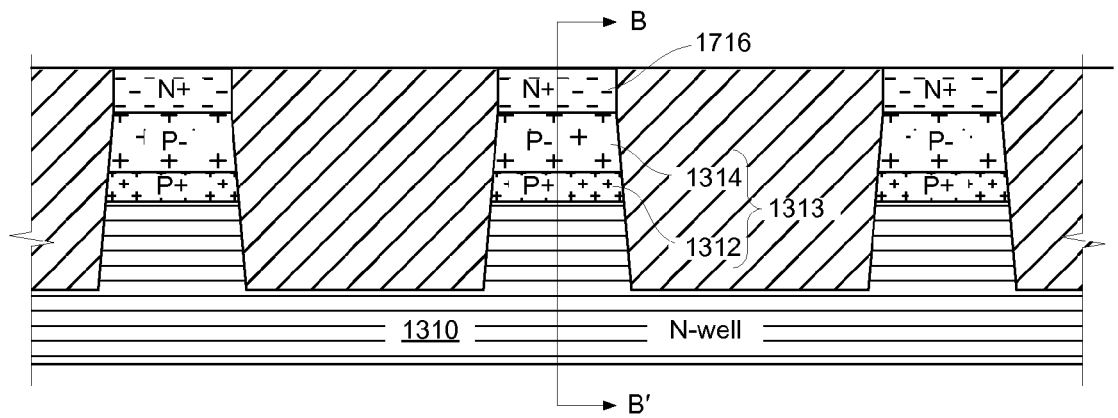
Figure 19B:
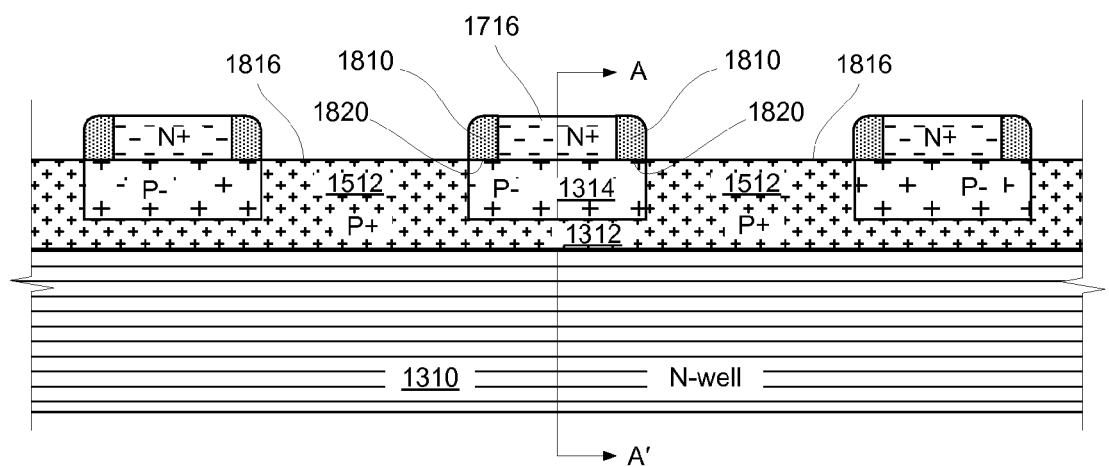
Figure 19C:
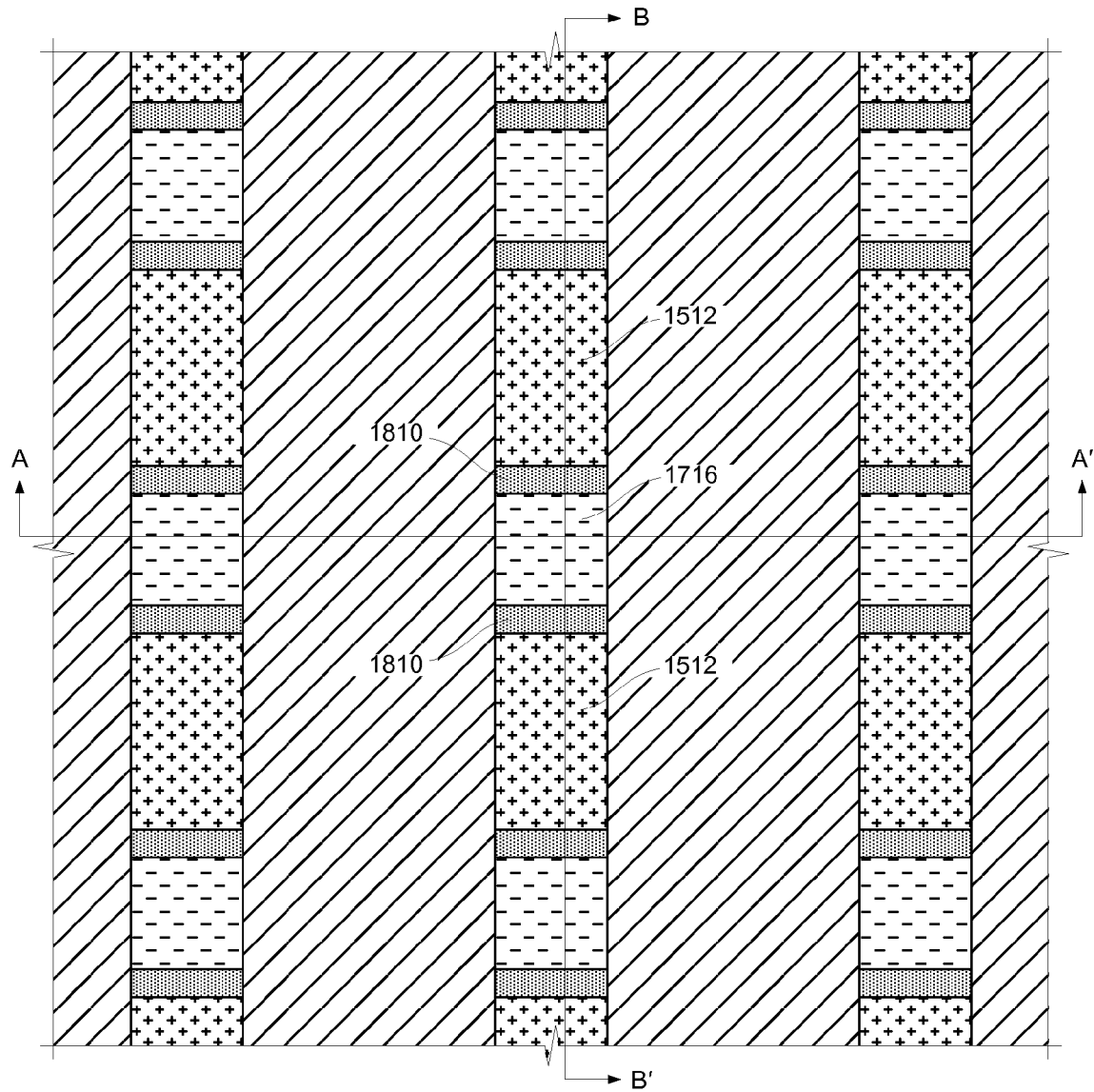

Thereafter, an implant is performed to heavily dope the exposed regions of the relatively lightly-doped crystalline semiconductor material, with a result as shown in FIGS. 19A, 19B, 19C. The regions 1512 beneath the exposed surfaces 1816 of the ridge 1313 of crystalline semiconductor material are now heavily doped, with the same conductivity type as the relatively heavily doped crystalline semiconductor material (1312, P+) overlying the N-well.

Figure 20A:
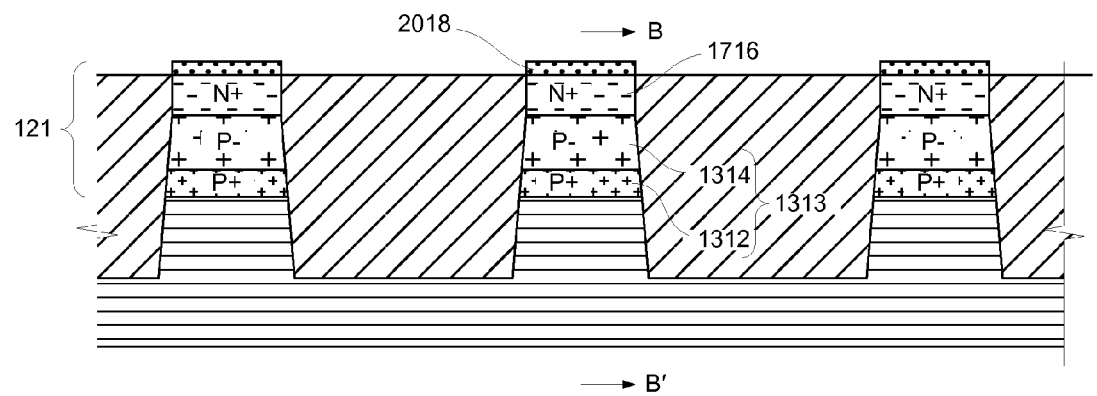
Figure 20B:
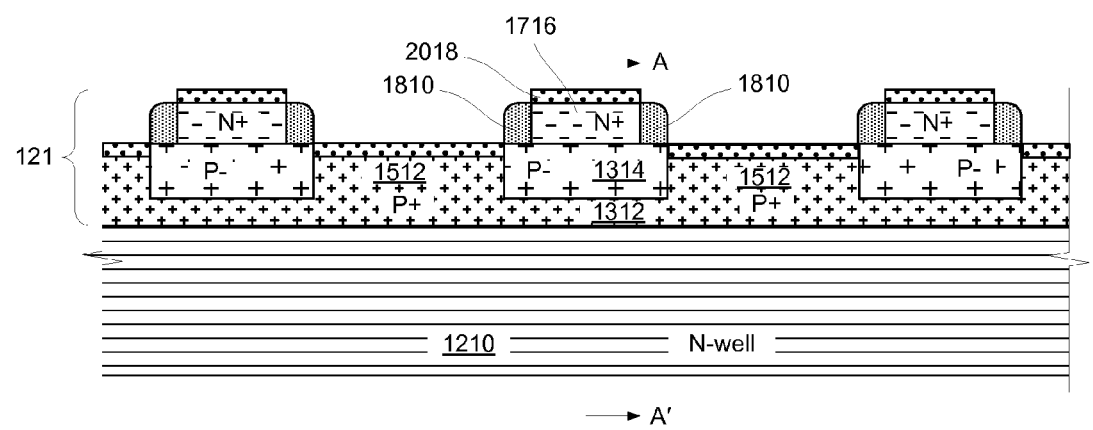
Figure 20C:
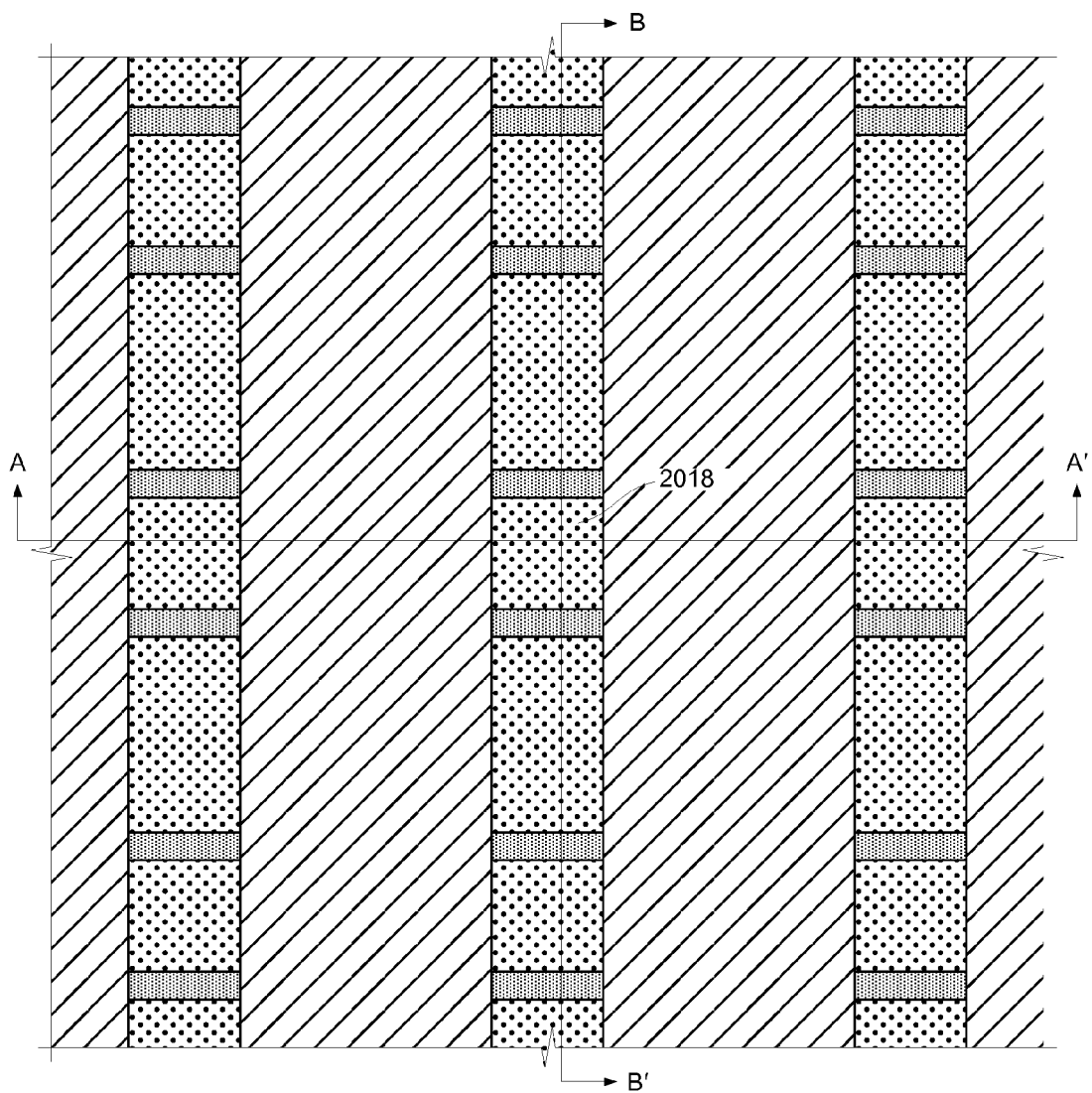

Thereafter, an electrically conductive cap 2018, such as a silicide as described above is formed over the islands 1716 of relatively heavily doped polycrystalline material, and over the relatively heavily doped crystalline material 1512, with the result shown in FIGS. 20A, 20B, 20C. The resulting diode structure (refer also to FIGS. 2A, 2B, 3) is now ready for formation of overlying memory elements, as described in detail below.

FIGS. 21A-25C show stages in an embodiment of a process for making access diodes having an island-type second region that is not self-aligned with the first diode region strip.

Figure 21A:
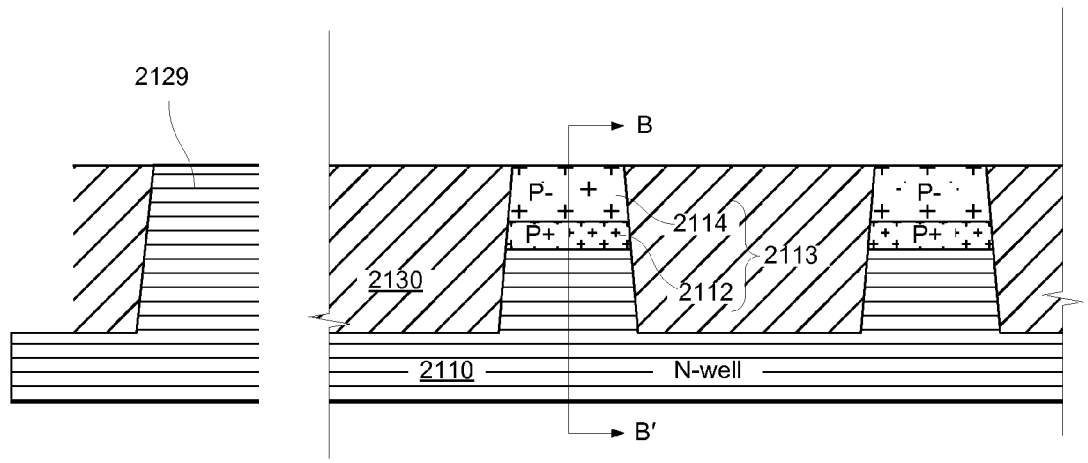
FIGS. 21A-25C are diagrammatic sketches showing stages in an embodiment of a process for making diode access devices such as are shown for example in FIGS. 2A, 2B, 4.
Figure 21B:
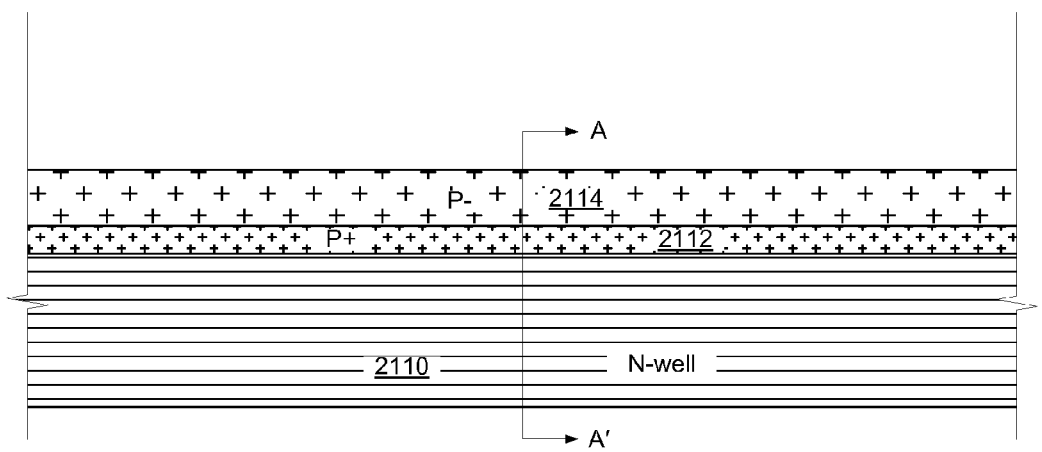
Figure 21C:
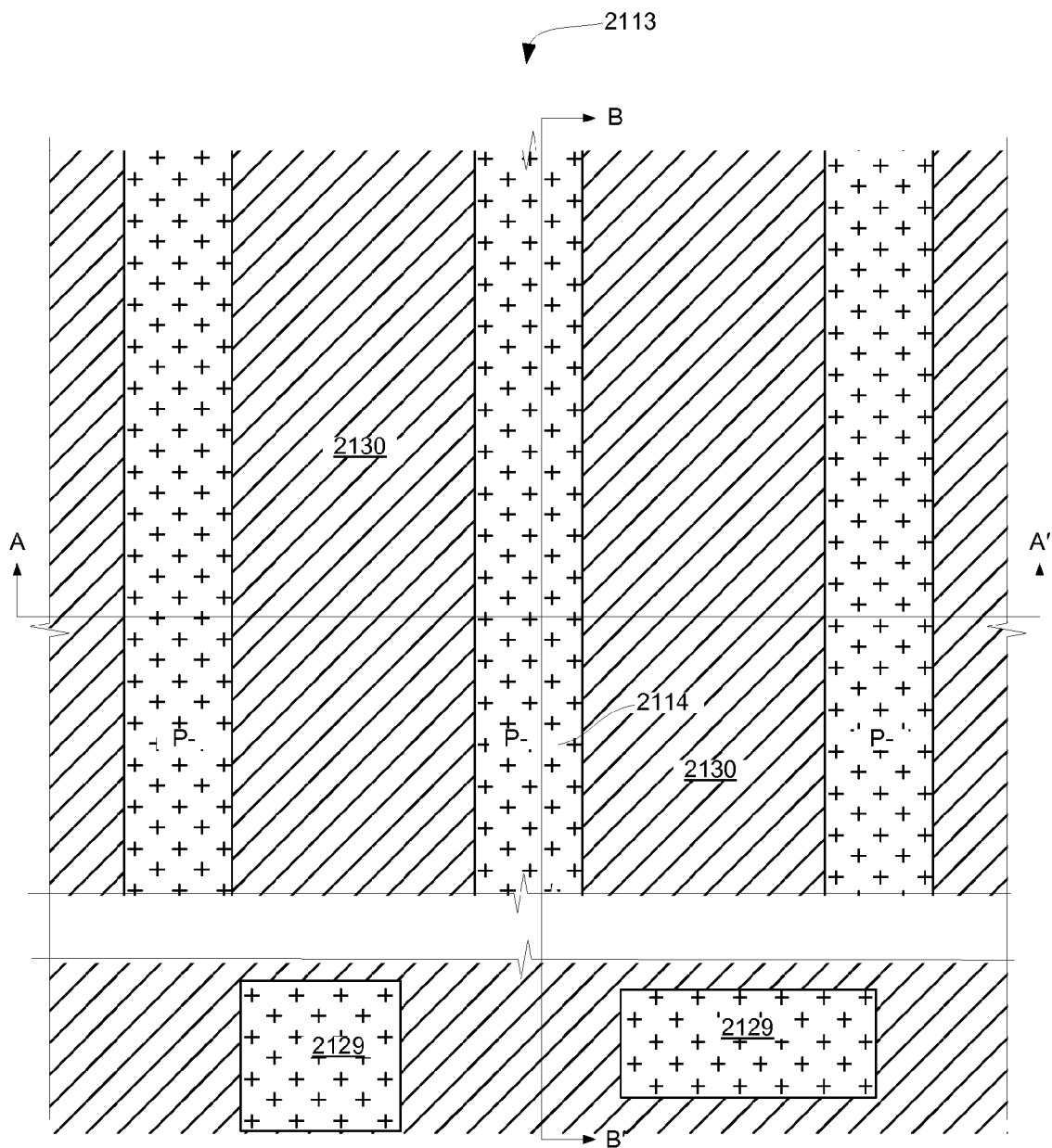

In these examples as for the examples discussed with reference to FIGS. 13-20C, a semiconductor substrate is provided (typically in the form of a semiconductor wafer, for example a silicon wafer). Where, as in this example, the substrate is a P-type semiconductor, an N-well 2110 is formed in the array region, and N-well and P-wells are formed in parts of the peripheral regions. In FIG. 21A, a peripheral active region 2129 is shown in a N-well. Then the wafer is doped in the array region to provide a relatively heavily-doped region overlain by a relatively lightly-doped region of the same conductivity type (P-type in this example). In the figures, the relatively heavily-doped region 2112 is indicated by "P+" and the relatively lightly-doped region 2114 is indicated by "P−". Isolation trenches are formed in both the array and peripheral regions, resulting in ridges separated by a dielectric 2130, as shown in FIGS. 21A, 21B, 21C, and in the active regions, such as regions 2129 in the peripheral regions shown with arbitrary shapes in FIG. 21C, whereas it will be understood that the transistors in the peripheral regions are used for logic and other purposes on the device and will have complex layouts. Each ridge in the array includes a strip of the relatively heavily doped crystalline semiconductor material (2112, P+) overlying the N-well, overlain by a strip of the relatively lightly doped crystalline semiconductor material (2114, P−). These together constitute a first diode region 2113, formed entirely of doped crystalline semiconductor material. Although not shown in the drawings, a sidewall of silicide can be formed to improve the conductivity of the conductor formed by the strips of p-type material in the ridges. This can be done in embodiments like that shown in FIG. 21A, by etching back a portion of the fill 2130 to expose the sides of the regions 2114 and 2112. Then a silicide precursor is deposited on the exposed sides and annealed to cause silicide formation. Then the remaining silicide precursor on the substrate is removed leaving the self-aligned silicide elements on the sides of the ridges. Typical silicide precursors include metals or combinations of metals such as cobalt, titanium, nickel, molybdenum, tungsten, tantalum, and platinum. Also, silicide precursors may include metal nitrides or other metal compounds. The resulting silicide strip, not shown, removes minority carriers from the p-type material and improves conductivity of the structures.

Figure 22A:
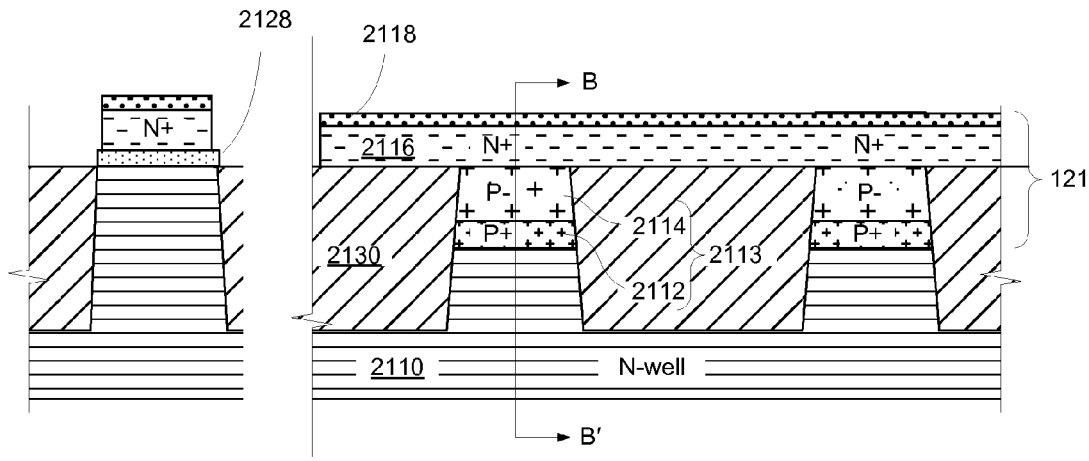
Figure 22B:
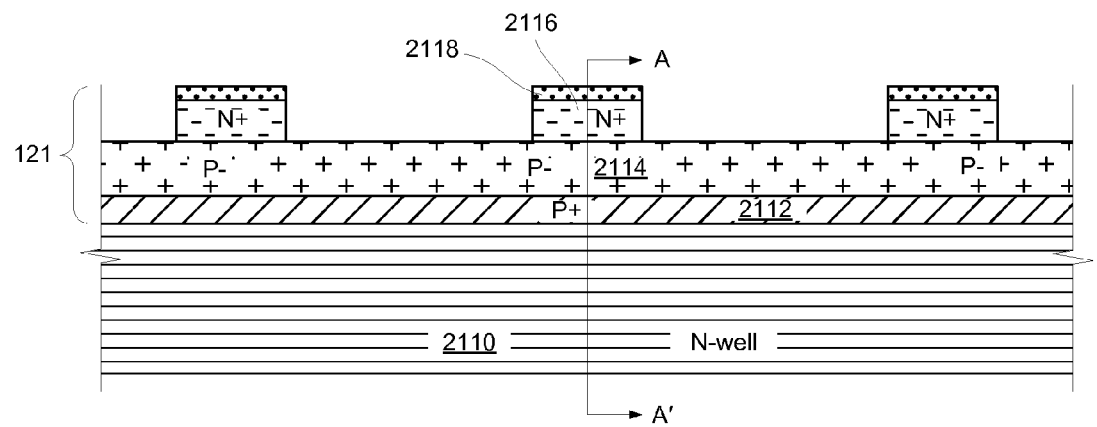
Figure 22C:
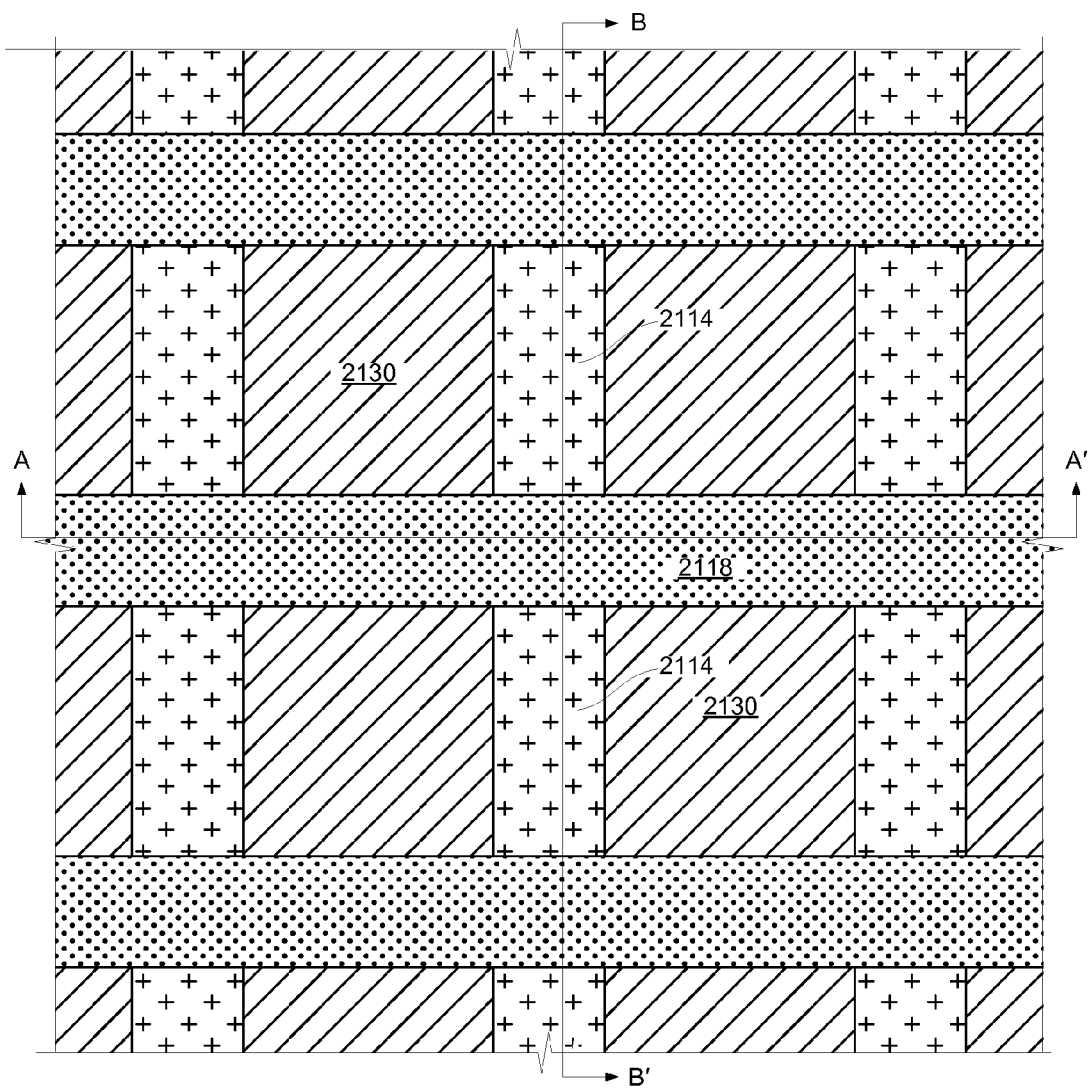
Figure 23A:
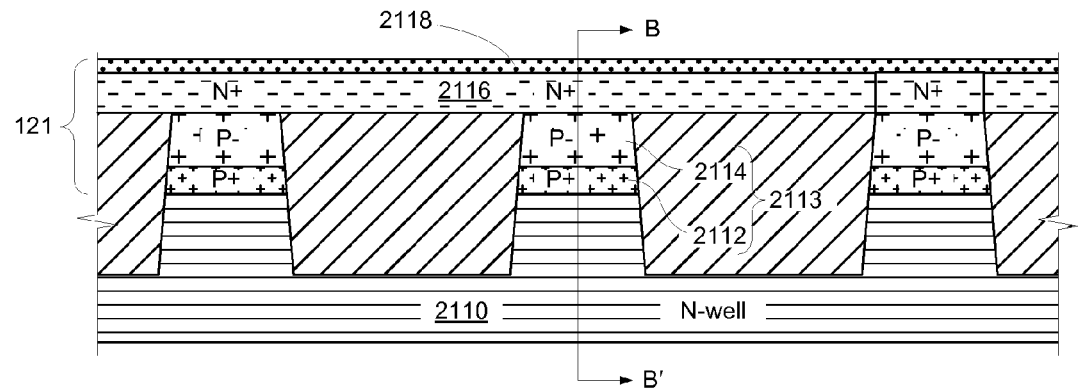
Figure 23B:
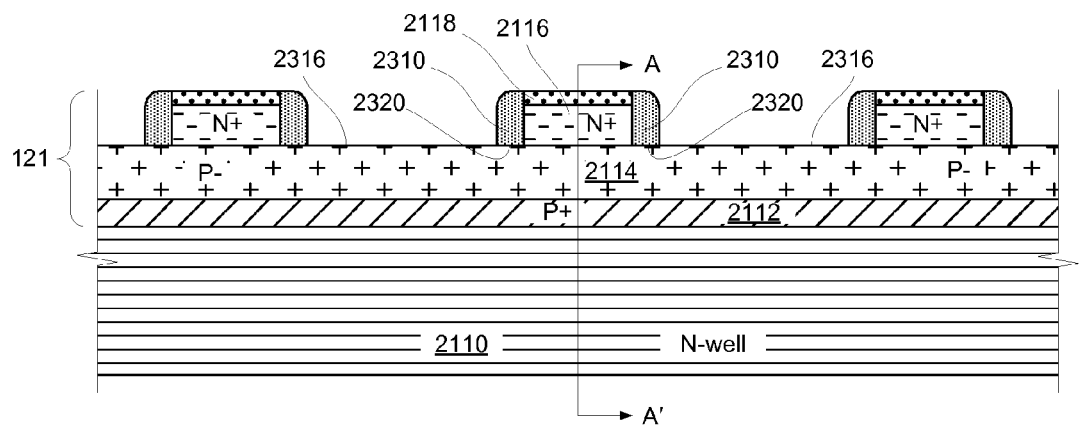
Figure 23C:
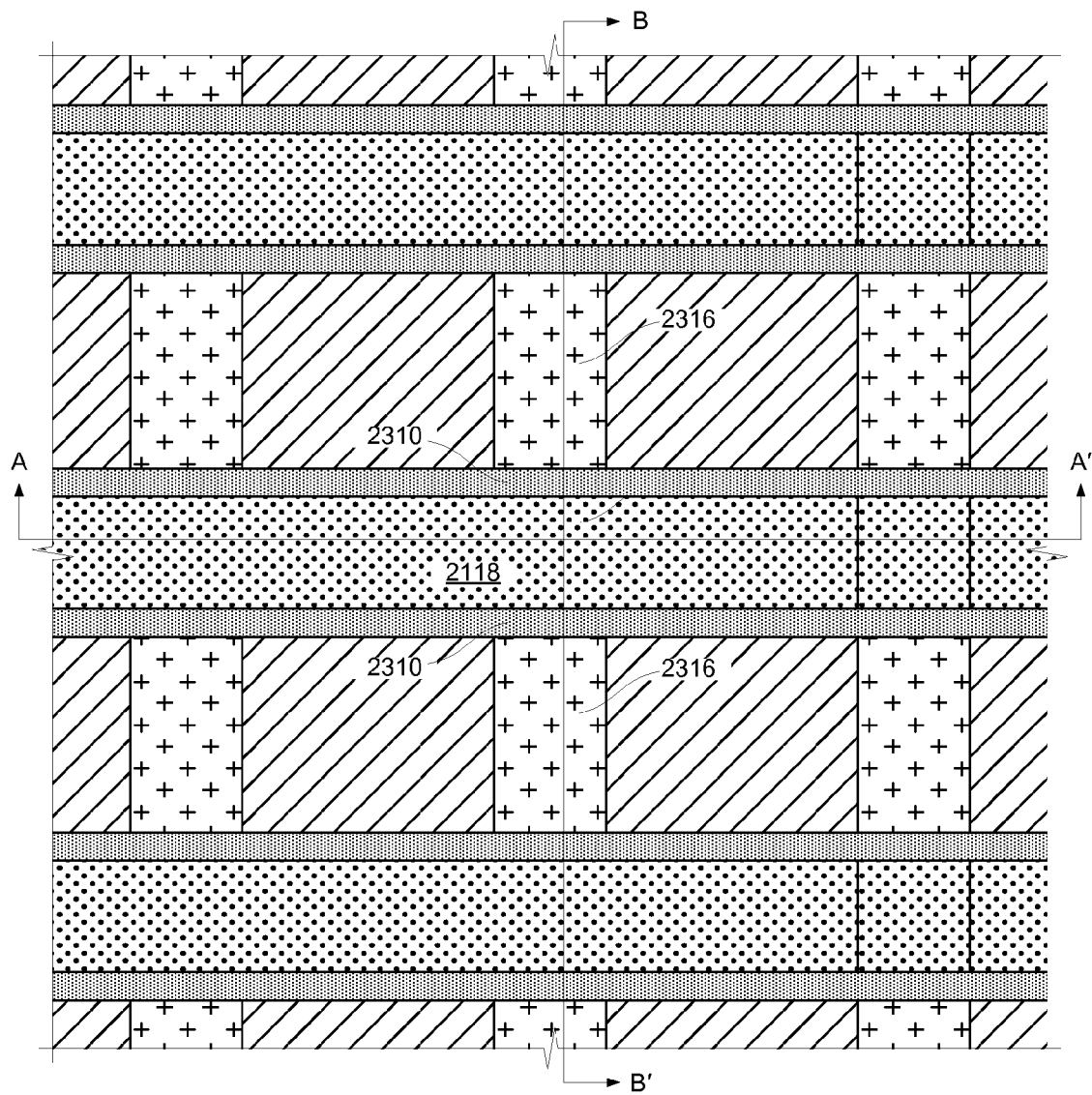

Thereafter, gate dielectric layer 2128 is deposited in the peripheral region, either by a blanket process followed by removal in the array area, or by a process which masks the array area. Then a layer of polycrystalline semiconductor material is formed over both the peripheral regions and the array regions, including over the lightly-doped region 2114 and the surface of the isolation trench dielectric 2130. The polycrystalline semiconductor material (typically polysilicon) is relatively heavily-doped, and has a conductivity type opposite that of the underlying lightly-doped region of the substrate. Then a cap layer is formed on the polycrystalline semiconductor layer, and the layers are patterned to form strips traversing the strips 2114 of the relatively lightly doped crystalline semiconductor material (2114, P−) and to form appropriate interconnect and gate structures in the peripheral regions. The result is shown in FIGS. 22A, 22B, 22C. In the figures, each strip 2116 of the relatively heavily-doped polycrystalline material is indicated by "N+"; and is overlain by a strip 2118 of cap material. In this process, and similar processes, a single polysilicon process can be shared for both the heavily doped polysilicon elements in the array and peripheral polysilicon structures, saving substantial costs in manufacturing. In this embodiment, transistor gate structures in the peripheral circuitry region of the device and the heavily doped polysilicon elements of the diodes comprise respective features in a single polysilicon layer. Thereafter an interlayer dielectric can formed, and openings are formed in both the peripheral device region and the memory array region. The openings are filled with a conductive contact plug material such as tungsten in the peripheral device region, and depending on the memory cell embodiment to be implemented, with elements completing the memory cells in the array region. Optionally, and preferably in some embodiments, a silicide layer (not shown) may be formed on the surface of layer 2412 as well (See, FIG. 24B).

Where, optionally, a barrier layer is desired at the pn-junction, the layer can be formed by growing or depositing a dielectric layer on the exposed lightly-doped silicon region 2114 prior to forming the overlying layer 2116 of polysilicon. A suitable barrier layer may be, for example, silicon dioxide (SiO2) or a silicon oxynitride (SiNxOy); and it may be formed to a thickness in a range of about 5 to 25 Angstroms, for example about 10 Angstroms.

Thereafter, focusing on the array area, spacers 2310 are formed at the sides of the strips 2116 of relatively heavily doped polycrystalline material. The spacers 2310 mask narrow regions 2320 of the relatively lightly-doped crystalline semiconductor material (2114, P−) adjacent each strip 2116, and the width of the masked region can be determined by the width of the spacers 2310. This leaves regions of the relatively lightly-doped crystalline semiconductor material exposed, as indicated at 2316.

Figure 24A:
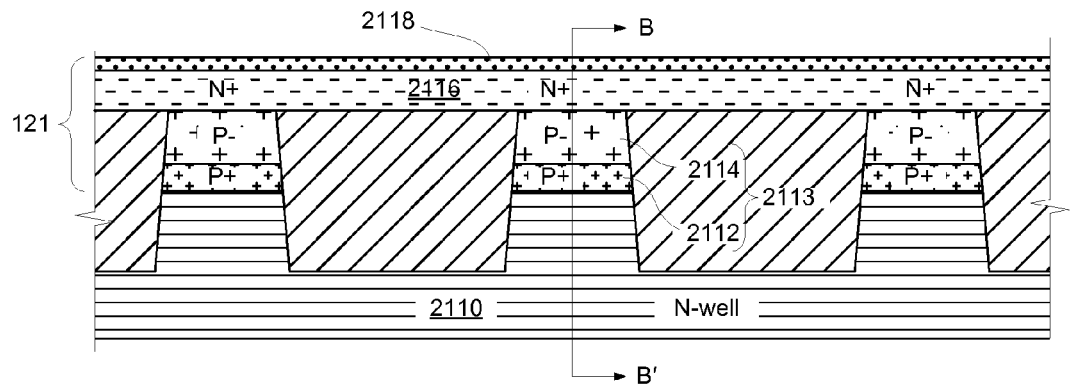
Figure 24B:
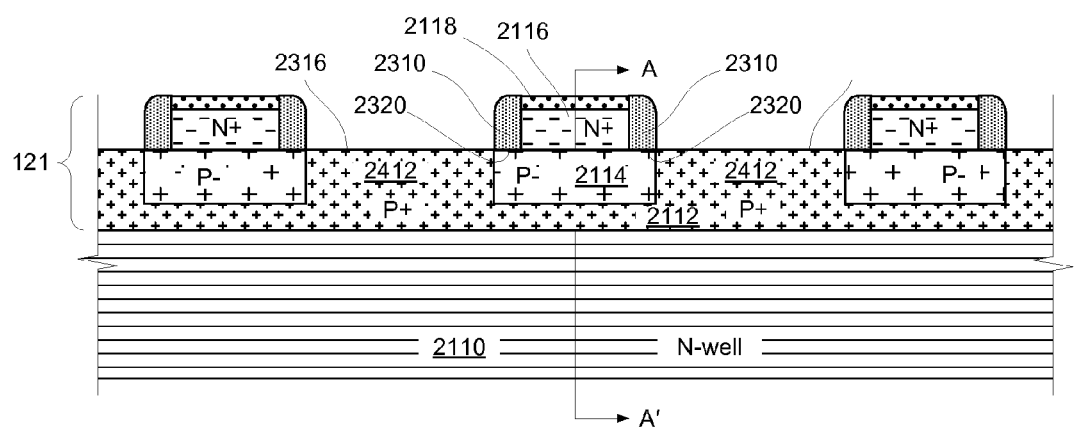
Figure 24C:
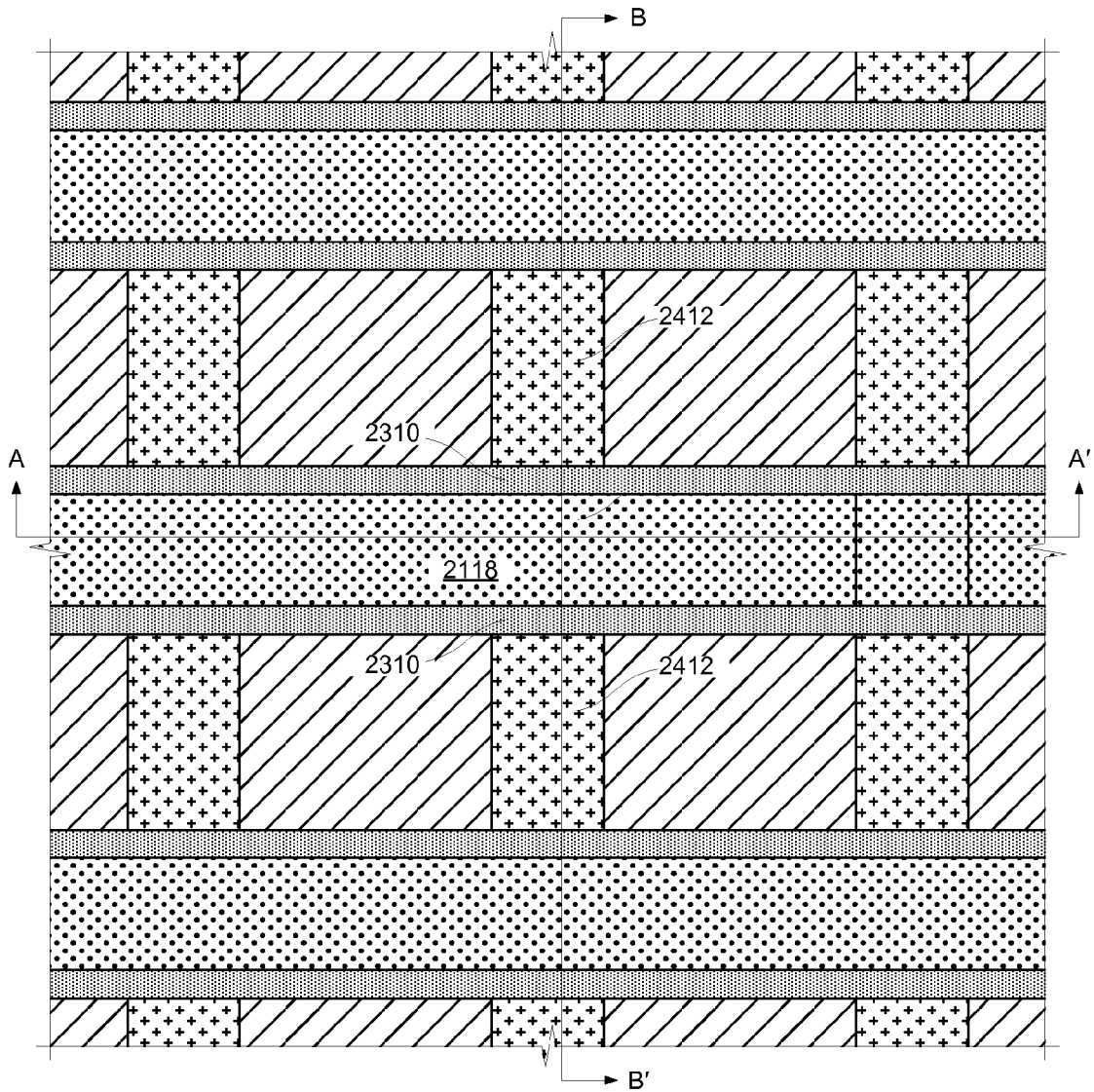

Thereafter, an implant is performed to heavily dope the exposed regions of the crystalline semiconductor material, with a result as shown in FIGS. 24A, 24B, 24C. The regions 2412 beneath the exposed surfaces 2316 of the ridge 2113 of crystalline semiconductor material are now heavily doped, with the same conductivity type as the relatively heavily doped crystalline semiconductor material (2112, P+) overlying the N-well.

Figure 25A:
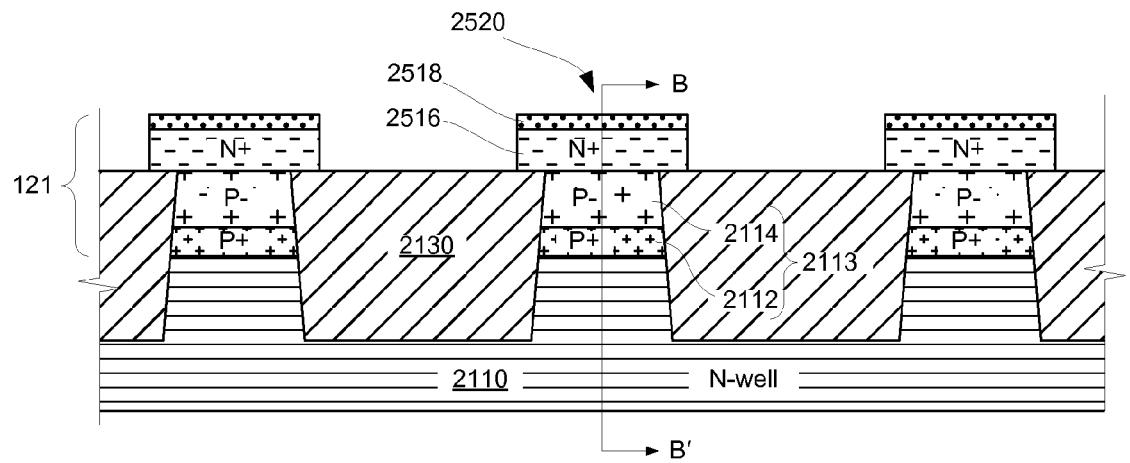
Figure 25B:
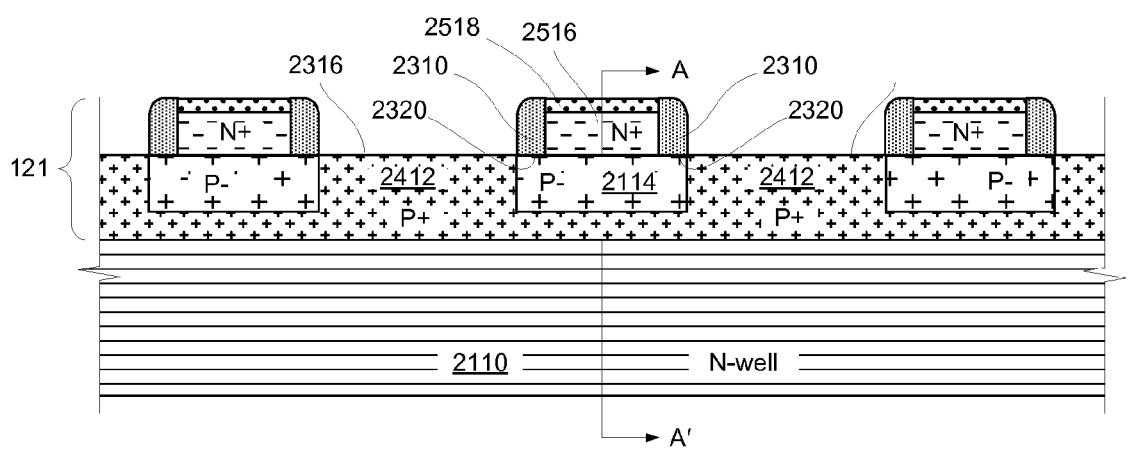
Figure 25C:
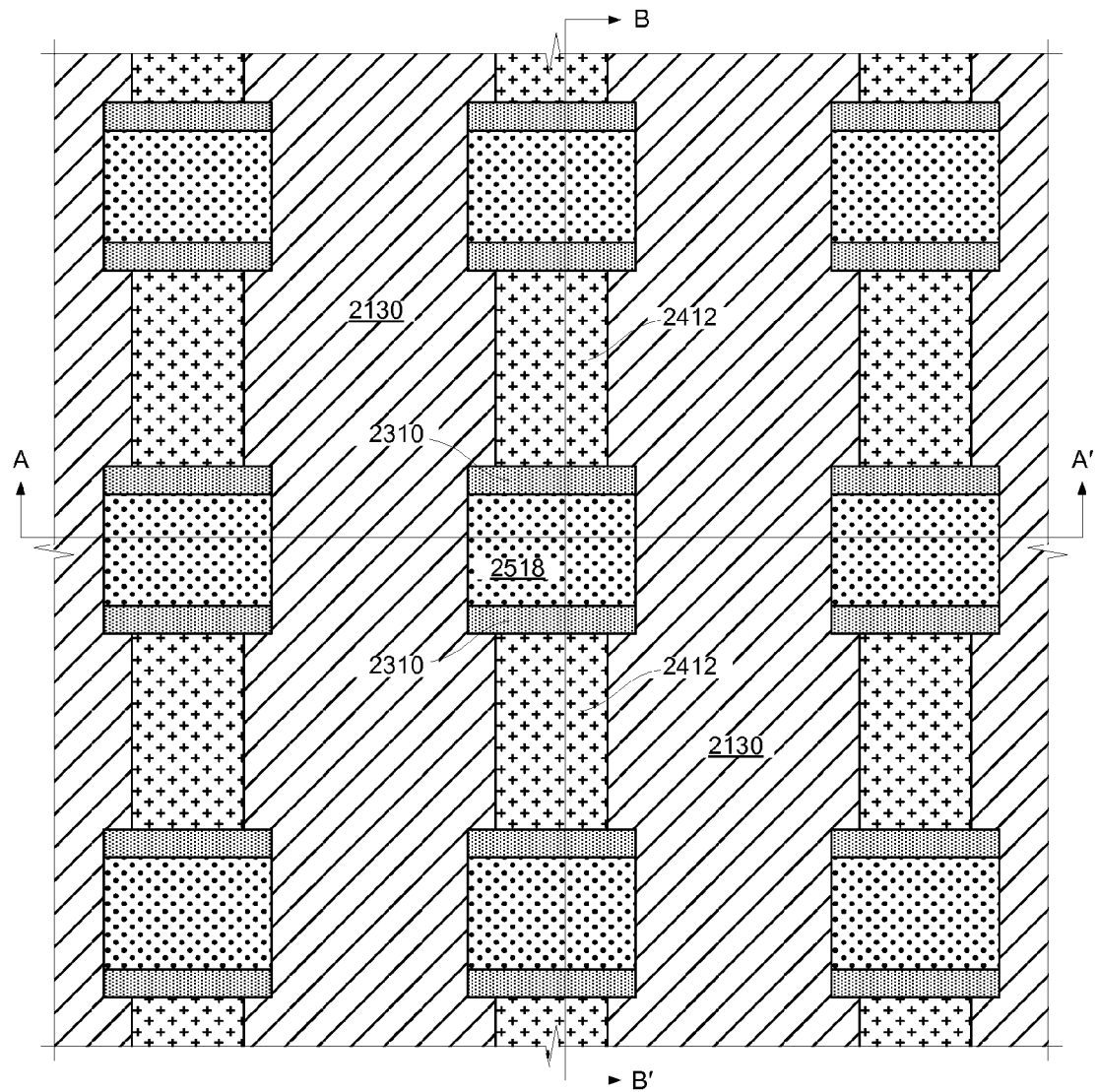

Thereafter, a mask is applied over the strips of cap material 2118 and polycrystalline material 2116, and the dielectric material 2130 between the ridges, and is patterned to cover at least portions of the cap material 2118 and polycrystalline material 2116 generally overlying the ridges 2113 of crystalline semiconductor material. An etch operation is performed to remove any exposed relatively heavily doped polycrystalline material, and the mask is removed, with a result as shown in FIGS. 25A, 25B, 25C. The etch stops at the surface of the implanted crystalline semiconductor material (2412, P+), so that the resulting construct consists of islands 2520 of relatively heavily doped polycrystalline material 2516 overlain by cap 2518 upon the first region 2113 ridges. Optionally, and preferably in some embodiments, a silicide layer (not shown) may be formed on the surface of layer 2412 as well. The resulting diode structure (refer also to FIGS. 2A, 2B, 4) is now ready for formation of overlying memory elements, as described in detail below.

Figure 26A:
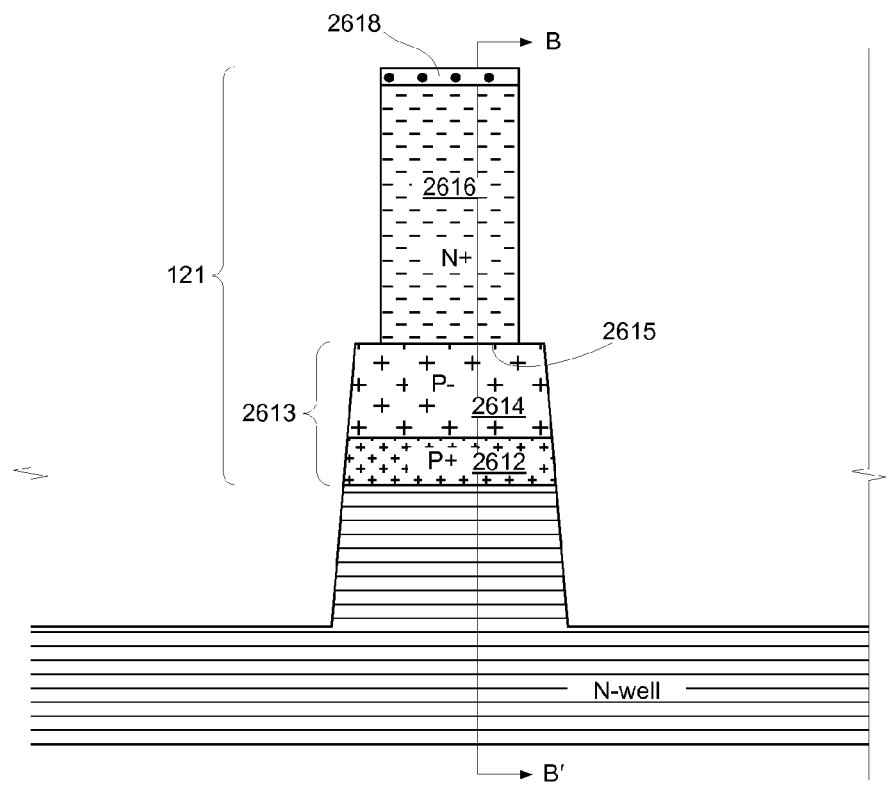
FIGS. 26A and 26B are diagrammatic sketches in sectional views showing another embodiment of a unit diode access device including a polysilicon plug.
Figure 26B:
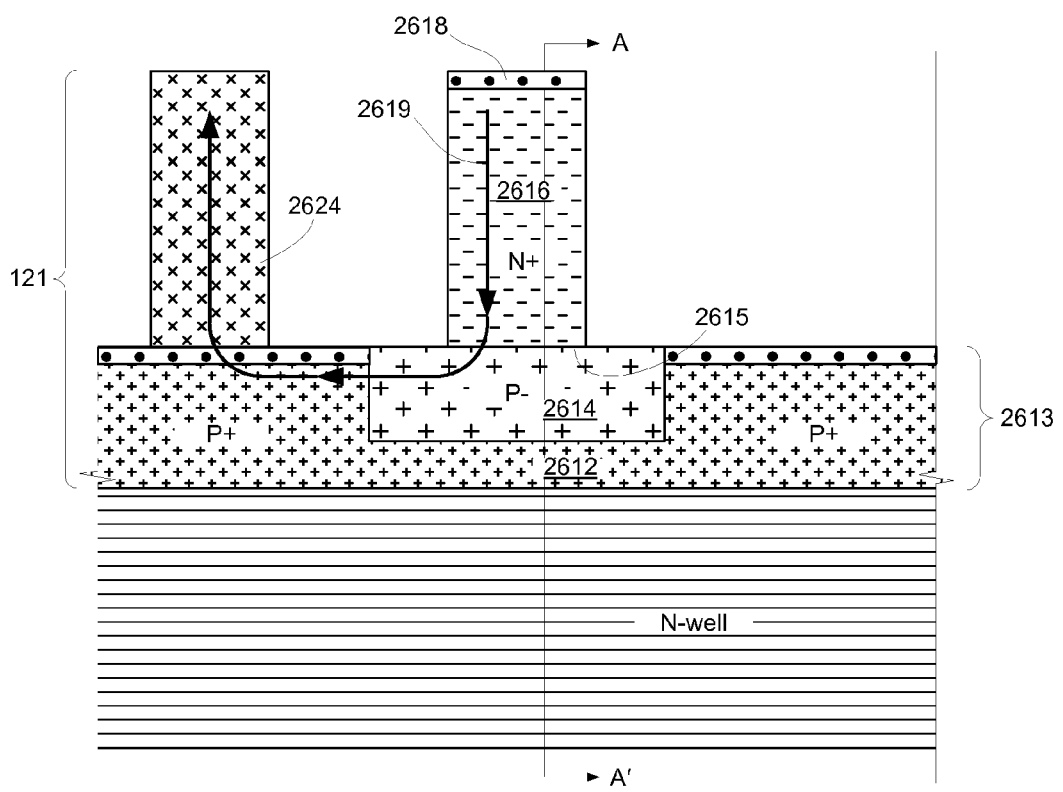

FIGS. 26A and 26B show a portion of an embodiment of a memory cell array, in which the second region of the diode has the form of a pillar, in diagrammatic sectional views. FIG. 26A is taken along a bit line 120, and FIG. 26B is taken along a word line 130.

Referring to FIGS. 26A and 26B, the memory cell 115 includes a first doped semiconductor region 2613 having a first conductivity type and a second doped semiconductor plug 2616 on the first doped semiconductor region 2613, the second doped semiconductor plug 2616 having a second conductivity type opposite the first conductivity type. The first doped semiconductor region 2613 includes a more heavily doped region 2612 overlain by a lightly doped region 2614. A pn-junction 2615 is defined between the lightly doped region 2614 of the first doped semiconductor region 2613 and the second doped semiconductor plug 2616. In the example shown in the figures, the first doped semiconductor region is a p-type semiconductor; the conductively doped region is marked "P+", and the lightly doped region is marked "P−". And, in the example shown in the figures, the second doped semiconductor region is a more heavily-doped n-type semiconductor, marked "N+", having a doping concentration higher than that of the lightly-doped region.

The first doped semiconductor region 2613 is formed by doping the (single-crystal) semiconductor substrate and, accordingly, the first doped semiconductor region is a single-crystal semiconductor. The second doped semiconductor region is a doped deposited polysilicon plug, formed within a via through an insulating layer (not shown). Accordingly, the diode is made up of first and second semiconductor regions, defining a pn-junction between them; the first semiconductor region is formed of a single-crystal semiconductor, and the second semiconductor region is formed of a polycrystalline semiconductor.

The doped single-crystal semiconductor regions may be formed in the wafer itself. Alternatively, the doped single-crystal semiconductor regions may be formed in a silicon-on-insulator "SOI" substrate (such as a silicon-insulator-silicon) substrate.

The memory cell 115 includes a conductive cap 2618 on the second doped semiconductor plug 2616. The first and second doped semiconductor regions 2613, 2616 and the conductive cap 2618 constitute a multi-layer stack defining diode 121. In the illustrated embodiment the conductive cap 2618 includes a silicide containing, for example, Ti, W, Co, Ni, or Ta. The conductive cap 2618 assists in maintaining the uniformity of an electric field impressed across the first and second doped semiconductor regions 2613, 2616 during operation by providing a contact surface that is more highly conductive than the semiconductor material of the first and second doped semiconductor regions 2613, 2616. The conductive cap 2618 also provides a low resistance ohmic contact between the diode 121 and the overlying memory element 160. Additionally, the conductive cap 2618 can serve as a protective etch stop layer for the second doped semiconductor plug 2616 during the manufacture of the memory cell array 100. Optionally, and preferably in some embodiments, a silicide layer may be formed on the surface of layer 2612 as well.

In the example shown in FIGS. 26A and 26B, the width of the lightly doped semiconductor region 2614 overlying the more heavily doped semiconductor region 2612 is greater than the width of the second doped semiconductor plug 2616. A conductive plug 2624 contacts the more heavily doped semiconductor region 2612 in a region of the array spaced away from or situated to the side of the second doped semiconductor plug 2616, and extends upward to make contact with overlying structures, as shown and described below.

Optionally, a barrier layer is desired at the pn-junction, the layer can be formed by growing or depositing a dielectric layer on the exposed lightly-doped silicon region 2614 prior to forming the overlying layer 2616 of polysilicon. A suitable barrier layer may be, for example, silicon dioxide ($SiO_2$) or a silicon oxynitride ($SiN_xO_y$); and it may be formed to a thickness in a range of about 5 to 25 Angstroms, for example about 10 Angstroms.

Arrow 2619 in FIG. 26B shows the current flow direction from an overlying memory element (not shown in this FIG.) across the pn-junction 2615 through the diode and on to and through the contact via 2624, and eventually to an overlying access line (not shown in this FIG.). As the FIG. illustrates, because the lightly doped semiconductor region 2614 is greater than the width of the second doped semiconductor plug 2616, the current necessarily passes from the second doped semiconductor plug 2616 through the lightly doped semiconductor region 2614 beneath the spacer before it passes on to the more heavily doped semiconductor region 2612.

Figure 27A:
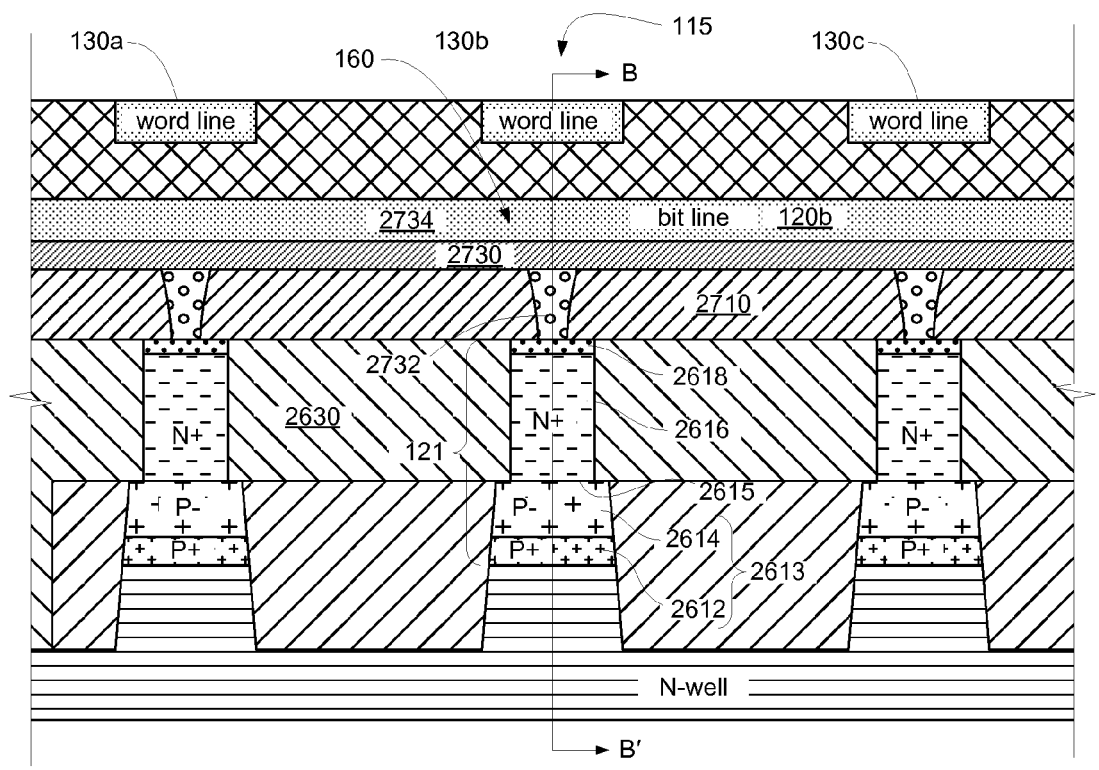
FIGS. 27A and 27B are diagrammatic sketches in sectional views of another embodiment of memory cells having diode access devices.
Figure 27B:
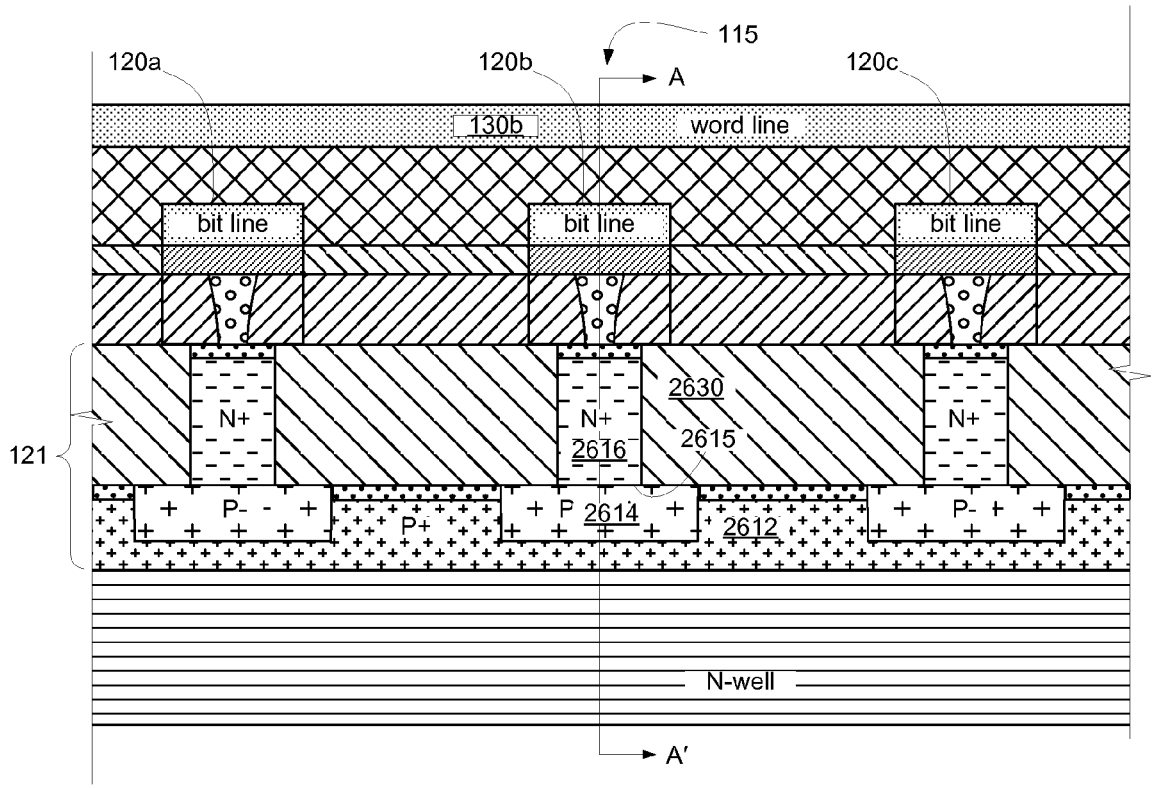

FIGS. 27A, 27B; 28A, 28B; 29A, 29B; 30A, 30B; 31A, 31B; 32A, 32B; and 33A, 33B show examples of various embodiments of memory cells in which the access diodes have a second region in the form of a pillar.

FIGS. 27A, 27B illustrate an embodiment of a memory cell array in which memory elements are formed over access diodes having a pillar-type second region. In this example a dielectric layer 2710 overlies the caps 2618 and adjacent dielectric fill 2630. In this example there is no separate bottom electrode; a top electrode strip 2730 overlies the dielectric layer 2710 and, in this example a bit line 2734 overlies the top electrode strip 2730 in direct electrical contact. Pores in the dielectric layer 2710 are narrower at the lower side, where the dielectric layer 2710 overlies the caps 2618, than at the upper side, where the dielectric layer 2710 underlies the top electrode 2730. The memory element for each cell is formed solely in the pores, as shown at 2732, and makes contact below at the narrower end with the cap 2618 at the top of the diode stack 121 and above at the wider end with the overlying top electrode 2730.

Referring particularly to FIG. 27B, the first heavily-doped region 2612 is electrically coupled to overlying word line 130*b* at locations not shown in local segments of the region 2612 by conductive plugs not shown.

Figure 28A:
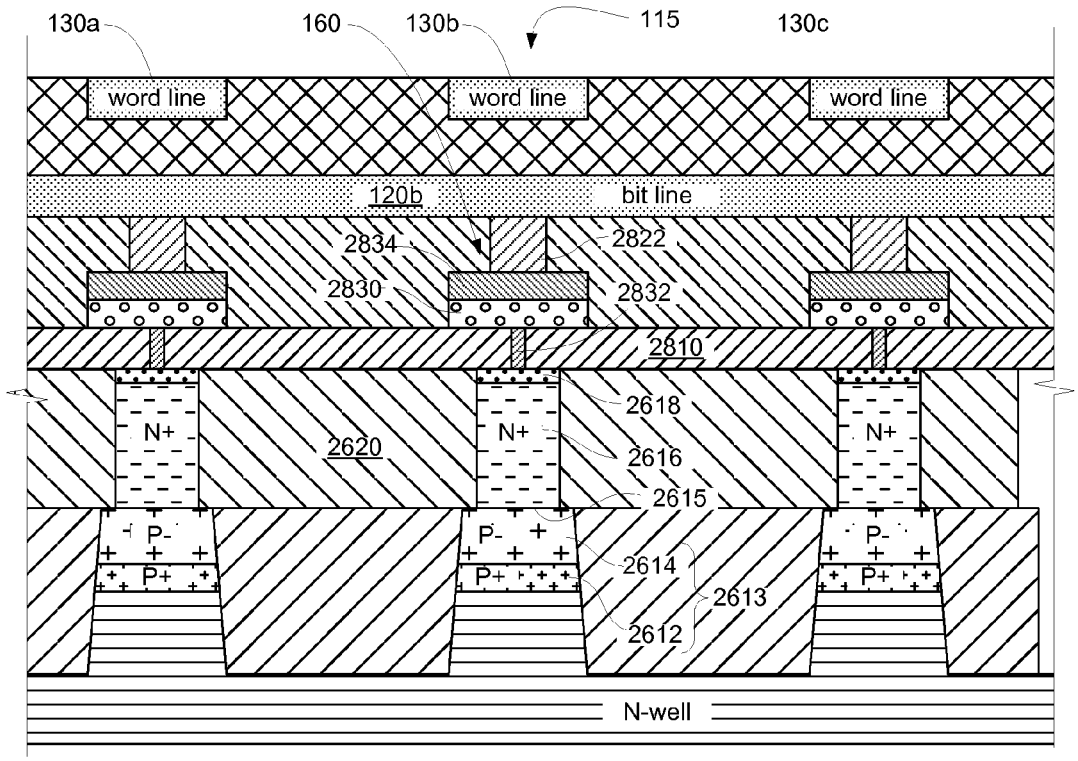
FIGS. 28A and 28B are diagrammatic sketches in sectional views of another embodiment of memory cells having diode access devices.
Figure 28B:
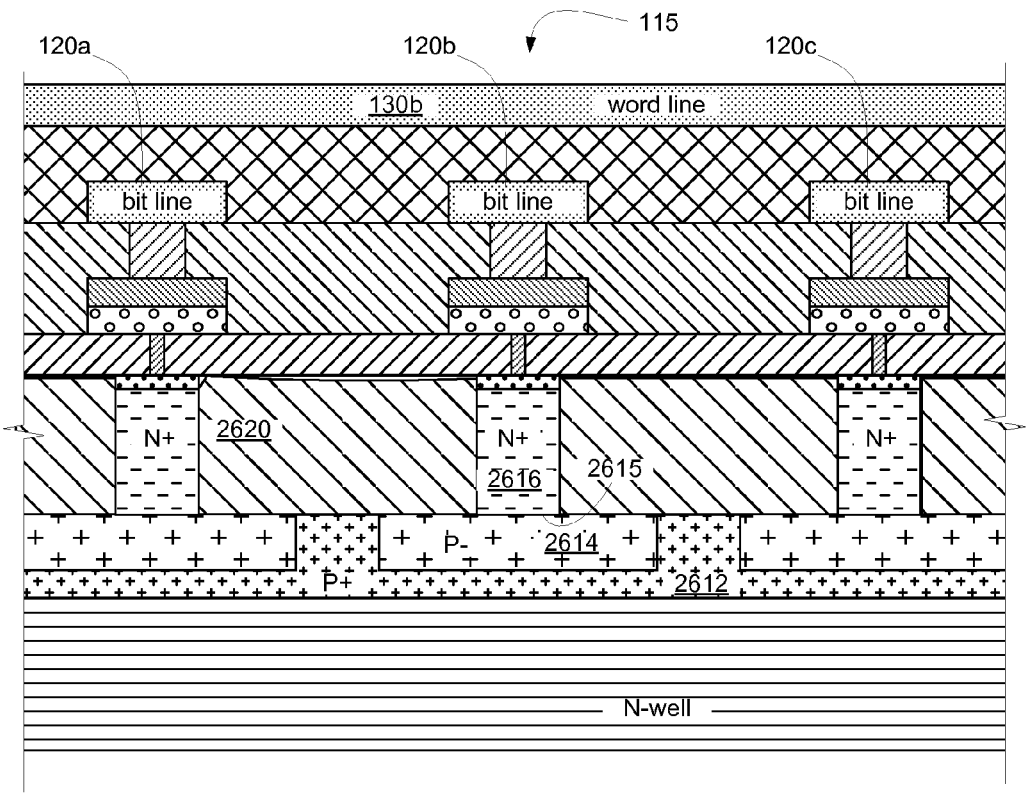

FIGS. 28A, 28B illustrate another embodiment of a memory cell array in which memory elements are formed over access diodes having a pillar-type second region. In this example a dielectric layer 2810 supports the memory element array. The memory element includes a bottom electrode in electrical contact with the second region of the diode, a memory material in contact with the bottom electrode, and a top electrode over the memory material and electrically coupled with overlying access line (bit line) 120*b*. In this configuration the bottom electrode 2832 is formed in and extends through a pore in the dielectric layer 2810. The bottom electrode 2832 contacts the underlying cap 2618 and contacts an overlying island of a memory material 2830 formed over the dielectric layer 2810, and each memory material island is overlain by a top electrode 2834. The top electrode is coupled to access line 120*b* by way of conductive plug 2822. In each cell a small area of the phase change material contacts the bottom electrode 2832, and an active region adjacent the contact with the bottom electrode is the region of the memory element 2830 in which the memory material is induced to change between at least two solid phases.

Referring particularly to FIG. 28B, the first heavily-doped region 2612 is electrically coupled to overlying word line 130*b* at locations not shown in local segments of the region 2612 by conductive plugs not shown. Also, the surface of heavily-doped region 2612 can be capped with a silicide.

Figure 29A:
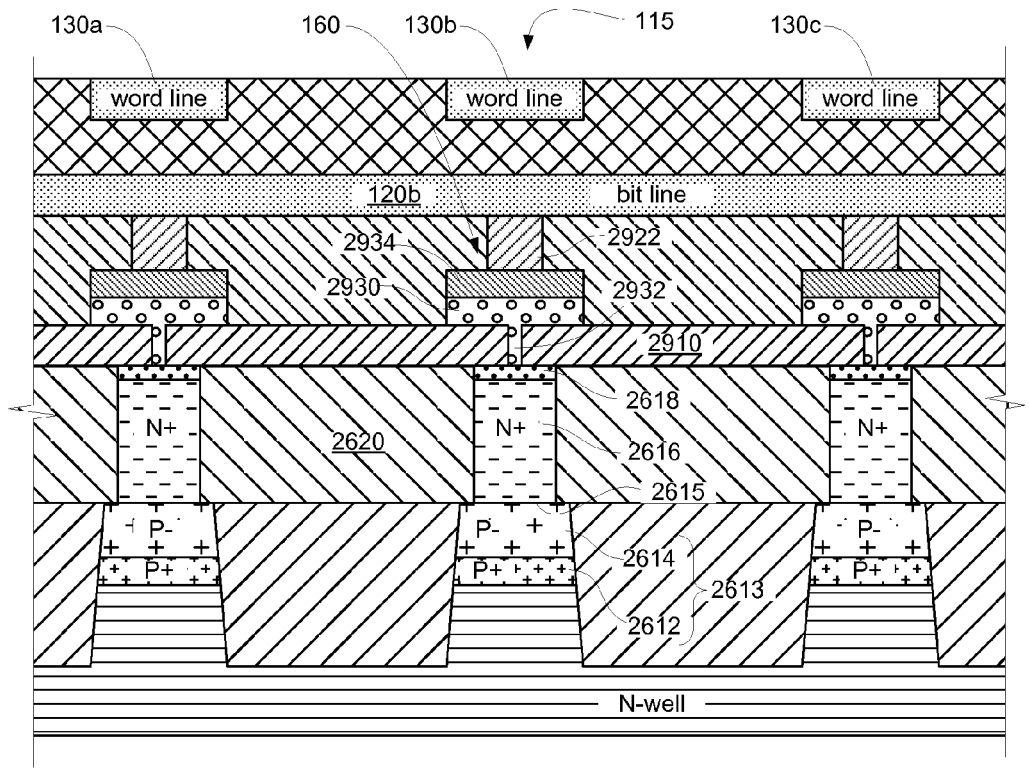
FIGS. 29A and 29B are diagrammatic sketches in sectional views of another embodiment of memory cells having diode access devices.
Figure 29B:
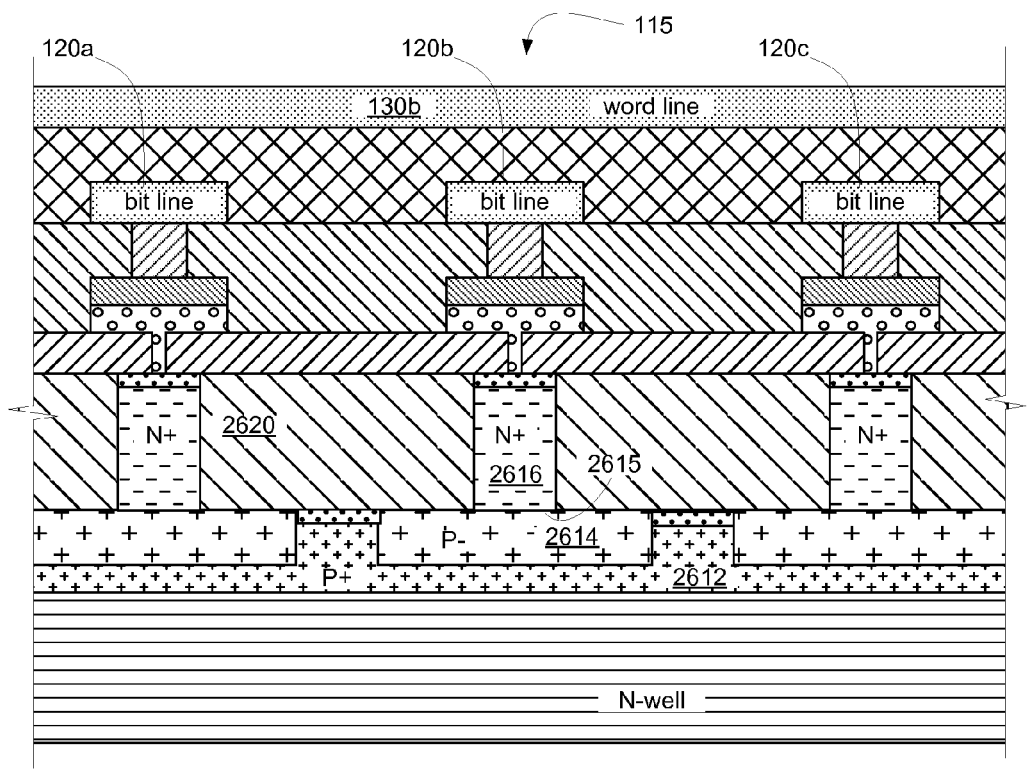

FIGS. 29A, 29B illustrate another embodiment of a memory cell array in which memory elements are formed over access diodes having a pillar-type second region. In this example, as in the example of FIGS. 28A, 28B, a dielectric fill 2620 surrounds at least the upper island part of the diode stack 121, including the second doped semiconductor 2616 and the cap 2618, and the memory material is formed as islands 2930 rather than a strips; and a top electrode, which is also formed as a strip 2934 overlies the memory material and is coupled to access line (bit line) 120*b* by way of conductive plug 2922. However, in this example there are pores in the dielectric layer 2910, but there is no separate bottom electrode. Instead, in this example a portion of the memory material extends from the island 2930 through the pores, as shown at 2932, and makes contact with the cap 2618 at the top of the diode stack 121.

Referring particularly to FIG. 29B, the first heavily-doped region 2612 is electrically coupled to overlying word line 130*b* at locations not shown in local segments of the region 2612 by conductive plugs not shown. Also, the surface of heavily-doped region 2612 can be capped with a silicide.

Figure 30A:
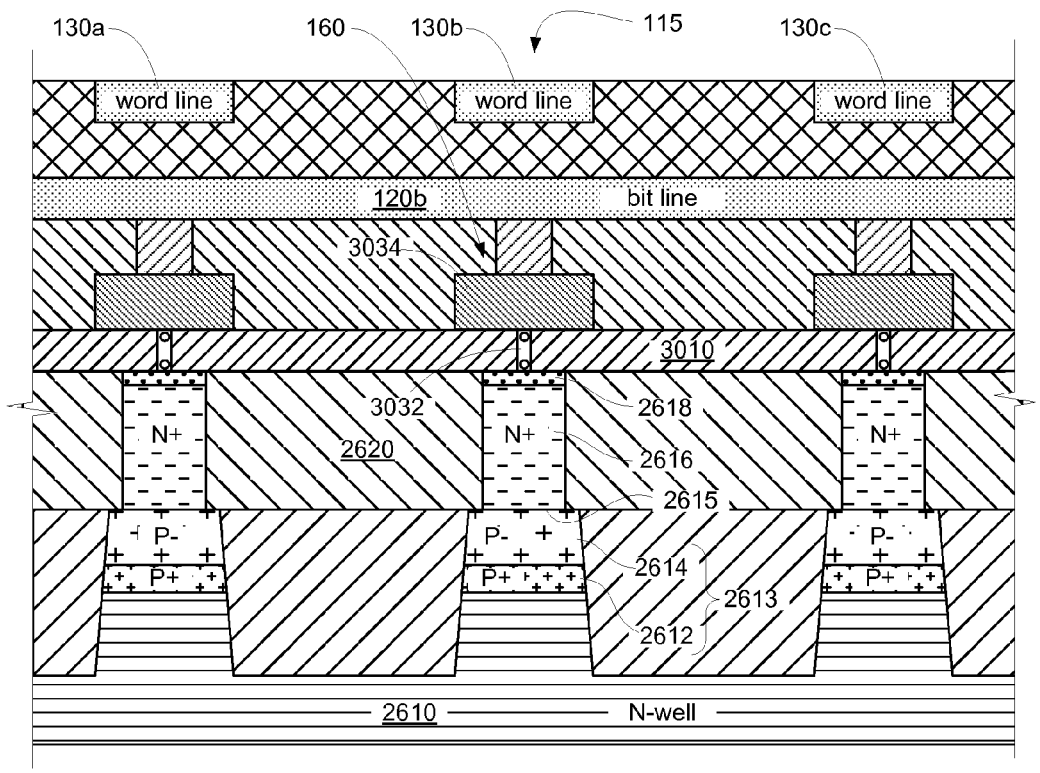
FIGS. 30A and 30B are diagrammatic sketches in sectional views of another embodiment of memory cells having diode access devices.
Figure 30B:
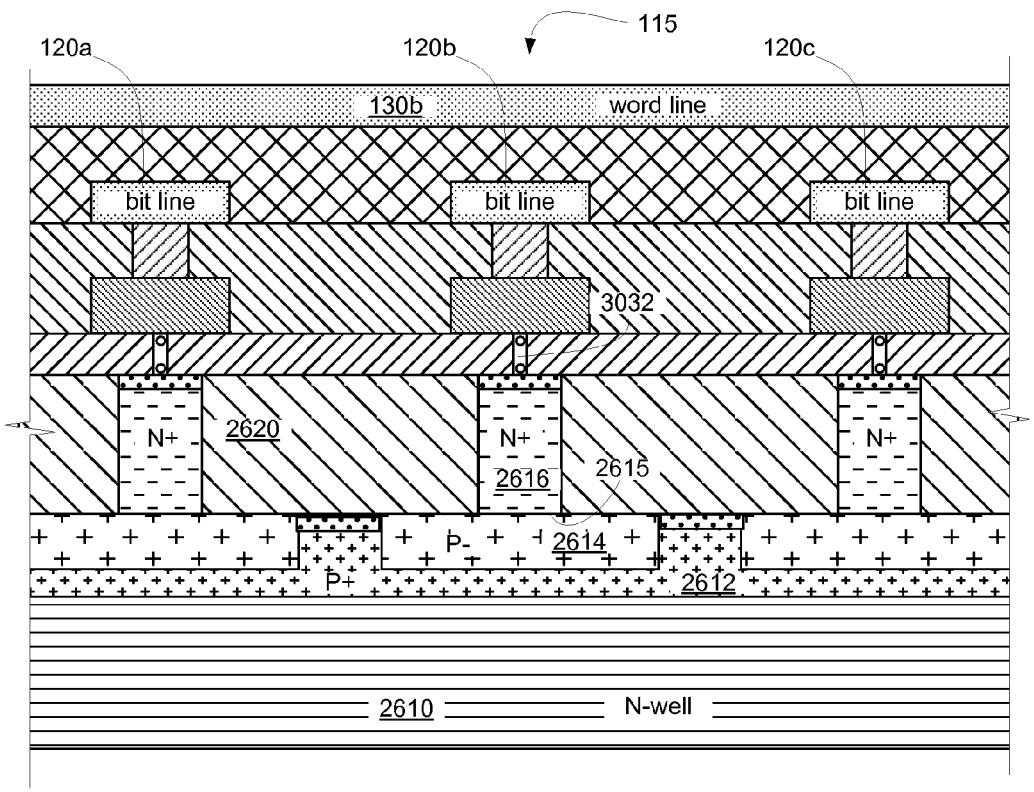

FIGS. 30A, 30B illustrate another embodiment of a memory cell array in which memory elements are formed over access diodes having a pillar-type second region. In this example there are pores in the dielectric layer 3010 and, as in the example shown in FIGS. 29A, 29B there is no separate bottom electrode. But here there are no strips or islands of memory material overlying the dielectric layer, and the top electrode 3034 is in the form of an island and overlies the dielectric 3010 directly. The memory element for each cell is formed solely in the pores, as shown at 3032, and makes contact below with the cap 2618 at the top of the diode stack 121 and above with the overlying top electrode 3034.

Referring particularly to FIG. 30B, the first heavily-doped region 2612 is electrically coupled to overlying word line 130*b* at locations not shown in local segments of the region 2612 by conductive plugs not shown. Also, the surface of heavily-doped region 2612 can be capped with a silicide.

Figure 31A:
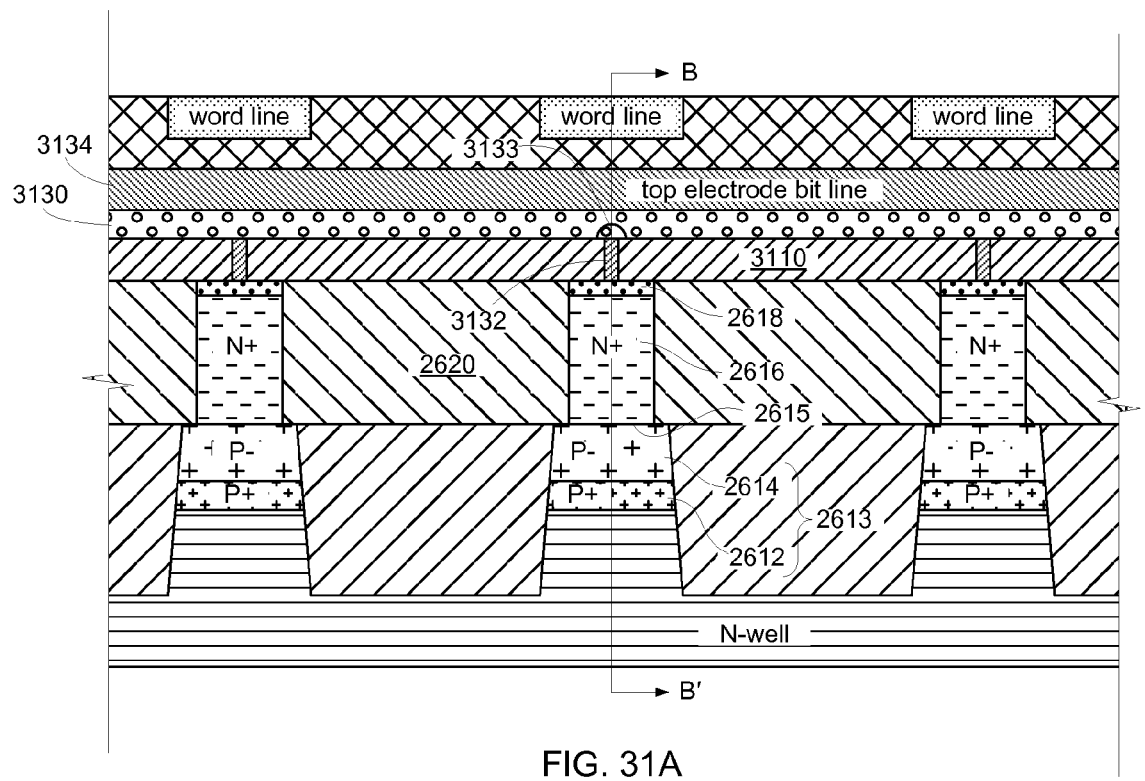
FIGS. 31A and 31B are diagrammatic sketches in sectional views of another embodiment of memory cells having diode access devices.
Figure 31B:
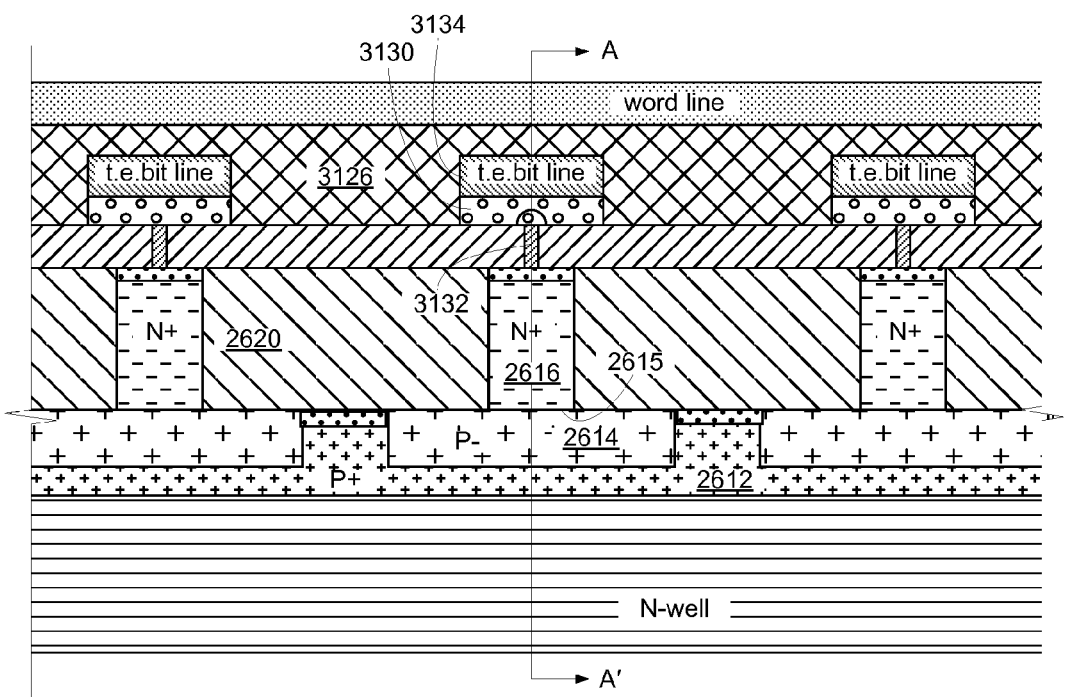

FIGS. 31A, 31B illustrate another embodiment of a memory cell array in which memory elements are formed over access diodes having a pillar-type second region. A dielectric layer 3110 supports the memory element array. As in FIGS. 28A, 28B, 28C, the memory element includes a bottom electrode in electrical contact with the second region of the diode, a memory material in contact with the bottom electrode, and a top electrode over the memory material and electrically coupled with overlying access line (bit line) 120b. In this configuration the bottom electrode 3132 is formed in and extends through a pore in the dielectric layer 3110. The bottom electrode 3132 contacts the underlying cap 2618 and contacts an overlying strip of a memory material 3130 formed over the dielectric layer 3110, and each memory material strip is overlain by a top electrode strip 3134, which also serves as a bit line 120b. In each cell a small area of the phase change material contacts the bottom electrode 3132, and an active region 3133 adjacent the contact with the bottom electrode is the region of the memory element 3130 in which the memory material is induced to change between at least two solid phases.

Referring particularly to FIG. 31B, the first heavily-doped region 2612 is electrically coupled to overlying word line 130b by at locations not shown in local segments of the region 2612 by conductive plugs not shown. Also, the surface of heavily-doped region 2612 can be capped with a silicide.

Figure 32A:
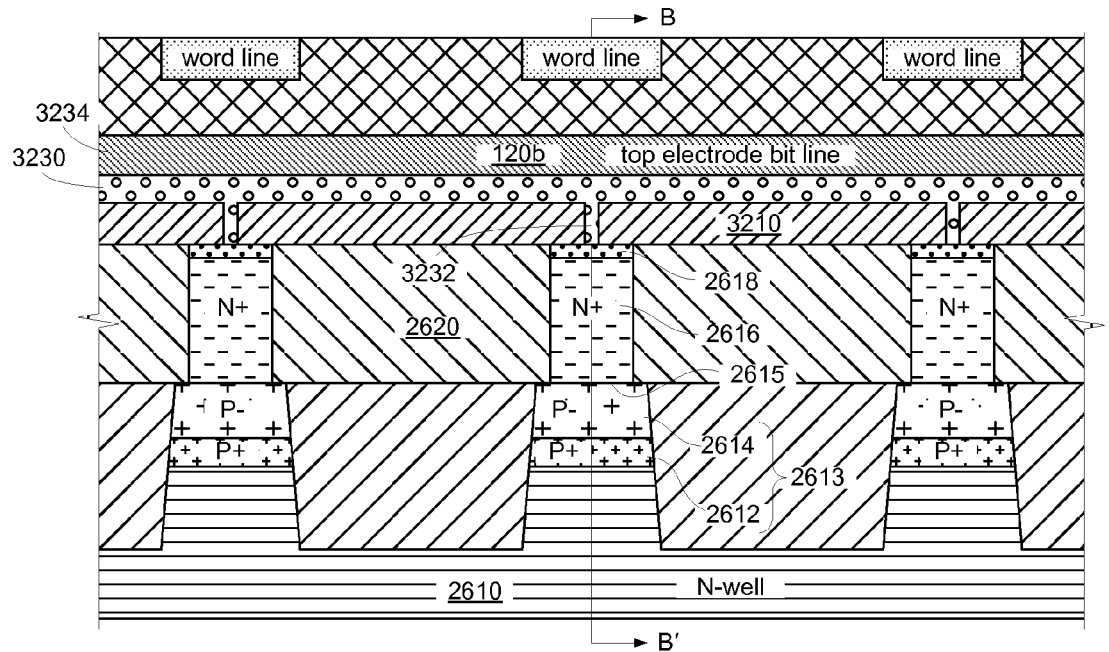
FIGS. 32A and 32B are diagrammatic sketches in sectional views of another embodiment of memory cells having diode access devices.
Figure 32B:
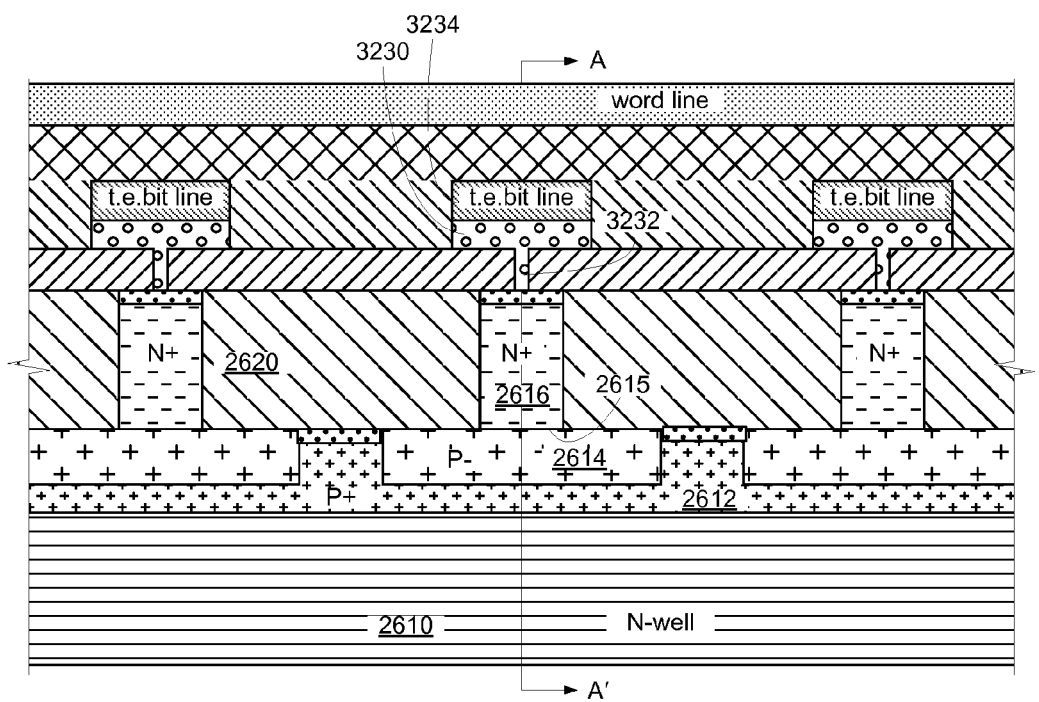

FIGS. 32A, 32B illustrate another embodiment of a memory cell array in which memory elements are formed over access diodes having a pillar-type second region. In this example the memory material is formed as strips 3230 rather than islands; and the top electrode, which is also formed as a strip 3234 overlying the memory material, serves as a bit line. Moreover, in this example there are pores in the dielectric layer 3210, but there is no separate bottom electrode. Instead, in this example a portion of the memory material extends from the strip 3230 through the pores, as shown at 3232, and makes contact with the cap 2618 at the top of the diode stack 121.

Referring particularly to FIG. 32B, the first heavily-doped region 2612 is electrically coupled to overlying word line 130b at locations not shown in local segments of the region 2612 by conductive plugs not shown. Also, the surface of heavily-doped region 2612 can be capped with a silicide.

Figure 33A:
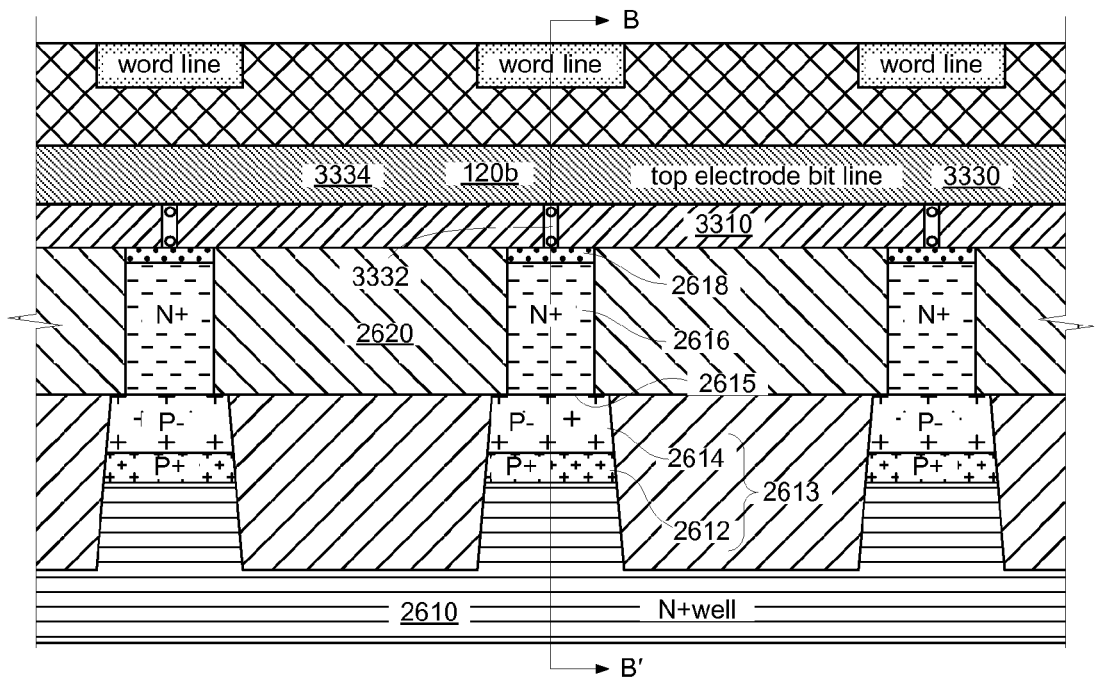
FIGS. 33A and 33B are diagrammatic sketches in sectional views of another embodiment of memory cells having diode access devices.
Figure 33B:
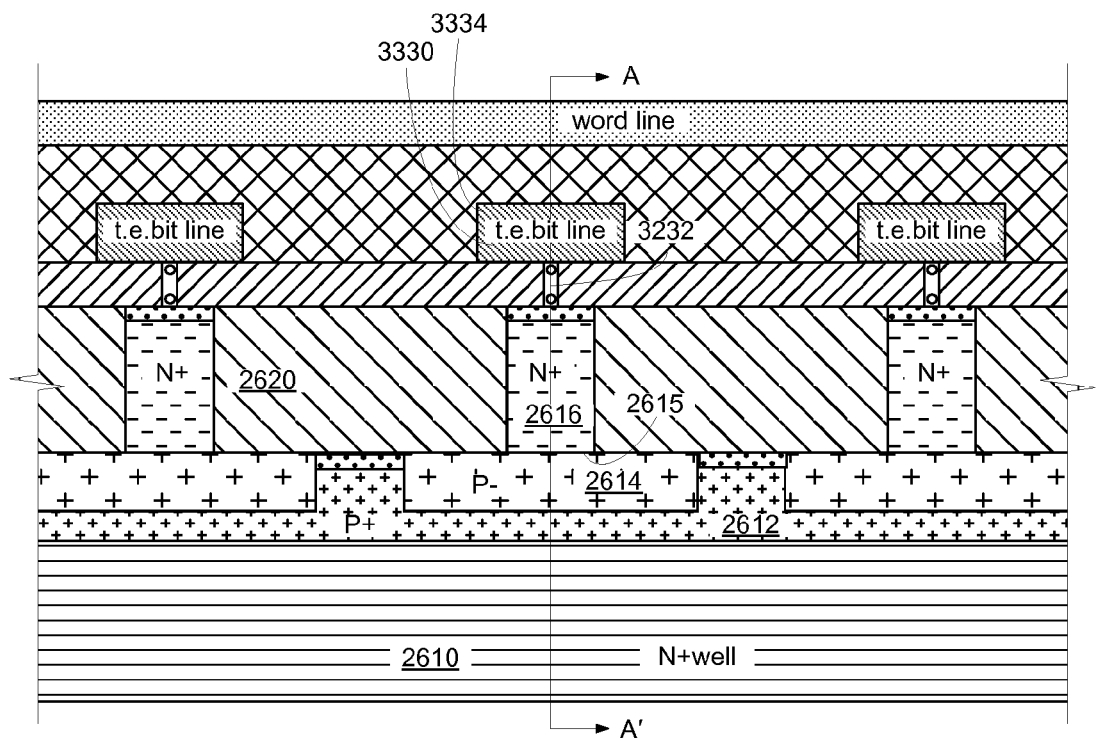

FIGS. 33A, 33B illustrate another embodiment of a memory cell array in which memory elements are formed over access diodes having a pillar-type second region. In this example there are pores in the dielectric layer 3310 and, as in the example shown in FIGS. 33A, 33B there is no separate bottom electrode. But here there are no strips of memory material, and the top electrode 3334, which also serves as the bit line 3330, overlies the dielectric 3310 directly. The memory element for each cell is formed solely in the pores, as shown at 3332, and makes contact below with the cap 2618 at the top of the diode stack 121 and above with the overlying top electrode 3334.

Referring particularly to FIG. 33B, the first heavily-doped region 312 is electrically coupled to overlying word line 130b at locations not shown in local segments of the region 2612 by conductive plugs not shown. Also, the surface of heavily-doped region 2612 can be capped with a silicide.

FIGS. 34A-39C show stages in an embodiment of a process for making access diodes having a second region that has the form of a pillar.

In these examples as for the examples discussed with reference to FIGS. 13-20C, a semiconductor substrate is provided (typically in the form of a semiconductor wafer, for example a silicon wafer). Where, as in this example, the substrate is a P-type semiconductor, an N-well 2110 is formed, and then the wafer is doped to provide a relatively heavily-doped region overlain by a relatively lightly-doped region of the same conductivity type (P-type in this example). In the figures, the relatively heavily-doped region 2112 is indicated by "P+" and the relatively lightly-doped region 2114 is indicated by "P–". An isolation trench is formed, resulting in ridges separated by a dielectric 2130, as shown in FIGS. 21A, 21B, 21C. Each ridge includes a strip of the relatively heavily doped crystalline semiconductor material (2112, P+) overlying the N-well, overlain by a strip of the relatively lightly doped crystalline semiconductor material (2114, P–). These together constitute a first diode region 2113, formed entirely of doped crystalline semiconductor material.

The doped single-crystal semiconductor regions may be formed in the wafer itself. Alternatively, the doped single-crystal semiconductor regions may be formed in a silicon-on-insulator "SOI" substrate (such as a silicon-insulator-silicon) substrate.

Figure 34A:
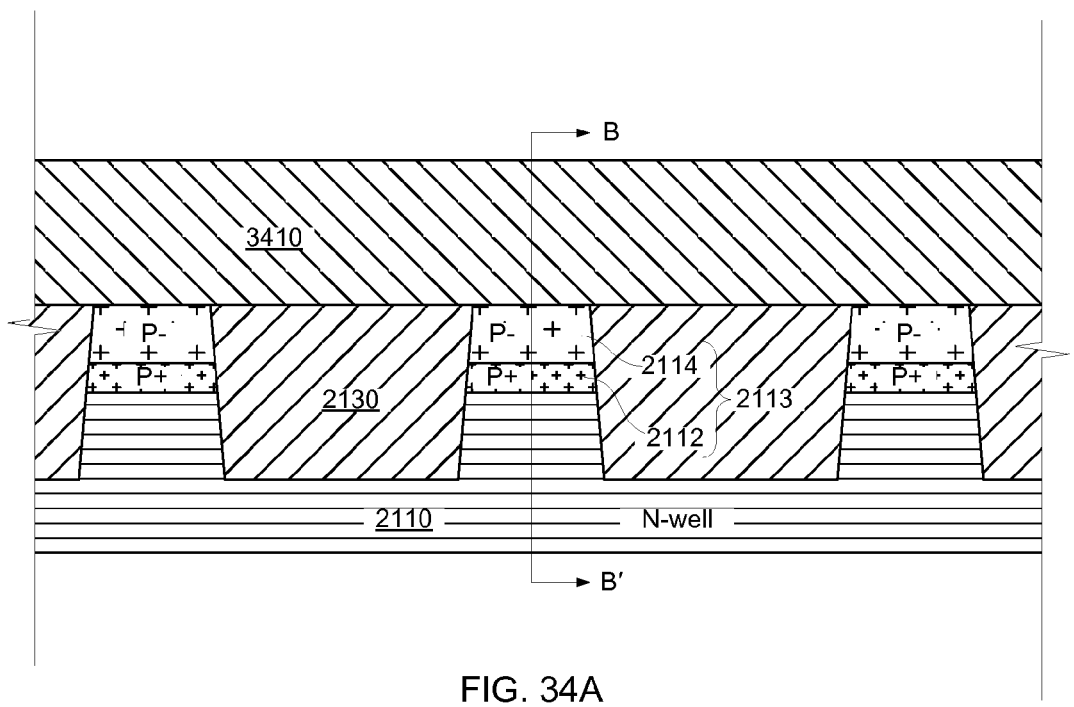
FIGS. 34A-39C are diagrammatic sketches showing stages in an embodiment of another process for making diode access devices such as are shown for example in FIGS. 26A, 26B.
Figure 34B:
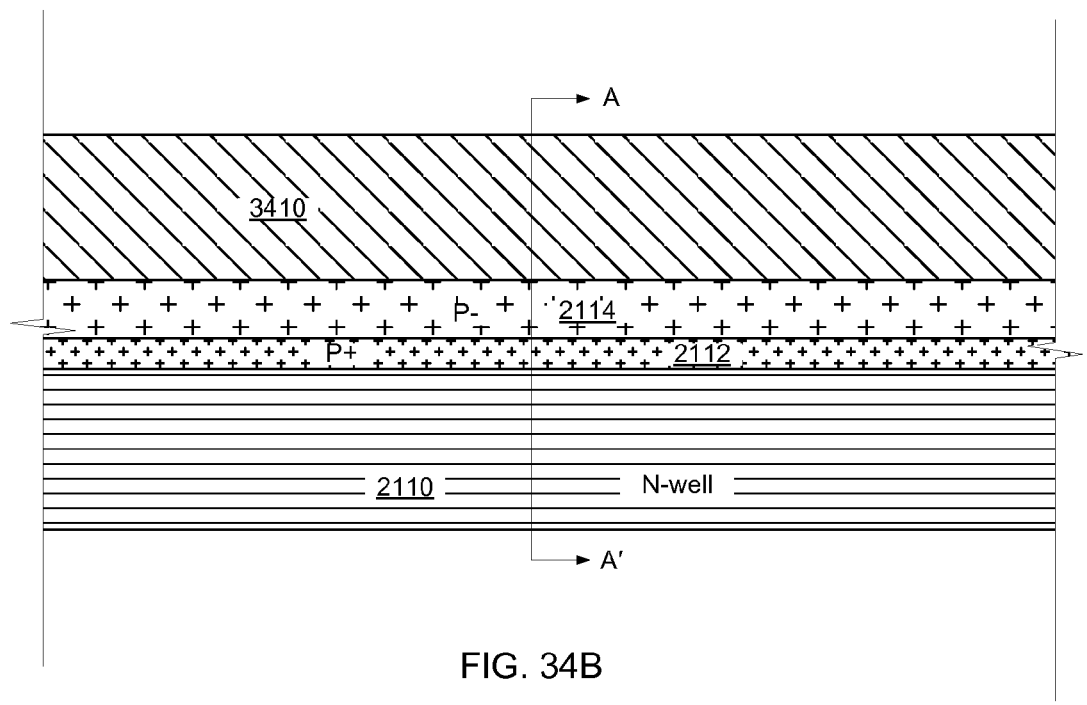

Thereafter, a layer of dielectric 3410 is formed on the structure shown in FIGS. 21A, 21B, 21C, resulting in the structure shown in FIGS. 34A, 34B, 34C.

Figure 35A:
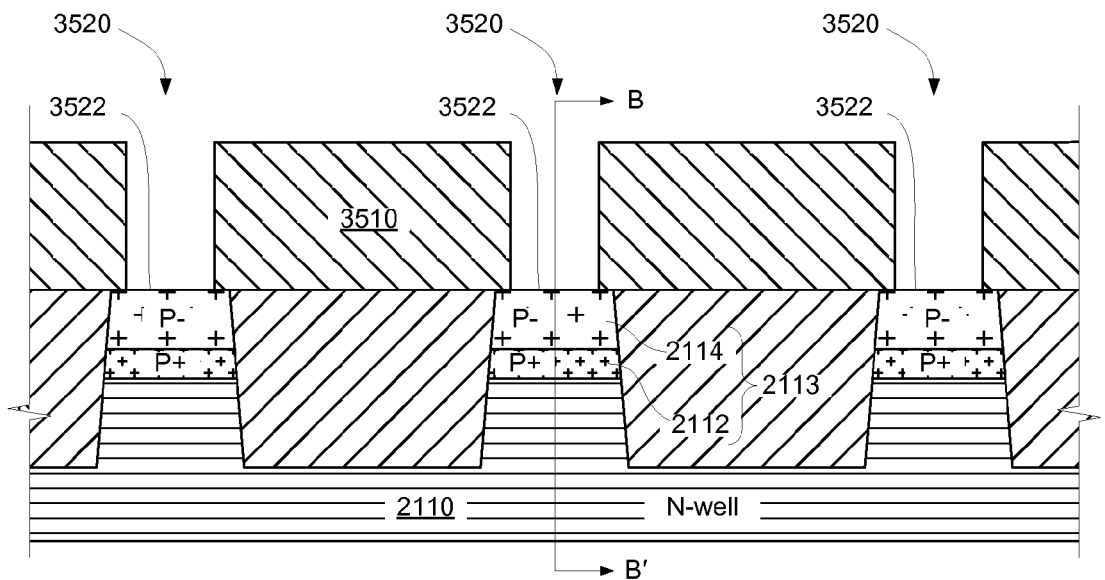
Figure 35B:
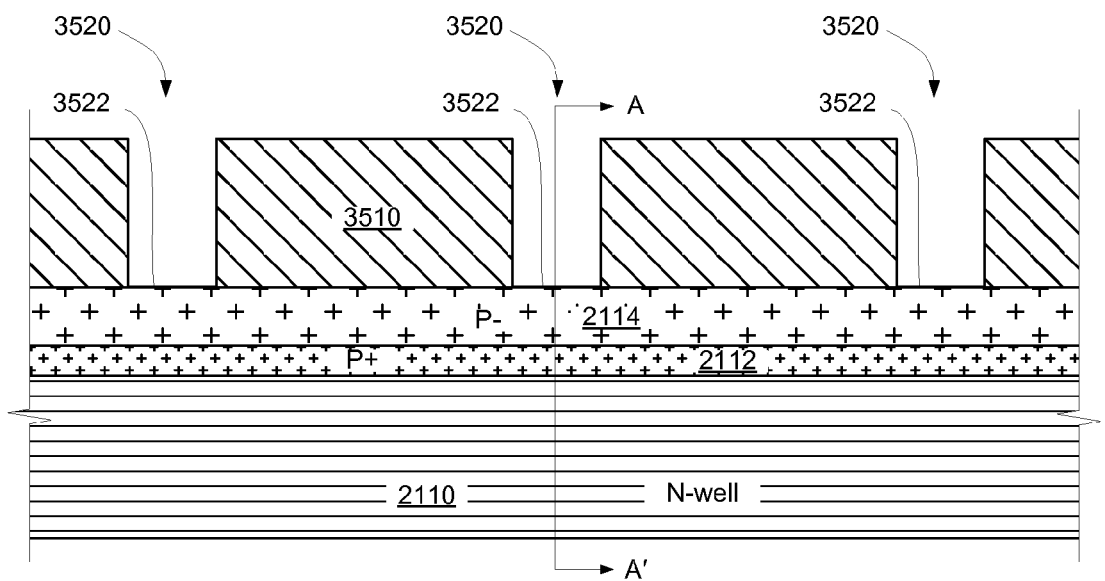
Figure 36:
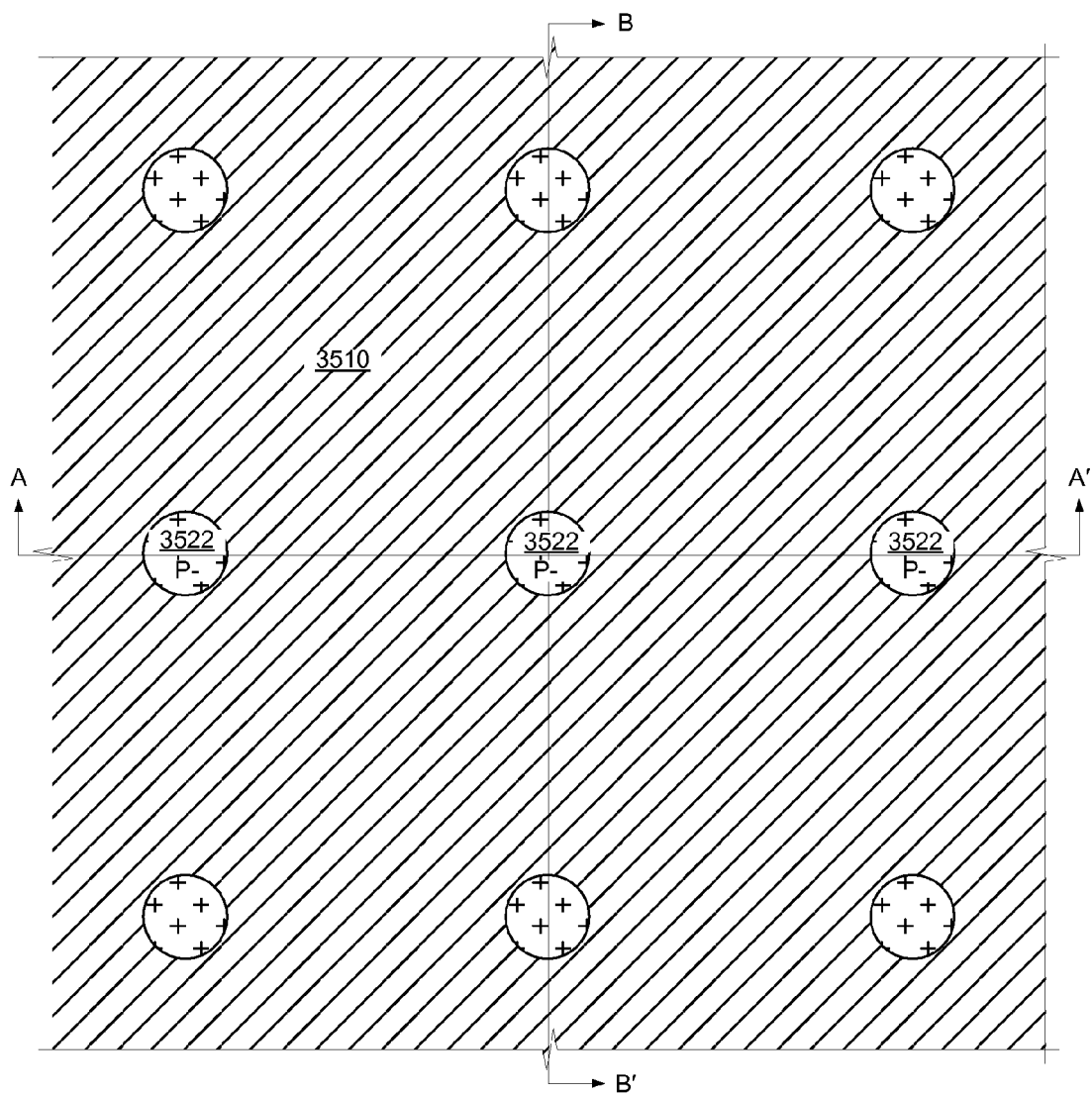

Thereafter, an array of openings 3520 are formed through the dielectric 3410 of the structure shown in FIGS. 34A, 34B, 34C to expose areas 3522 of the top surfaces of relatively lightly doped crystalline semiconductor material (2114, P–), resulting in the structure illustrated in FIGS. 35A, 35B, 36. The openings 3520 can be formed by a via etch technique.

Figure 37A:
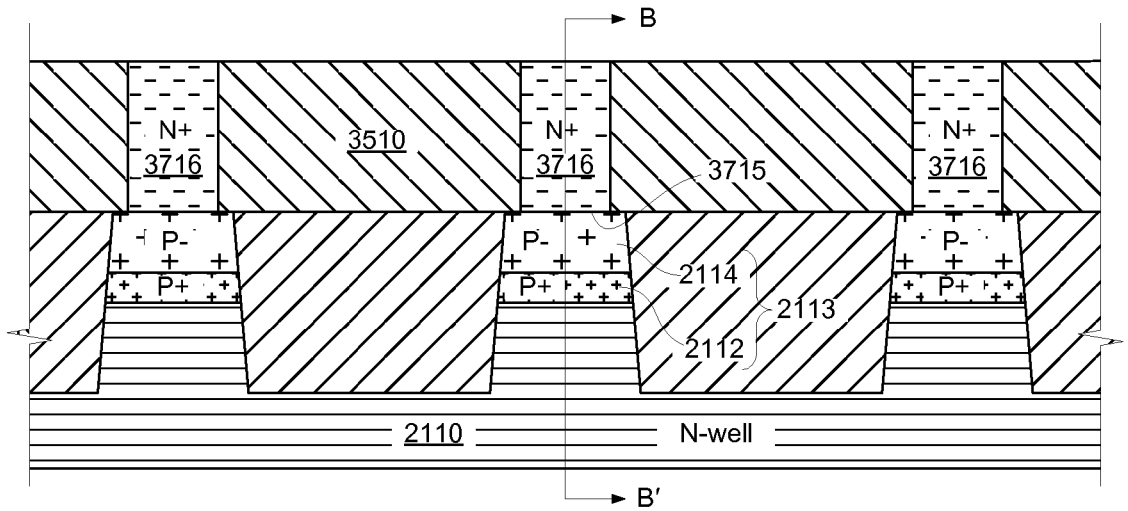
Figure 37B:
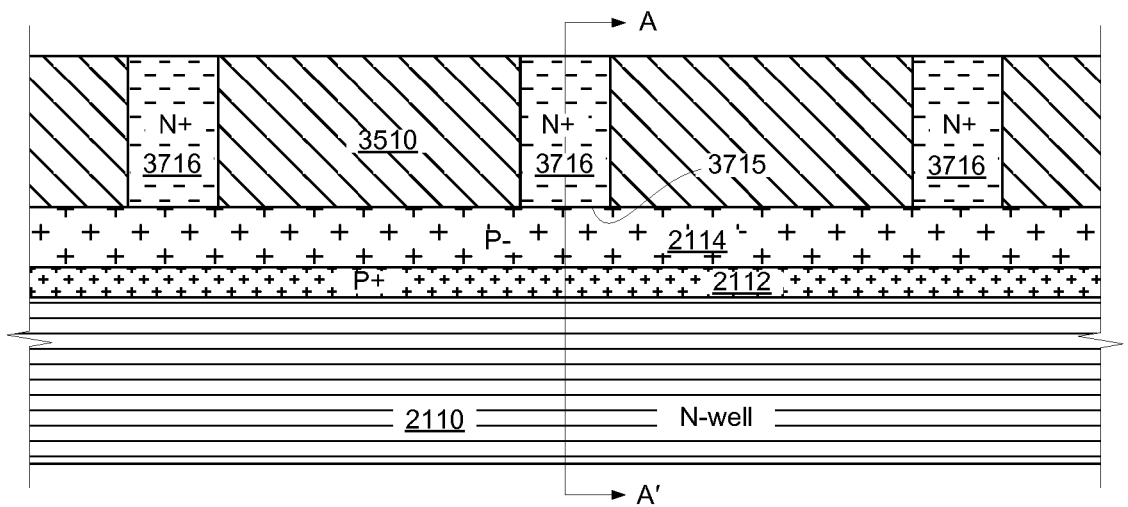
Figure 37C:
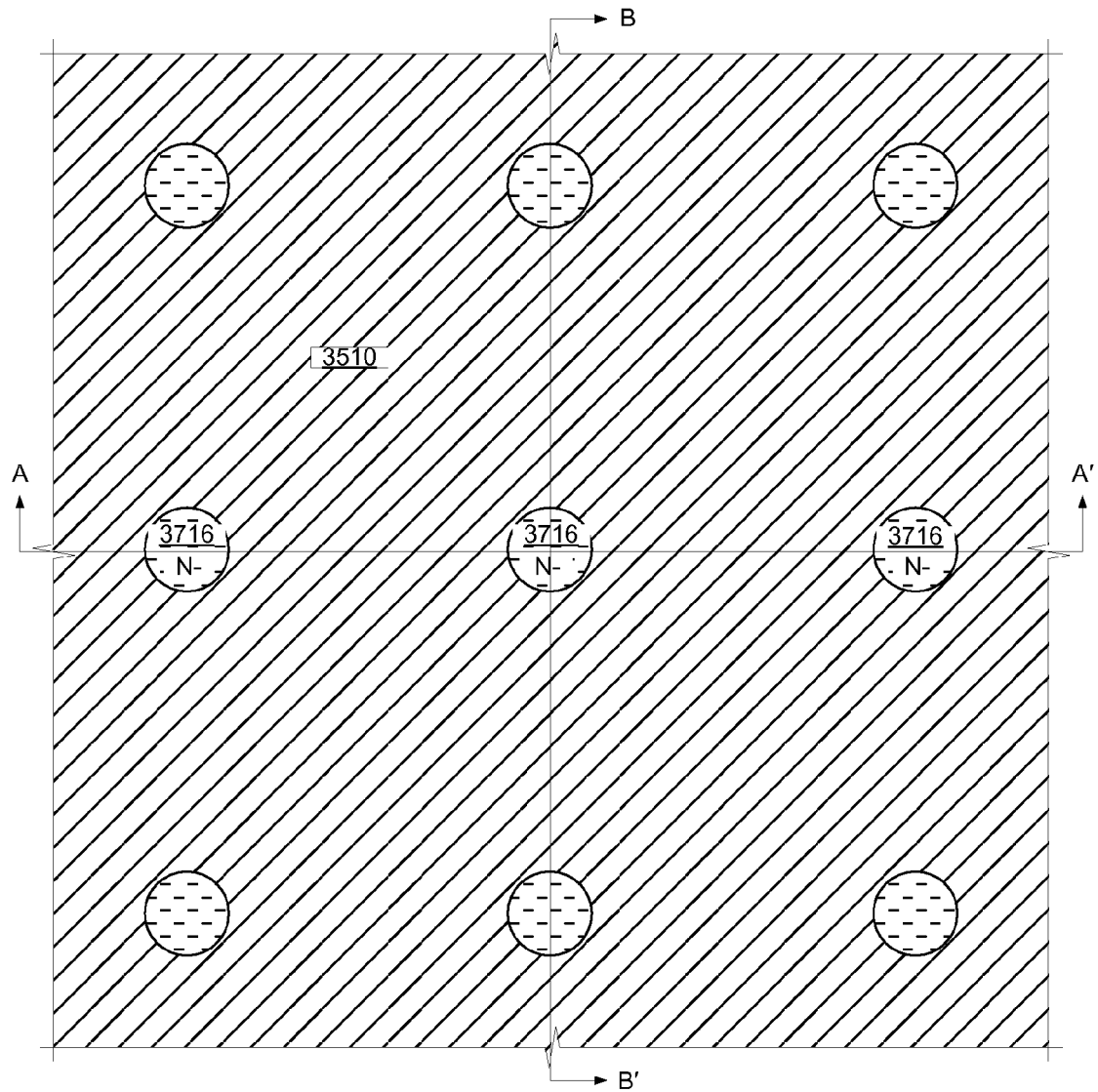

Thereafter, doped polysilicon plugs 3716 are formed in the openings 3520 of the structure shown in FIGS. 35A, 35B, 36, resulting in the structure shown in FIGS. 37A, 37B, 37C. The doped polysilicon plugs 3716 have a conductivity opposite that of the relatively lightly doped crystalline semiconductor material (2114, P–), and thus the plugs 3716 contact a corresponding lightly doped crystalline semiconductor material (2114, P–) to define a pn-junction 3715 therebetween. The doped polysilicon plugs 3716 may be formed by, for example, deposition of doped polysilicon material on the structure shown in FIGS. 35A, 35B, 36, followed by a planarization process such as Chemical Mechanical Polishing (CMP).

Where, optionally, a barrier layer is desired at the pn-junction, the layer can be formed by growing or depositing a dielectric layer on the exposed areas 3522 of the lightly-doped silicon layer 2114 prior to forming the polysilicon plugs 3716 in the openings 3520 through the dielectric 3510. A suitable barrier layer may be, for example, silicon dioxide ($SiO_2$) or a silicon oxynitride ($SiN_xO_y$); and it may be formed to a thickness in a range about 5-25 Angstroms, for example about 10 Angstroms.

Figure 38A:
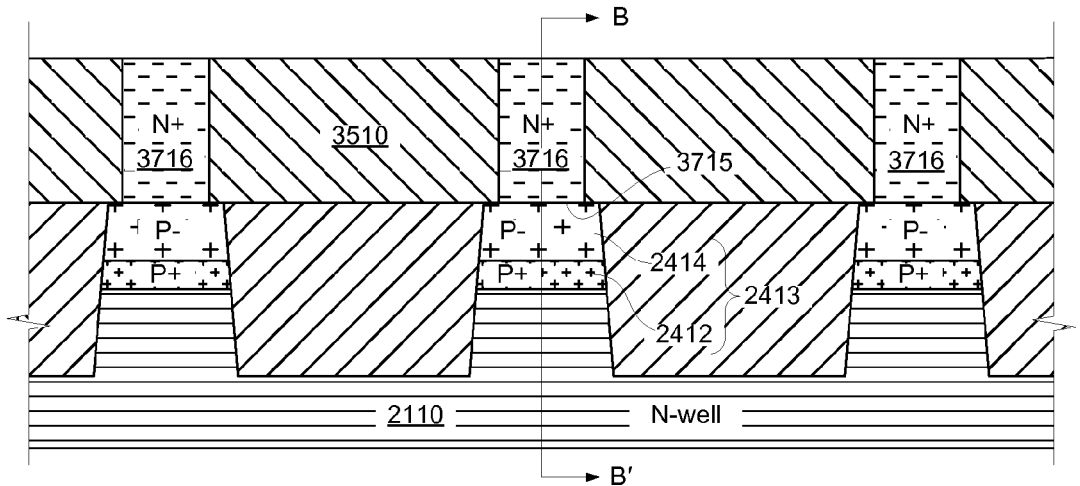
Figure 38B:
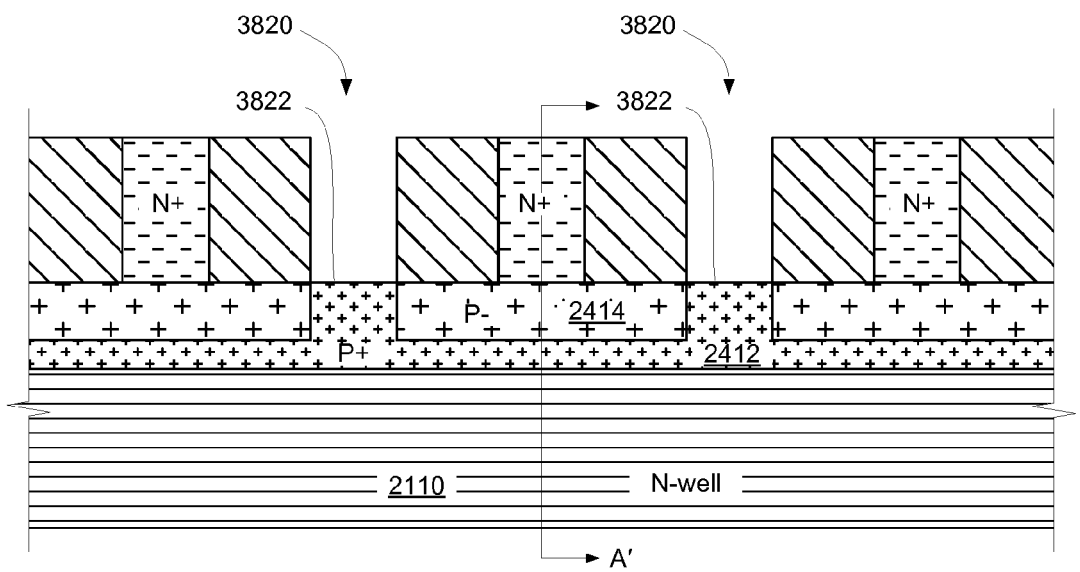
Figure 38C:
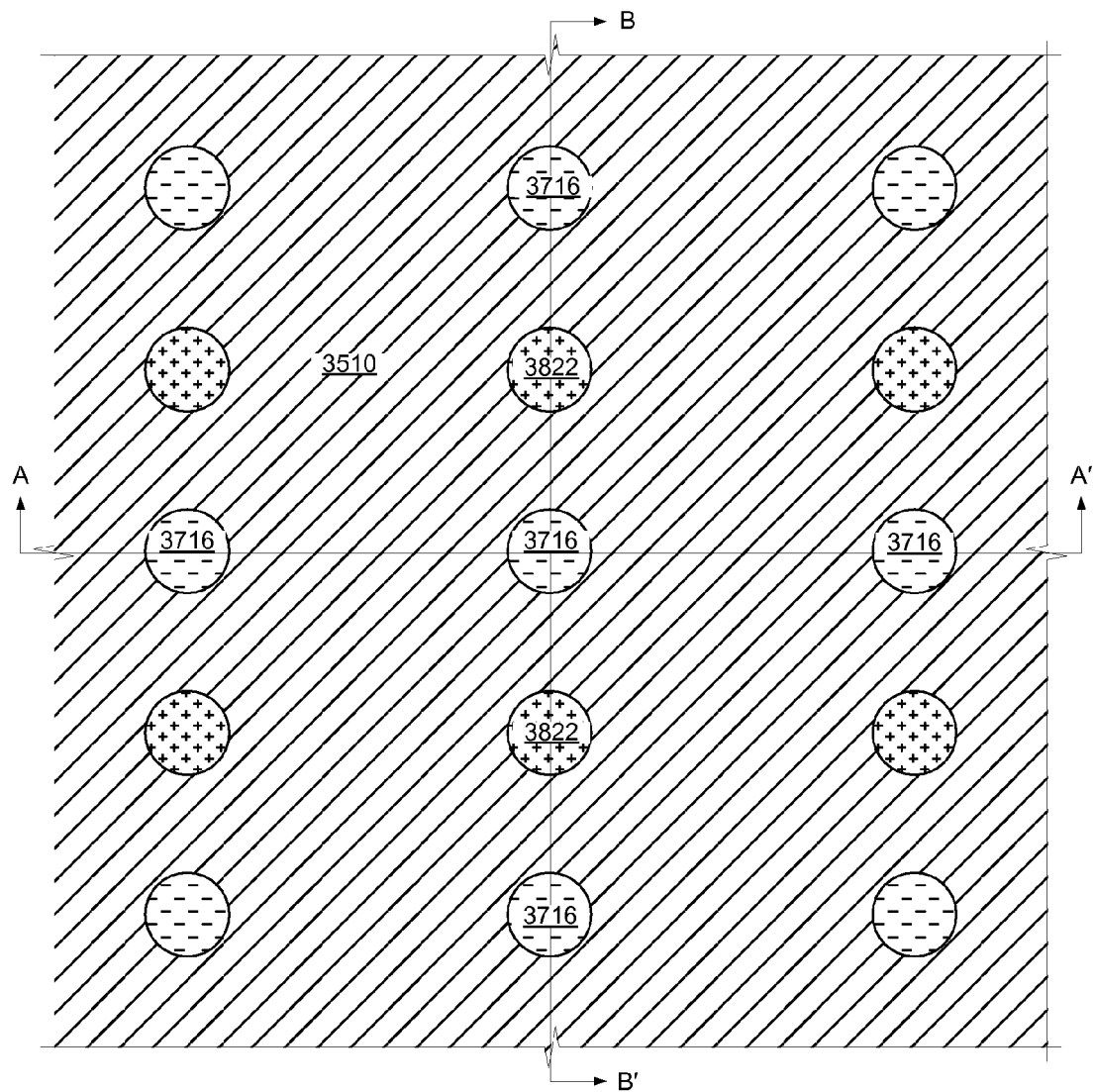

Optionally, a second array of openings 3820 are formed through the dielectric 3510 of the structure shown in FIGS. 37A, 37B, 37C to expose areas 3822 of the top surfaces of implanted relatively highly doped crystalline semiconductor material (2414, P+), resulting in the structure illustrated in FIGS. 38A, 38B, 38C. The openings 3820 can be formed by a via etch technique. Optionally, silicide may be formed on top of the material 2414. Alternatively, as mentioned above, contact openings 3820 are used only occasionally in the array, or at the periphery of the array.

Figure 39A:
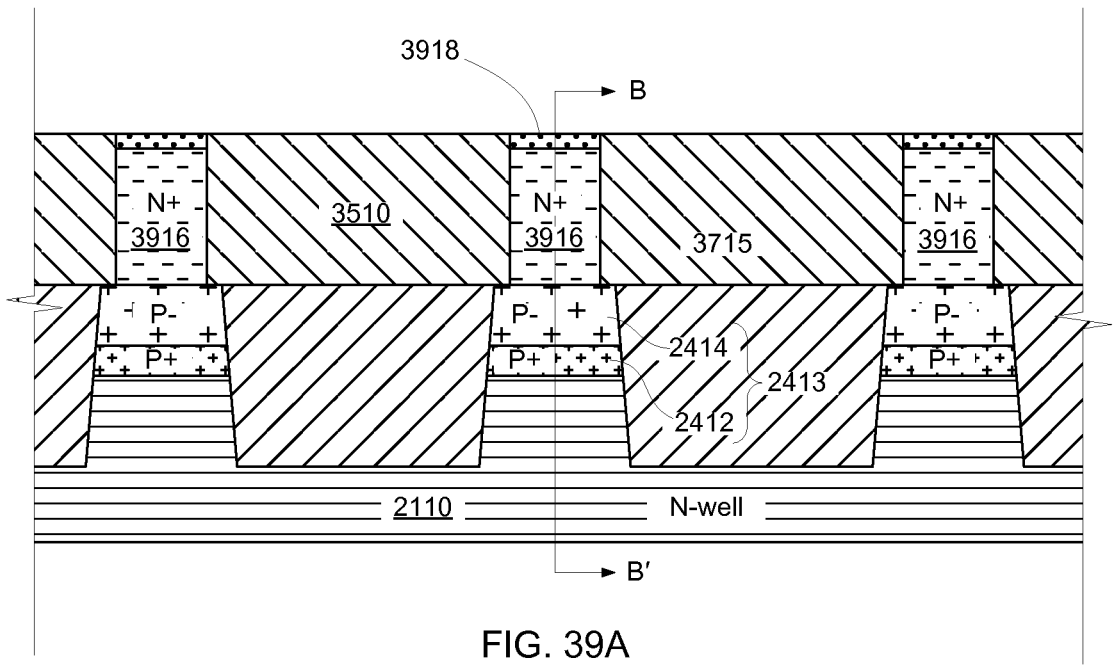
Figure 39B:
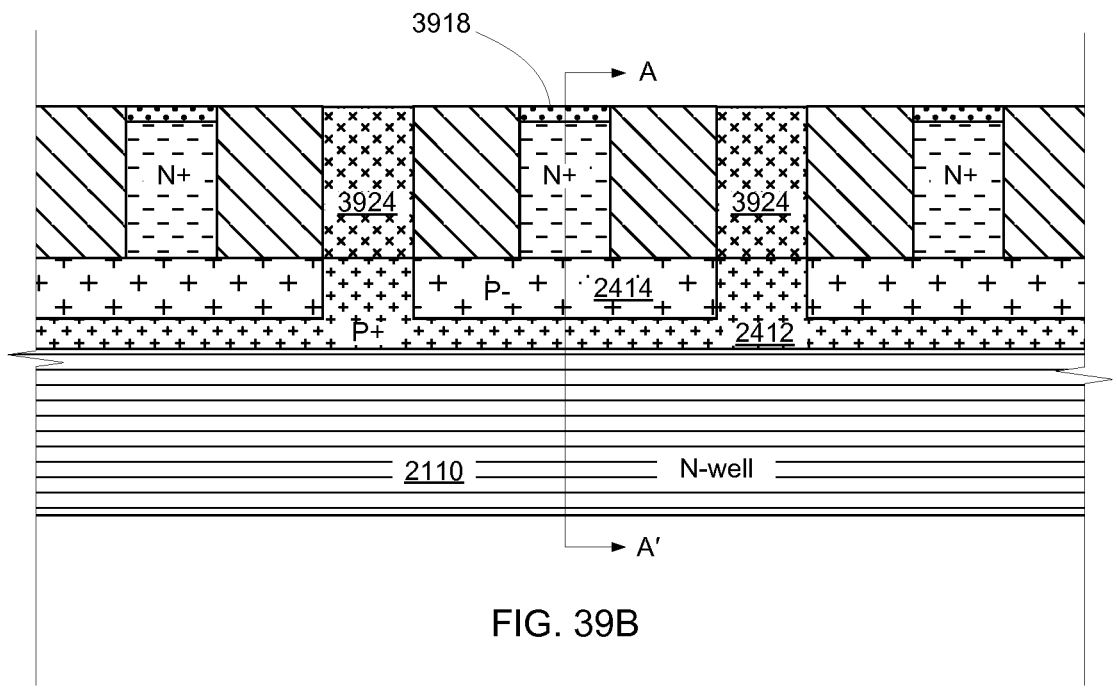
Figure 39C:
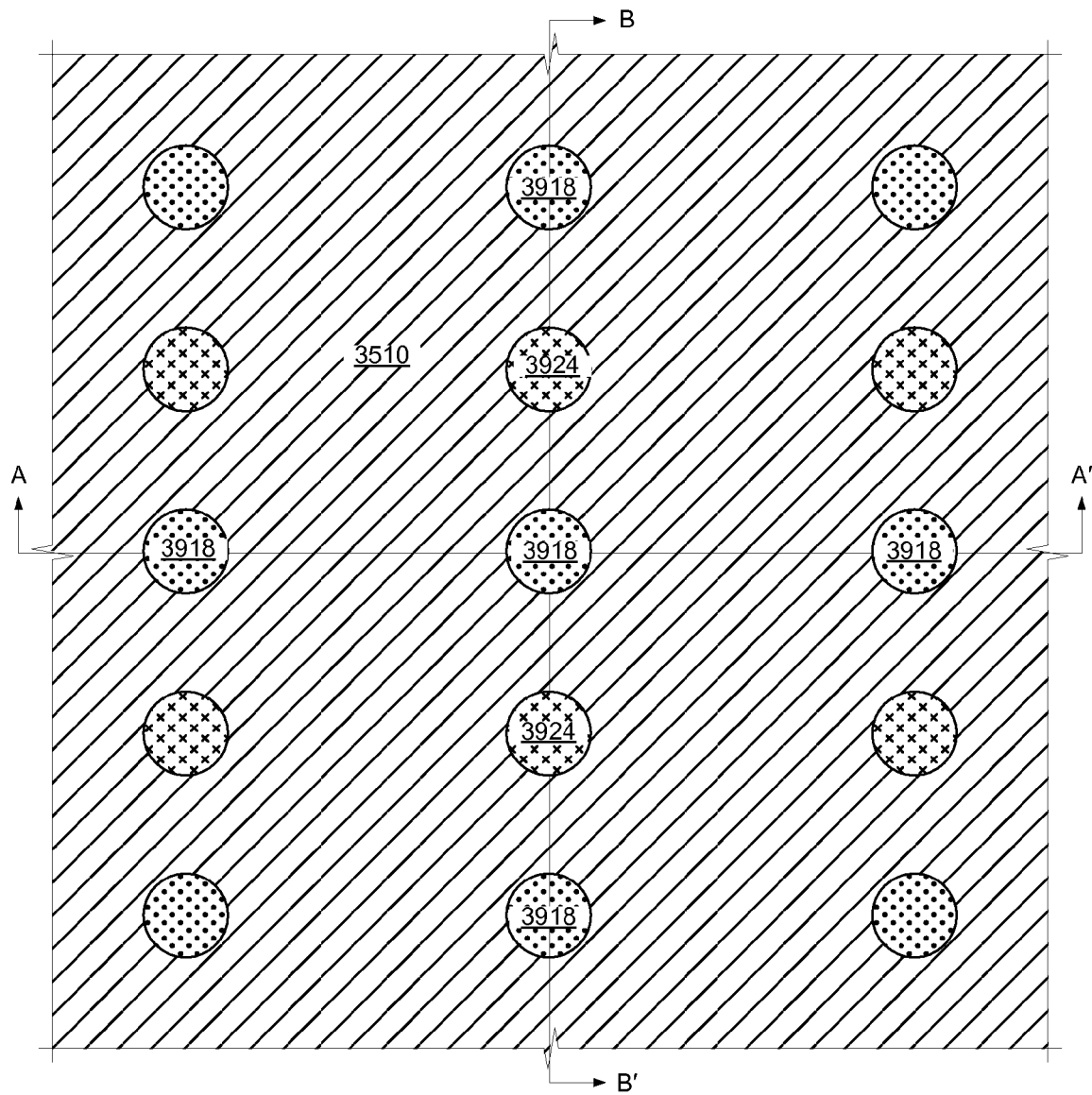

Conductive plugs 3924 are formed by depositing conductive material in the openings 3820 acting a vias through insulating layer 3510 in the structure illustrated in FIGS. 38A, 38B, 38C; and conductive caps 3918 are formed at the top surface of the doped polysilicon plugs 3716 resulting in the structure shown in FIGS. 39A, 39B, 39C. The resulting construct consists of pillars of relatively heavily doped polycrystalline material (plug 3916) overlain by cap 3918 upon the lightly-doped regions of the first diode region 2413 ridges; and conductive plugs 3924 providing for electrical connection at the diode construct surface to the heavily-doped regions 2412 of the first diode region 2413 ridges. The resulting diode structure (refer also to FIGS. 26A, 26B) is now ready for formation of overlying memory elements, as described in detail below.

FIGS. 40A-44C show stages in an embodiment of a process for forming memory elements over access diodes having an island-type second region, consisting of a patterned polysilicon body, that is self-aligned with the first diode region strip (as in FIGS. 7A, 7B).

Figure 40A:
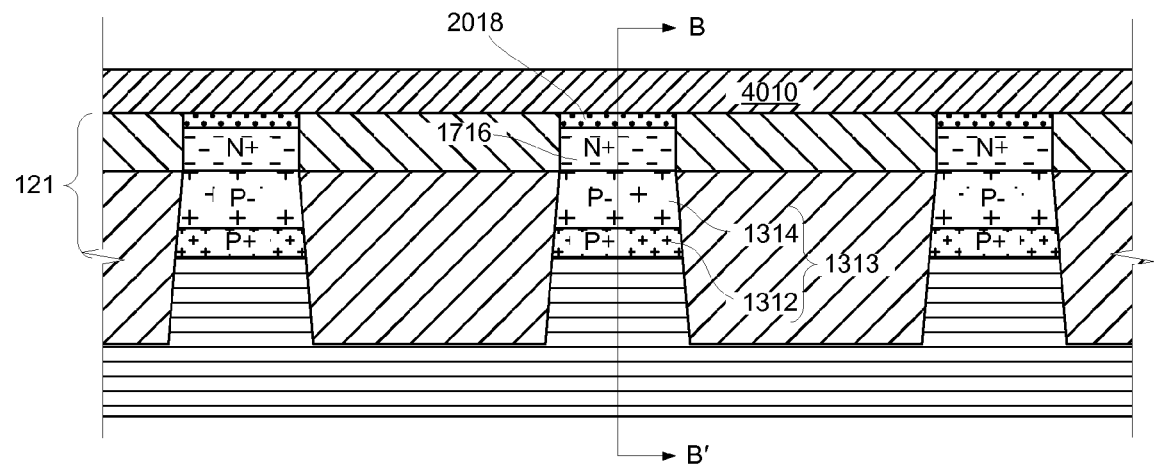
FIGS. 40A-44C are diagrammatic sketches showing stages in an embodiment of a process for forming memory elements over access diodes such as are shown in FIGS. 2A, 2B, 3, resulting in memory cell devices generally as illustrated in FIGS. 7A, 7B.
Figure 40B:
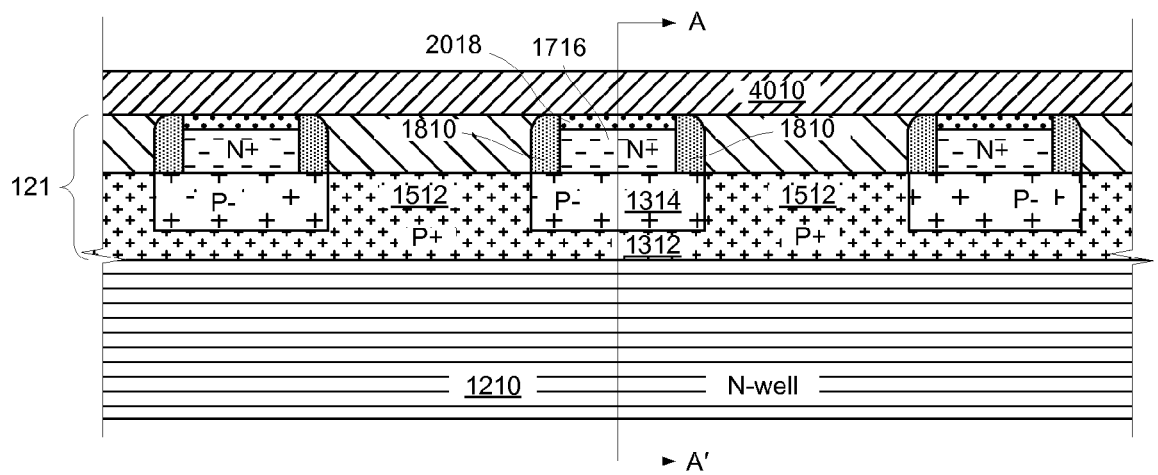

Beginning for example with a configuration as shown in FIGS. 20A, 20B, 20C, a dielectric layer 4010 is deposited over the caps 2018 at the tops of the relatively heavily-doped polysilicon islands 1716, resulting in a structure as shown in FIGS. 40A, 40B.

Figure 41A:
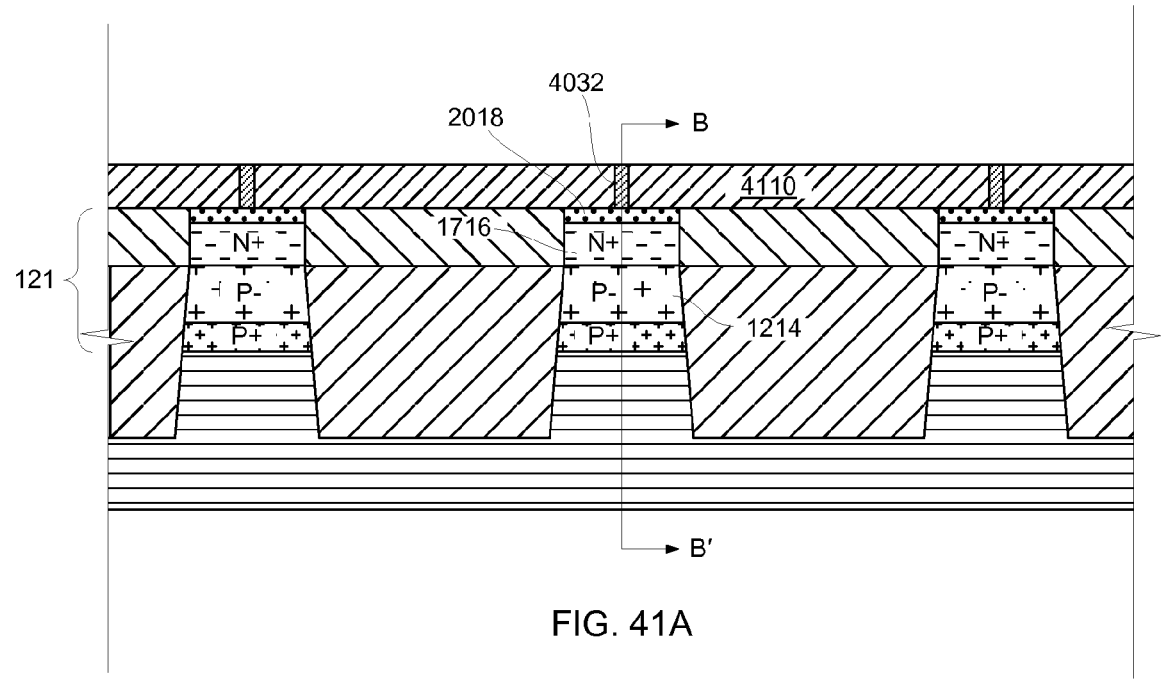
Figure 41B:
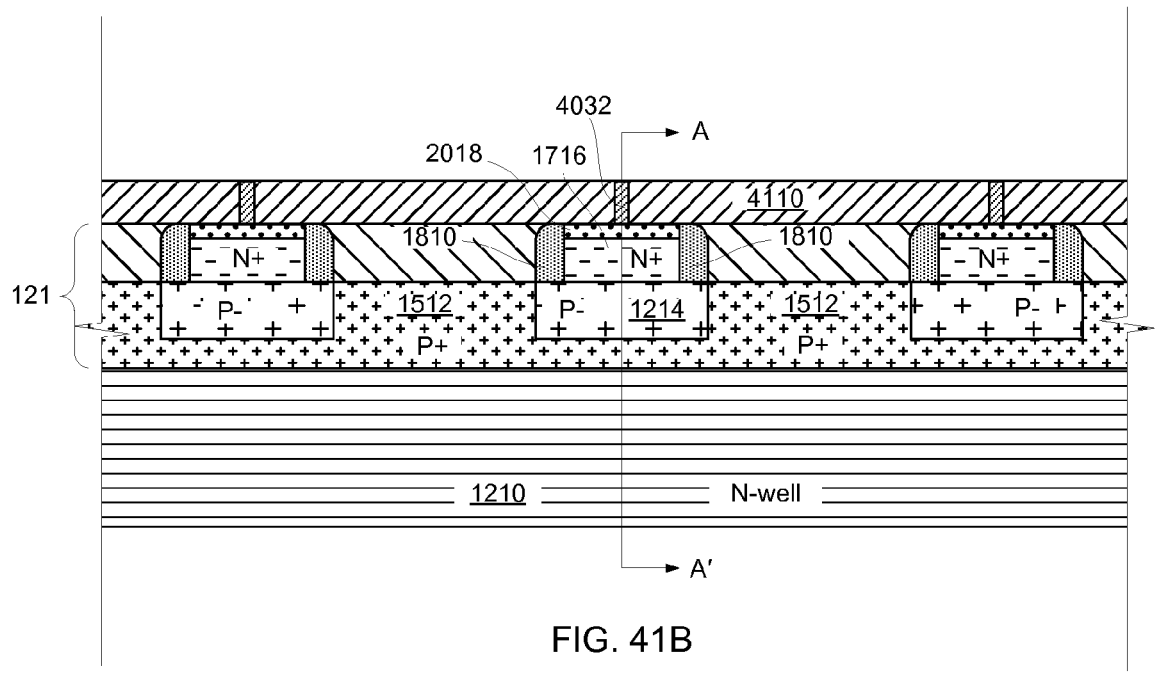
Figure 41C:
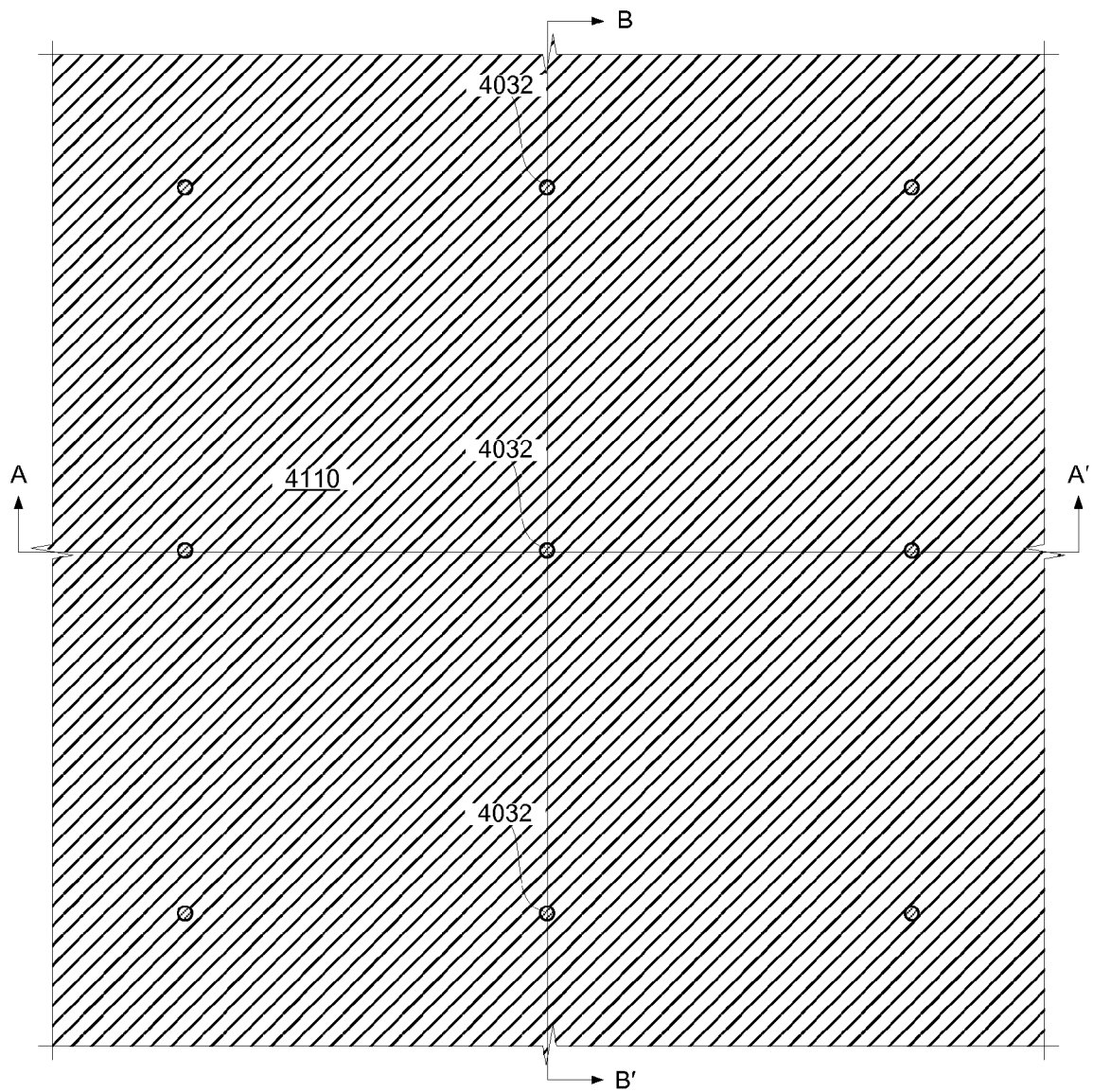

Thereafter, an array of pores are formed in the dielectric 4010, and the pores are filled with an electrode material to form bottom electrodes 4032, with the result shown in FIGS. 41A, 41B, 41C.

Figure 42A:
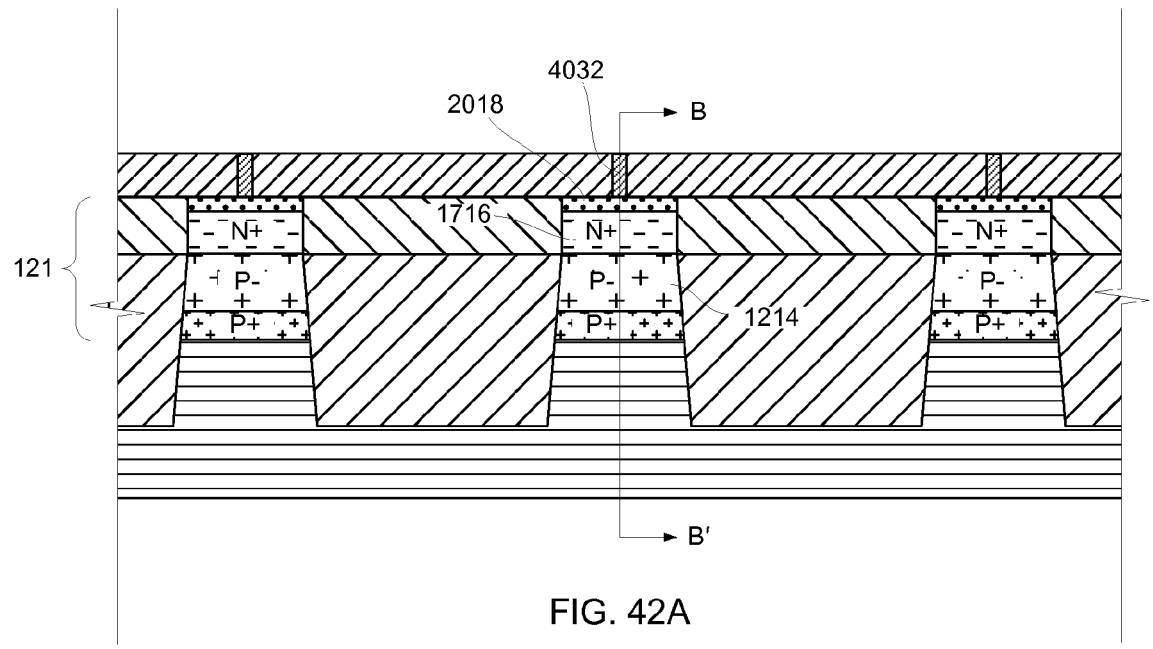
Figure 42B:
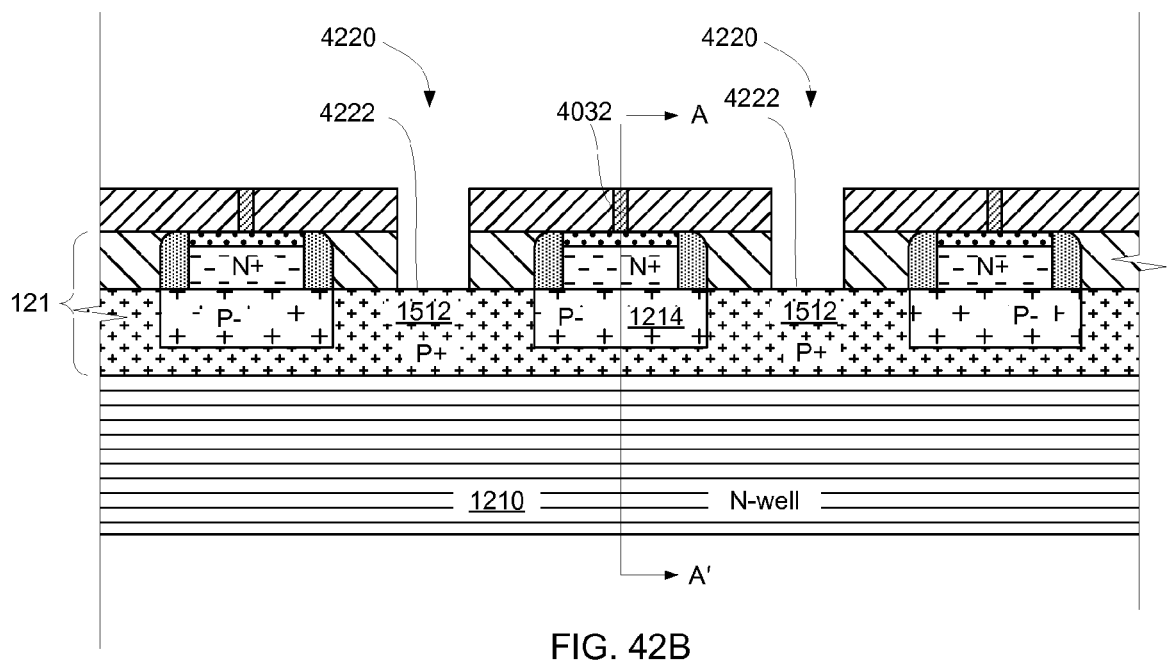
Figure 42C:
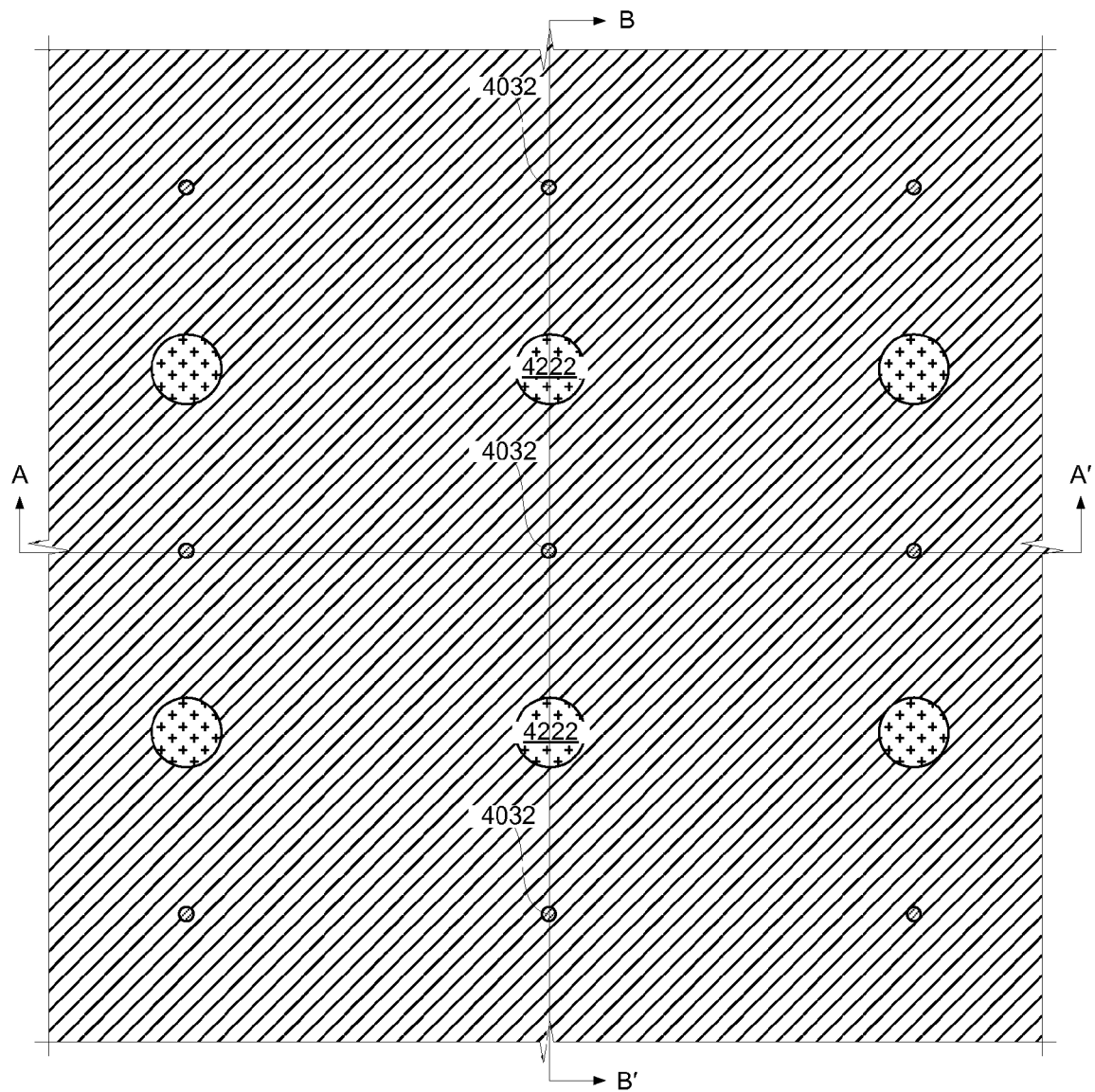

Thereafter, a second array of openings 4220 can be formed through the dielectric 4110 of the structure shown in FIGS. 41A, 41B, 41C to expose areas 4222 of the top surfaces of implanted relatively highly doped crystalline semiconductor material (1512, P+), resulting in the structure illustrated in FIGS. 42A, 42B, 42C. The openings 4220 can be formed by etching, for example.

Figure 43A:
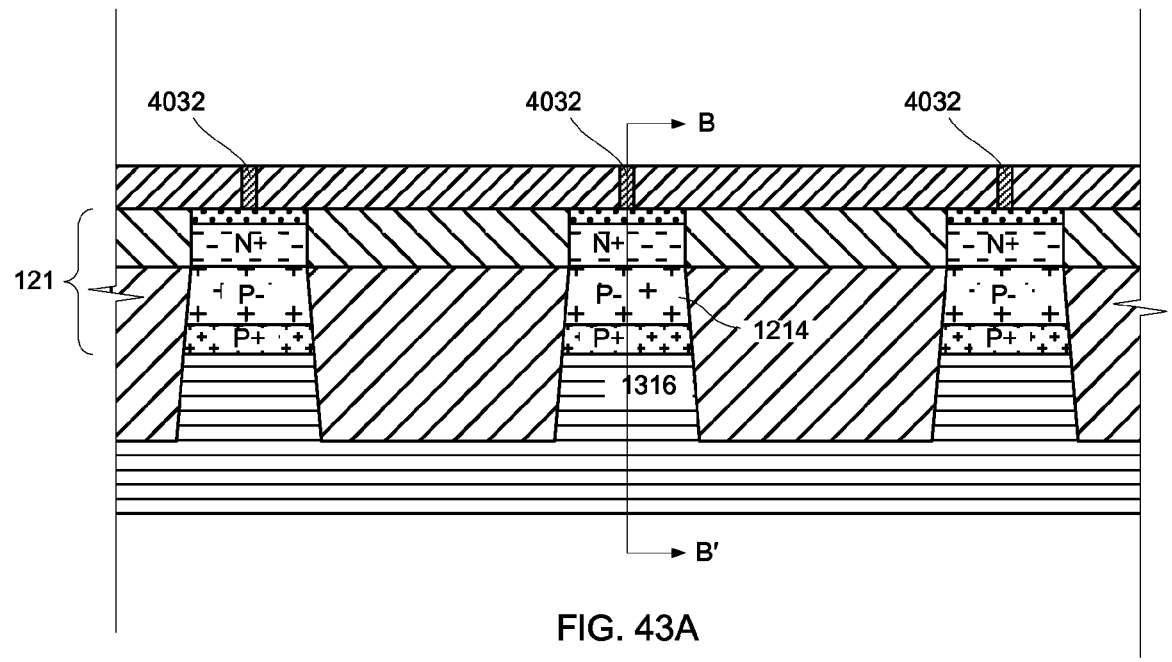
Figure 43B:
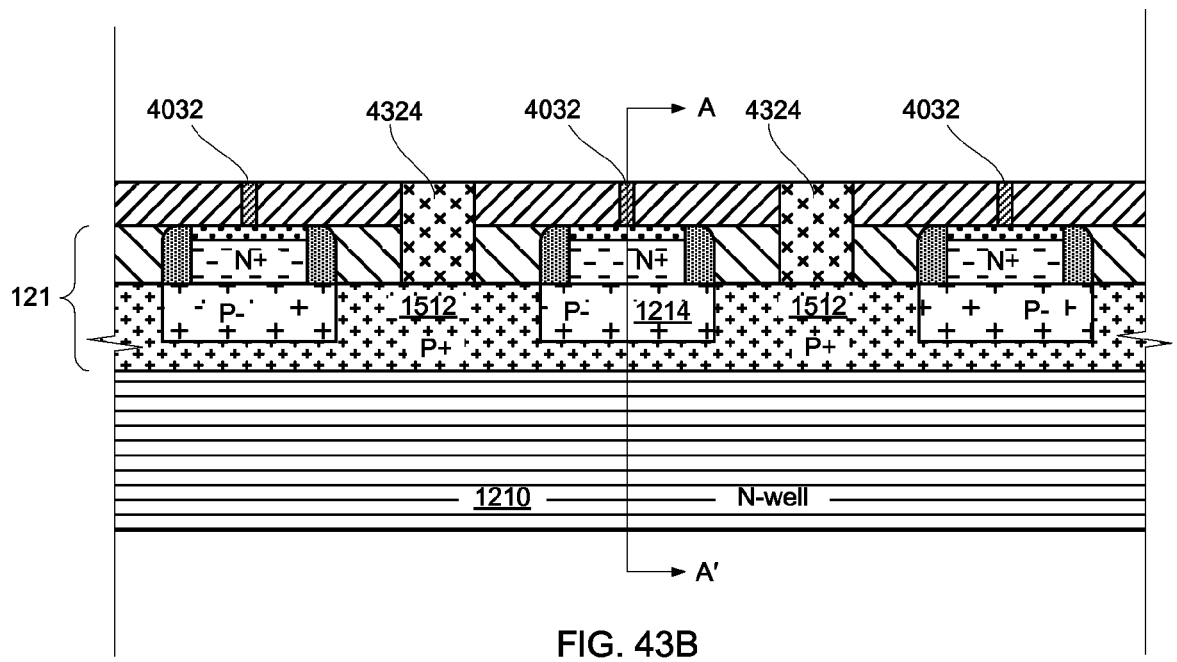
Figure 43C:
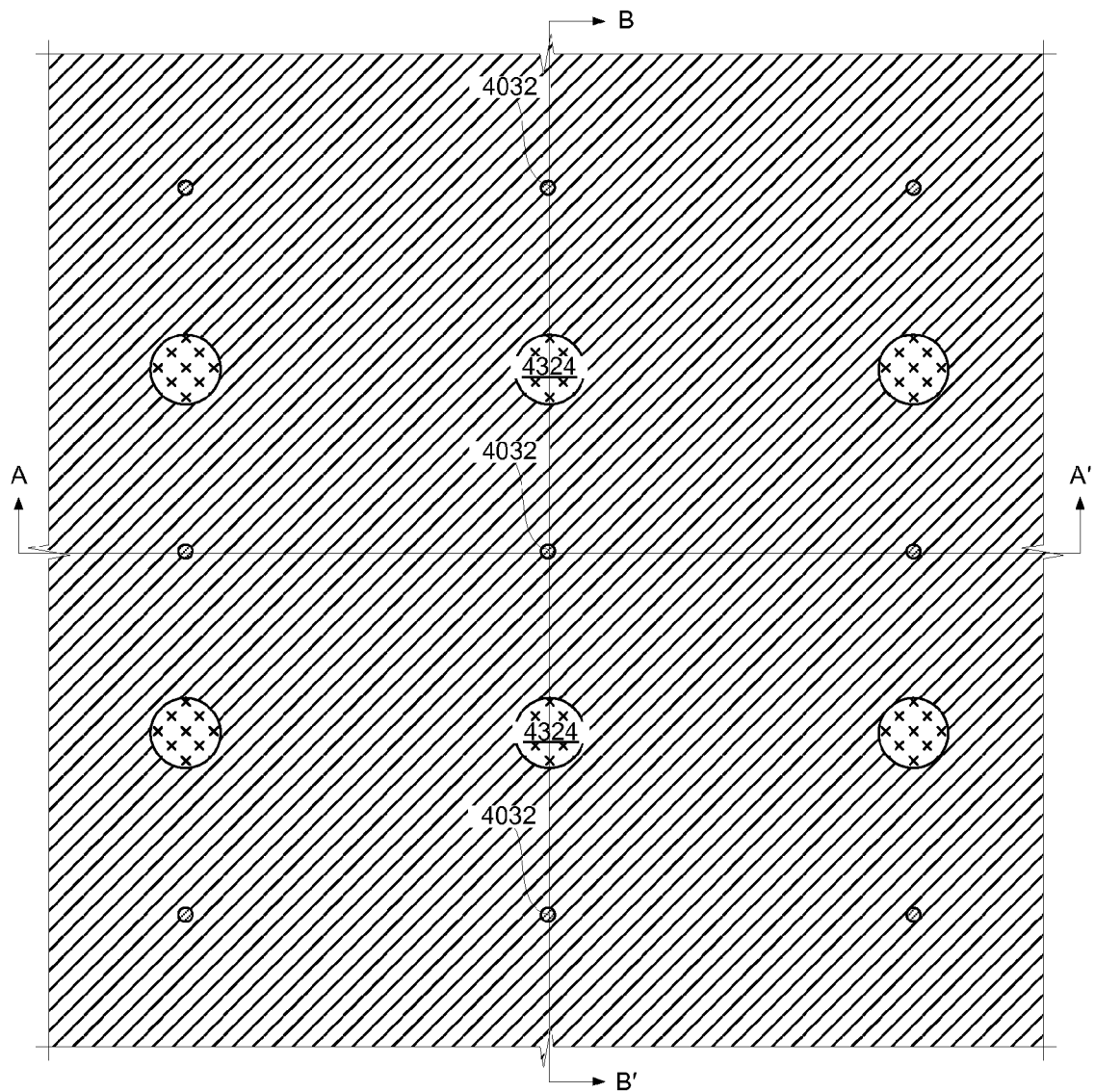

Thereafter, conductive plugs 4324 are formed by depositing conductive material in the openings 4220 in the structure illustrated in FIGS. 42A, 42B, 42C, resulting in the structure shown in FIGS. 43A, 43B, 43C. As mentioned above, the conductive plugs 4324 may be eliminated or used only occasionally is some embodiments.

Figure 44A:
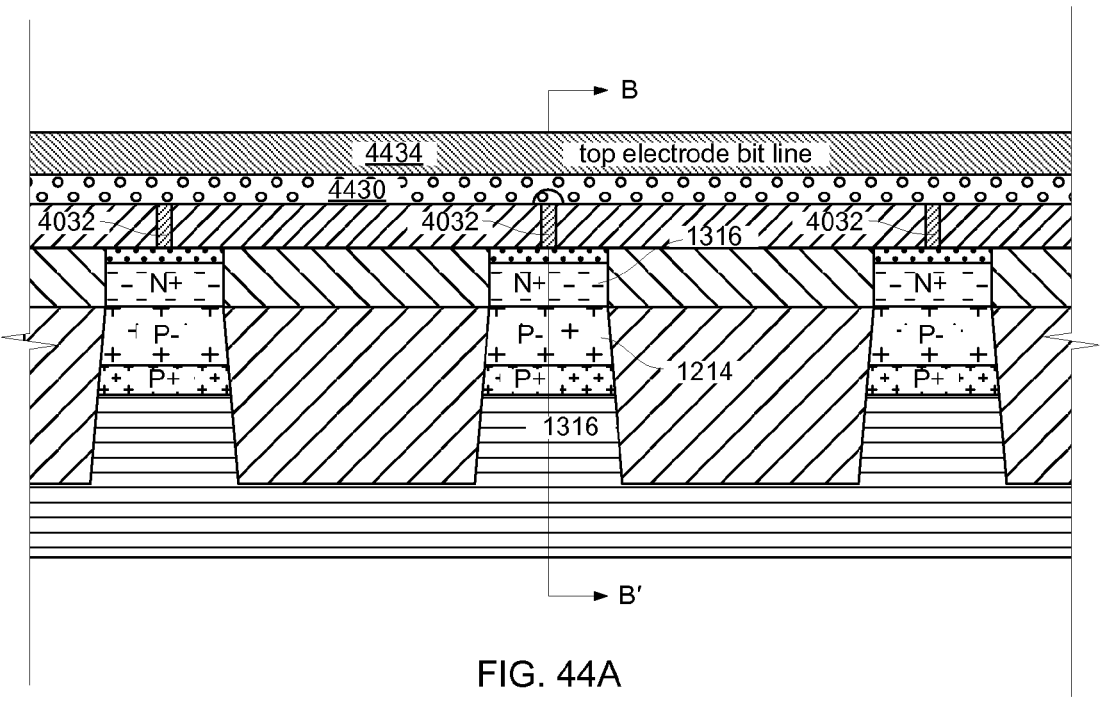
Figure 44B:
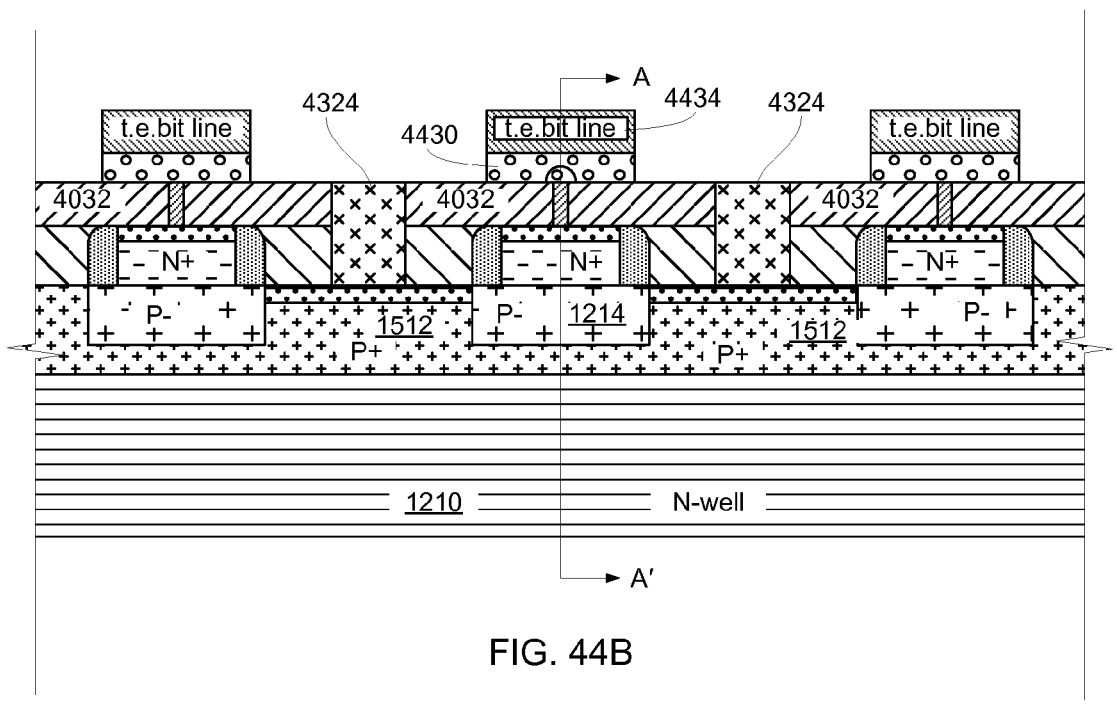
Figure 44C:
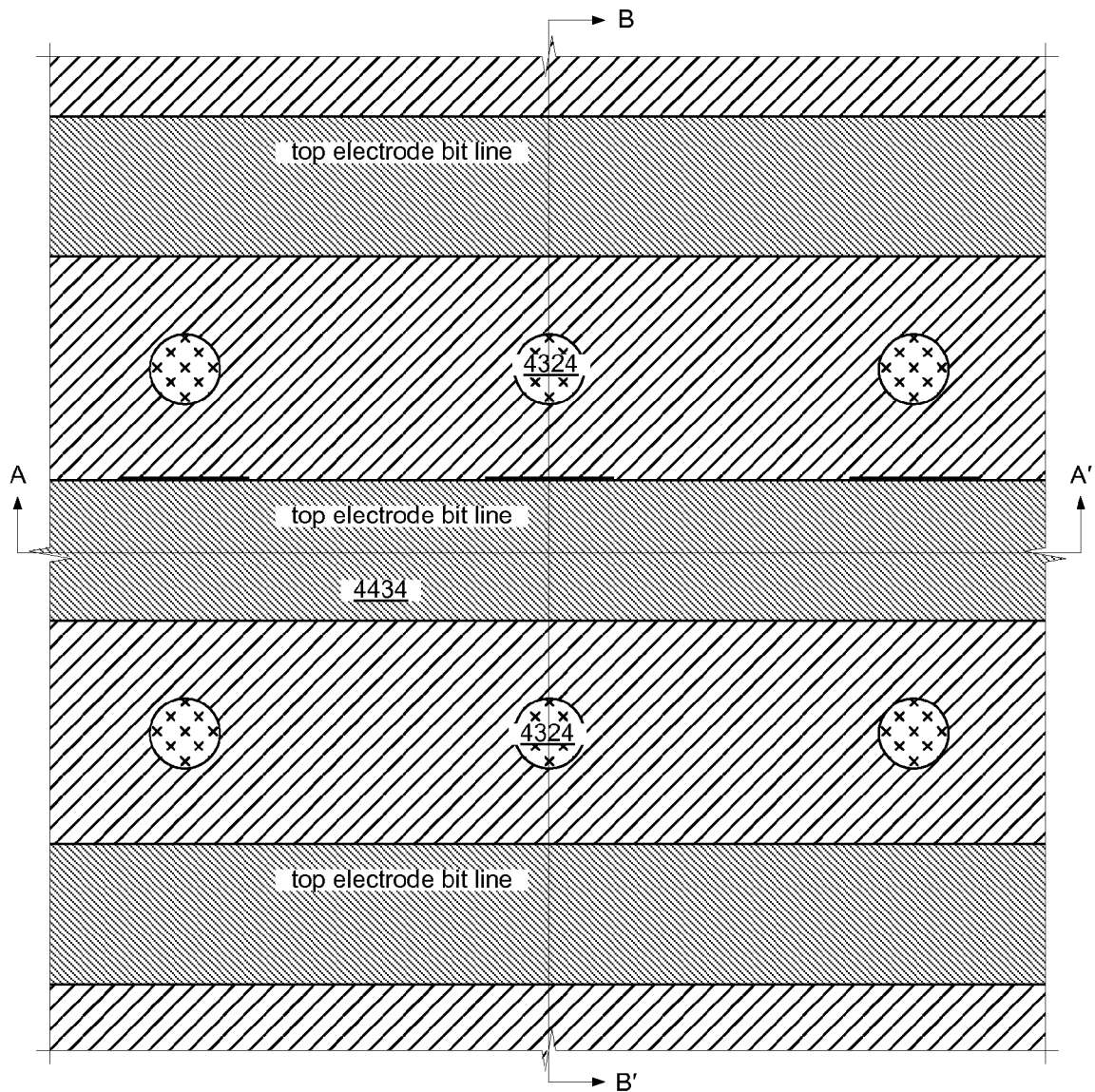

Thereafter, strips 4430 of memory material overlain by strips 4434 of top electrode material are formed over a construct as shown in FIGS. 43A, 43B, 43C, resulting in a structure as shown in FIG. 44A, 44B, 44C. The strips are arranged so that they traverse the rows of bottom electrodes 4032, and so that the memory material contacts the underlying bottom electrodes. In the example shown, the top electrode 4434 also serves as a bit line.

FIGS. 45A-50B show stages in an embodiment of a process for forming memory elements over access diodes having an island-type second region that is not self-aligned with the first diode region strip.

Figure 45A:
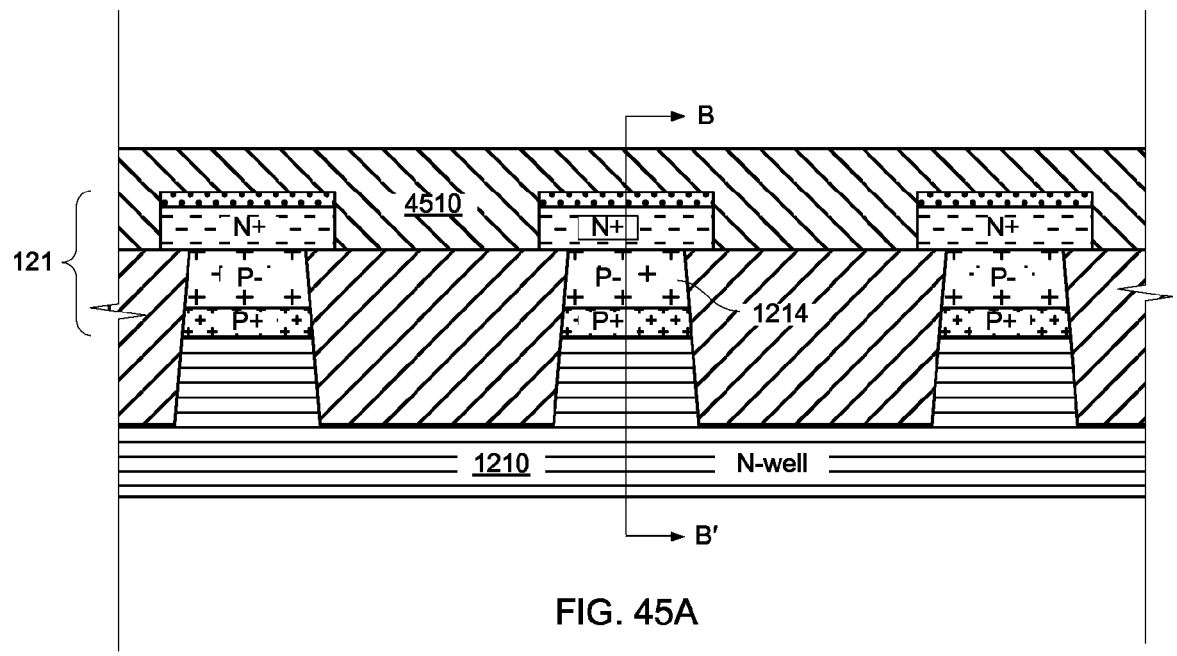
FIGS. 45A-50B are diagrammatic sketches showing stages in an embodiment of a process for forming memory elements over access diodes such as are shown in FIGS. 2A, 2B, 4, resulting in memory cell devices generally as illustrated in FIGS. 7A, 7B.
Figure 45B:
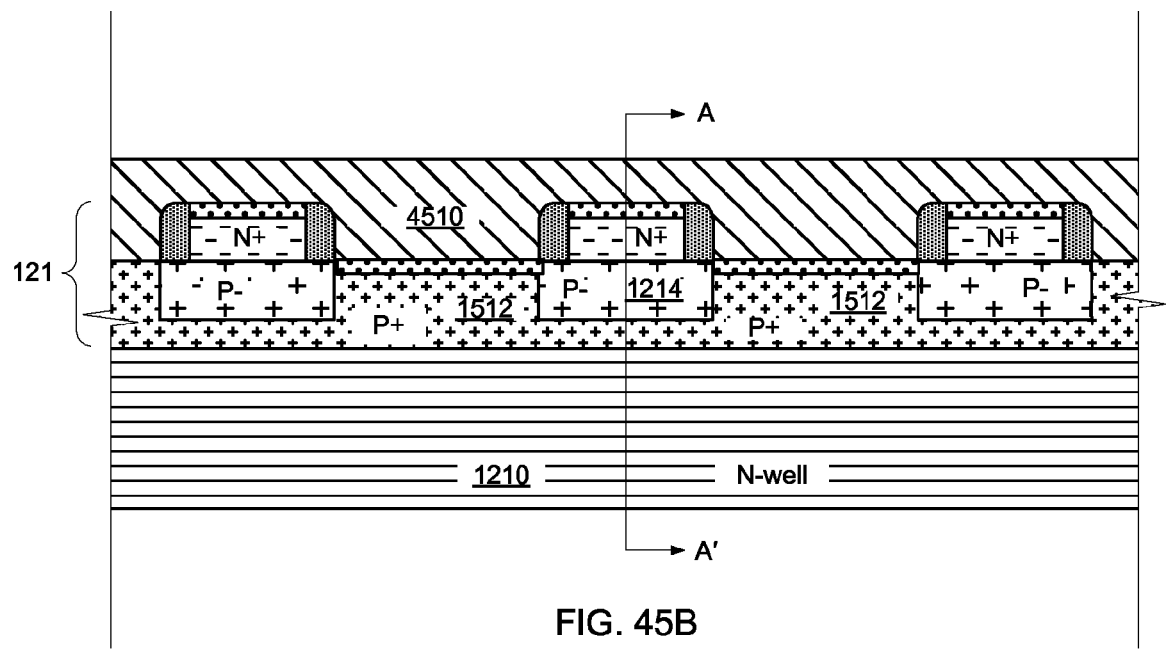

Beginning for example with a configuration as shown in FIGS. 25A, 25B, 25C, a dielectric layer 4510 is deposited over the caps 2518 (labeled in FIG. 25A) at the tops of the relatively heavily-doped polysilicon islands 1316, resulting in a structure as shown in FIGS. 45A, 45B.

Figure 46A:
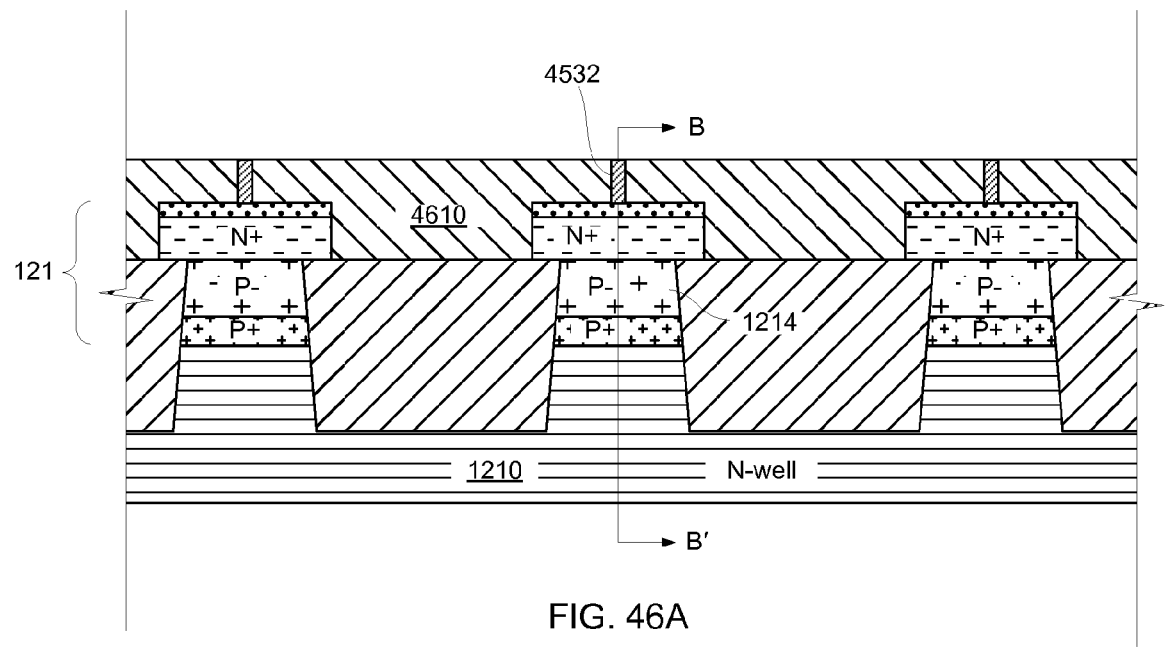
Figure 46B:
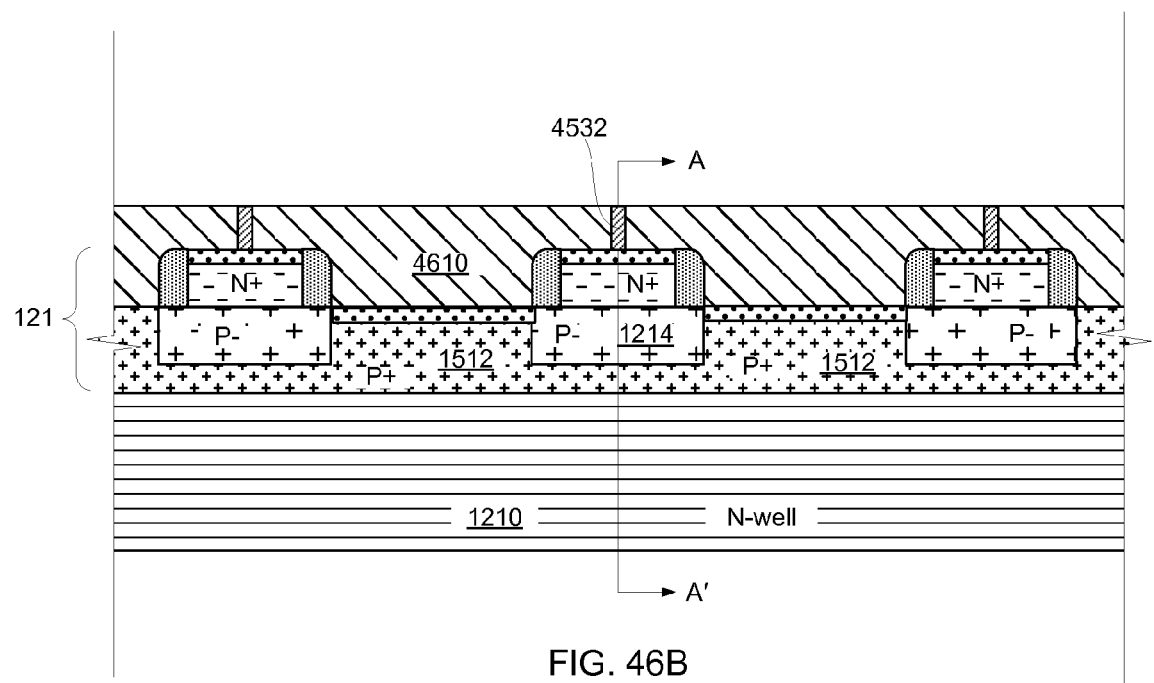
Figure 46C:
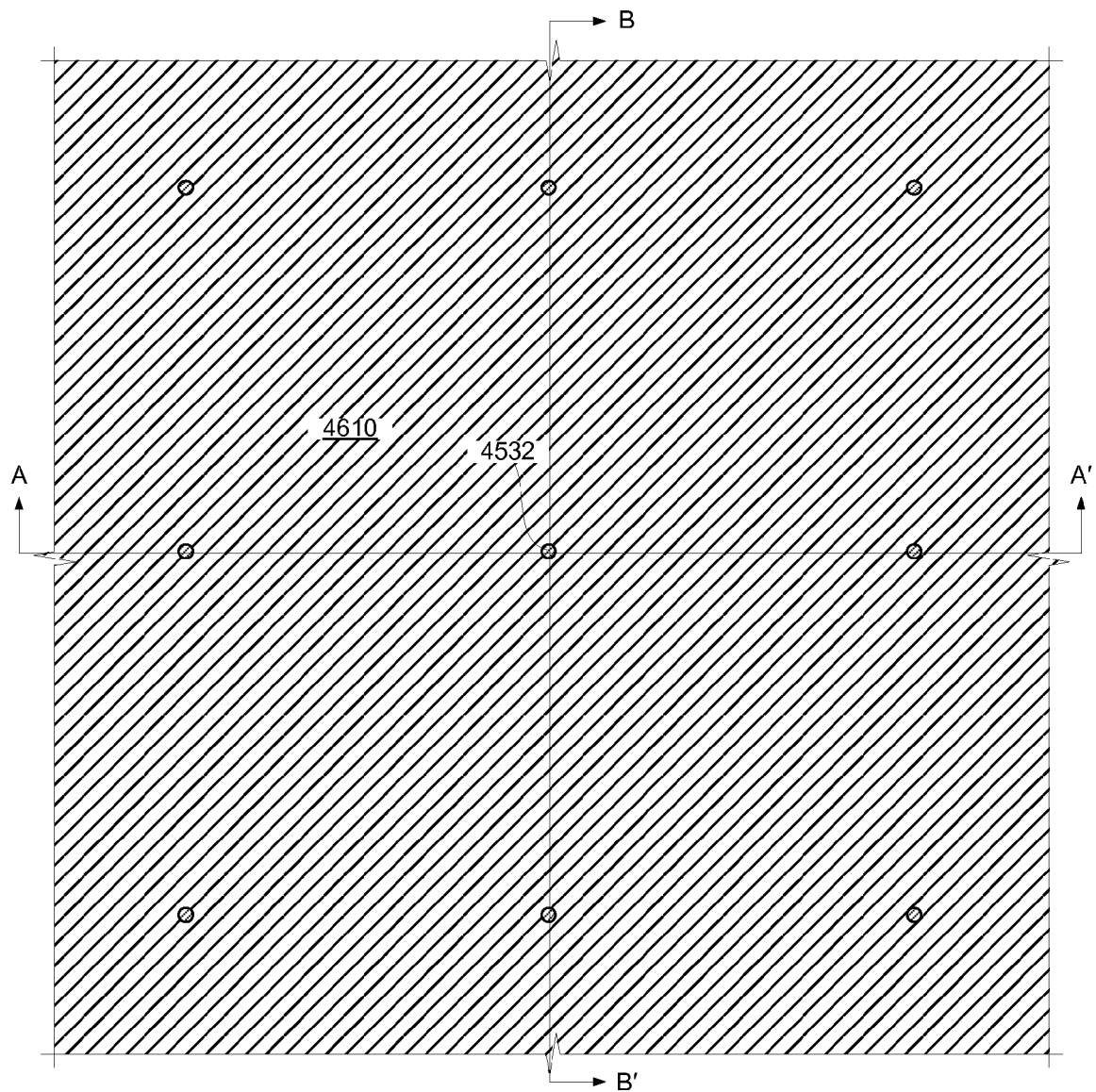

Thereafter, an array of pores are formed in the dielectric 4510, and the pores are filled with an electrode material to form bottom electrodes 4532, with the result shown in FIGS. 46A, 46B, 46C. As mentioned above, the conductive plugs 4724 may be eliminated or used only occasionally is some embodiments.

Figure 47A:
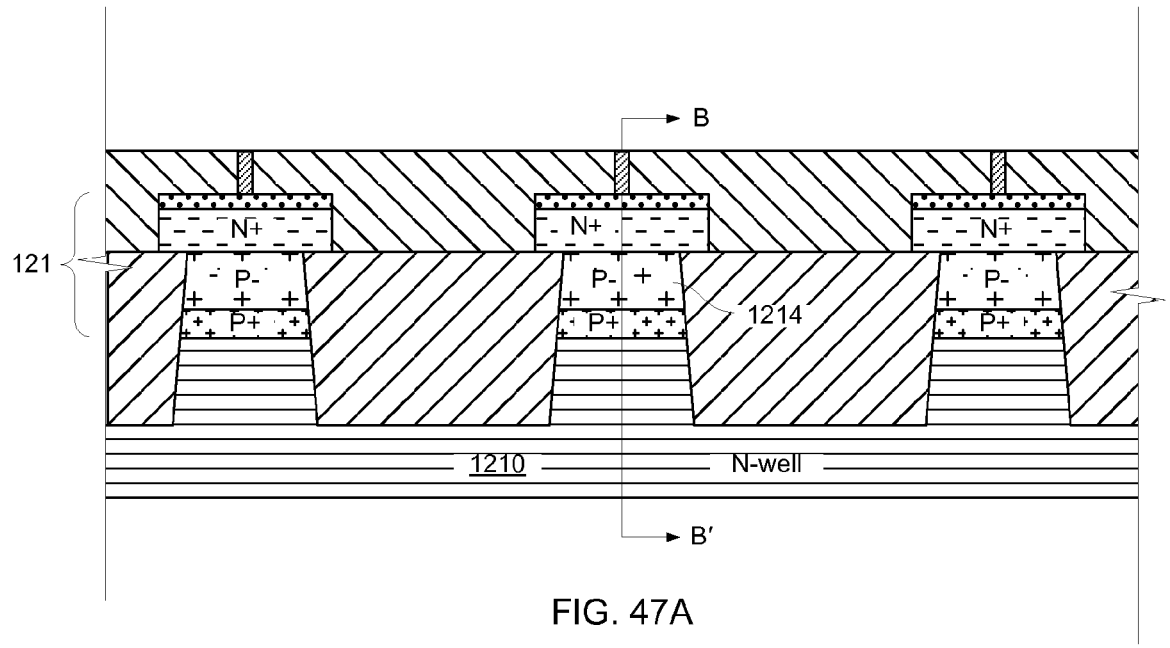
Figure 47B:
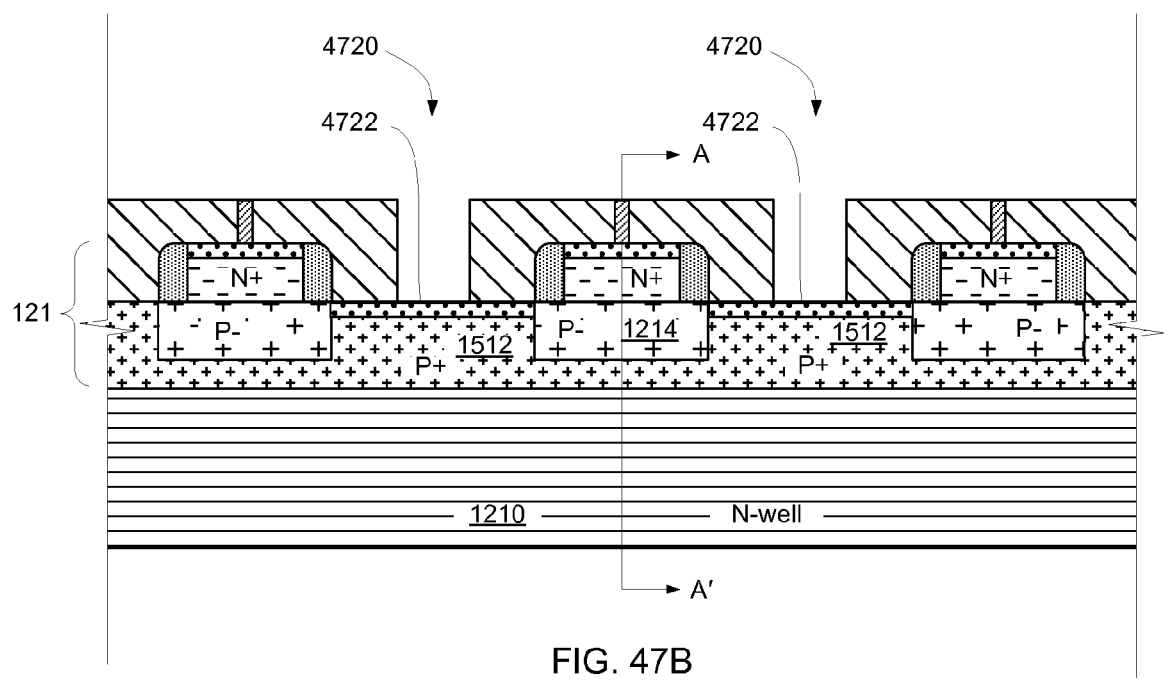
Figure 47C:
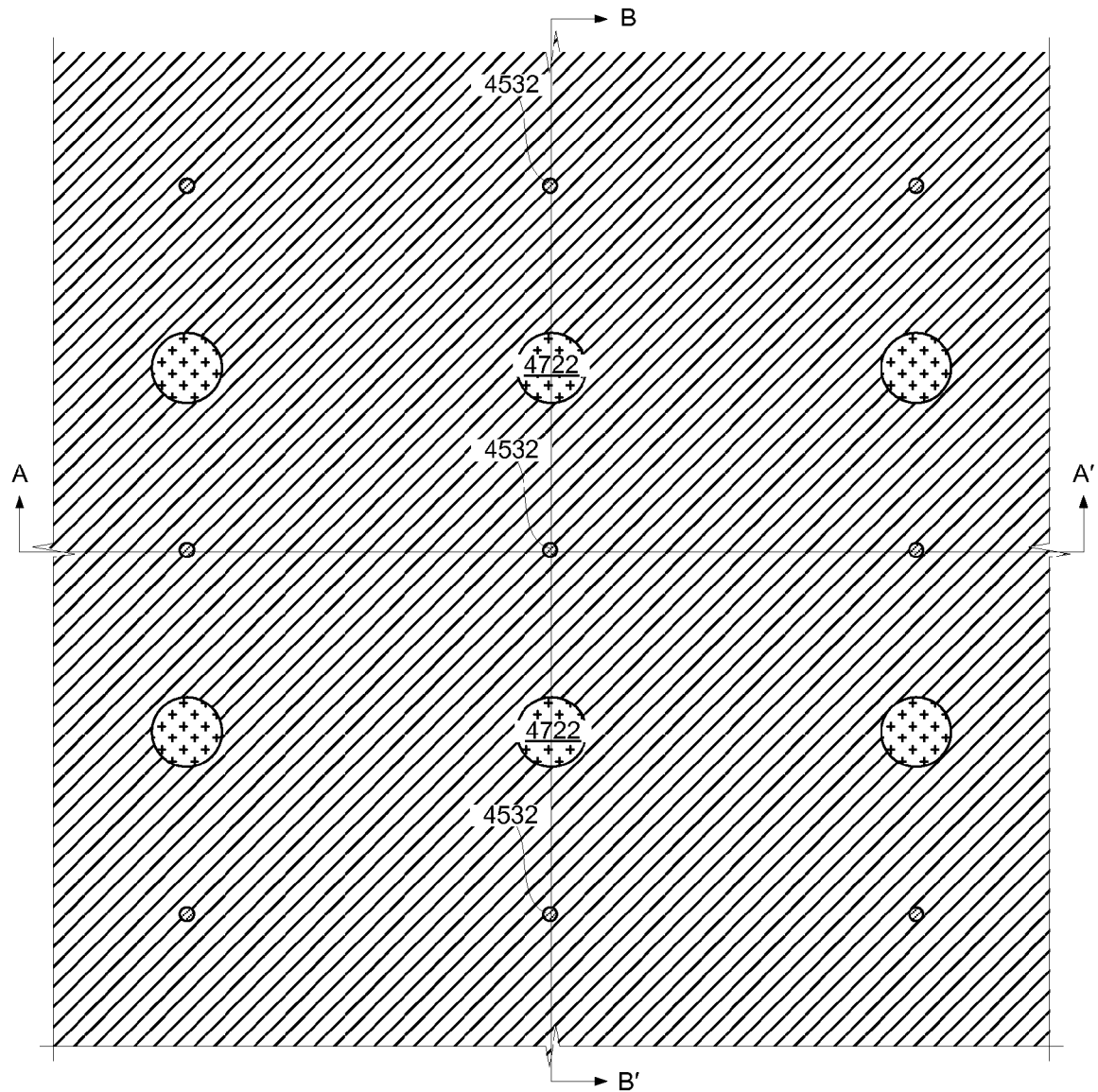

Thereafter, a second array of openings 4720 can be formed through the dielectric 4610 of the structure shown in FIGS. 46A, 46B, 46C to expose areas 4722 of the top surfaces of implanted relatively highly doped crystalline semiconductor material (1512, P+), resulting in the structure illustrated in FIGS. 47A, 47B, 47C. The openings 4720 can be formed by etching, for example.

Figure 48A:
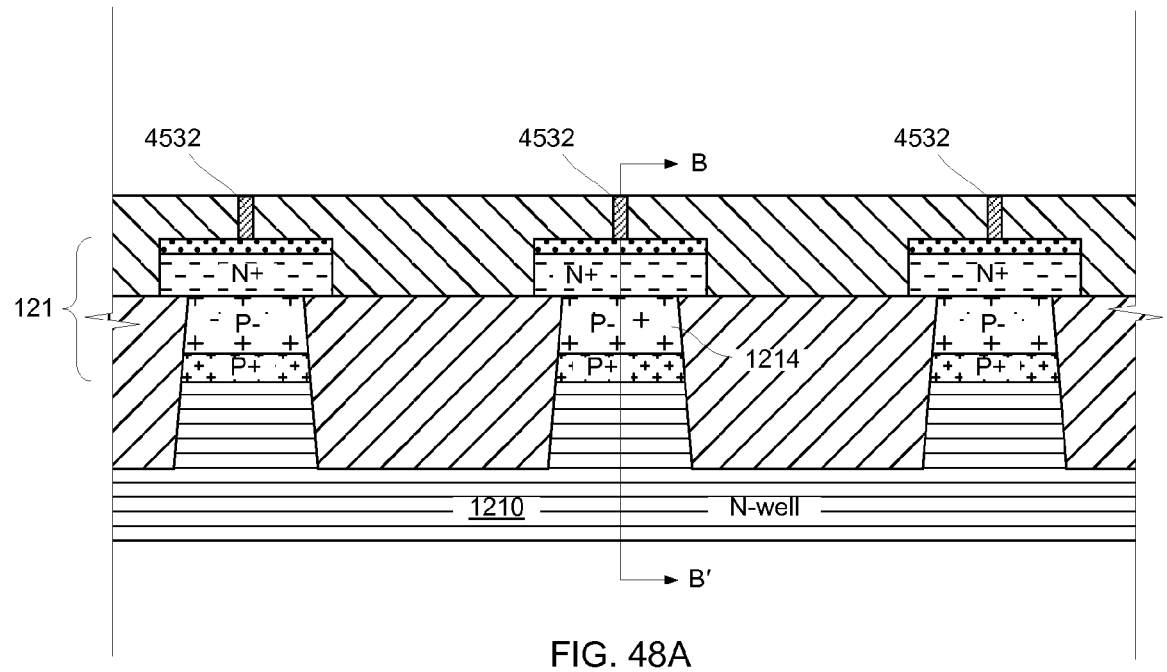
Figure 48B:
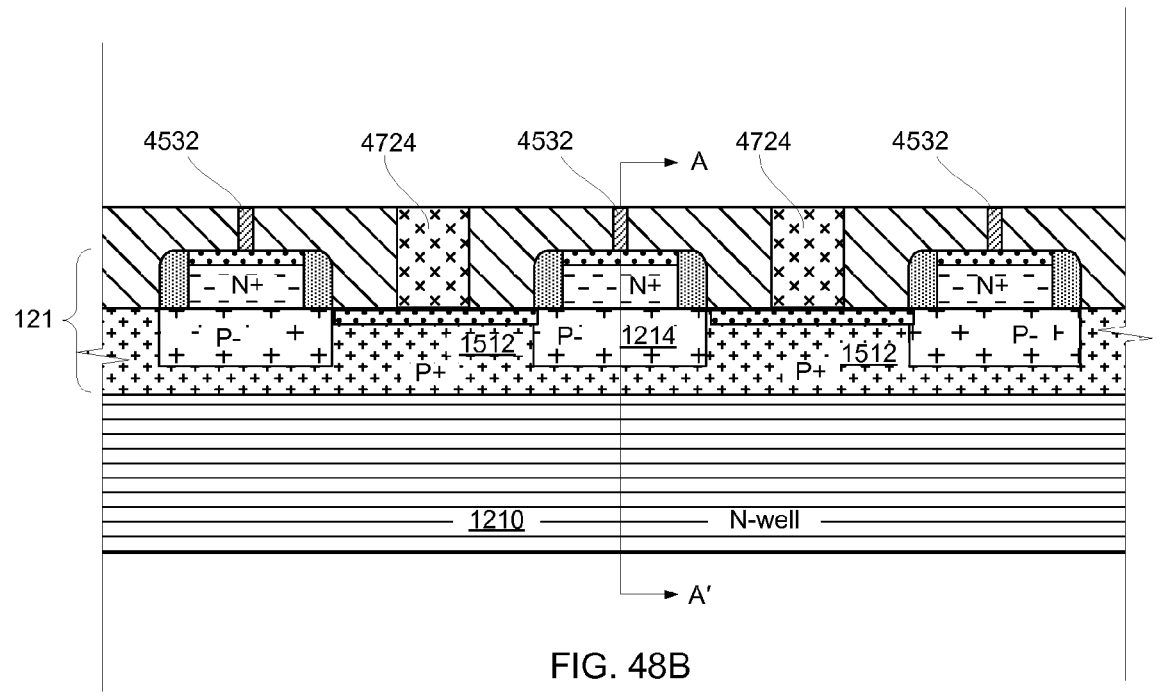
Figure 48C:
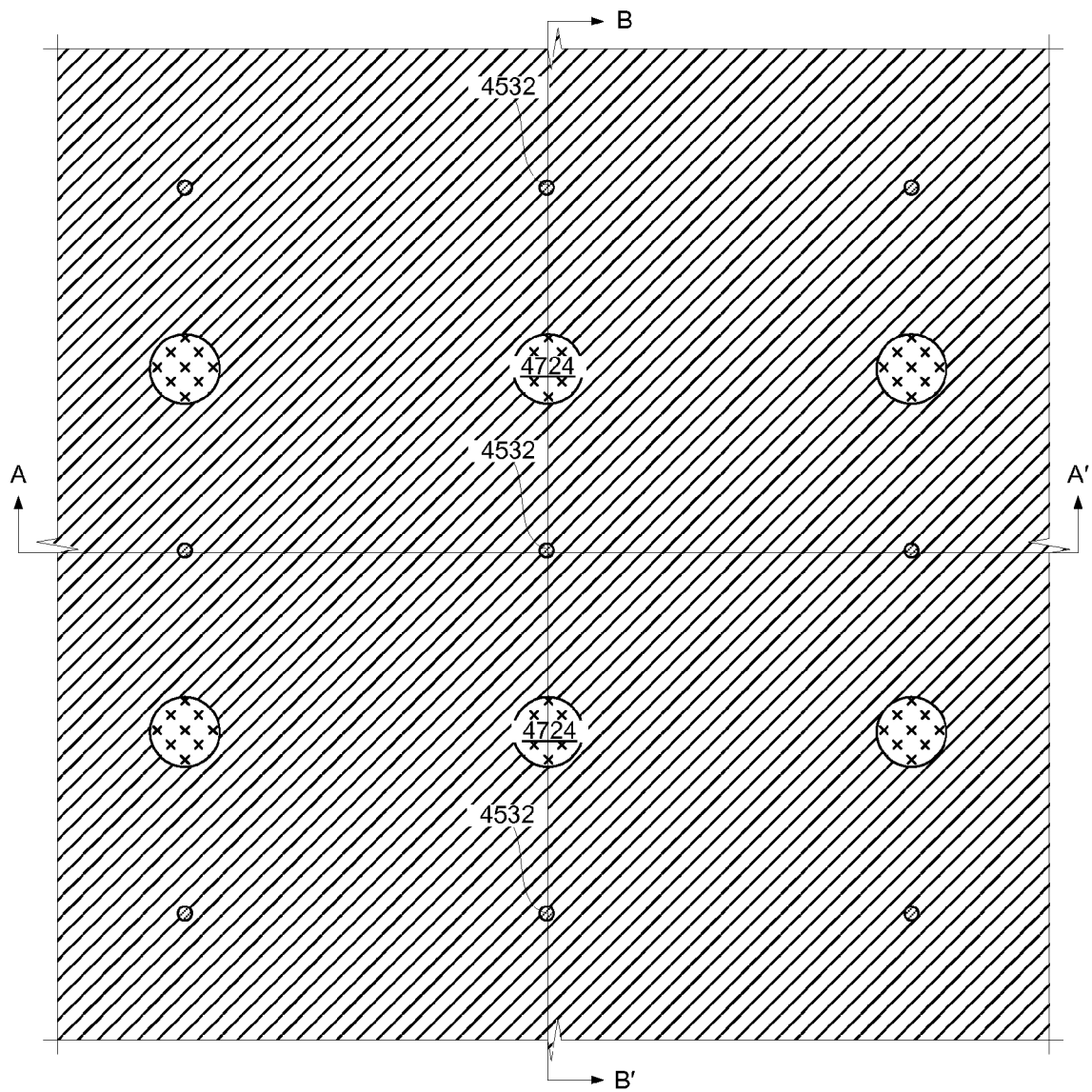

Thereafter, conductive plugs 4724 are formed by depositing conductive material in the openings 4720 in the structure illustrated in FIGS. 47A, 47B, 47C, resulting in the structure shown in FIGS. 48A, 48B, 48C.

Figure 49A:
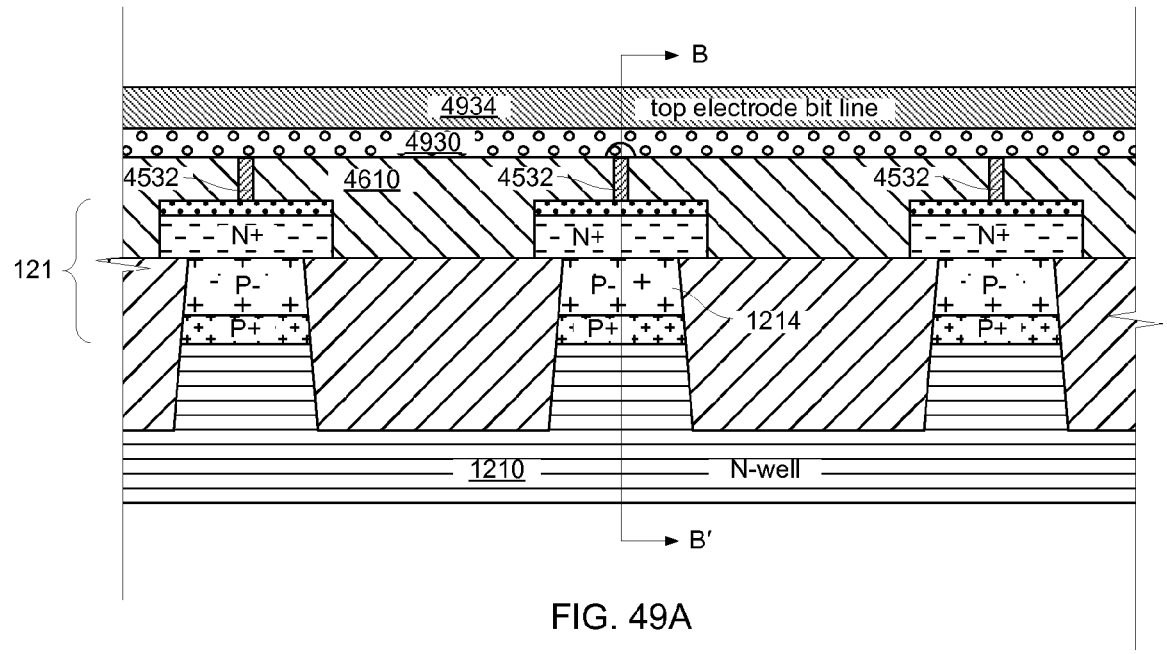
Figure 49B:
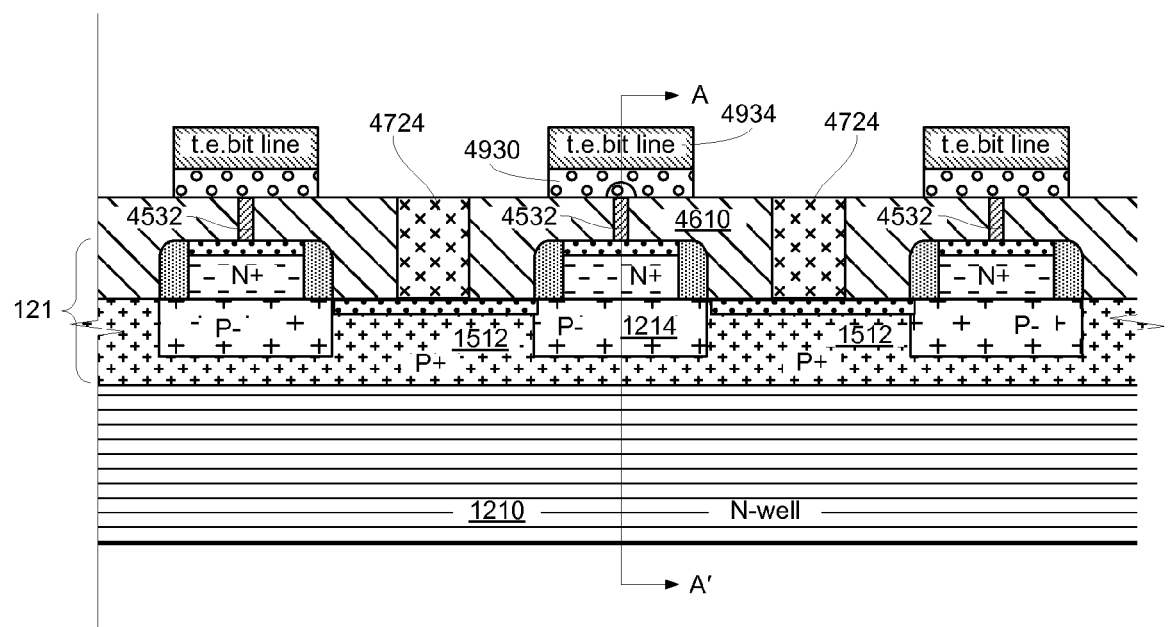
Figure 49C:
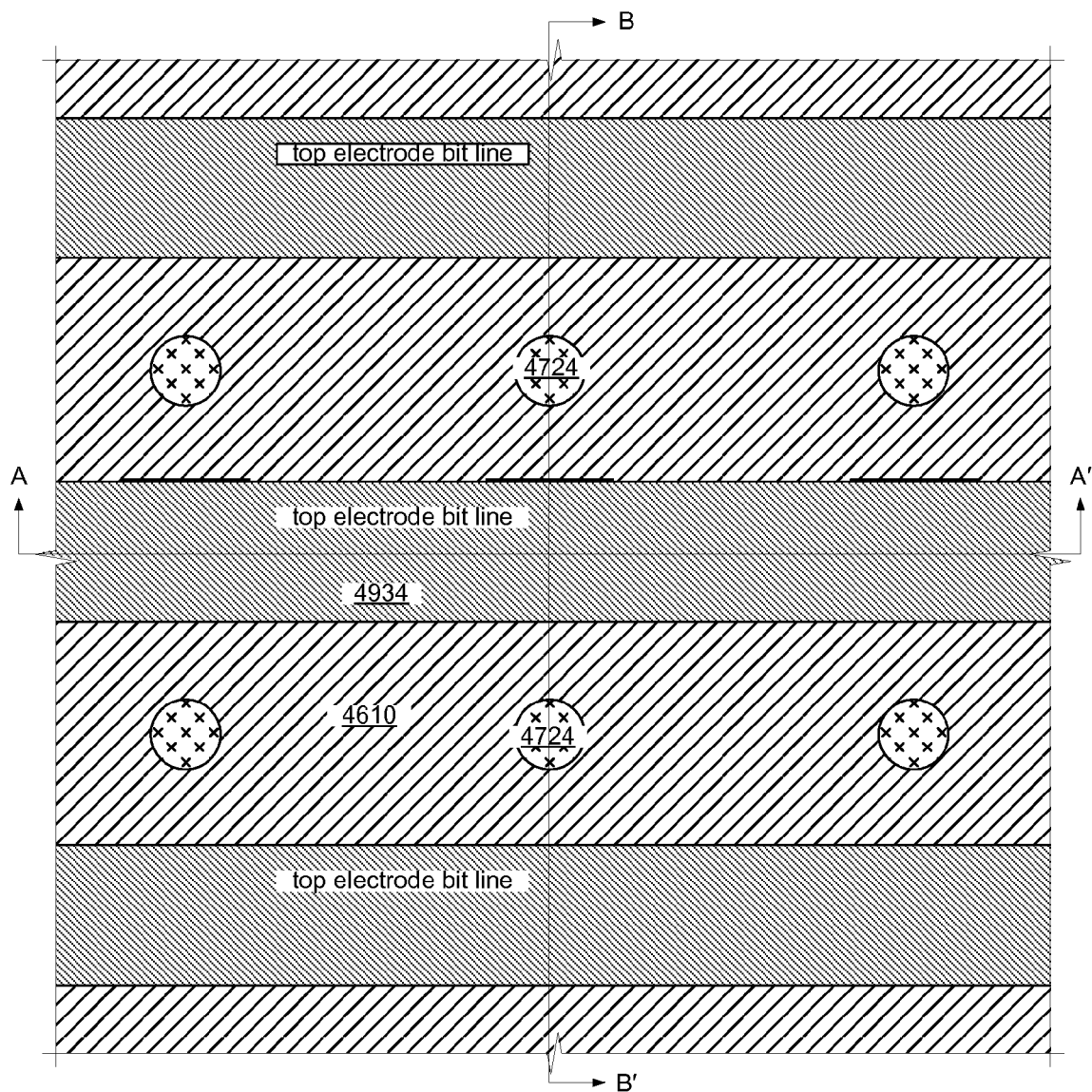

Thereafter, strips 4930 of memory material overlain by strips 4934 of top electrode material are formed over a construct as shown in FIGS. 48A, 48B, 48C, resulting in a structure as shown in FIG. 49A, 49B, 49C. The strips are arranged so that they traverse the rows of bottom electrodes 4532, and so that the memory material contacts the underlying bottom electrodes. In the example shown, the top electrode 4934 also serves as a bit line.

Figure 50A:
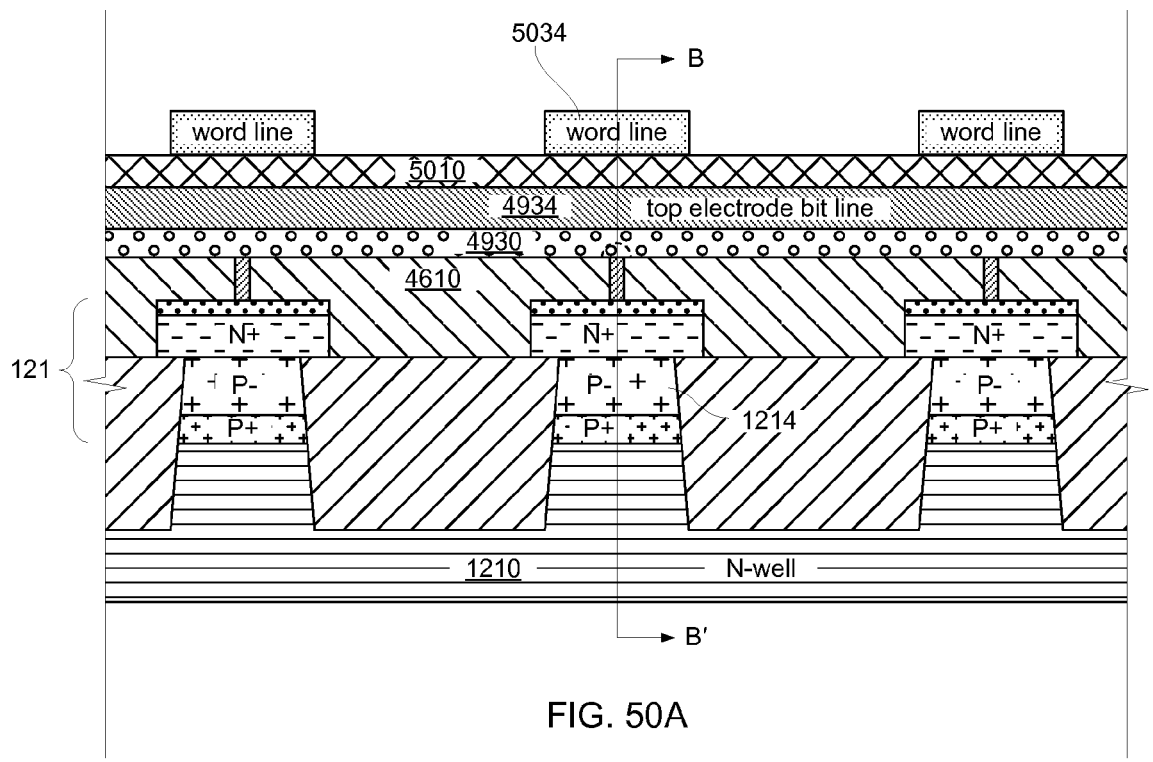
Figure 50B:
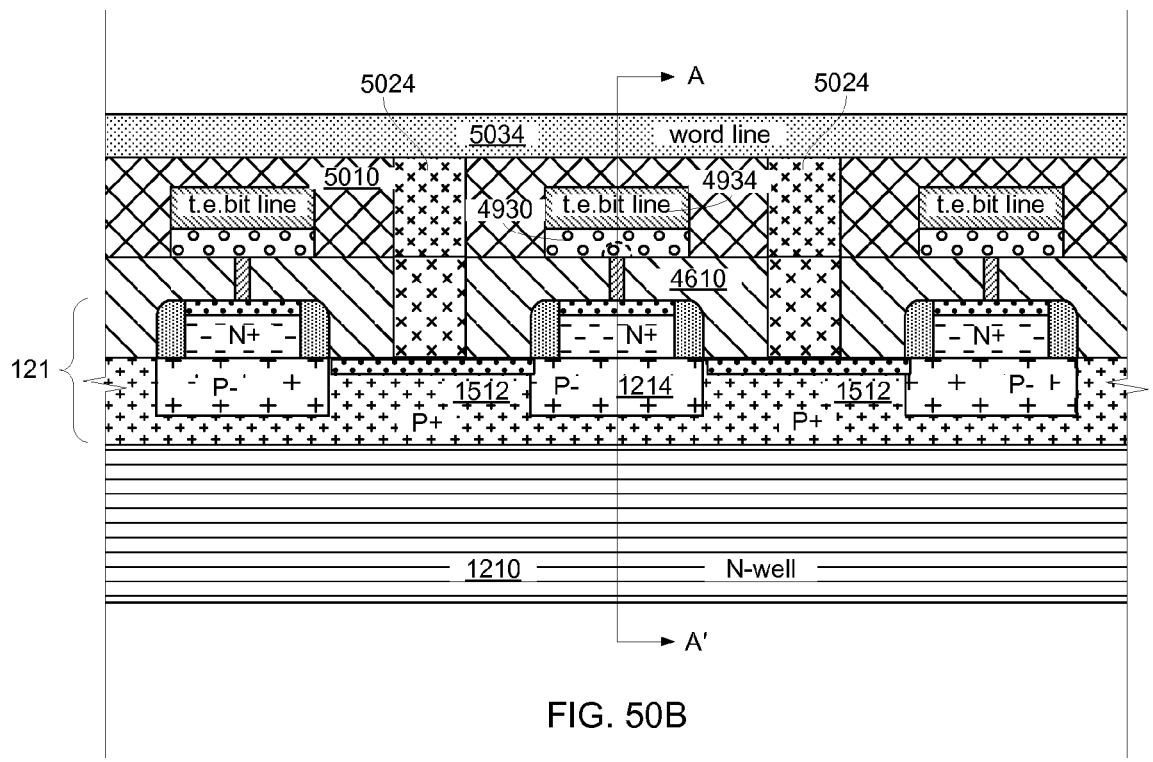

Thereafter, a dielectric fill 5010 is formed over the structure as shown in FIGS. 49A, 49B, 49C. An array of additional openings are formed through the dielectric fill 5010 to expose the surfaces of conductive plugs 4724, and additional conductive plugs 5024 are formed by depositing conductive material in the additional openings. Thereafter, word lines 5034 are formed over the dielectric fill 5010. The word lines are arranged so that they traverse the rows of additional conductive plugs 5024, and so that the word line makes electrical contact with the underlying conductive plugs. The resulting structure is shown in FIGS. 50A, 50B. As mentioned above, the conductive plugs 5024 may be eliminated or used only occasionally is some embodiments.

Figure 51A:
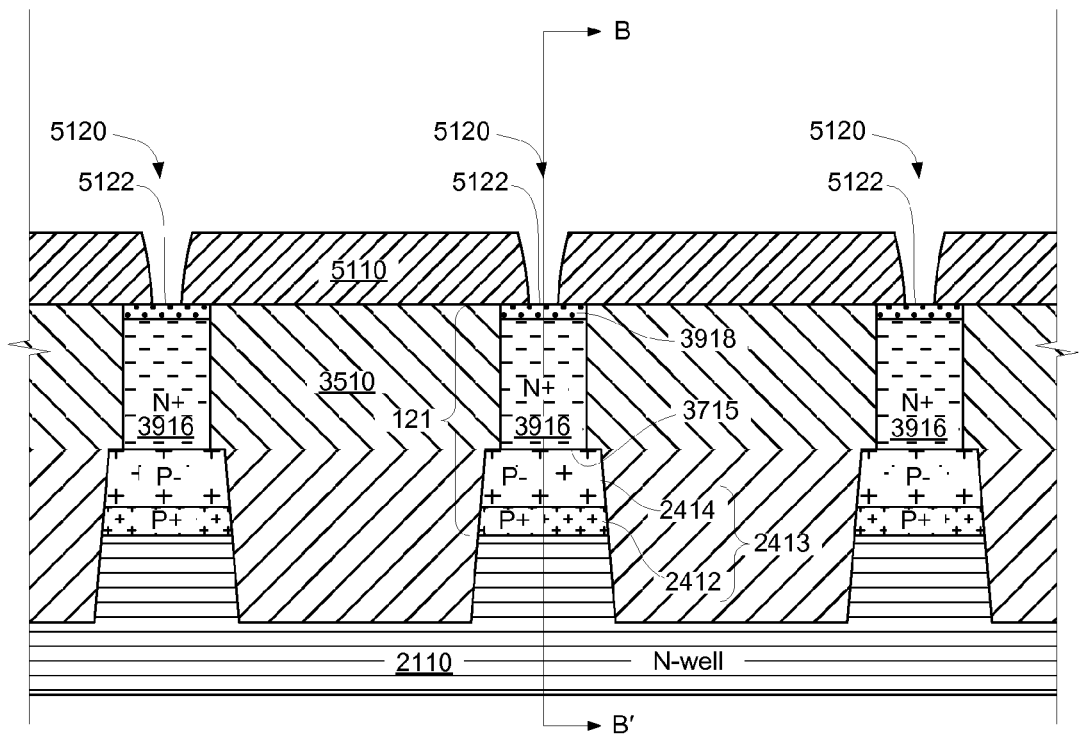
FIGS. 51A-54C are diagrammatic sketches showing stages in an embodiment of a process for forming memory elements over access diodes such as are shown in FIGS. 26A, 26B, resulting in memory cell devices generally as illustrated in FIGS. 27A, 27B.
Figure 51B:
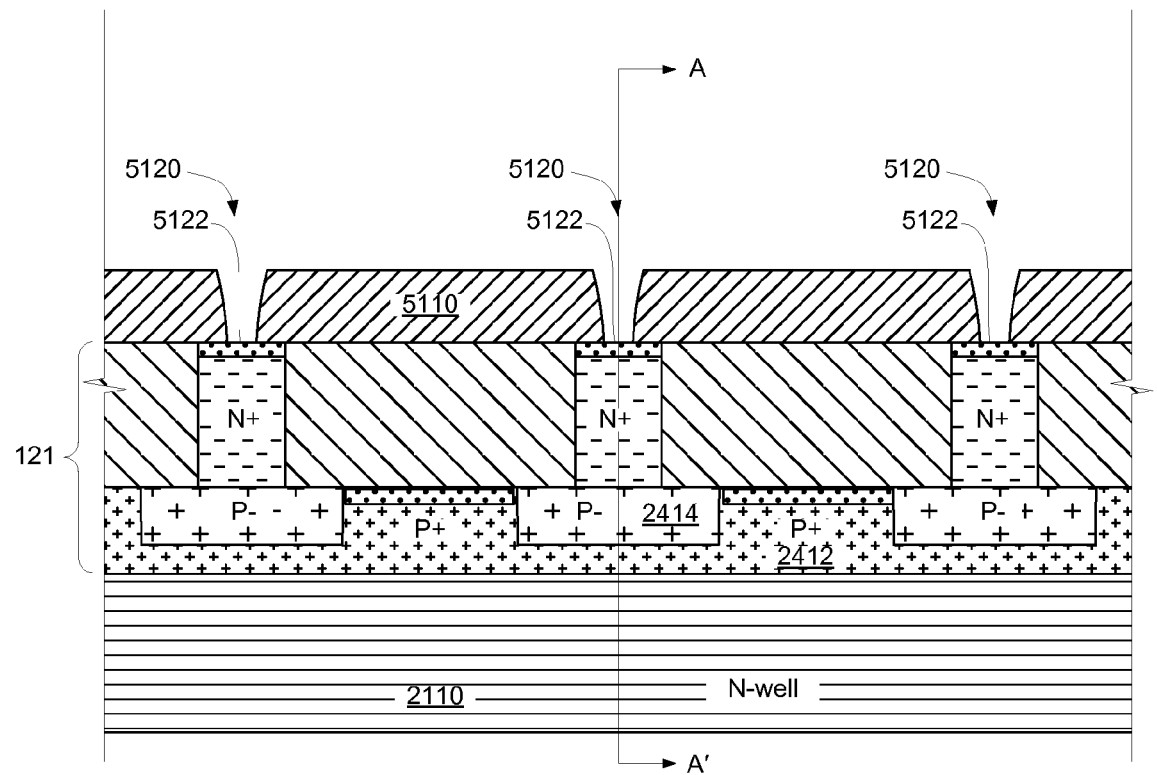
Figure 51C:
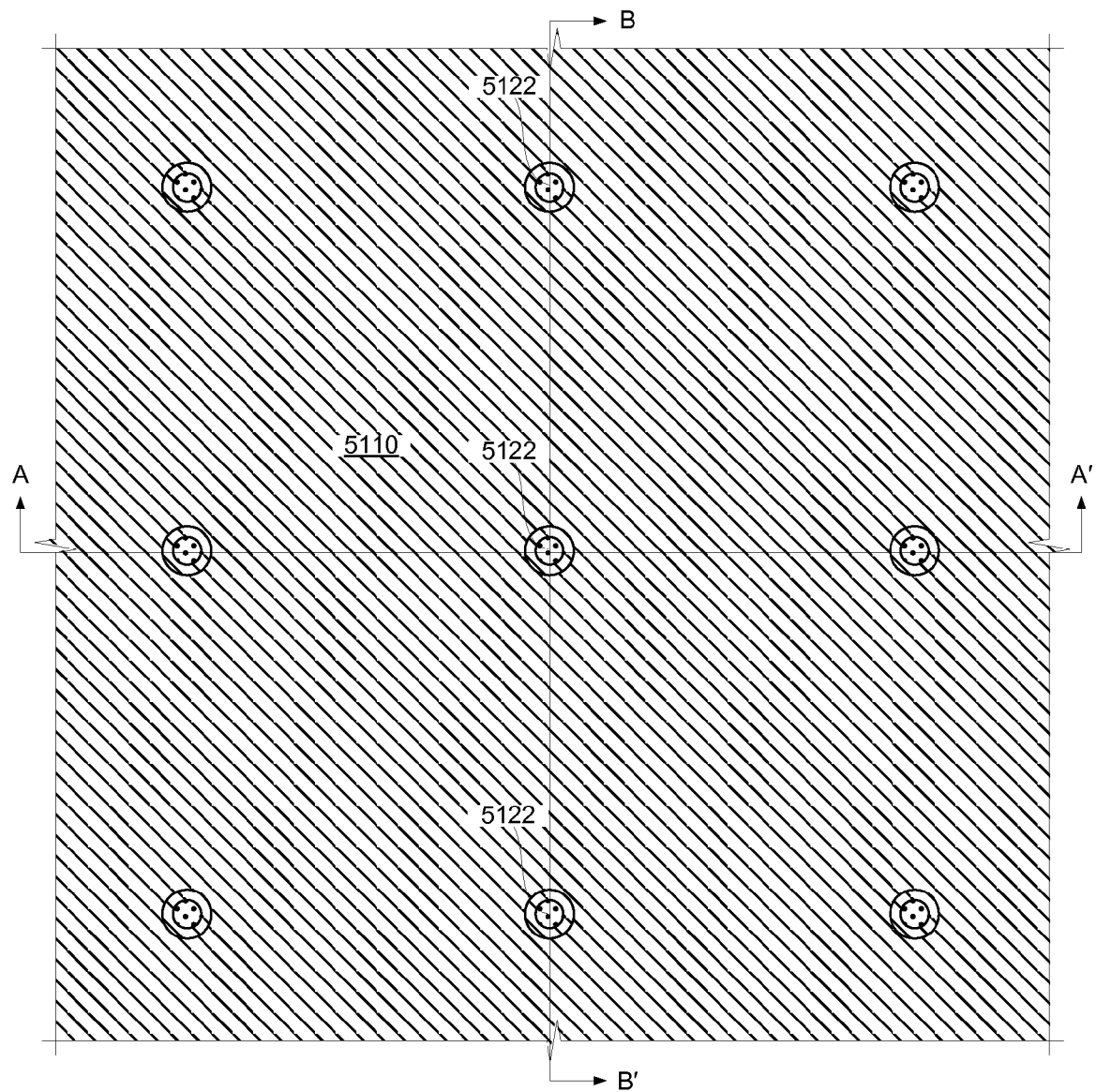

FIGS. 51A-54C show stages in an embodiment of a process for forming memory elements over access diodes having a second region in the form of a pillar (as in FIGS. 27A, 27B). Beginning for example with a configuration as shown in FIGS. 39A, 39B, 39C, a dielectric 5110 is formed over the caps 3918 at the tops of the relatively heavily-doped polysilicon pillars 3916, and an array of tapered pores 5120 are formed through the dielectric 5110, exposing areas 5122 of the underlying caps 3918. The resulting structure is shown in FIGS. 51A, 51B, 51C.

Figure 52A:
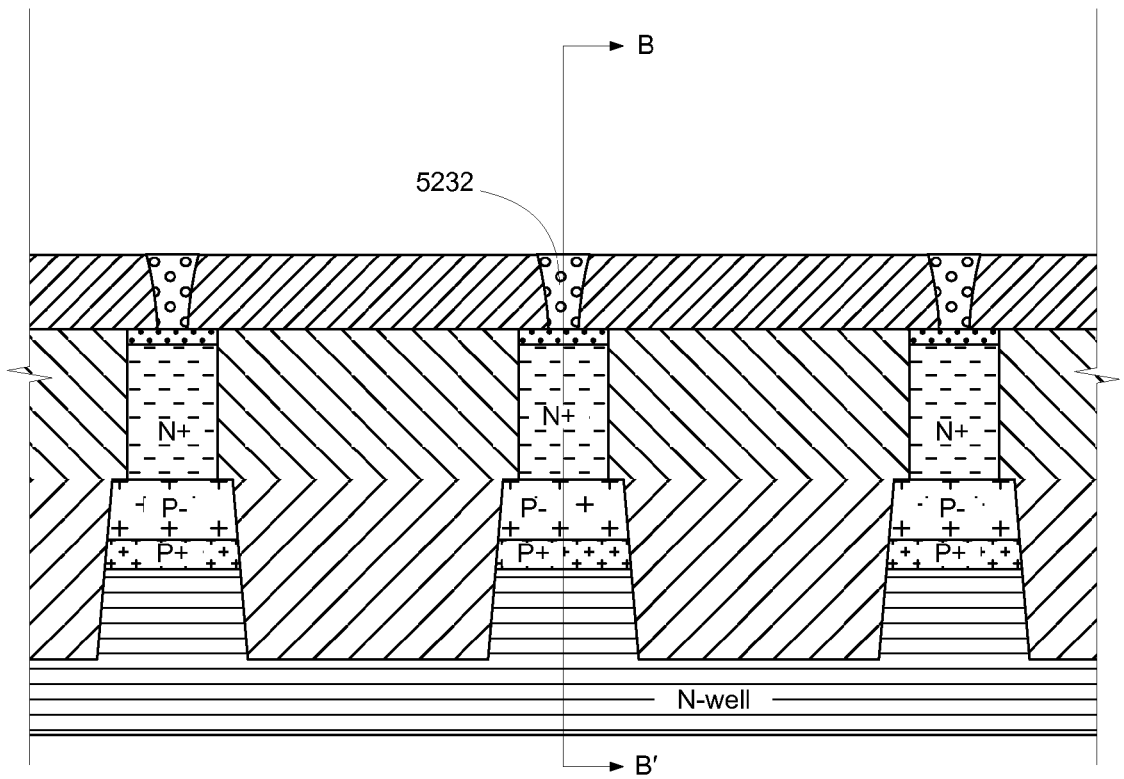
Figure 52B:
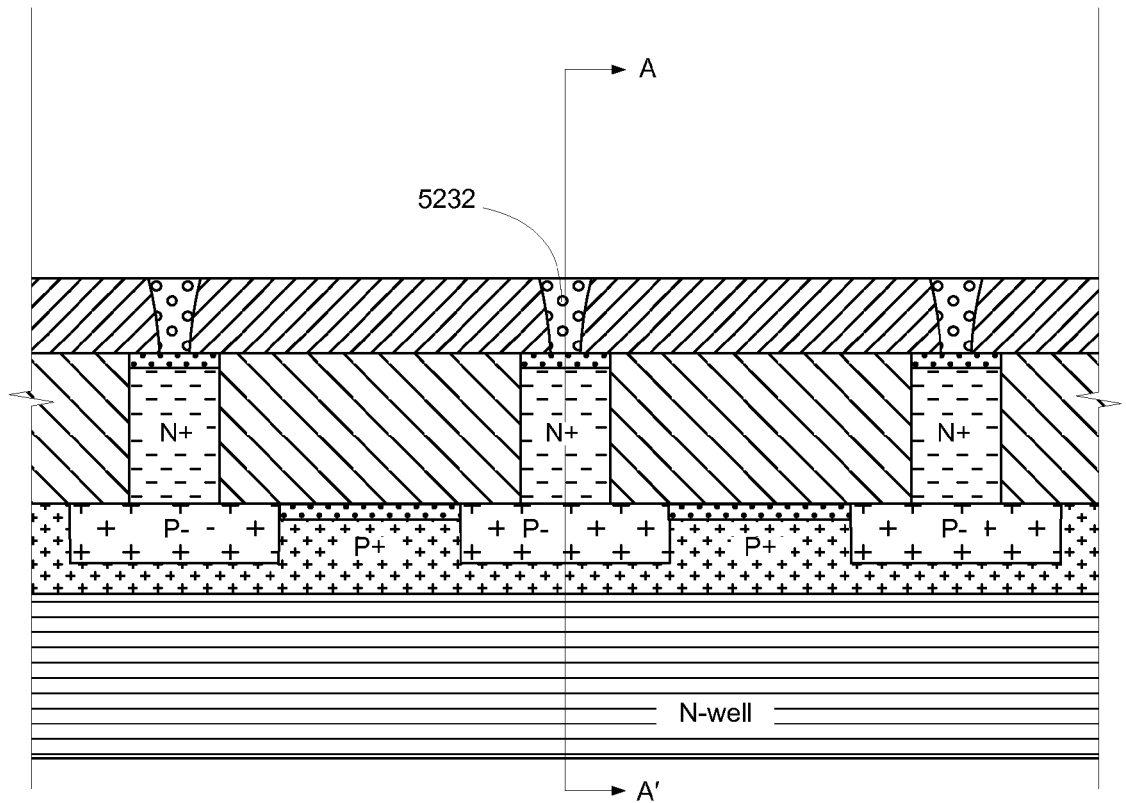
Figure 52C:
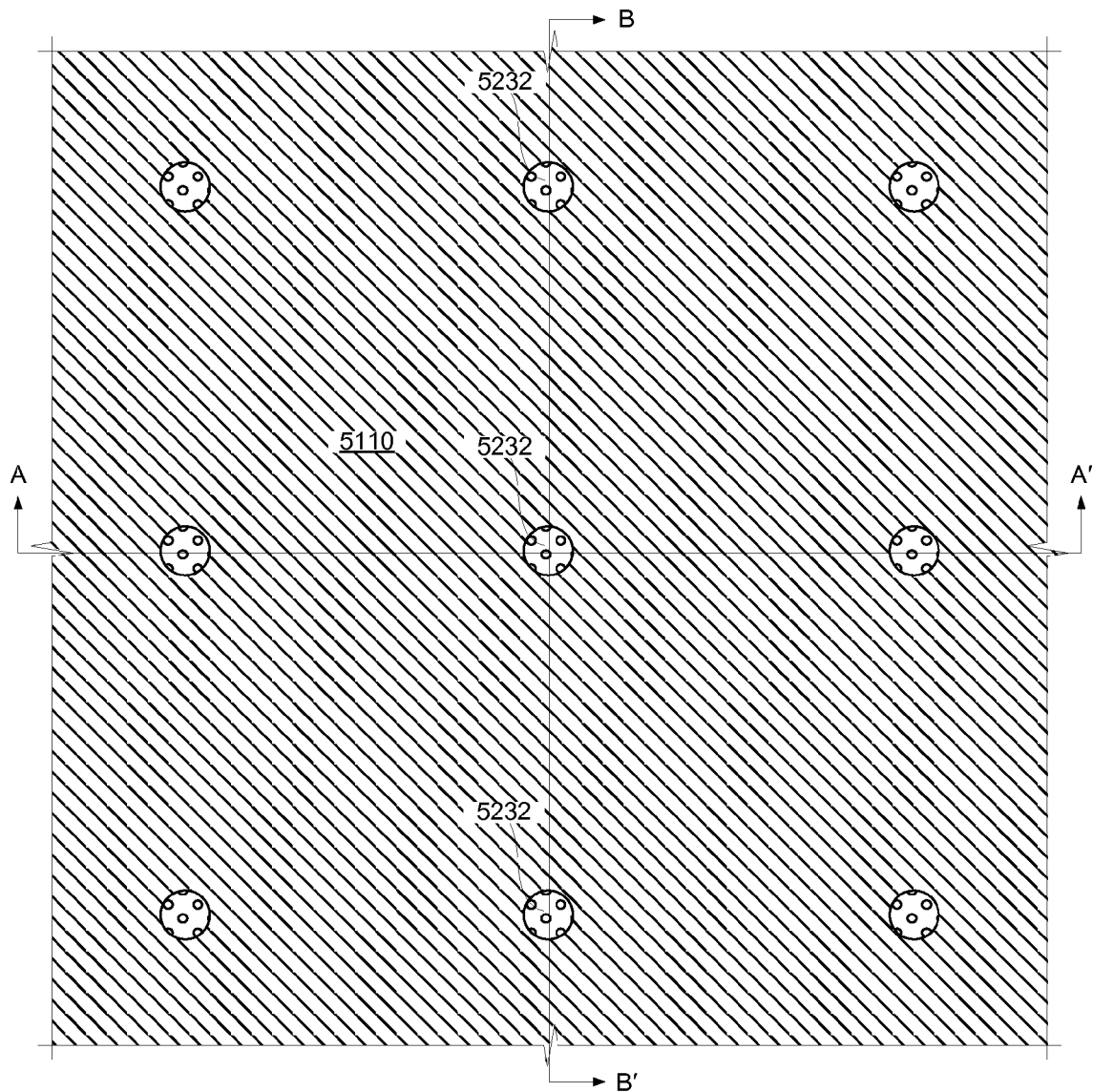

Thereafter, the pores are filled with a memory material 5232, with a result as shown in FIGS. 52A, 52B, 52C.

Thereafter, strips 5330 of top electrode material are formed over the rows of memory material elements 5232, and bit lines 120b are formed over the top electrode strips. These strips may be formed by a deposition-mask-etch procedure, for example. The resulting structure is shown in FIGS. 53A, 53B, 53C.

Figure 53A:
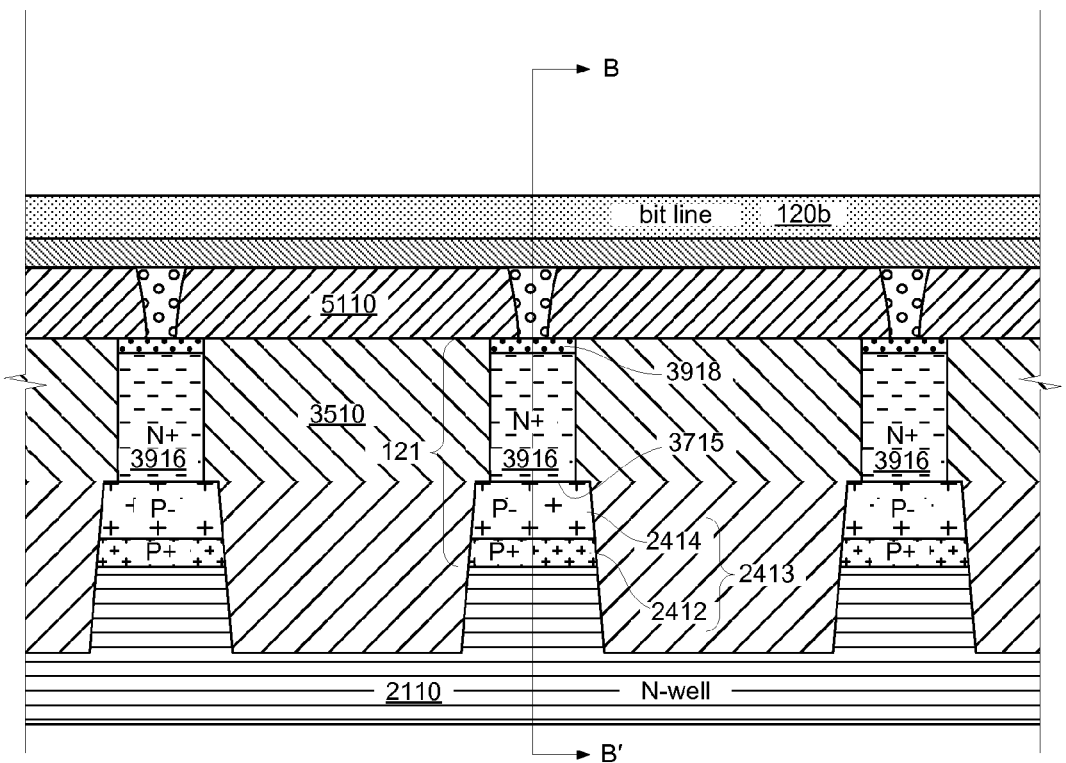
Figure 53B:
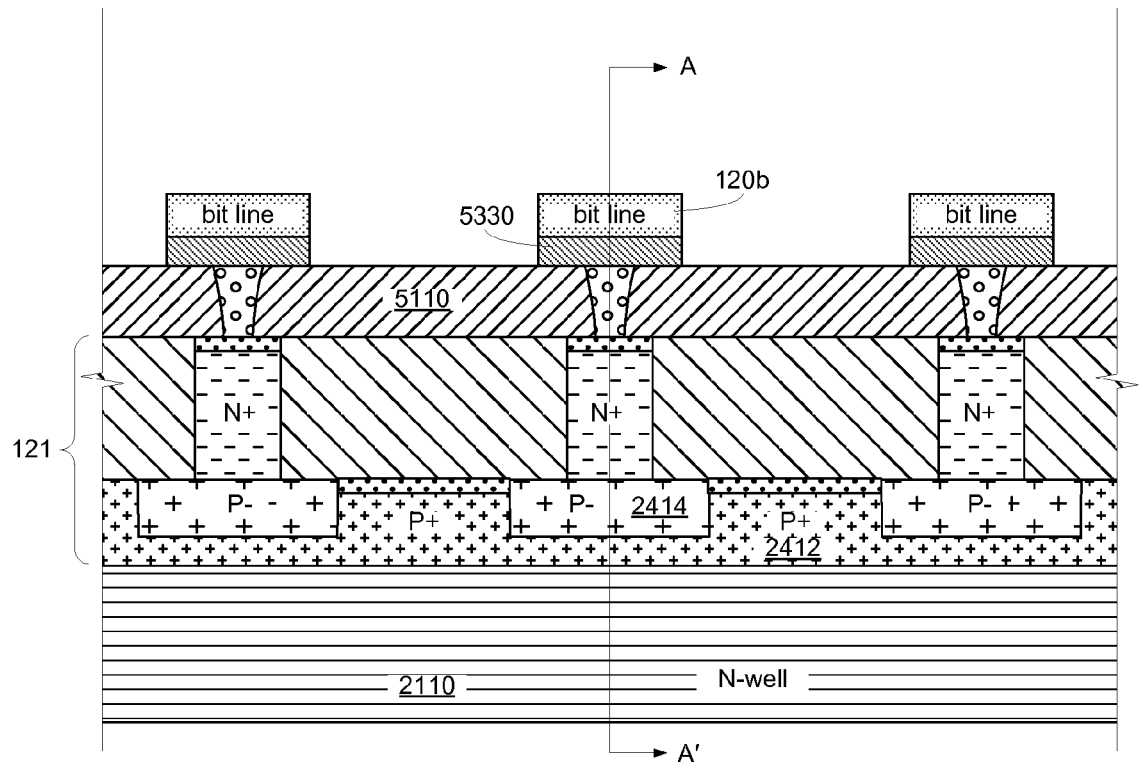
Figure 53C:
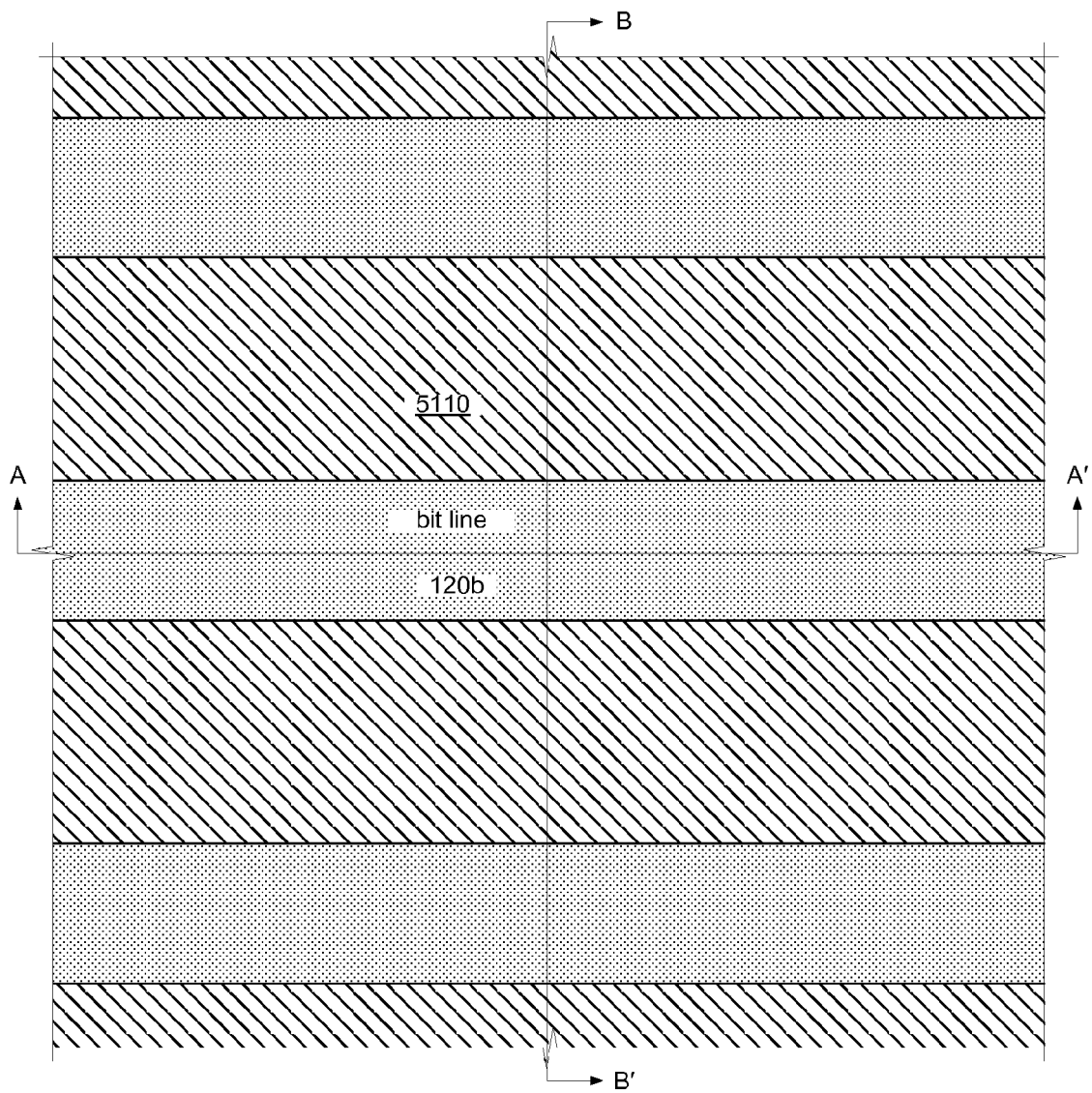
Figure 54A:
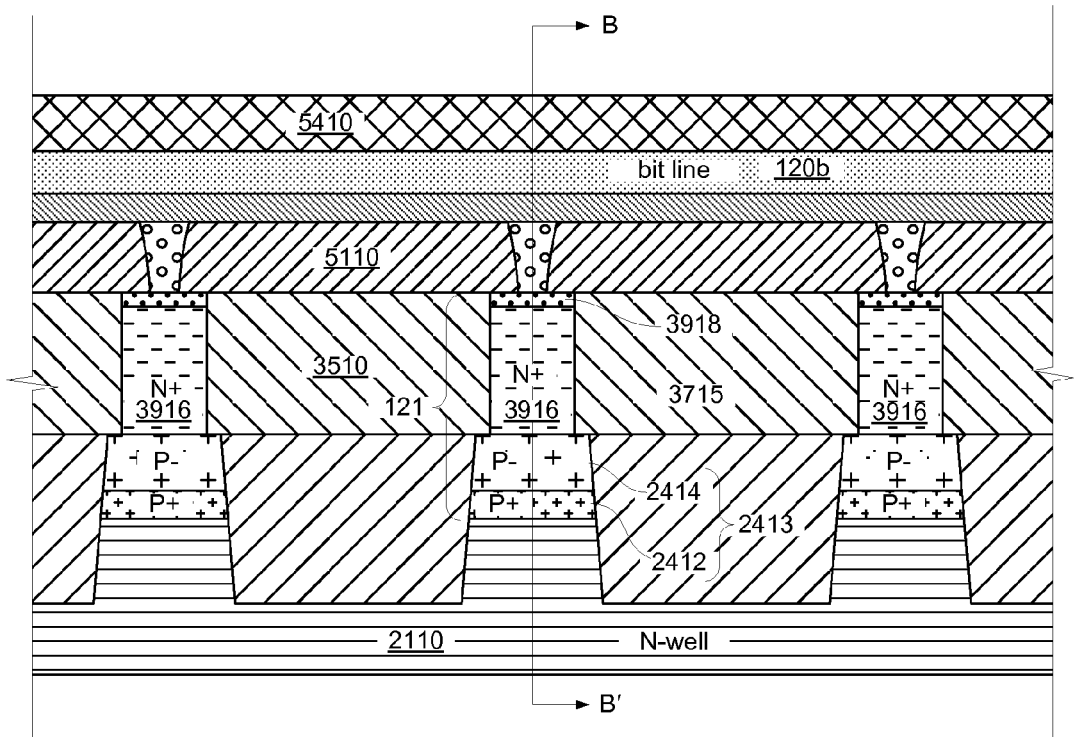
Figure 54B:
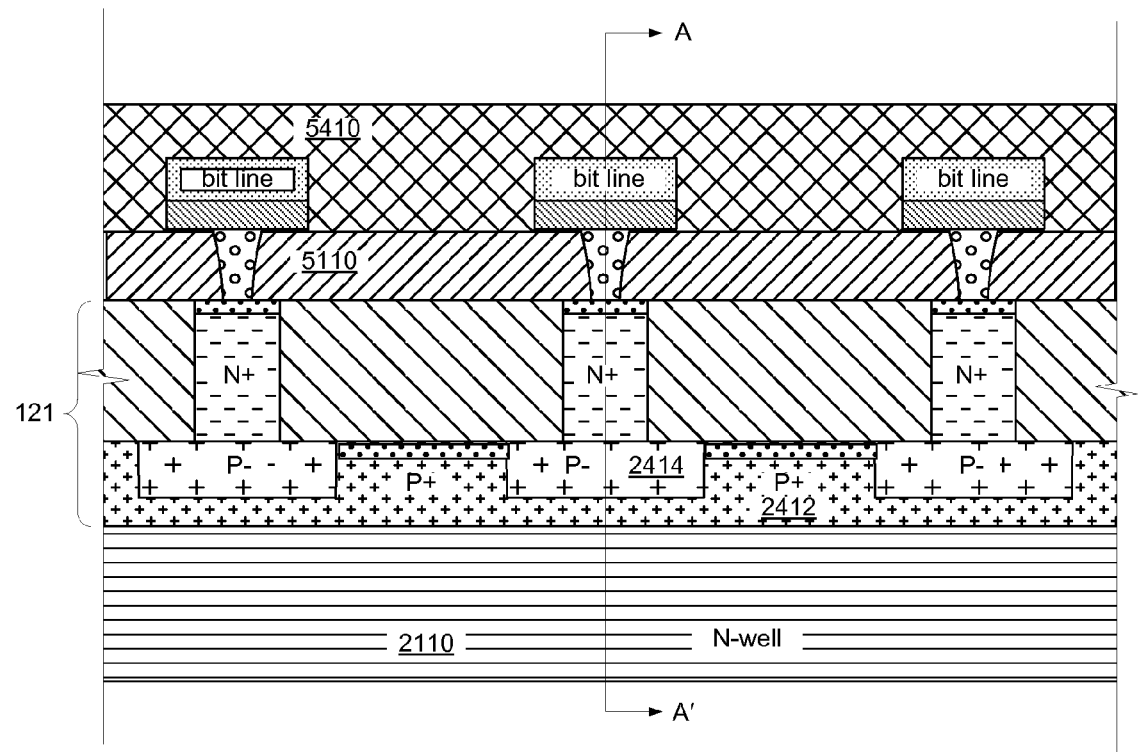
Figure 54C:
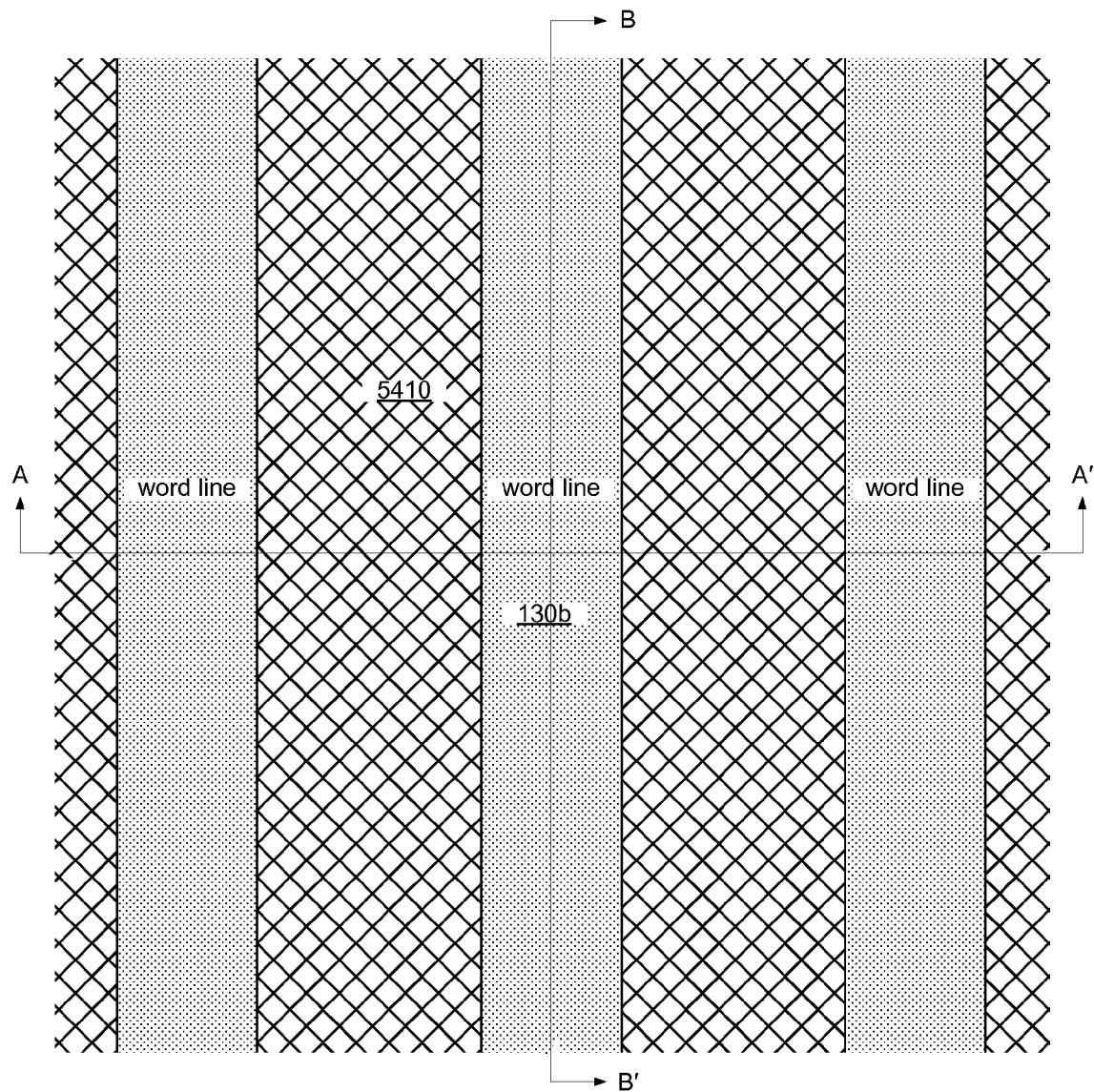

Thereafter an additional dielectric fill 5410 is formed over the structure of FIGS. 53A, 53B, 53C, and word lines 130b are patterned over the structure, as shown in FIG. 54C, to which contacts are made occasionally as discussed above.

Other embodiments are within the following claims.

We claim:

1. A memory cell, comprising an access device comprising a multilayer stack comprising:
    a conductively doped strip of single-crystalline semiconductor extending in a first direction and having a first conductivity type, and a first doped semiconductor region having the first conductivity type in and more lightly doped than the conductively doped strip, the strip of single-crystalline semiconductor having a top surface in the first doped semiconductor region, the first doped semiconductor region being at the top surface of the strip, and having a depth less than the depth of the strip;
    an insulating layer over the strip including a via in the insulating layer over the first doped semiconductor region; and
    a doped semiconductor plug within the via and contacting the first doped semiconductor region on the top surface of the strip, the doped semiconductor plug having a second conductivity type opposite the first conductivity type, so that the first doped semiconductor region and the doped semiconductor plug define a pn junction at the top surface of the strip, wherein the doped semiconductor plug comprises a polycrystalline semiconductor, and the doping concentration of doped semiconductor plug is more than 10 times higher than the doping concentration of the first doped semiconductor region.

2. The memory cell of claim 1 further comprising a programmable resistance memory element over the insulating layer and coupled with the doped semiconductor plug.

3. The memory cell of claim 1 wherein the doping concentration of the doped semiconductor plug is in a range about 100 to about 1000 times higher than the doping concentration of the first doped semiconductor region.

4. The memory cell of claim 1 wherein the first doped semiconductor region comprises a P-type semiconductor and the doped semiconductor plug comprises a N-type polycrystalline semiconductor.

5. The memory cell of claim 1 wherein the first doped semiconductor region comprises a N-type semiconductor and the doped semiconductor plug comprises a P-type polycrystalline semiconductor.

6. The memory cell of claim 1, further comprising an electrically conductive cap on the doped semiconductor plug.

7. The memory cell of claim 6 wherein the cap comprises a silicide.

8. The memory cell of claim 1, further comprising a barrier between the first doped semiconductor region and the doped semiconductor plug.

9. The memory cell of claim 8 wherein the barrier comprises $SiO_2$.

10. The memory cell of claim 8 wherein the barrier comprises $SiN_xO_y$.

11. The memory cell of claim 8 wherein the barrier has a thickness in a range about 5 to 25 Angstroms.

12. A memory device comprising
a plurality of doped semiconductor first access lines comprising respective conductively doped strips of single-crystalline semiconductor having a first conductivity type extending in a first direction,
a plurality of second access lines extending in a second direction,
a plurality of memory cells, each comprising
an access device, comprising
a doped semiconductor region in a particular conductively doped strip having the first conductivity type and more lightly doped than adjacent portions of the particular conductively doped strip, the particular conductively doped strip having a top surface in the doped semiconductor region and having a depth, the doped semiconductor region being at the top surface of, and having a depth less than the depth of, the particular conductively doped strip;
an insulating layer over the top surface of the particular conductively doped strip including a via in the insulating layer over the doped semiconductor region;
a doped semiconductor plug within the via having a second conductivity type opposite the first conductivity type and contacting the doped semiconductor region on the top surface of the particular conductively doped strip, the doped semiconductor plug comprising a polycrystalline semiconductor, the doped semiconductor region and doped semiconductor plug defining a pn junction therebetween at the top surface of the particular conductively doped strip, and an electrically conductive cap on the doped semiconductor plug; and
a memory material in electrical communication with the electrically conductive cap, the memory material underlying and in electrical communication with a corresponding second access line.

13. The memory device of claim 12 wherein adjacent semiconductor first access lines are separated by a trench isolation.

14. The memory device of claim 12 wherein the doped semiconductor region comprises a lightly-doped P-type semiconductor and the doped semiconductor plug comprises a more heavily-doped N-type polycrystalline semiconductor having a doping concentration higher than that of the lightly-doped P-type semiconductor, and the cap comprises a silicide.

15. The memory device of claim 14 wherein the conductively doped strips of single-crystalline semiconductor comprise a conductively-doped P-type semiconductor.

16. The memory device of claim 14 wherein the conductively doped strips of single-crystalline semiconductor comprise a conductively-doped P-type semiconductor, and including a conductive cap layer on surface portions of the conductively-doped P-type semiconductor.

17. The memory device of claim 16, further comprising a bottom electrode between the electrically conductive cap and the memory material.

18. The memory device of claim 16, further comprising a barrier between the doped semiconductor region and the doped semiconductor plug.

19. The memory device of claim 18 wherein the barrier comprises $SiO_2$.

20. The memory device of claim 18 wherein the barrier comprises $SiN_xO_y$.

21. The memory device of claim 18 wherein the barrier has a thickness in a range about 5 to 25 Angstroms.

22. The memory device of claim 12 wherein the doped semiconductor region comprises a lightly-doped N-type semiconductor and the doped semiconductor plug comprises a more heavily-doped P-type polycrystalline semiconductor having a doping concentration higher that that of the lightly-doped N-type semiconductor.

23. The memory device of claim 22 wherein the conductively doped strips of single-crystalline semiconductor comprise a conductively-doped N-type semiconductor.

24. The memory device of claim 22 wherein the conductively doped strips of single-crystalline semiconductor comprise a conductively-doped N-type semiconductor, and including a conductive cap layer on surface portions of the conductively-doped N-type semiconductor.

25. A memory cell comprising:
a storage element, and
a diode coupled as an access device to the storage element, comprising a polysilicon node of a first conductivity type, a first single crystal silicon node of a second conductivity type, the polysilicon node comprising a polysilicon plug within a contact opening through a particular dielectric layer, and including a metal plug within another contact opening through the same particular dielectric layer, acting as an interlayer connector and having a top surface in contact with an overlying conductor.

* * * * *